(12) United States Patent
Palfreyman et al.

(10) Patent No.: US 11,692,702 B2
(45) Date of Patent: Jul. 4, 2023

(54) LIGHTING SYSTEMS INCORPORATING CONNECTIONS FOR SIGNAL AND POWER TRANSMISSION

(71) Applicants: Paul Palfreyman, Vancouver (CA); Philippe M. Schick, Vancouver (CA); Michael A. Tischler, Vancouver (CA)

(72) Inventors: Paul Palfreyman, Vancouver (CA); Philippe M. Schick, Vancouver (CA); Michael A. Tischler, Vancouver (CA)

(73) Assignee: COOLEDGE LIGHTING, INC., Richmond (CA)

( * ) Notice: Subject to any disclaimer, the term of this patent is extended or adjusted under 35 U.S.C. 154(b) by 0 days.

(21) Appl. No.: 17/673,001

(22) Filed: Feb. 16, 2022

(65) Prior Publication Data

US 2022/0170625 A1 Jun. 2, 2022

Related U.S. Application Data

(63) Continuation of application No. 16/923,258, filed on Jul. 8, 2020, now Pat. No. 11,274,823, which is a continuation-in-part of application No. 16/455,863, filed on Jun. 28, 2019, now Pat. No. 10,746,358, which is a continuation-in-part of application No. 15/446,494, filed on Mar. 1, 2017, now Pat. No. 10,344,954.

(Continued)

(51) Int. Cl.
*F21V 33/00* (2006.01)
*E04B 1/84* (2006.01)
*F21S 8/04* (2006.01)
*F21Y 105/16* (2016.01)
*F21Y 115/10* (2016.01)

(52) U.S. Cl.
CPC ........ *F21V 33/0056* (2013.01); *E04B 1/8409* (2013.01); *F21S 8/04* (2013.01); *F21Y 2105/16* (2016.08); *F21Y 2115/10* (2016.08)

(58) Field of Classification Search
CPC .... F21V 19/003; F21V 19/004; F21V 21/005; F21V 21/35; F21V 23/06; F21V 33/0056; F21S 2/00; F21S 2/005; F21S 8/04; F21S 4/00; F21S 8/06; F21S 8/061; E04B 1/86; E04B 1/8409; F21Y 2105/16; F21Y 2105/18; F21Y 2115/10; H05K 1/181; H05K 1/189; H05K 2201/055; H05K 2201/10106
See application file for complete search history.

(56) References Cited

U.S. PATENT DOCUMENTS 4,365,244 A 12/1982 Gillessen et al.
4,533,245 A 8/1985 Love, III
(Continued)

*Primary Examiner* — Haissa Philogene
(74) *Attorney, Agent, or Firm* — Morgan, Lewis & Bockius LLP

(57) ABSTRACT

In accordance with various embodiments, lighting systems features one or more inter-connectable light panels each having multiple light-emitting elements thereon. One or more of the light panels may feature one or more connectors, and associated conductors, for the transmission of power, communication signals, and/or control signals. One or more of the light panels may include sound-absorbing material therebelow and may define one or more apertures and/or cut-out regions that reveal the sound-absorbing material.

23 Claims, 77 Drawing Sheets

Related U.S. Application Data

(60) Provisional application No. 62/302,434, filed on Mar. 2, 2016.

(56) References Cited

U.S. PATENT DOCUMENTS

| | | | |
|---|---|---|---|
| 4,972,094 A | 11/1990 | Marks | |
| 5,782,551 A | 7/1998 | Capaul | |
| 6,565,231 B1 | 5/2003 | Cok | |
| 6,851,831 B2 | 2/2005 | Karlicek, Jr. | |
| 7,108,392 B2 | 9/2006 | Strip et al. | |
| 7,303,305 B2 | 12/2007 | Kennedy | |
| 7,331,681 B2 | 2/2008 | Pohlert et al. | |
| 7,607,815 B2 | 10/2009 | Pang | |
| 7,617,857 B2 | 11/2009 | Froese | |
| 7,766,511 B2 | 8/2010 | Zampini et al. | |
| 8,066,403 B2 | 11/2011 | Sanfilippo et al. | |
| 8,384,114 B2 | 2/2013 | Tischler et al. | |
| 8,471,274 B2 | 6/2013 | Golle et al. | |
| 8,536,772 B2 | 9/2013 | Kim et al. | |
| 8,653,539 B2 | 2/2014 | Tischler et al. | |
| 8,674,616 B2 | 3/2014 | Holman et al. | |
| 8,704,448 B2 | 4/2014 | Tischler et al. | |
| 8,714,772 B1 | 5/2014 | Levante et al. | |
| 8,746,923 B2 | 6/2014 | Ashdown et al. | |
| 8,759,125 B2 | 6/2014 | Tischler | |
| 8,947,001 B2 | 2/2015 | Tischler et al. | |
| 8,970,362 B2 | 3/2015 | Morley et al. | |
| 9,062,854 B2 | 6/2015 | Livesay et al. | |
| 9,116,276 B2 | 8/2015 | Montfort et al. | |
| 9,194,124 B2 | 11/2015 | Johnson et al. | |
| 9,410,683 B2 | 8/2016 | Tischler et al. | |
| 9,494,305 B2 | 11/2016 | Tischler et al. | |
| 9,506,633 B2 | 11/2016 | Tischler | |
| 9,607,393 B2 | 3/2017 | Breuer et al. | |
| 9,629,220 B2 | 4/2017 | Panopoulos et al. | |
| 9,645,304 B2 | 5/2017 | Nichol et al. | |
| 9,691,370 B1 | 6/2017 | Stone et al. | |
| 9,696,019 B2 | 7/2017 | Palfreyman et al. | |
| 9,714,746 B2 | 7/2017 | Tischler et al. | |
| 9,772,655 B1 | 9/2017 | Brooks | |
| 9,803,815 B2 | 10/2017 | Cousin | |
| 9,839,084 B2 | 12/2017 | Palfreyman et al. | |
| 9,845,936 B1 | 12/2017 | Sayers et al. | |
| 9,867,244 B2 | 1/2018 | Palfreyman et al. | |
| 9,903,574 B2 | 2/2018 | Golle et al. | |
| 10,077,877 B2 | 9/2018 | Nicolai et al. | |
| 10,091,567 B2 | 10/2018 | Schalla | |
| 10,190,753 B2 | 1/2019 | Palfreyman et al. | |
| 10,215,387 B2 | 2/2019 | Golle et al. | |
| 10,253,934 B2 | 4/2019 | Tischler et al. | |
| 10,321,541 B2 | 6/2019 | Bora et al. | |
| 10,344,954 B1 | 7/2019 | Tischler et al. | |
| 10,371,332 B2 | 8/2019 | Bailey | |
| 10,378,080 B2 | 8/2019 | Tischler et al. | |
| 10,465,889 B2 * | 11/2019 | Baker | F21V 23/003 |
| 10,508,798 B2 | 12/2019 | Tischler et al. | |
| 10,514,136 B2 | 12/2019 | Hack et al. | |
| 10,663,157 B2 | 5/2020 | Nicolai et al. | |
| 10,731,828 B2 | 8/2020 | Tischler et al. | |
| 10,746,358 B1 | 8/2020 | Palfreyman et al. | |
| 10,788,177 B2 * | 9/2020 | Lui | F21S 8/061 |
| 11,274,823 B1 * | 3/2022 | Palfreyman | E04B 1/8409 |
| 11,391,446 B2 * | 7/2022 | Amin | F21V 19/003 |
| 2002/0140880 A1 | 10/2002 | Weindorf et al. | |
| 2002/0181231 A1 | 12/2002 | Luk | |
| 2004/0070967 A1 | 4/2004 | Kennedy | |
| 2005/0178034 A1 | 8/2005 | Schubert et al. | |
| 2005/0237739 A1 | 10/2005 | Lee et al. | |
| 2007/0086189 A1 | 4/2007 | Raos et al. | |
| 2007/0090387 A1 | 4/2007 | Daniels et al. | |
| 2007/0290217 A1 | 12/2007 | Daniels | |
| 2008/0037284 A1 | 2/2008 | Rudisill | |
| 2008/0087903 A1 | 4/2008 | Stoyan | |
| 2008/0105455 A1 | 5/2008 | Palfreyman et al. | |
| 2008/0244944 A1 | 10/2008 | Nall et al. | |
| 2008/0278950 A1 | 11/2008 | Pickard et al. | |
| 2008/0297072 A1 | 12/2008 | Snijder et al. | |
| 2009/0226656 A1 | 9/2009 | Crandell et al. | |
| 2009/0237958 A1 | 9/2009 | Kim | |
| 2010/0008090 A1 | 1/2010 | Li et al. | |
| 2010/0053956 A1 | 3/2010 | Park et al. | |
| 2010/0135022 A1 | 6/2010 | Deguara | |
| 2010/0197148 A1 | 8/2010 | Rudisill et al. | |
| 2010/0259159 A1 | 10/2010 | Seaman | |
| 2010/0274447 A1 | 10/2010 | Stumpf | |
| 2011/0075382 A1 | 3/2011 | Mackey et al. | |
| 2011/0138663 A1 | 6/2011 | Chen | |
| 2011/0175533 A1 | 7/2011 | Holman et al. | |
| 2011/0193105 A1 | 8/2011 | Lerman et al. | |
| 2011/0285314 A1 | 11/2011 | Carney et al. | |
| 2011/0315956 A1 | 12/2011 | Tischler et al. | |
| 2012/0075871 A1 | 3/2012 | Chen | |
| 2012/0092875 A1 | 4/2012 | Cho et al. | |
| 2012/0104976 A1 | 5/2012 | Snijder et al. | |
| 2012/0217882 A1 | 8/2012 | Wong et al. | |
| 2012/0224373 A1 | 9/2012 | Snijder et al. | |
| 2012/0243227 A1 | 9/2012 | Shimizu et al. | |
| 2012/0257384 A1 | 10/2012 | Pickard et al. | |
| 2012/0293086 A1 | 11/2012 | Ishikita et al. | |
| 2012/0319582 A1 | 12/2012 | Shan | |
| 2012/0326634 A1 | 12/2012 | Li | |
| 2013/0099666 A1 | 4/2013 | Stuffle | |
| 2013/0148357 A1 | 6/2013 | Johnston et al. | |
| 2013/0175943 A1 | 7/2013 | Tackett | |
| 2013/0301249 A1 | 11/2013 | Ngai et al. | |
| 2013/0322082 A1 | 12/2013 | Hollander | |
| 2014/0226316 A1 | 8/2014 | Medendorp, Jr. et al. | |
| 2014/0226329 A1 | 8/2014 | Oraw et al. | |
| 2014/0265809 A1 | 9/2014 | Hussell | |
| 2014/0334142 A1 | 11/2014 | Levante et al. | |
| 2015/0109765 A1 | 4/2015 | Sepkhanov et al. | |
| 2015/0138776 A1 | 5/2015 | Lay | |
| 2015/0226415 A1 | 8/2015 | Tanaka et al. | |
| 2015/0308671 A1 | 10/2015 | Tischler et al. | |
| 2015/0312975 A1 | 10/2015 | Tischler et al. | |
| 2016/0018092 A1 | 1/2016 | Knaapen et al. | |
| 2016/0178145 A1 | 6/2016 | Oleske et al. | |
| 2016/0305621 A1 | 10/2016 | Tischler et al. | |
| 2016/0363276 A1 | 12/2016 | Palfreyman et al. | |
| 2016/0366731 A1 | 12/2016 | Palfreyman et al. | |
| 2017/0074474 A1 | 3/2017 | Bailey | |
| 2018/0142849 A1 | 5/2018 | Nicolai et al. | |
| 2019/0017260 A1 * | 1/2019 | Bou Harb | E04B 9/001 |
| 2020/0149714 A1 | 5/2020 | Tischler et al. | |
| 2020/0149719 A1 * | 5/2020 | Matsuda | F21V 23/001 |
| 2021/0190278 A1 * | 6/2021 | Bartella | E04B 9/225 |
| 2021/0248988 A1 * | 8/2021 | Simla | F21S 8/061 |
| 2021/0270450 A1 * | 9/2021 | Yaphe | E04B 9/006 |

* cited by examiner

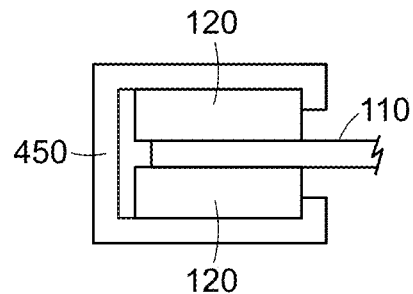
FIG. 4D
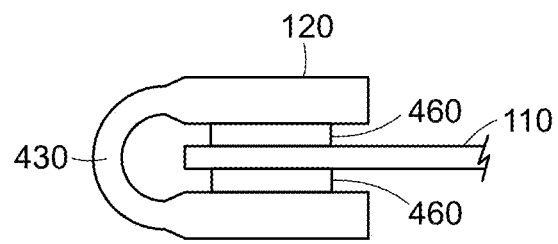
FIG. 4E
FIG. 5A
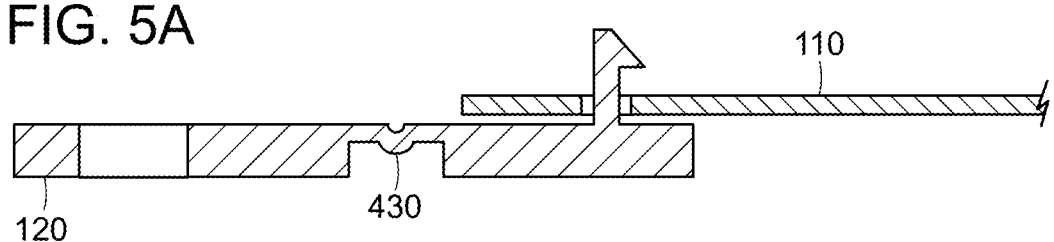
FIG. 5B
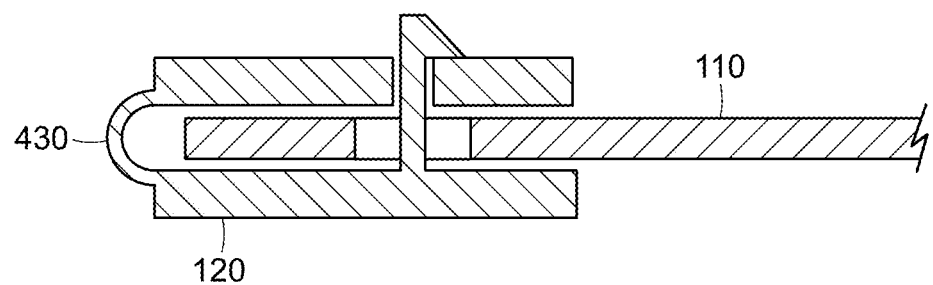

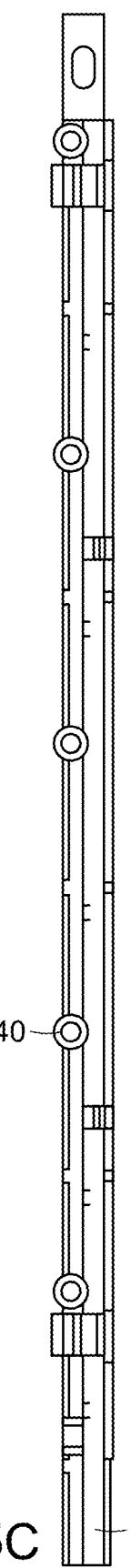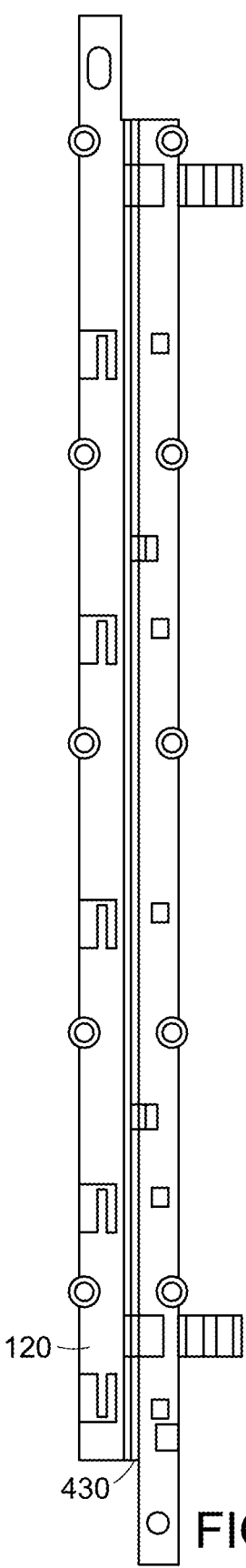
FIG. 5C
FIG. 5D

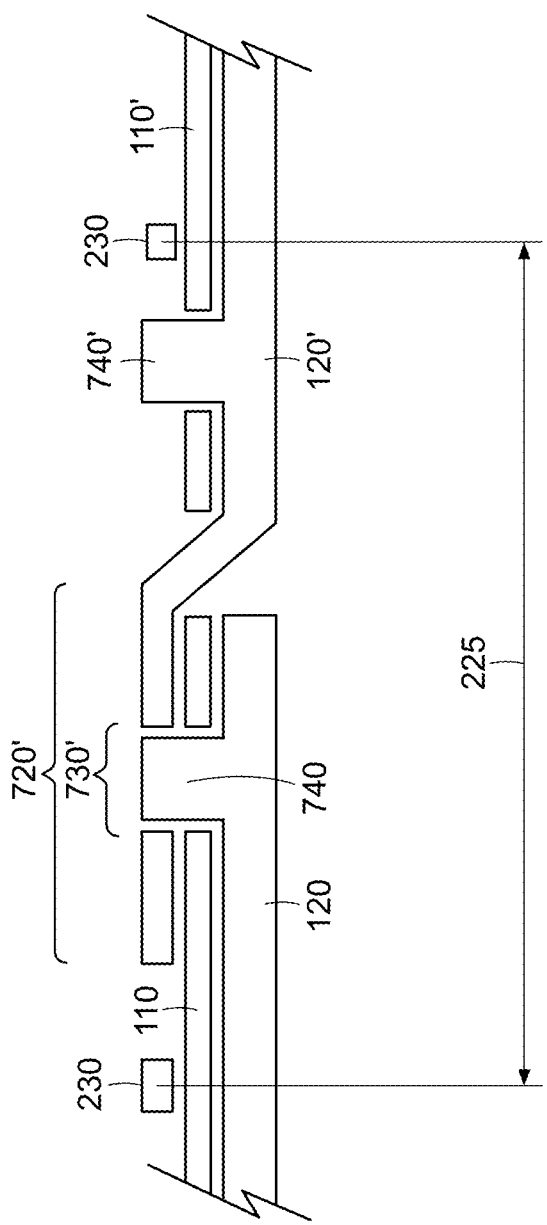
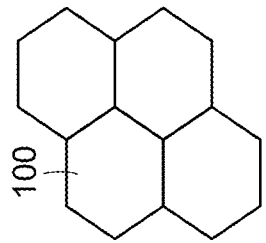
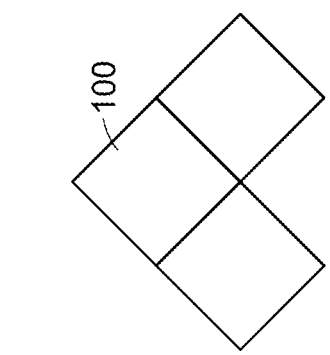
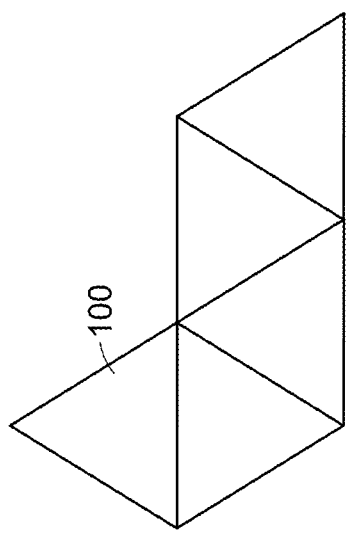

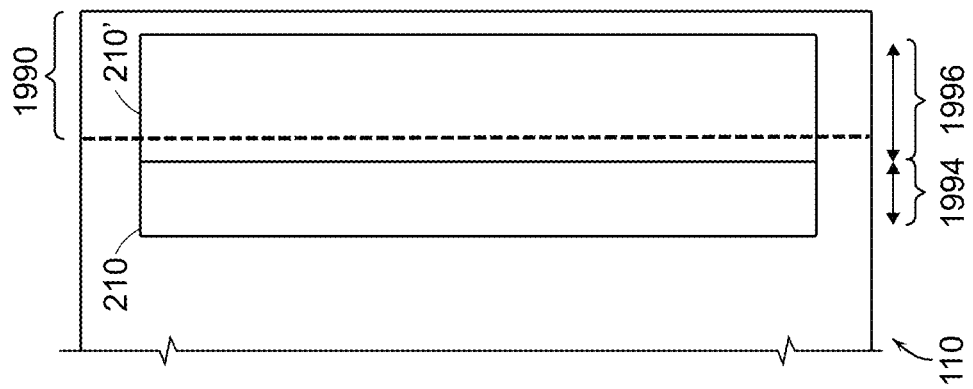
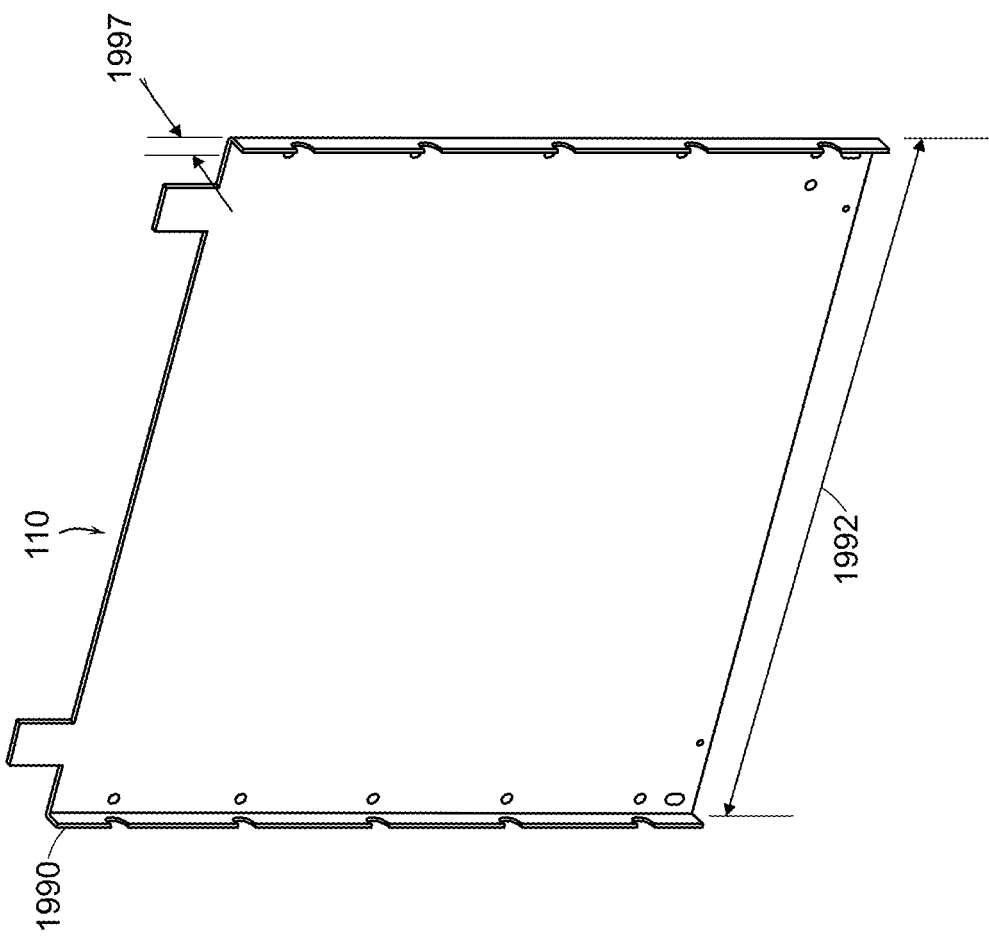

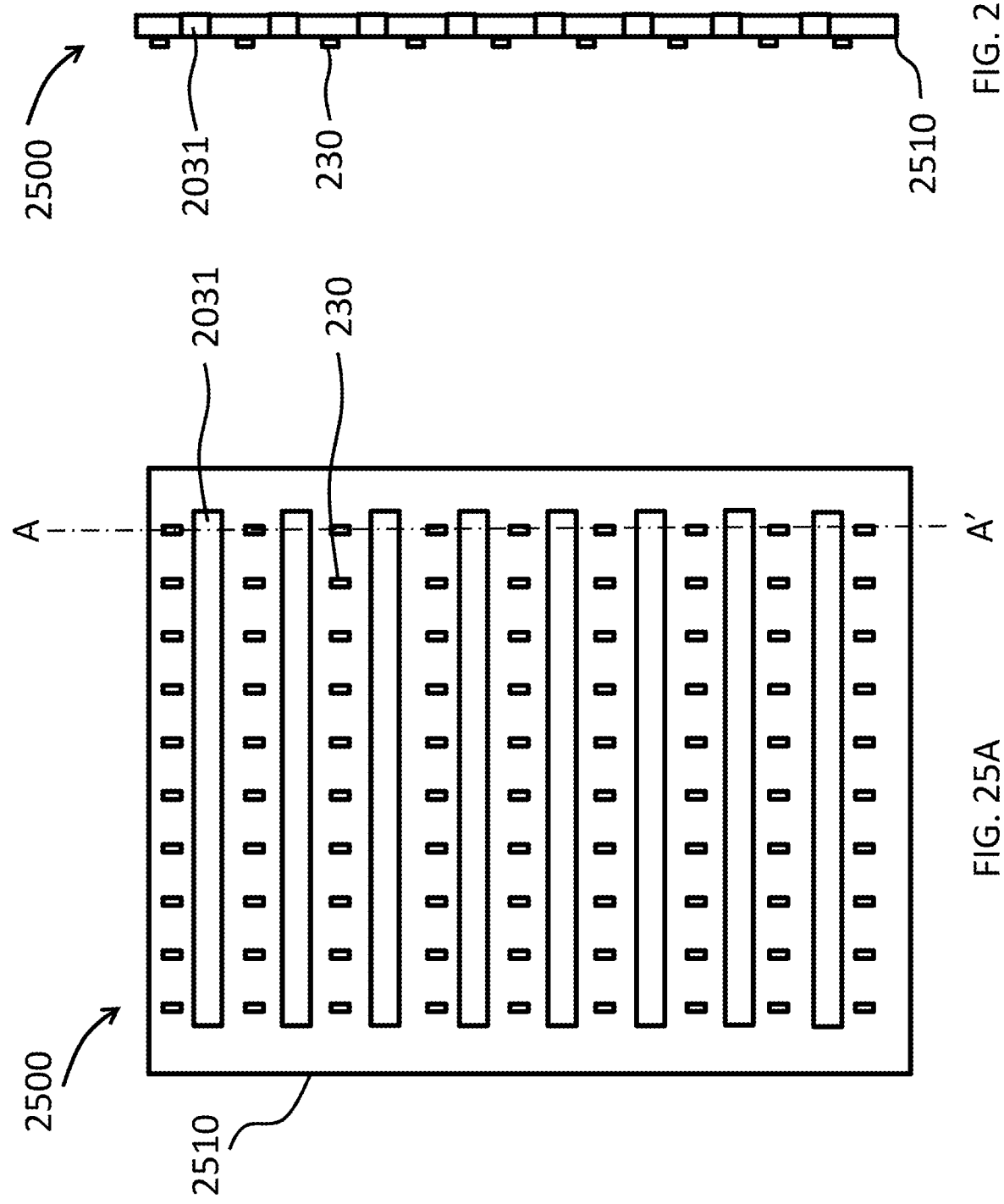

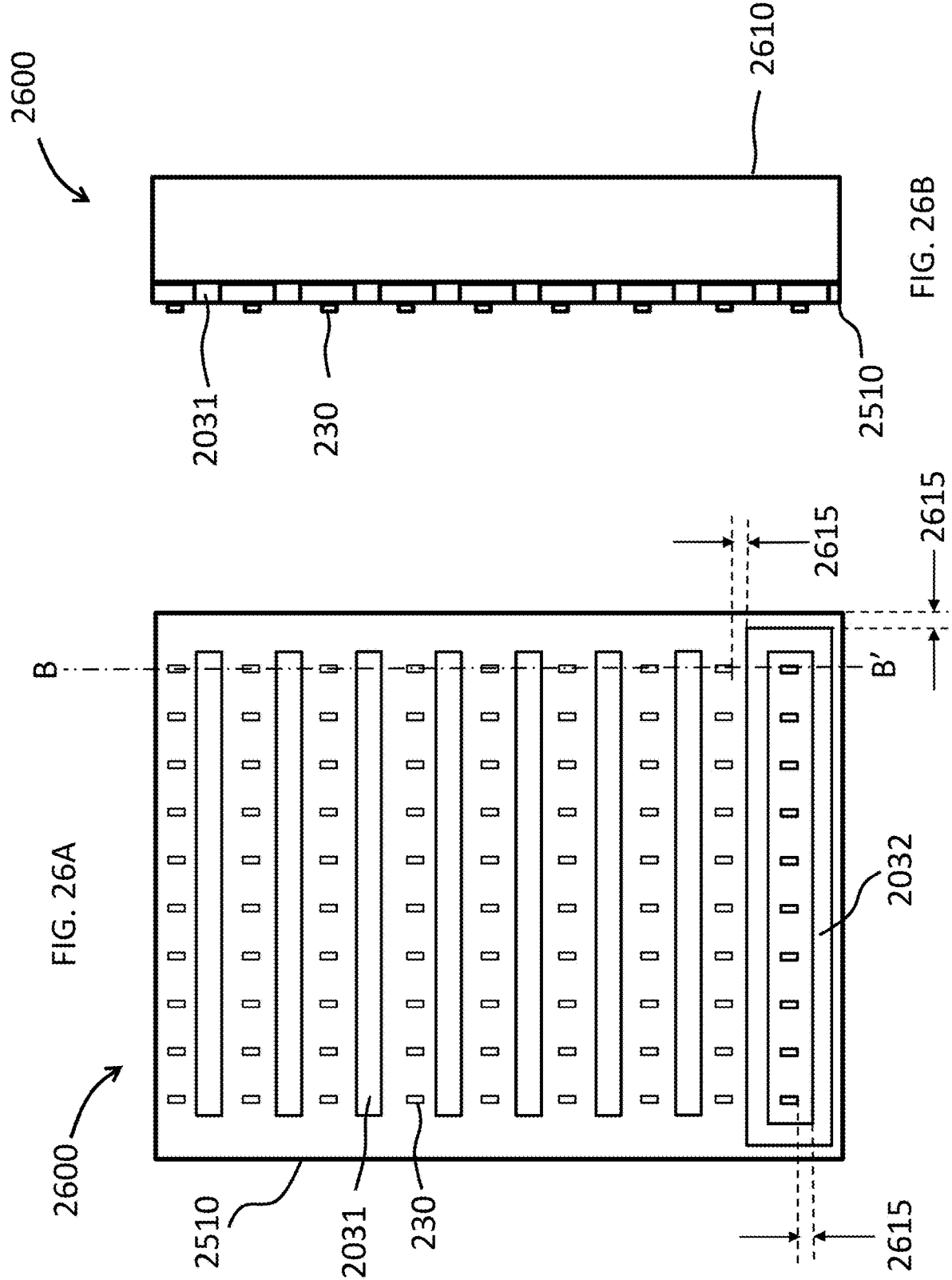

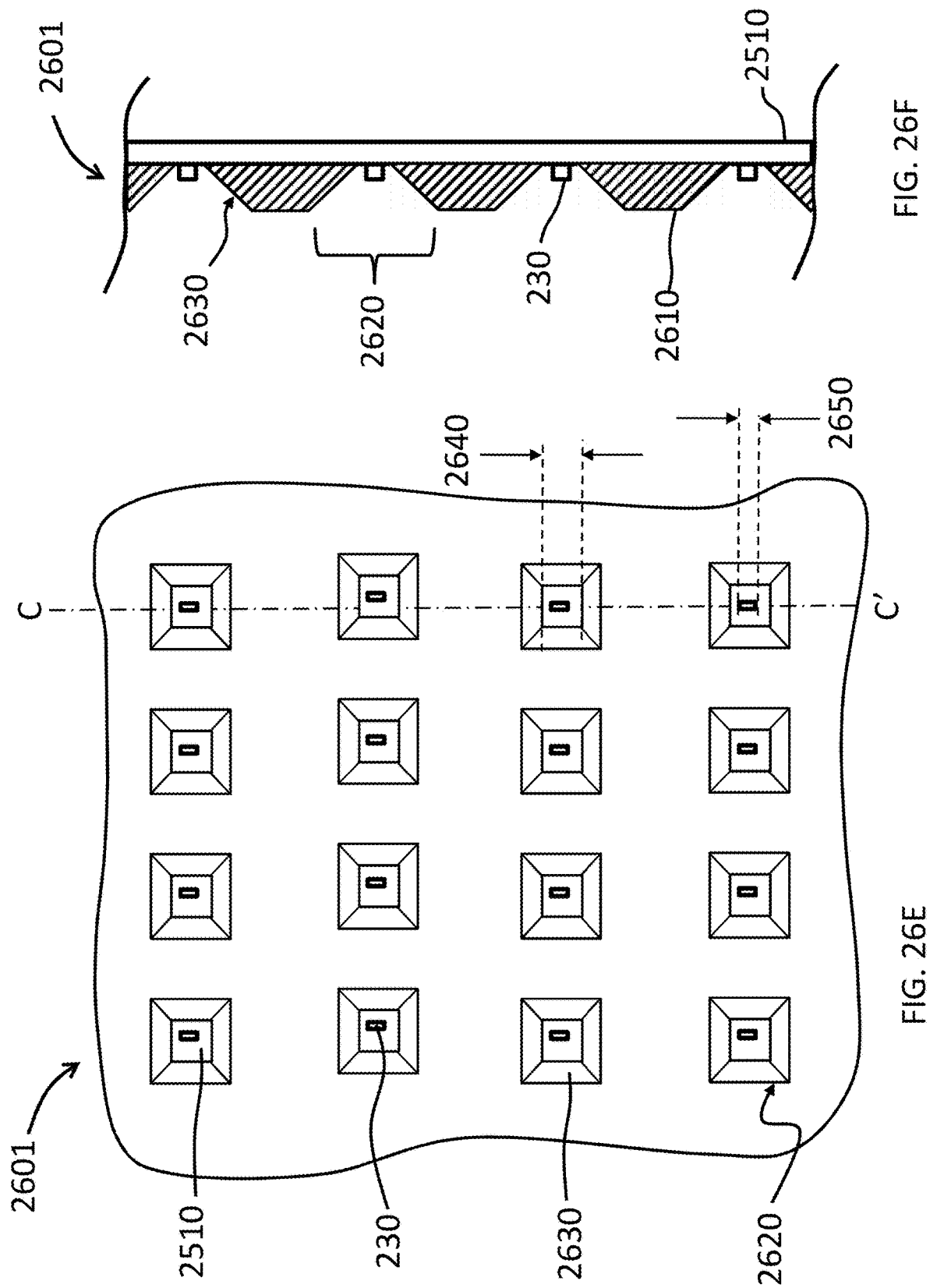

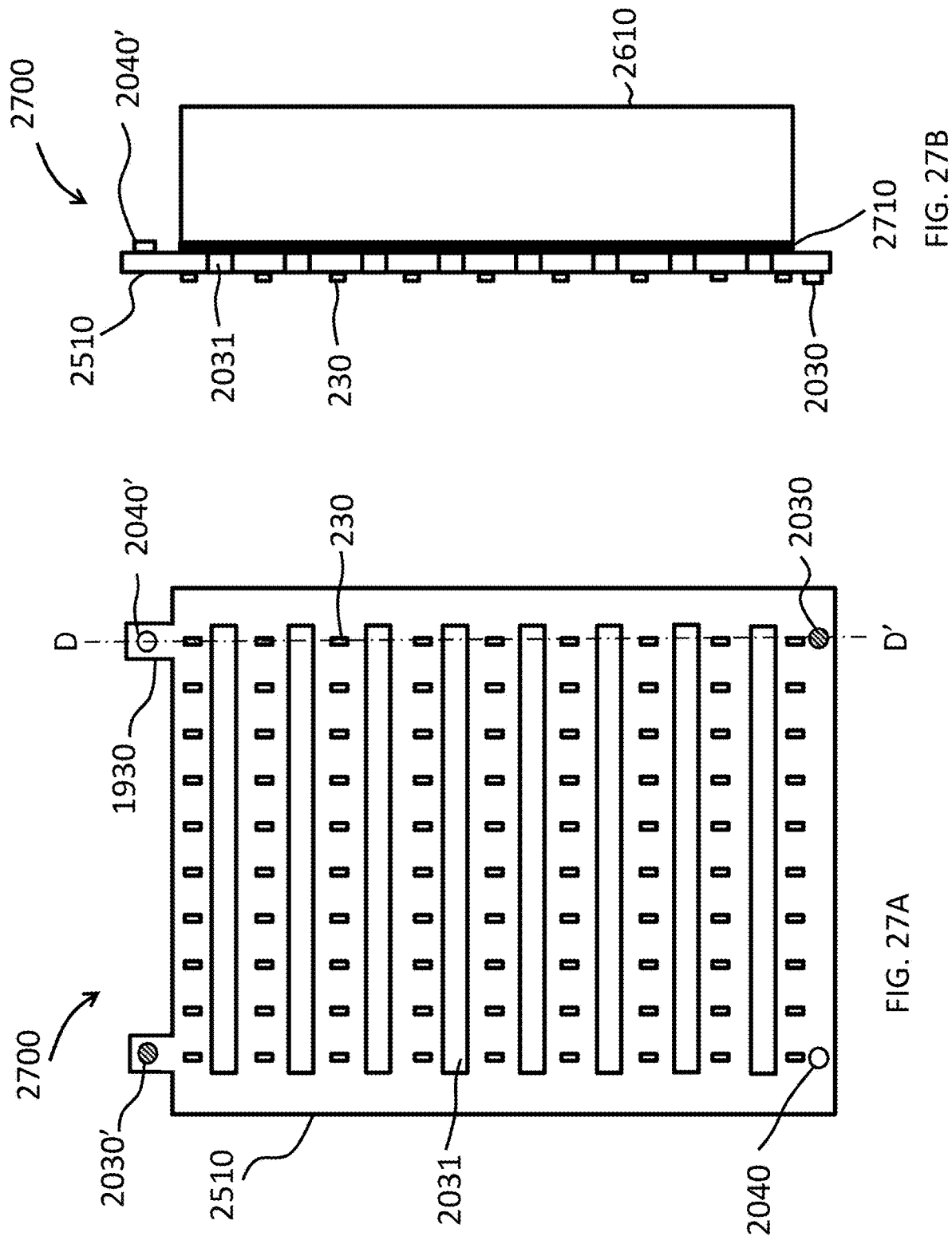

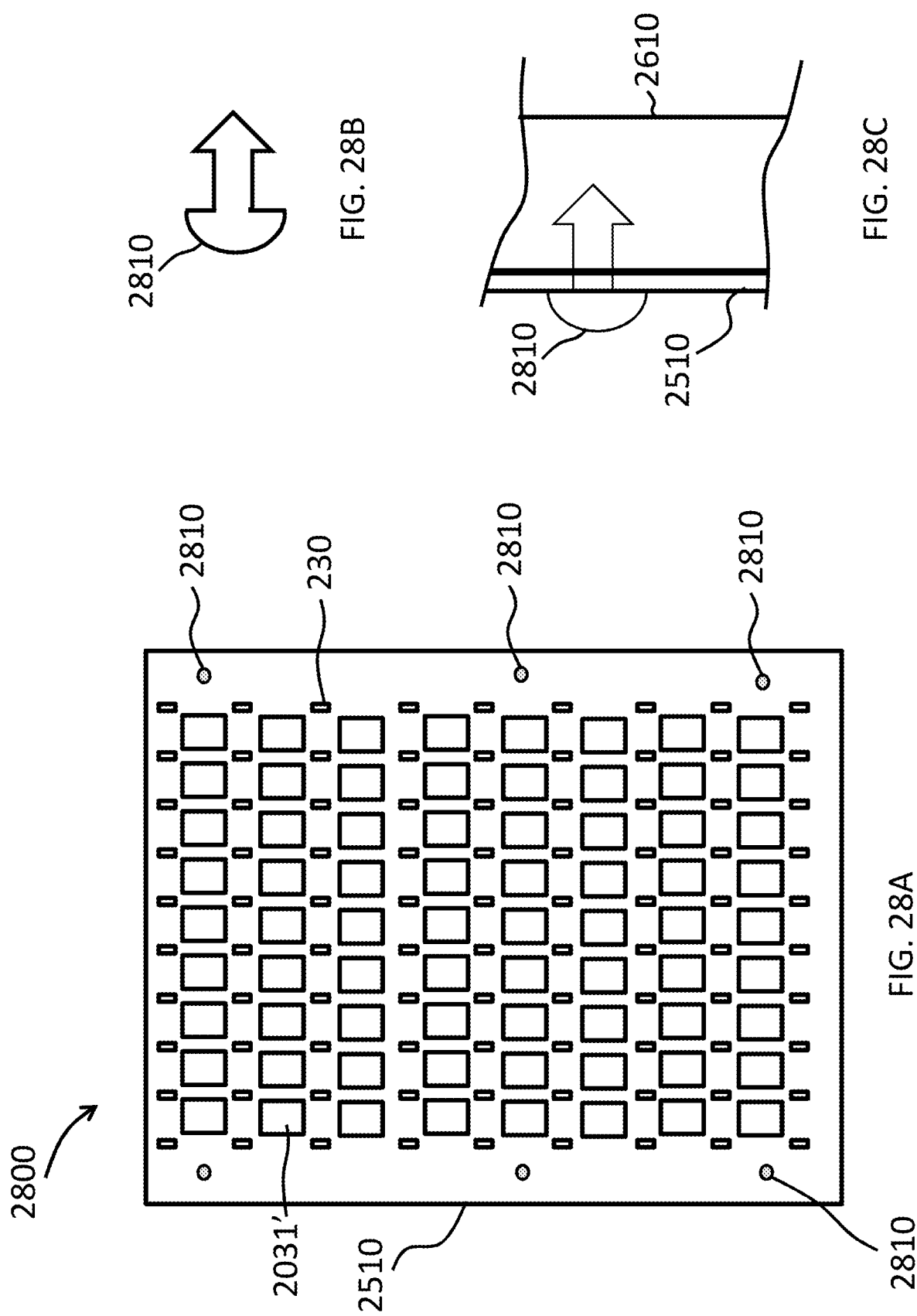

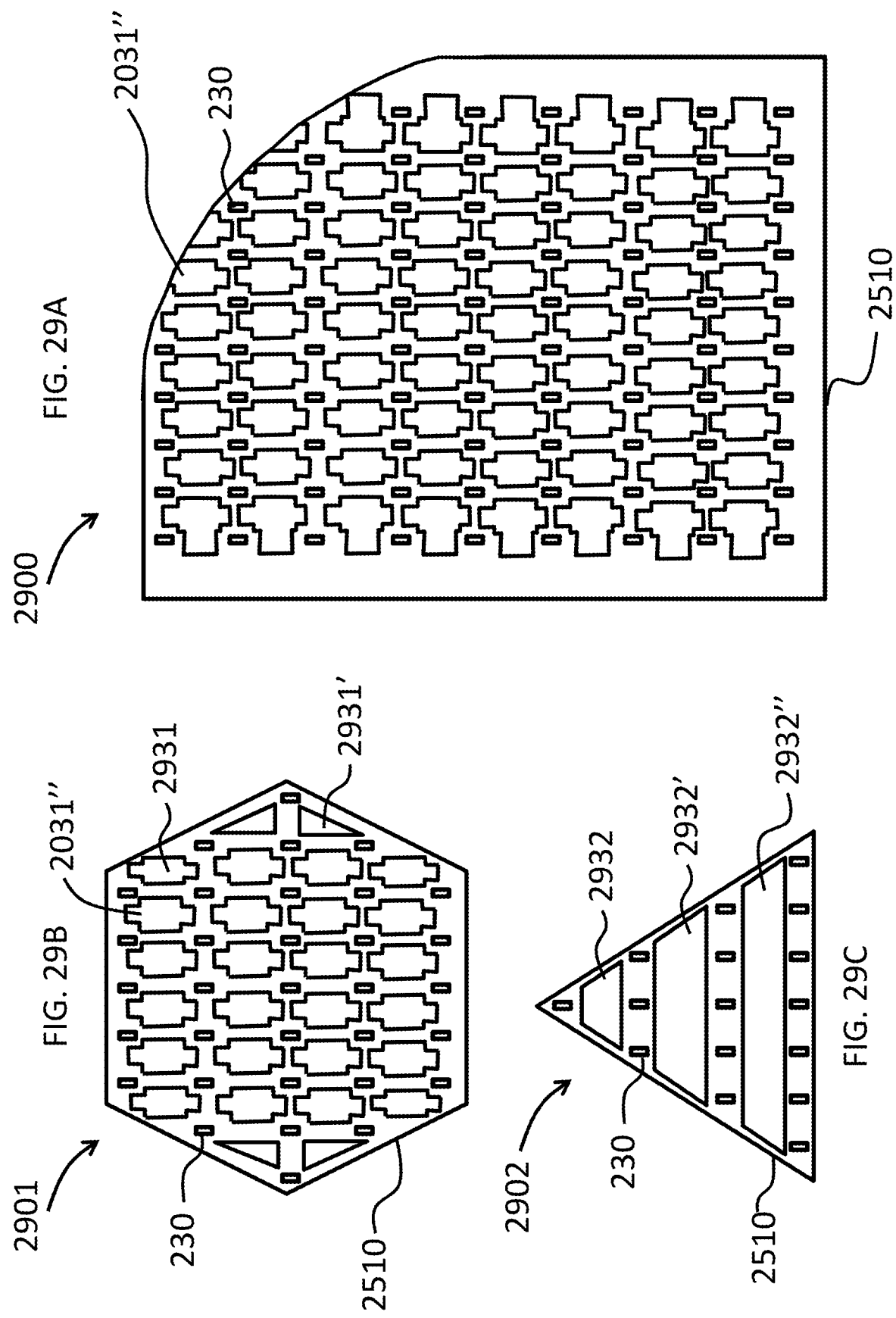

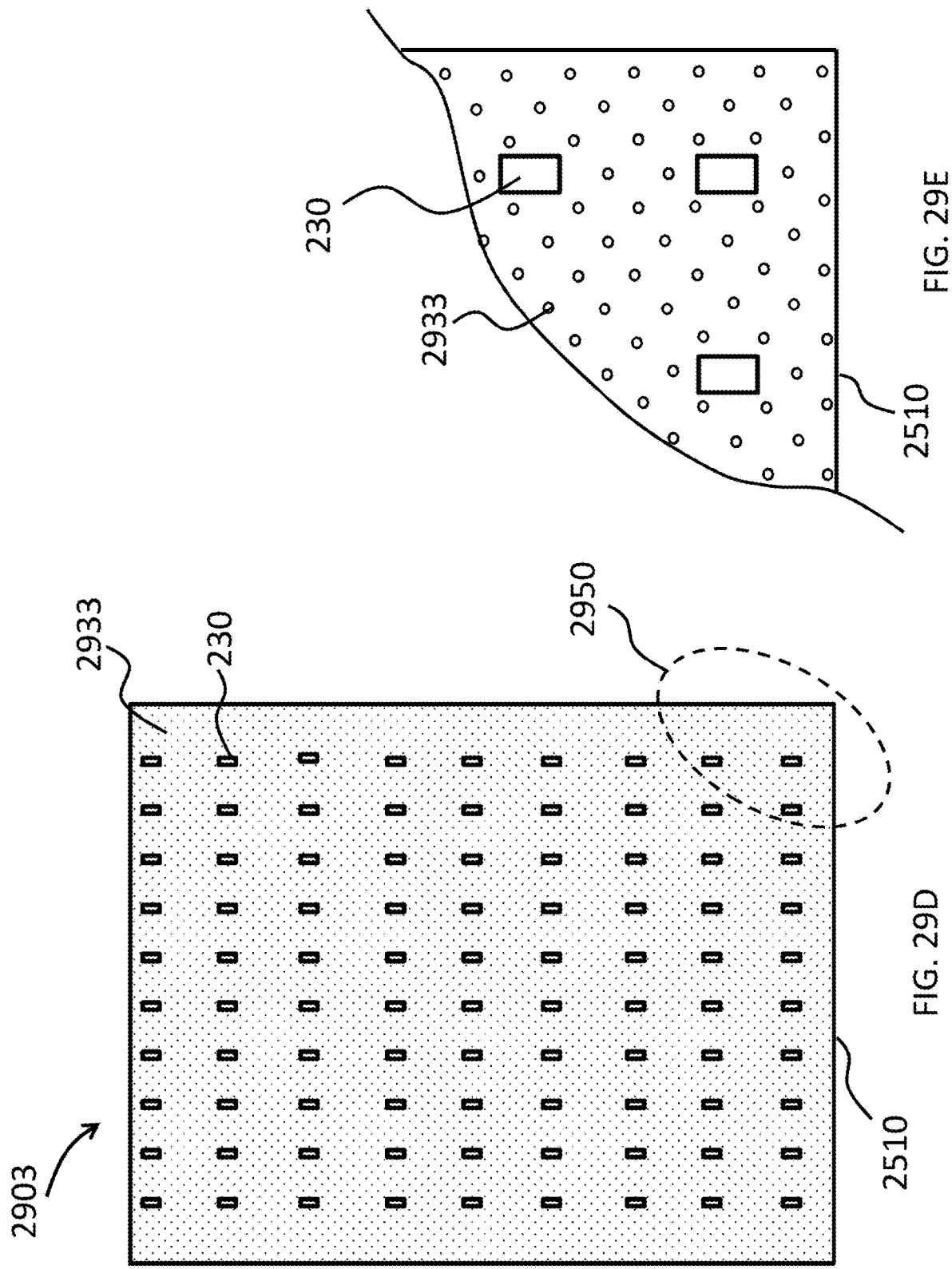

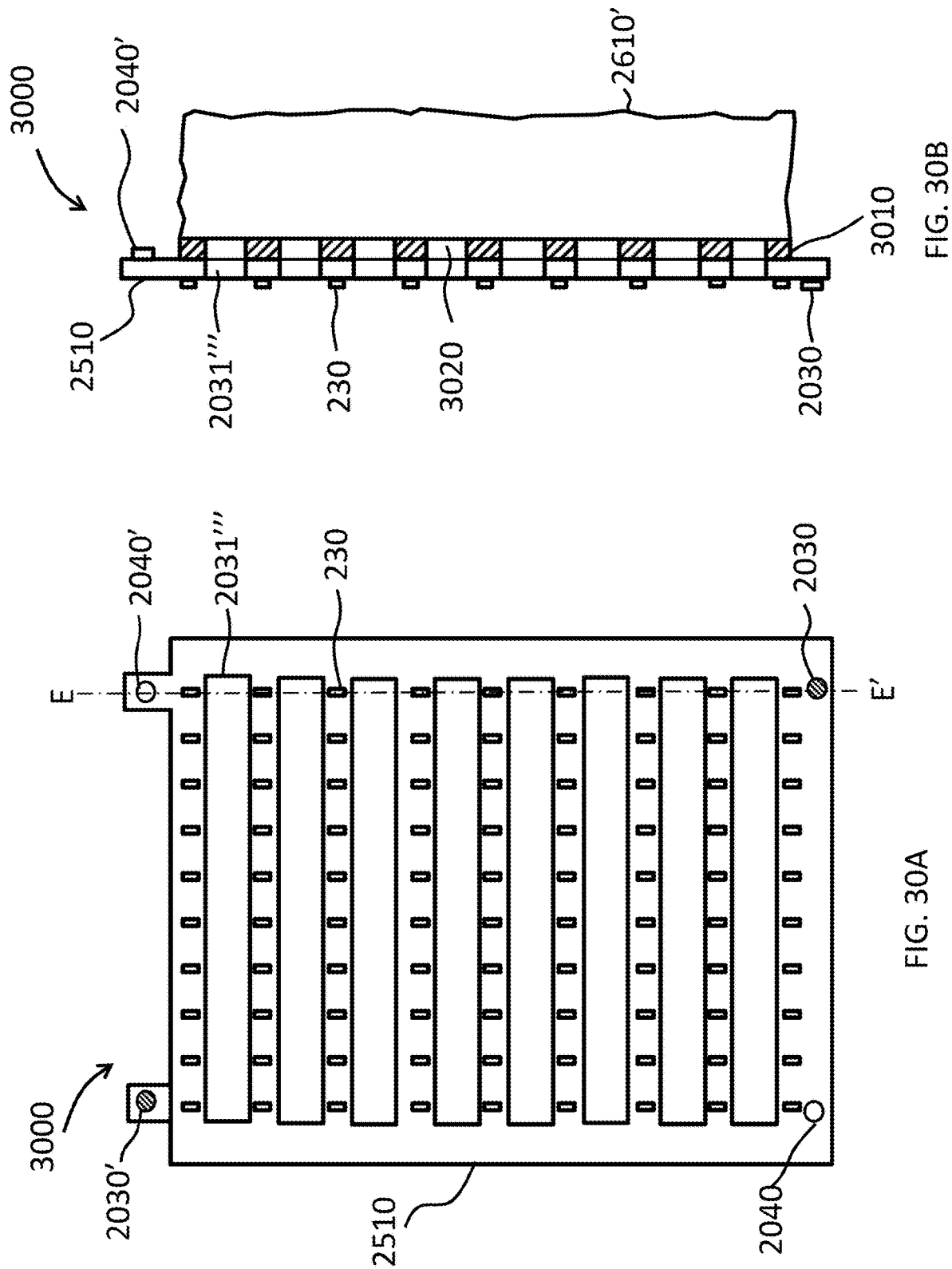

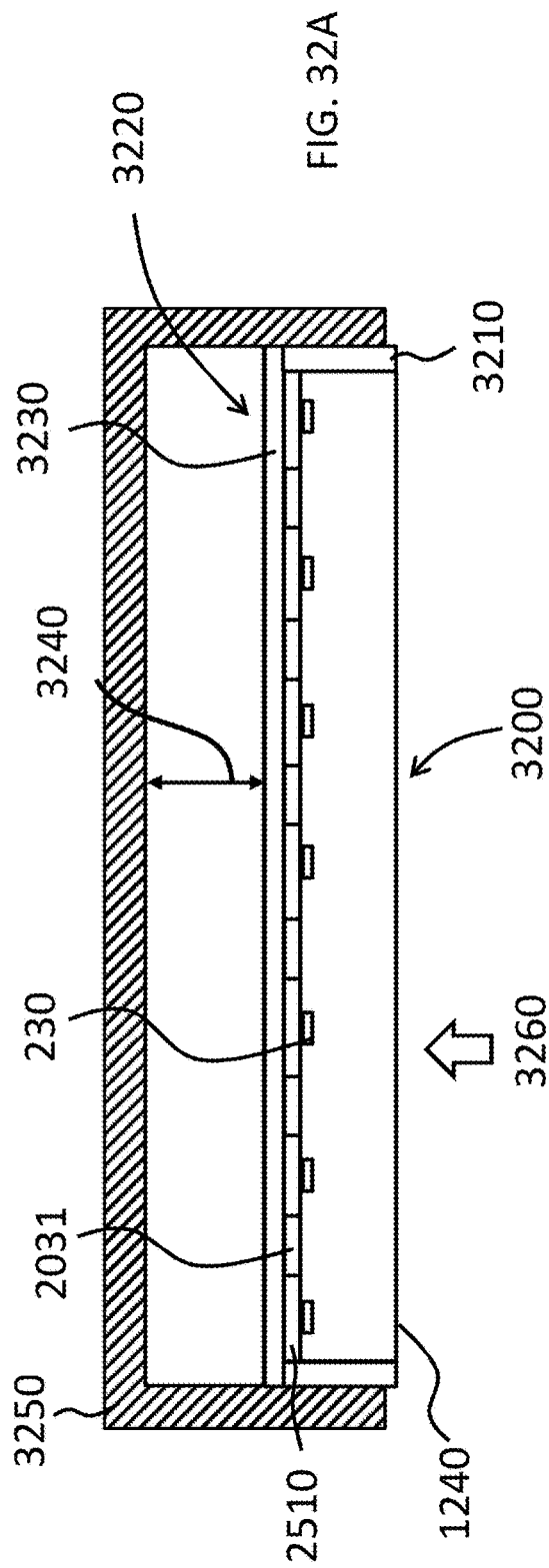
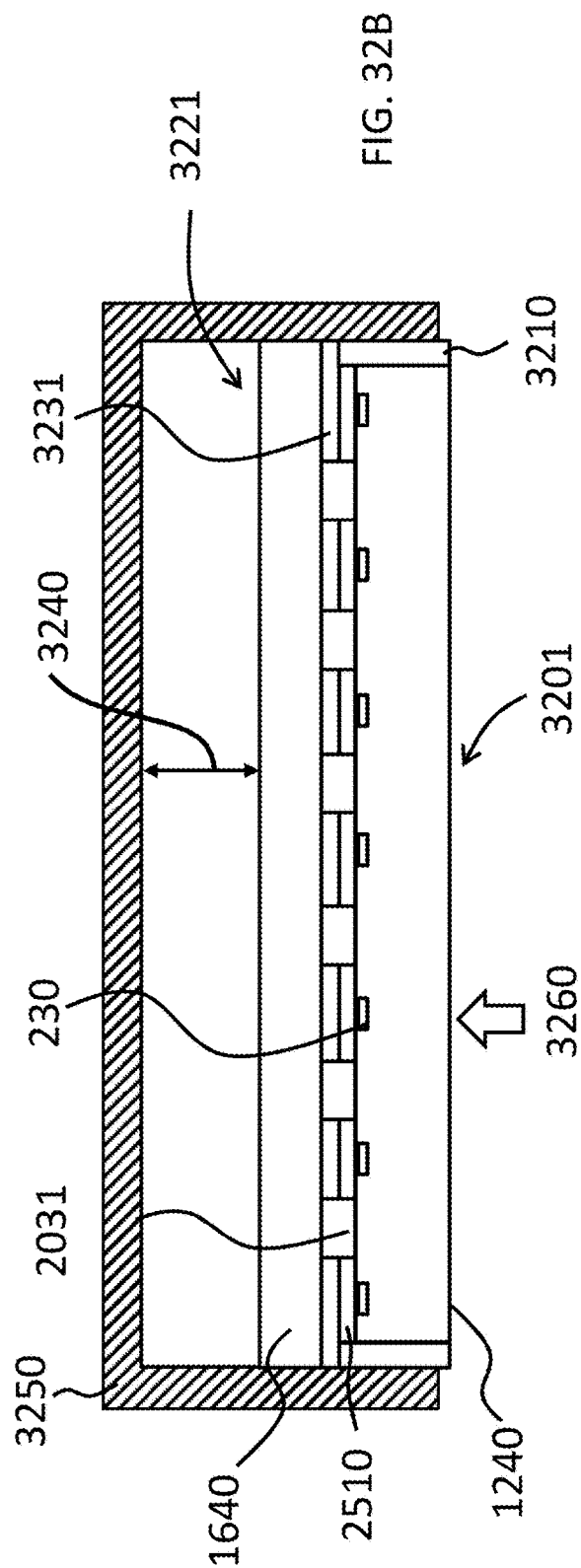

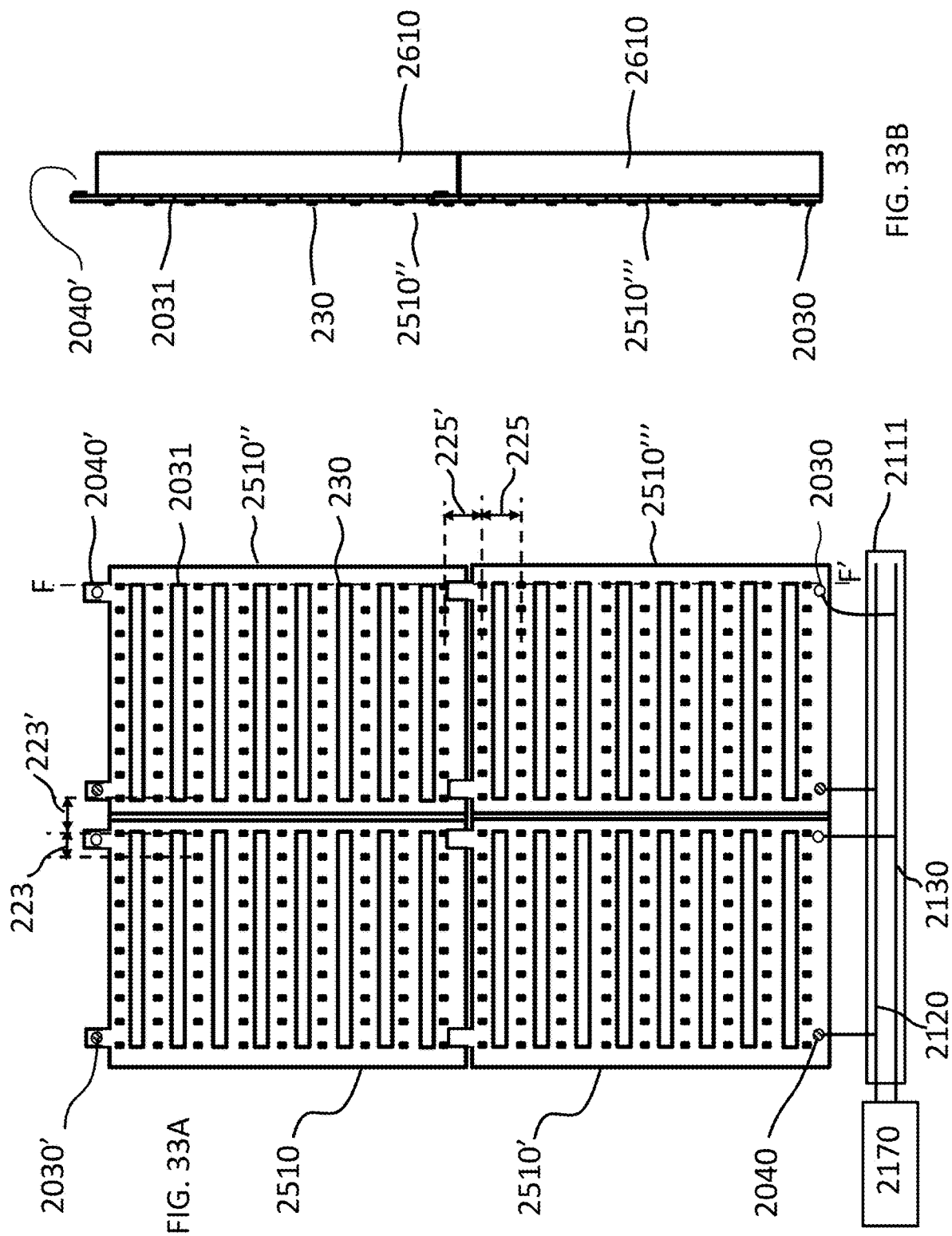

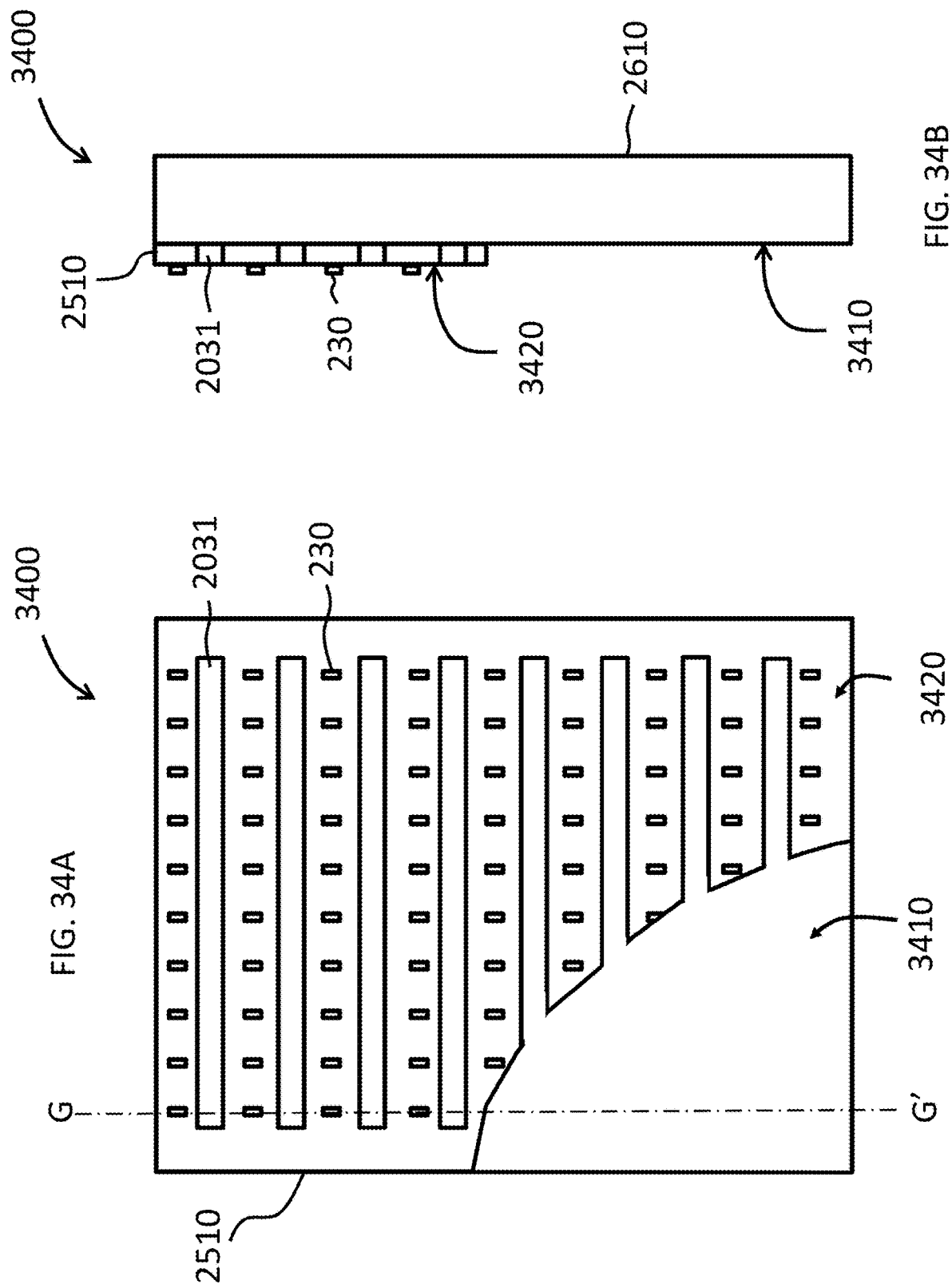

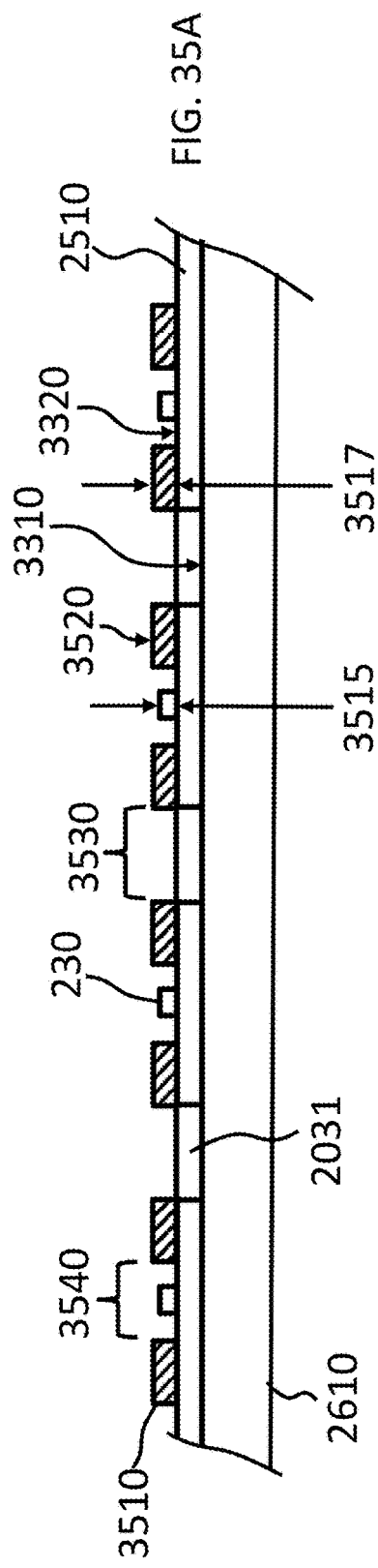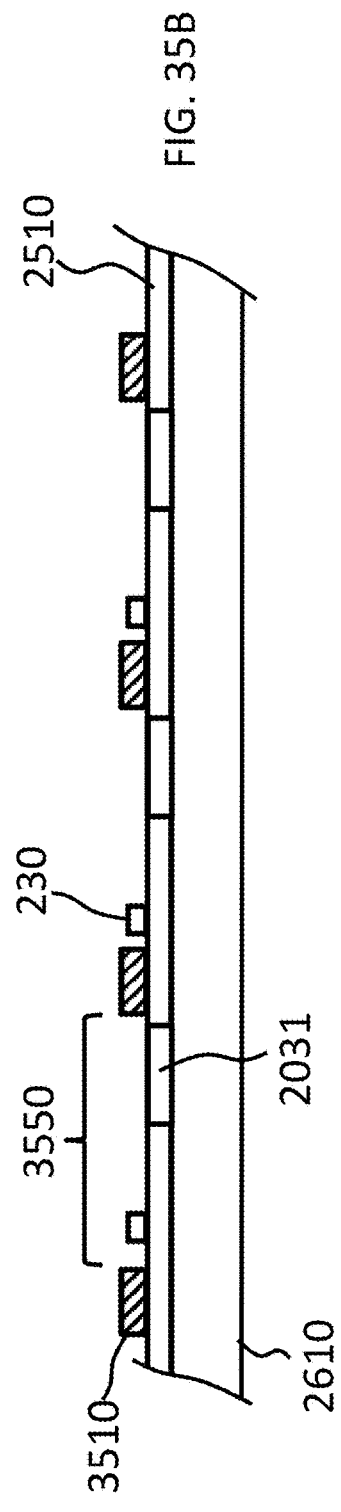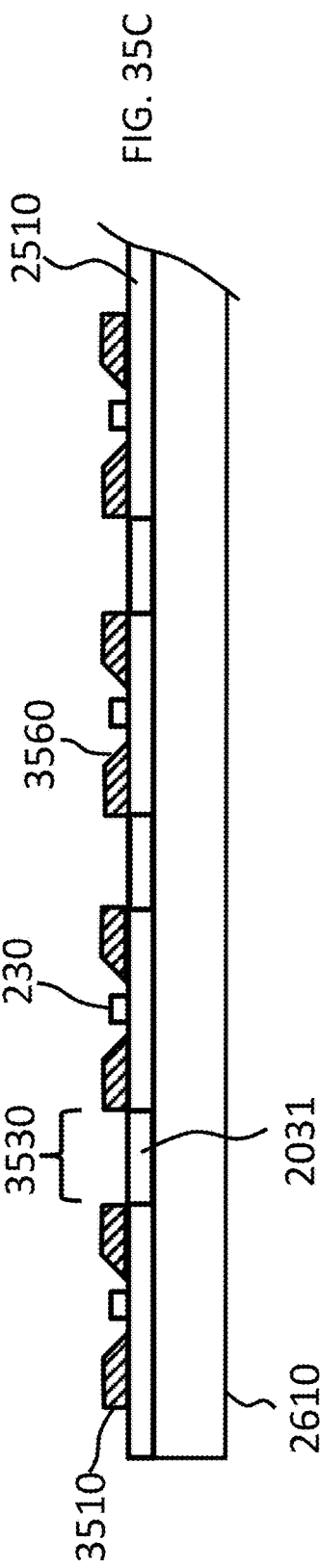

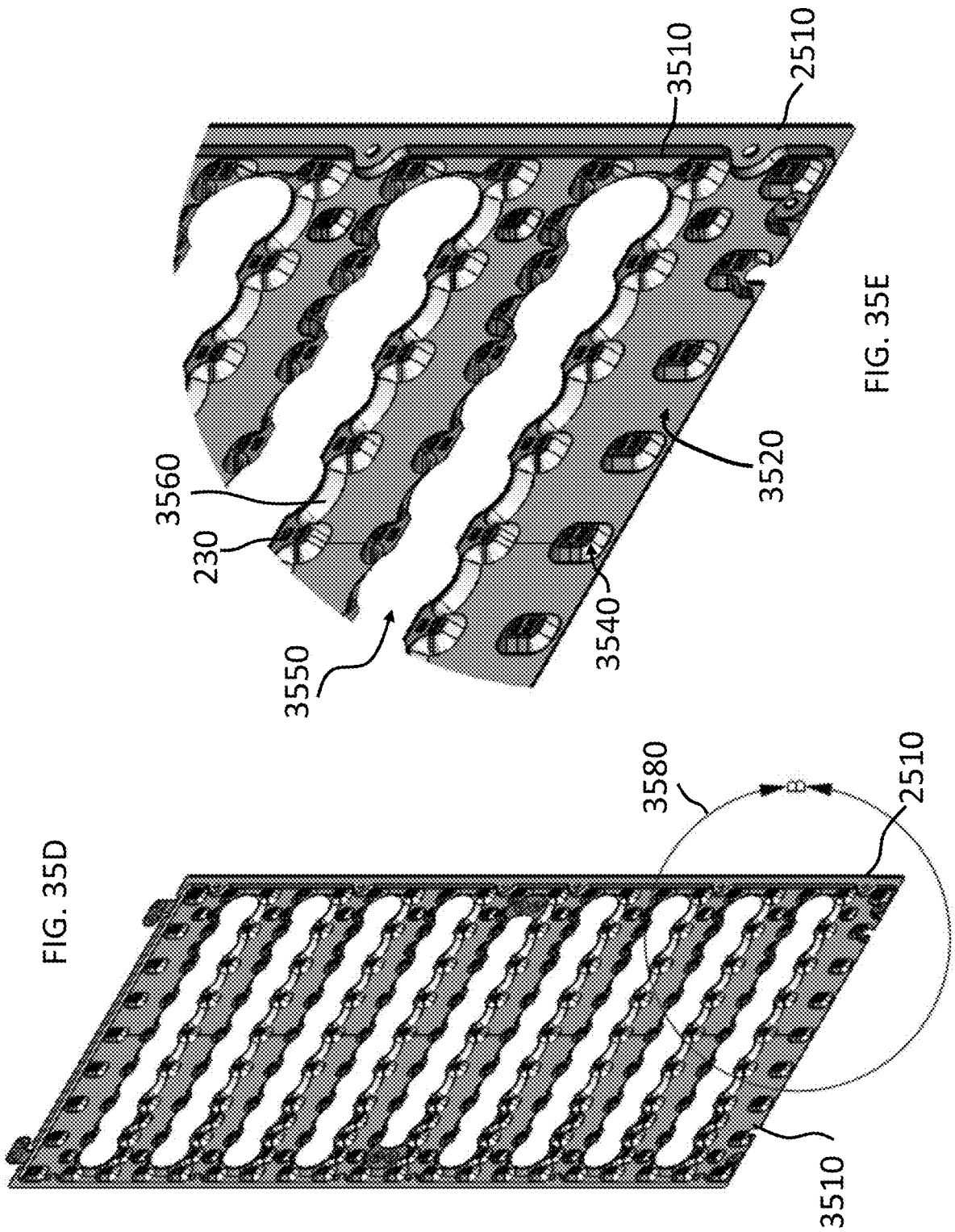

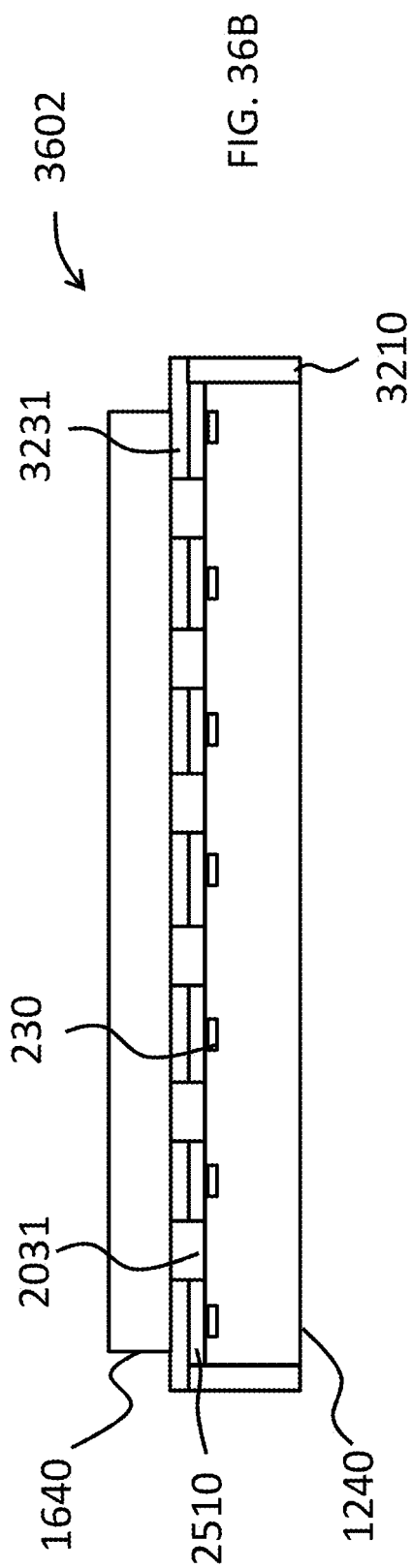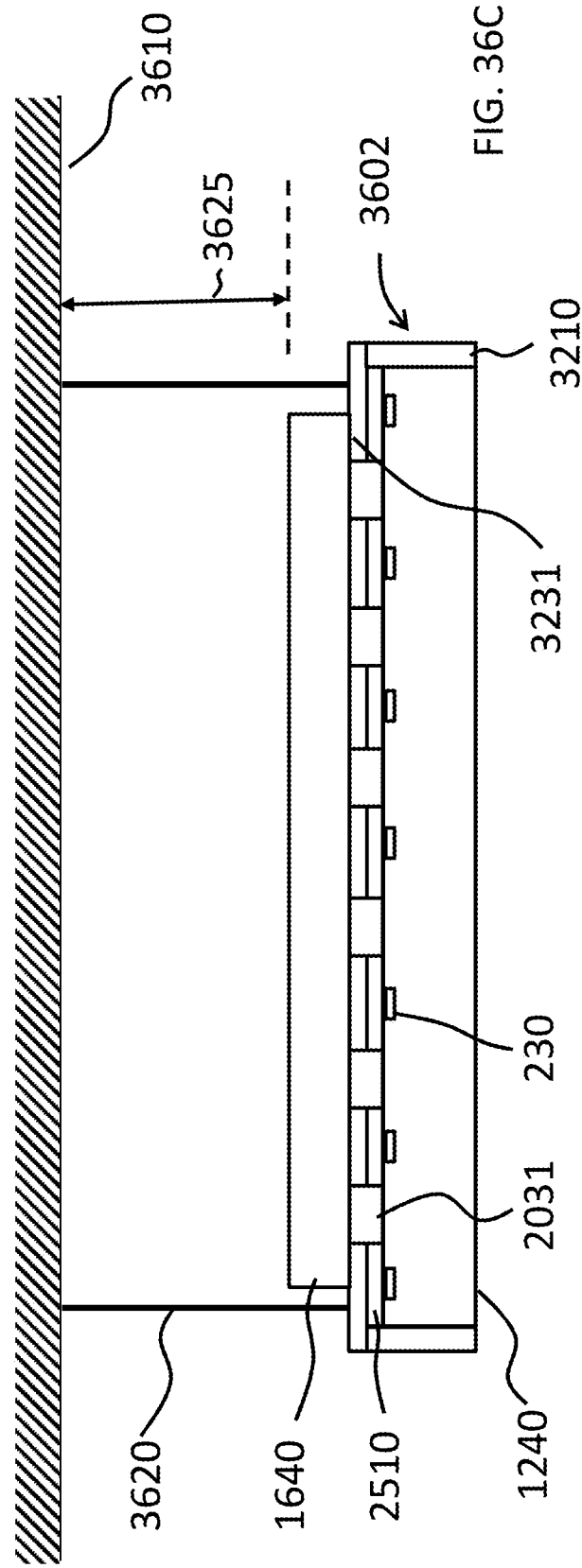

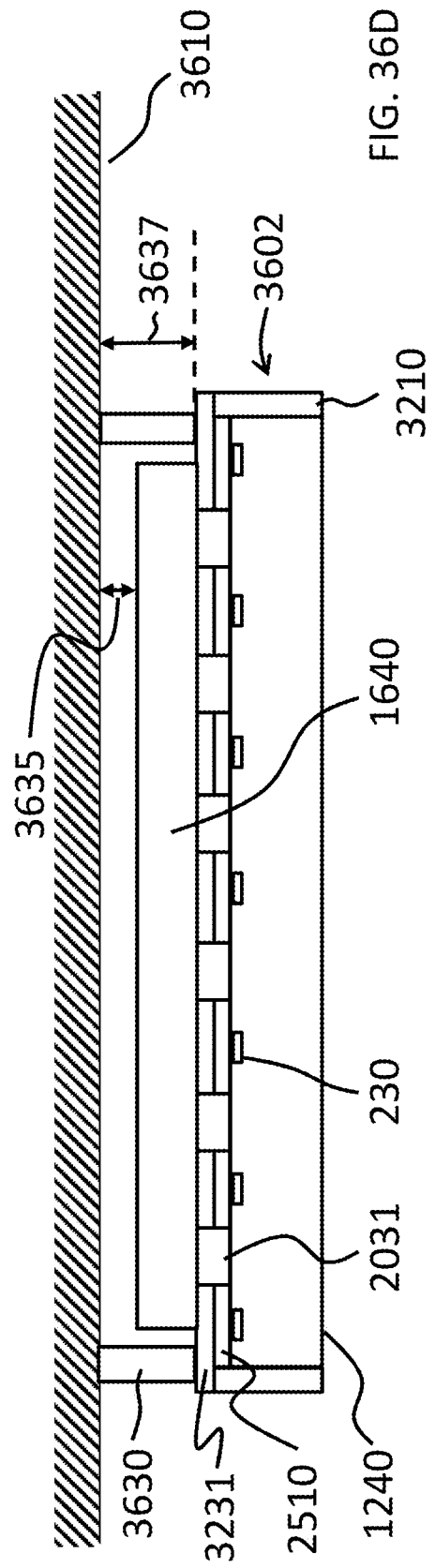

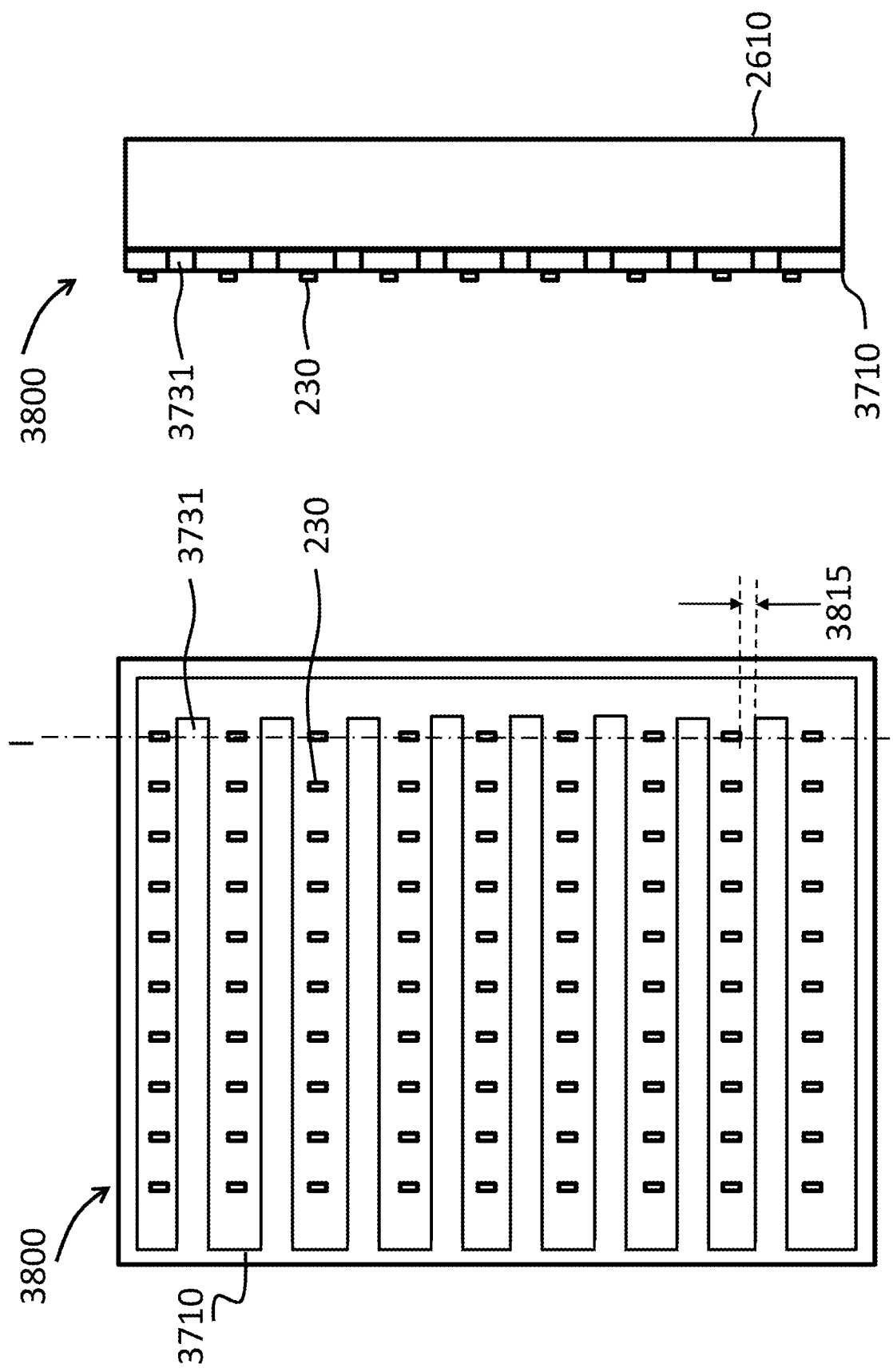

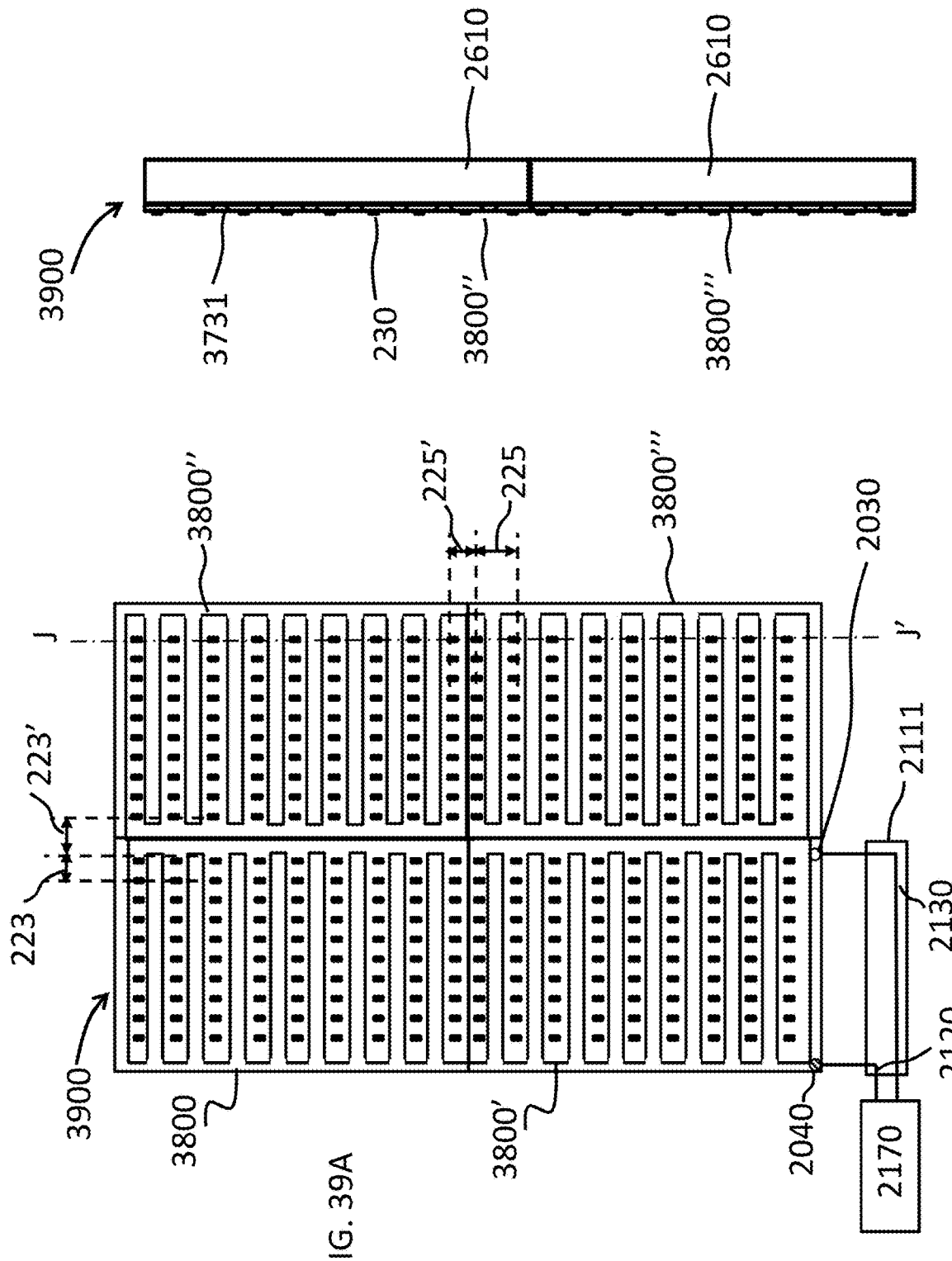

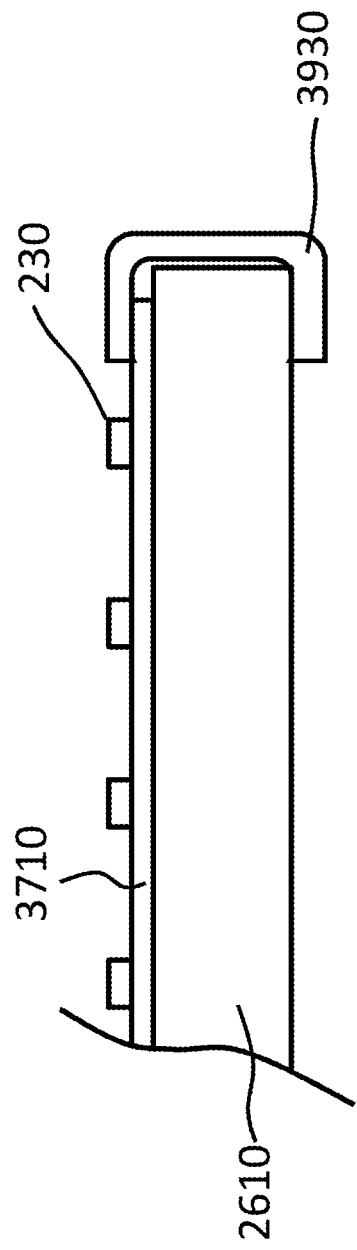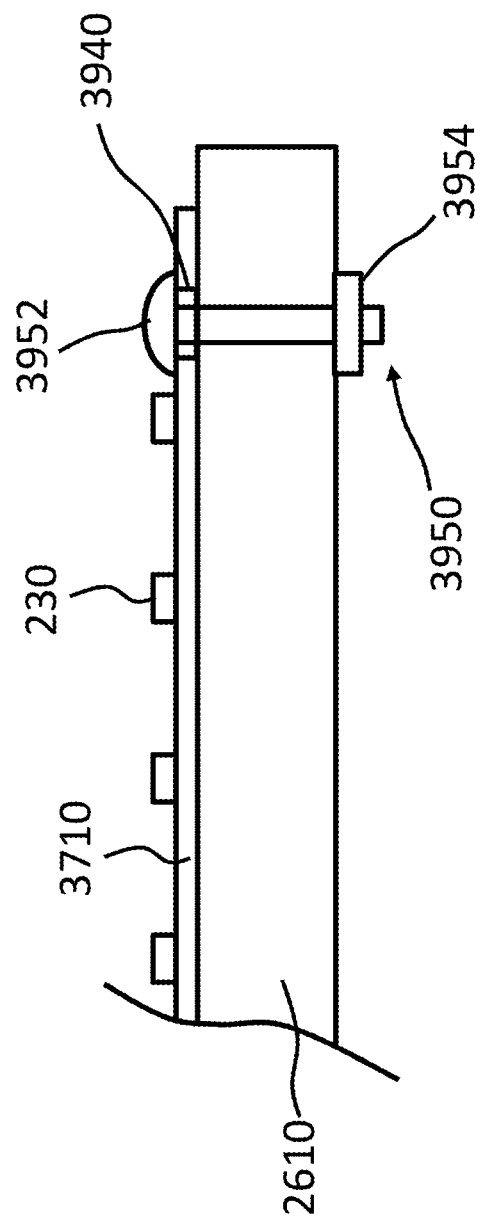
FIG. 39F
FIG. 39G

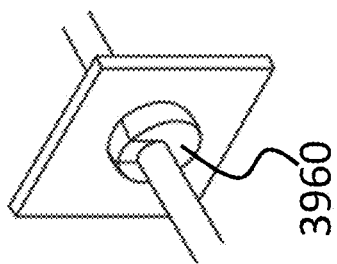
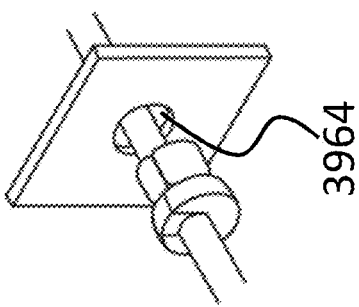
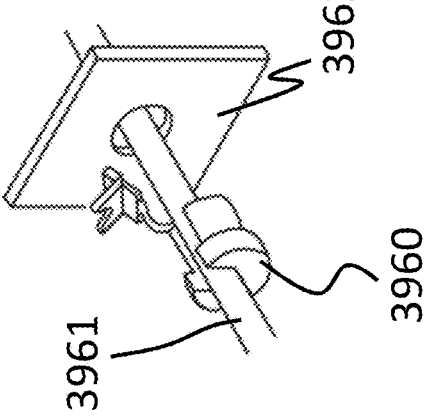
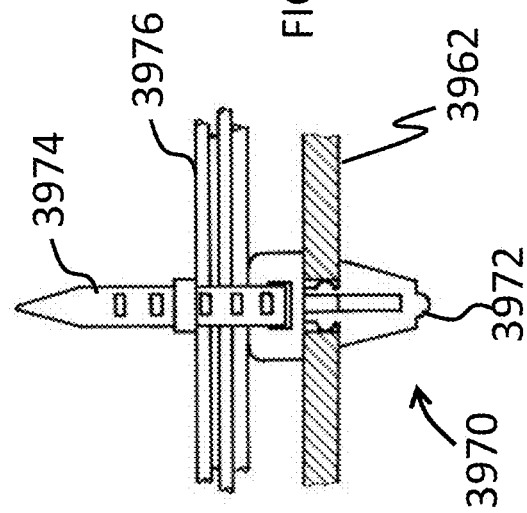
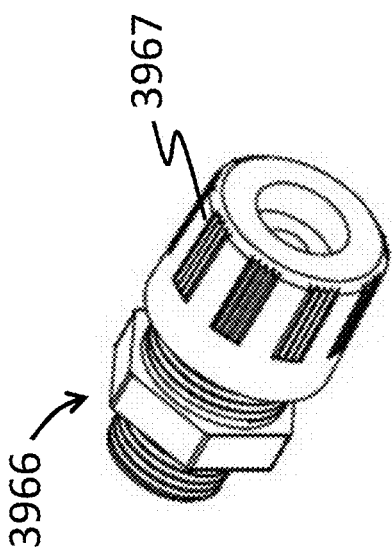

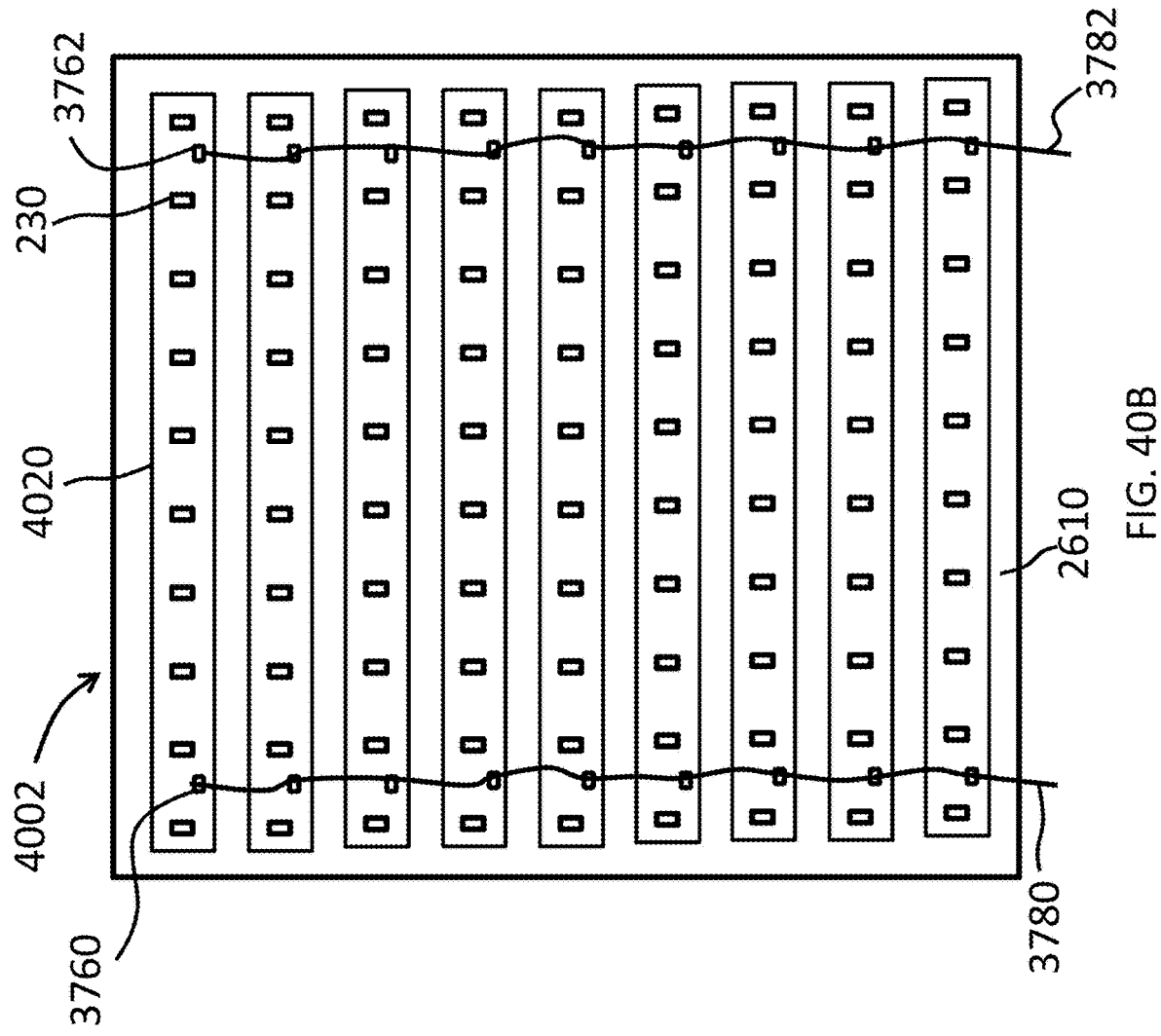
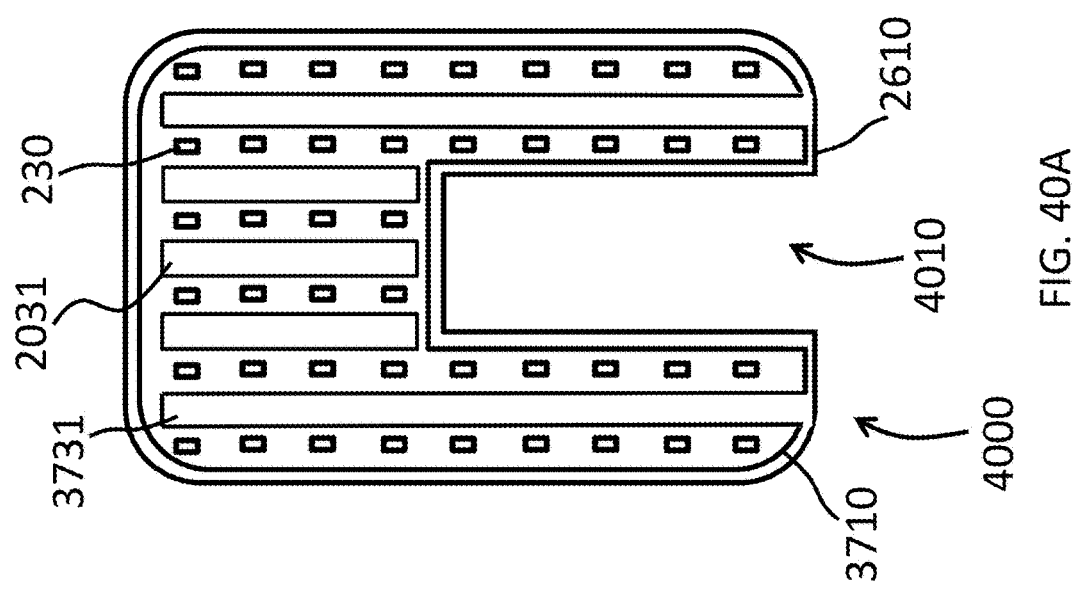

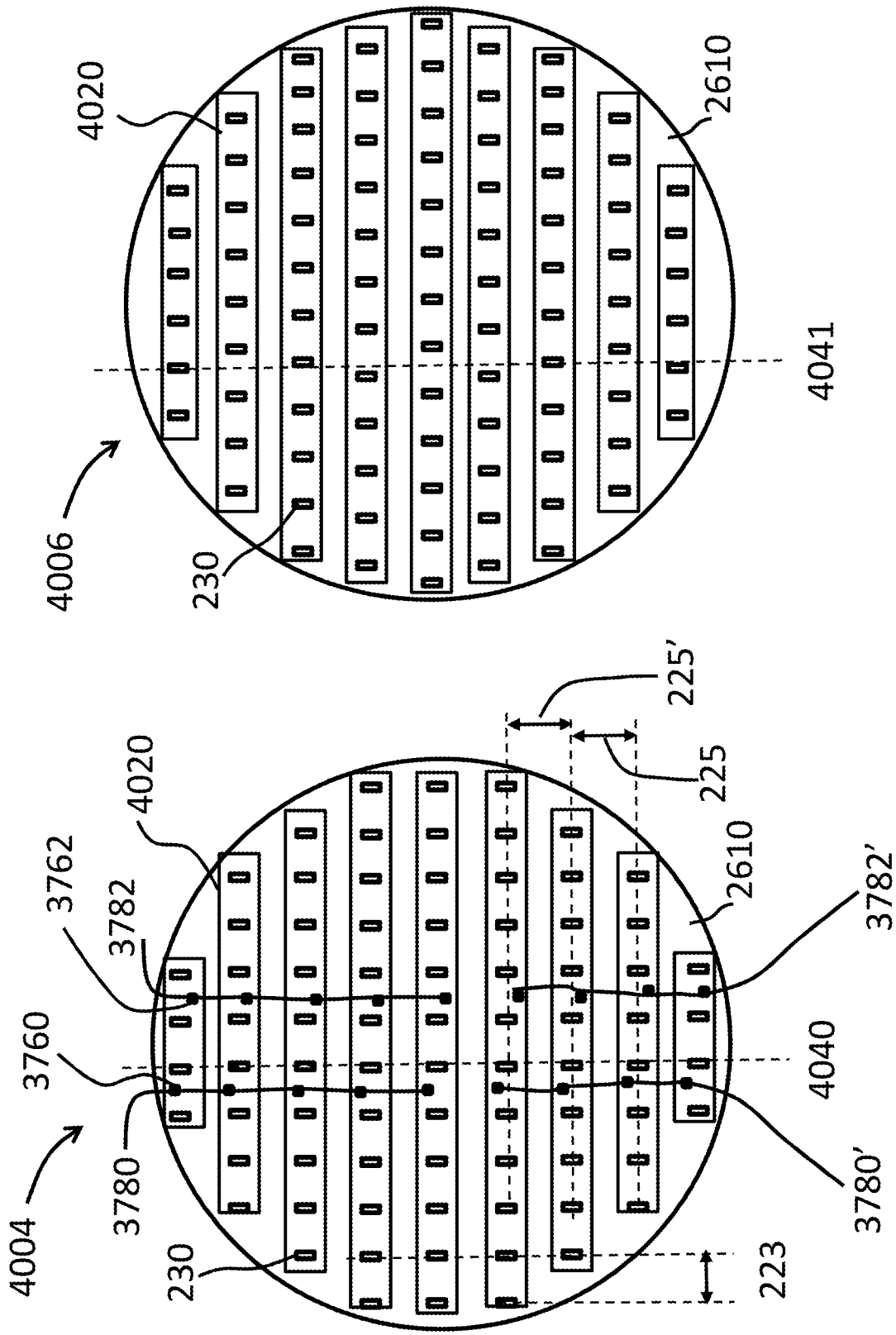

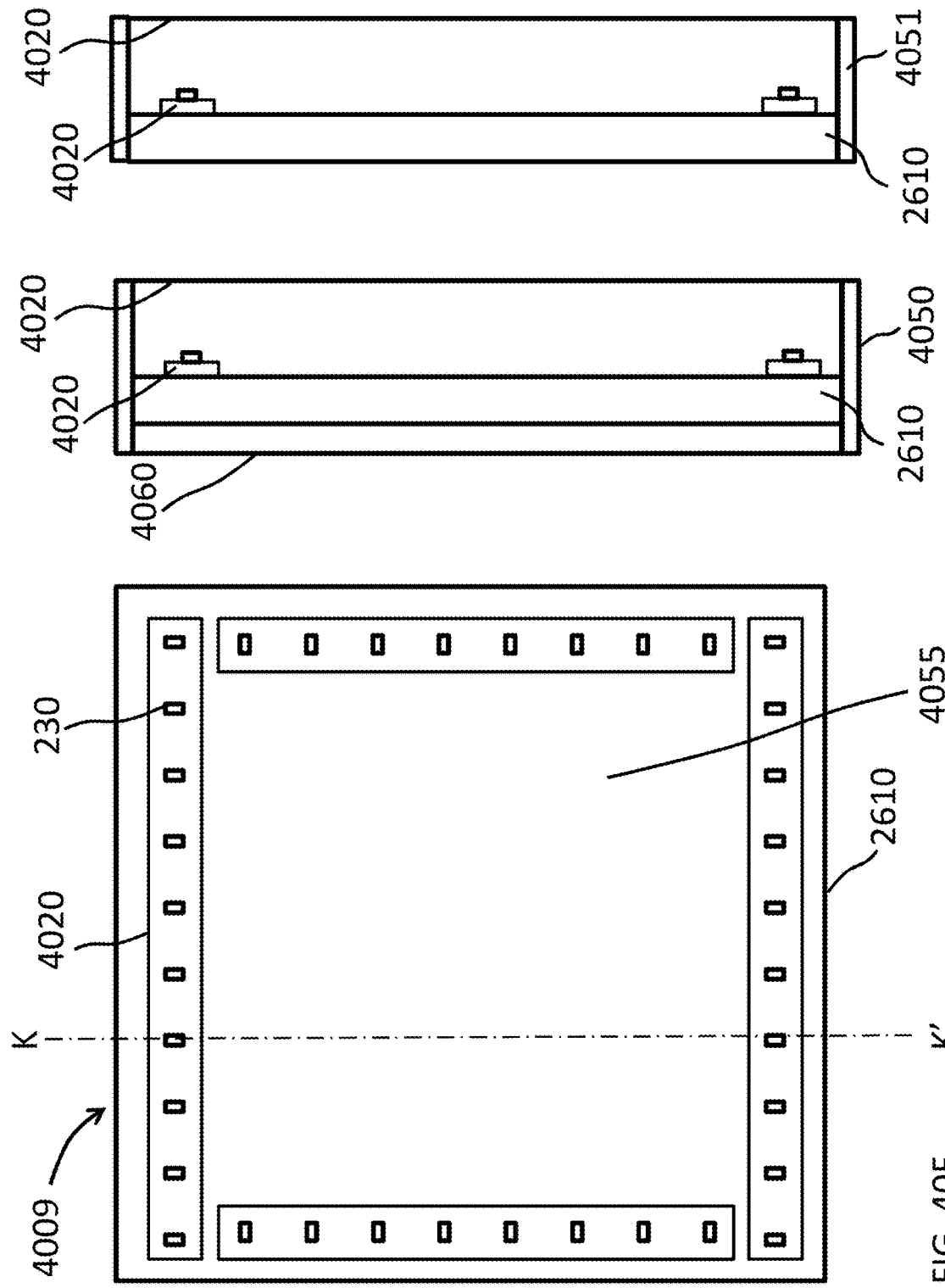

LIGHTING SYSTEMS INCORPORATING CONNECTIONS FOR SIGNAL AND POWER TRANSMISSION

RELATED APPLICATIONS

This application is a continuation of U.S. patent application Ser. No. 16/923,258, filed Jul. 8, 2020, which is a continuation-in-part of U.S. patent application Ser. No. 16/455,863, filed Jun. 28, 2019, which is a continuation-in-part of U.S. patent application Ser. No. 15/446,494, filed Mar. 1, 2017, which claims the benefit of and priority to U.S. Provisional Patent Application No. 62/302,434, filed Mar. 2, 2016, the entire disclosure of each of which is hereby incorporated herein by reference.

FIELD OF THE INVENTION

In various embodiments, the present invention generally relates to electronic devices, and more specifically to array-based electronic devices.

BACKGROUND

Solid-state lighting is an attractive alternative to incandescent and fluorescent lighting systems for backlighting of translucent panels or materials and signs because of its relatively higher efficiency, robustness, and long life. A number of backlighting systems based on light-emitting diodes (LEDs) have been proposed, but these generally suffer from one or more deficiencies. It is often desirable to have the thickness of the panel or sign as small as possible, for example to fit within a restricted space, to provide a thin visual perspective, or to reduce cost. Various LED systems generally include LEDs that are operated at relatively high current, resulting in very bright light sources that must be mixed and diffused to provide even and low-glare illumination of the panel or sign. For systems having LEDs spaced several inches or more apart, this may result in an undesirably large spacing between the LEDs and the diffuser. The diffuser reduces the efficiency, and as the LEDs become brighter, more diffusion, with concomitant decreases in efficiency, is required to achieve a homogeneous luminance across the panel or sign. Furthermore, such systems often require relatively large heat sinks or thermal management systems, which also take up space and may require suitable ventilation, for example passive ventilation or active ventilation such as fans, to prevent deleterious heat buildup. These issues typically lead to undesirably large, thick, and potentially complicated lighting systems.

In addition, many applications for backlighting and illuminated panels and signs require custom sizing to fit in a particular location. Systems having relatively few high-brightness LEDs on rigid circuit boards or systems employing edge-lit panels may be difficult to use cost effectively in a wide range of installations, e.g., installations requiring size customization while maintaining high illumination uniformity and high efficiency.

Accordingly, there is a need for solutions that provide lighting systems having a thin form factor with improved uniformity, high efficiency, and which are simple to install.

SUMMARY

Embodiments of the present invention relate to illumination systems based on flexible light sheets and that incorporate additional functionality that enables various different mechanical mounting and electrical and/or mechanical joining techniques. For example, illumination systems in accordance with embodiments of the invention incorporate rigid or semi-rigid mounting frames that may also provide electrical connectivity. In various embodiments, the illumination systems are modular and feature connection mechanisms (e.g., snap connectors) that mechanically and electrically interconnect individual light panels or light sheets together and/or to power-distribution systems and/or to mounting rails.

Additional details of lighting systems in accordance with embodiments of the present invention appear within U.S. patent application Ser. No. 13/799,807, filed Mar. 13, 2013 (the '807 application), U.S. patent application Ser. No. 13/748,864, filed Jan. 24, 2013 (the '864 application), and U.S. patent application Ser. No. 14/699,149, filed Apr. 29, 2015 (the '149 application), the entire disclosure of each of which is incorporated by reference herein.

In an aspect, embodiments of the invention feature a lighting system that includes, consists essentially of, or consists of a first light panel, a second light panel, and a power distribution bus. The first light panel includes, consists essentially of, or consists of a first substrate, first and second spaced-apart power conductors disposed on the first substrate, a plurality of first light-emitting elements disposed on the first substrate and electrically connected to the first and second power conductors, a first connector electrically connected to the first power conductor, and a second connector electrically connected to the second power conductor. The second light panel includes, consists essentially of, or consists of a second substrate, third and fourth spaced-apart power conductors disposed on the second substrate, a plurality of second light-emitting elements disposed on the second substrate and electrically connected to the third and fourth power conductors, a third connector electrically connected to the third power conductor, a fourth connector electrically connected to the fourth power conductor, a fifth connector electrically connected to the third power conductor, a sixth connector electrically connected to the fourth power conductor, a seventh connector electrically connected to the third power conductor, and an eighth connector electrically connected to the fourth power conductor. The power distribution bus includes, consists essentially of, or consists of first and second power distribution lines, a ninth connector electrically connected to the first power distribution line, and a tenth connector electrically connected to the second power distribution line. The first connector is configured for connection to the third connector, thereby electrically coupling the first power conductor to the third power conductor. The second connector is configured for connection to the fourth connector, thereby electrically coupling the second power conductor to the fourth power conductor. The ninth connector is configured for connection to the fifth connector, thereby electrically coupling the third power conductor to the first power distribution line. The tenth connector is configured for connection to the sixth connector, thereby electrically coupling the fourth power conductor to the second power distribution line. The seventh and eighth connectors are configured to provide power to an electronic device from the first and second power distribution lines when (a) the ninth connector is connected to the fifth connector and (b) the tenth connector is connected to the sixth connector.

Embodiments of the invention may include one or more of the following in any of a variety of combinations. Connections between connectors may be direct connections (i.e., the connectors make a direct physical connection) or may be connections made via a jumper or other intermediate element (i.e., the connectors are electrically connected to each other via the jumper or other intermediate element but are not in direct physical contact). The seventh and/or eighth connector may include, consist essentially of, or consist of one or more vertical connectors. The seventh and/or eighth connector may include, consist essentially of, or consist of one or more snap connectors. The seventh connector may be disposed on or over the second substrate. The seventh connector may be spaced apart from the third and fifth connectors. The eighth connector may be disposed on or over the second substrate. The eighth connector may be spaced apart from the fourth and sixth connectors. The lighting system may include an electronic device electrically coupled to the seventh and eighth connectors. The electronic device may include, consist essentially of, or consist of a sensor, a camera, a speaker, and/or a microphone. The first light panel may define one or more apertures (i.e., holes) therethrough. The second light panel may define one or more apertures (i.e., holes) therethrough. The lighting system may include a first jumper and/or a second jumper. The first jumper may include, consist essentially of, or consist of (i) a first jumper connector configured for connection to the fifth connector and (ii) a second jumper connector configured for connection to the ninth connector. The second jumper may include, consist essentially of, or consist of (i) a third jumper connector configured for connection to the sixth connector and (ii) a fourth jumper connector configured for connection to the tenth connector.

In another aspect, embodiments of the invention feature a lighting system that includes, consists essentially of, or consists of a first light panel, a second light panel, and a power distribution bus. The first light panel includes, consists essentially of, or consists of a first substrate, first and second spaced-apart power conductors disposed on the first substrate, a plurality of first light-emitting elements disposed on the first substrate and electrically connected to the first and second power conductors, a first connector electrically connected to the first power conductor, a second connector electrically connected to the second power conductor, and a third connector. The third connector may not be electrically connected to the first and/or second power conductors. The second light panel includes, consists essentially of, or consists of a second substrate, third and fourth spaced-apart power conductors disposed on the second substrate, a control conductor disposed on the second substrate, a plurality of second light-emitting elements disposed on the second substrate and electrically connected to the third and fourth power conductors, a fourth connector electrically connected to the third power conductor, a fifth connector electrically connected to the fourth power conductor, a sixth connector electrically connected to the third power conductor, a seventh connector electrically connected to the fourth power conductor, an eighth connector electrically connected to the control conductor, a ninth connector electrically connected to the control conductor, and a control connector electrically connected to the control conductor. The control conductor may be separate and/or spaced apart from the third and/or fourth power conductors. The power distribution bus includes, consists essentially of, or consists of first and second power distribution lines, a control distribution line, a tenth connector electrically connected to the first power distribution line, an eleventh connector electrically connected to the second power distribution line, and a twelfth connector electrically connected to the control distribution line. The control distribution line may be separate and/or spaced apart from the first and/or second power distribution lines. The first connector is configured for connection to the fourth connector, thereby electrically coupling the first power conductor to the third power conductor. The second connector is configured for connection to the fifth connector, thereby electrically coupling the second power conductor to the fourth power conductor. The tenth connector is configured for connection to the sixth connector, thereby electrically coupling the third power conductor to the first power distribution line. The eleventh connector is configured for connection to the seventh connector, thereby electrically coupling the fourth power conductor to the second power distribution line. The third connector is configured for connection to the eighth control connector, thereby electrically coupling the first control connector to the control conductor. The ninth connector is configured for connection to the twelfth connector, thereby electrically coupling the control conductor to the control distribution line. The control connector is configured for at receipt and/or transmission of control and/or communication signals along the control conductor.

Embodiments of the invention may include one or more of the following in any of a variety of combinations. Connections between connectors may be direct connections (i.e., the connectors make a direct physical connection) or may be connections made via a jumper or other intermediate element (i.e., the connectors are electrically connected to each other via the jumper or other intermediate element but are not in direct physical contact). The control connector may be disposed on or over the second substrate. The control connector may be separate and spaced apart from the eighth and/or ninth connectors. The control connector may include, consist essentially of, or consist of one or more vertical connectors. The control connector may include, consist essentially of, or consist of one or more snap connectors. The control connector may include, consist essentially of, or consist of a wireless receiver and/or a wireless transmitter. The lighting system may include a controller configured to control an emission characteristic of at least the second light panel in response to control signals received via the control connector. The controller may be configured to control an emission characteristic of the first light panel. The emission characteristic may include, consist essentially of, or consist of a light intensity, an emission color, a spectral power distribution, and/or a spatial light distribution pattern. The second light panel may include a thirteenth connector electrically connected to the third power conductor and a fourteenth connector electrically connected to the fourth power conductor. The thirteenth and fourteenth connectors may be configured to provide power to an electronic device from the first and second power distribution lines when (a) the tenth connector is connected to the sixth connector and/or (b) the eleventh connector is connected to the seventh connector. The thirteenth connector may include, consist essentially of, or consist of one or more vertical connectors. The thirteenth connector may include, consist essentially of, or consist of one or more snap connectors. The fourteenth connector may include, consist essentially of, or consist of one or more vertical connectors. The fourteenth connector may include, consist essentially of, or consist of one or more snap connectors. The thirteenth connector may be disposed on or over the second substrate. The thirteenth connector may be separate and spaced apart from the fourth and/or sixth connectors. The fourteenth connector may be disposed on or over the second substrate. The fourteenth connector may be separate and spaced apart from the fifth and/or seventh connectors. The lighting system may include an electronic device electrically coupled to the thirteenth and fourteenth connectors. The electronic device may include, consist essentially of, or consist of a sensor, a camera, a speaker, and/or a microphone. The first light panel may define one or more apertures (i.e., holes) therethrough. The second light panel may define one or more apertures (i.e., holes) therethrough. An electronic device may be electrically coupled to the control connector. The electronic device may include, consist essentially of, or consist of a sensor, a camera, a speaker, and/or a microphone. The lighting system may include a first jumper and/or a second jumper. The first jumper may include, consist essentially of, or consist of (i) a first jumper connector configured for connection to the sixth connector and (ii) a second jumper connector configured for connection to the tenth connector. The second jumper may include, consist essentially of, or consist of (i) a third jumper connector configured for connection to the seventh connector and (ii) a fourth jumper connector configured for connection to the eleventh connector. The first jumper may include, consist essentially of, or consist of (i) a first jumper connector configured for connection to the ninth connector and (ii) a second jumper connector configured for connection to the twelfth connector.

In yet another aspect, embodiments of the invention feature a lighting system that includes, consists essentially of, or consists of a first light panel and a second light panel. The first light panel includes, consists essentially of, or consists of a first substrate, first and second spaced-apart power conductors disposed on the first substrate, a plurality of first light-emitting elements disposed on the first substrate and electrically connected to the first and second power conductors, a first connector electrically connected to the first power conductor, and a second connector electrically connected to the second power conductor. The second light panel includes, consists essentially of, or consists of a second substrate, first and second tabs extending from (and/or defined by) the second substrate, third and fourth spaced-apart power conductors disposed on the second substrate, a plurality of second light-emitting elements disposed on the second substrate and electrically connected to the third and fourth power conductors, a third connector electrically connected to the third power conductor and disposed on the first tab, and a fourth connector electrically connected to the fourth power conductor and disposed on the second tab. The first tab and/or the second tab may be planar and/or elongated. The first tab and/or the second tab may be flexible. The first connector is configured for connection to the third connector, thereby electrically coupling the first power conductor to the third power conductor. The second connector is configured for connection to the fourth connector, thereby electrically coupling the second power conductor to the fourth power conductor. The first tab may include one or more first strain-relief features that, e.g., increase compliance and/or flexibility of the lighting system when the first connector is connected to the third connector. The second tab may include one or more second strain-relief features that, e.g., increase compliance and/or flexibility of the lighting system when the second connector is connected to the fourth connector.

Embodiments of the invention may include one or more of the following in any of a variety of combinations. Connections between connectors may be direct connections (i.e., the connectors make a direct physical connection) or may be connections made via a jumper or other intermediate element (i.e., the connectors are electrically connected to each other via the jumper or other intermediate element but are not in direct physical contact). One or more of the first strain-relief features may include, consist essentially of, or consist of a cut (e.g., a slit) penetrating through only a portion of a dimension (e.g., width) of the first tab. One or more of the second strain-relief features may include, consist essentially of, or consist of a cut (e.g., a slit) penetrating through only a portion of a dimension (e.g., width) of the second tab. The one or more first strain-relief features may include, consist essentially of, or consist of two first strain-relief features extending inward into the first tab from opposite sides thereof. Each of the first strain-relief features may include, consist essentially of, or consist of a cut penetrating through only a portion of a dimension (e.g., width) of the first tab. The one or more second strain-relief features may include, consist essentially of, or consist of two second strain-relief features extending inward into the second tab from opposite sides thereof. Each of the second strain-relief features may include, consist essentially of, or consist of a cut penetrating through only a portion of a dimension (e.g., width) of the second tab. One or more of the first strain-relief features may include, consist essentially of, or consist of an elongated cut having a termination feature disposed at an end thereof. A dimension (e.g., a width and/or diameter) of the termination feature may be greater than a dimension (e.g., width) of the cut. One or more of the second strain-relief features may include, consist essentially of, or consist of an elongated cut having a termination feature disposed at an end thereof. A dimension (e.g., a width and/or diameter) of the termination feature may be greater than a dimension (e.g., width) of the cut. The first tab may include, consist essentially of, or consist of two or more layers of a material of the second substrate. At least one of the layers may be folded over at least another one of the layers (e.g., along one or more fold lines) to define at least a portion of the first tab. The third connector may extend through the two or more layers of the material of the second substrate. At least one of the first strain-relief features may extend only through one of the layers of the material of the second substrate. At least one of the first strain-relief features may not extend through all of the layers of the material of the second substrate. The second tab may include, consist essentially of, or consist of two or more layers of a material of the second substrate. At least one of the layers may be folded over at least another one of the layers (e.g., along one or more fold lines) to define at least a portion of the second tab. The fourth connector may extend through the two or more layers of the material of the second substrate. At least one of the second strain-relief features may extend only through one of the layers of the material of the second substrate. At least one of the second strain-relief features may not extend through all of the layers of the material of the second substrate. The second light panel may include a fifth connector electrically connected to the third power conductor, and a sixth connector electrically connected to the fourth power conductor. The lighting system may include a power distribution bus. The power distribution bus may include, consist essentially of, or consist of first and second power distribution lines, a seventh connector electrically connected to the first power distribution line, and an eighth connector electrically connected to the second power distribution line. The seventh connector may be configured for connection to the fifth connector, thereby electrically coupling the third power conductor to the first power distribution line. The eighth connector may be configured for connection to the sixth connector, thereby electrically coupling the fourth power conductor to the second power distribution line.

In another aspect, embodiments of the invention feature a lighting system that includes, consists essentially of, or consists of a first light panel. The first light panel includes, consists essentially of, or consists of a first substrate, first and second spaced-apart power conductors disposed on the first substrate, a plurality of first light-emitting elements disposed on the first substrate, and a sound-absorbing material. The first substrate defines a plurality of apertures therethrough. The first light-emitting elements are electrically connected to the first and second power conductors by a plurality of conductive traces. The first substrate is disposed over the sound-absorbing material. The first substrate may be disposed in direct mechanical contact with the sound-absorbing material. The first substrate may be adhered or attached to the sound-absorbing material via, e.g., an adhesive or other fastener(s). None of the apertures defined through the substrate intersects the first and second spaced-apart power conductors, the plurality of first light-emitting elements, or the plurality of conductive traces.

Embodiments of the invention may include one or more of the following in any of a variety of combinations. The top surface of the first light panel may be shaped as a rectangle, square, circle, triangle, parallelogram, trapezoid, pentagon, or hexagon. The first light panel may include a first connector and/or a second connector. The first connector may be electrically connected to the first power conductor. The second connector may be electrically connected to the second power conductor. The first connector may be disposed on a tab (e.g., a flat, planar tab, which may include, consist essentially of, or consist of the same material as the first substrate). The tab may protrude from the first substrate. The first substrate and the tab may be coplanar. The second connector may be disposed on a tab, which may protrude from the first substrate. The sound-absorbing material may not directly underlie a portion of or an entirety of the tab and/or the first connector. The sound-absorbing material may not directly underlie the first connector and/or the second connector. The first connector and the second connector may be differently gendered or polarized. The first connector may be a male connector and the second connector may be a female connector. The first connector may be a female connector and the second connector may be a male connector.

The plurality of apertures may collectively have an area that is at least 10%, at least 15%, at least 25%, at least 50%, at least 70%, or at least 80% of a surface area of the first light panel. Proximate one of the apertures, at least one of the first power conductor, the second power conductor, or at least one said conductive trace may not extend in a straight line. Opposing sides of the first power conductor, second power conductor, or at least one conductive trace may not be parallel to each other proximate one of the apertures. At least one of the opposing sides may conform to curvature of the aperture. Proximate the one of the apertures, the at least one of the first power conductor, the second power conductor, or at least one said conductive trace may curve away from the aperture. The first light panel may have a noise reduction coefficient of at least 0.5, at least 0.7, at least 0.8, at least 0.9, or at least 0.95.

The sound-absorbing material may include, consist essentially of, or consist of fiberglass, sound absorbing foam, mineral wool, mineral fiber, acoustic fleece, acoustic ceiling tile, and/or fiberglass foam. All or a portion of the sound-absorbing material may be rigid. All or a portion of the sound-absorbing material may be flexible and/or soft. Below the apertures defined through the first substrate, the sound-absorbing material may have no apertures defined therethrough (i.e., the sound-absorbing material may define no apertures therethrough that partially or completely overlap with apertures defined through the first substrate). The sound-absorbing material may be a multi-layer structure including, consisting essentially of, or consisting of at least one rigid layer and at least one layer that is flexible and/or soft. The first substrate may be disposed on and in direct mechanical contact with the sound-absorbing material. The sound-absorbing material may be attached to the first substrate with an adhesive and/or one or more mechanical fasteners. At least a portion of the outer perimeter of the sound-absorbing material may substantially conform to at least a portion of the outer perimeter of the first substrate. The sound-absorbing material may include, consist essentially of, or consist of a rigid sound-absorbing panel. At least a portion of the outer perimeter of the sound-absorbing panel may substantially conform to at least a portion of the outer perimeter of the first substrate. The first substrate may be attached and/or adhered to the sound-absorbing panel.

The first substrate may have a first surface and a second surface opposite the first surface. The sound-absorbing material may have a first surface and a second surface opposite the first surface. The second surface of the first substrate may face, directly mechanically contact, or be adhered or attached to the first surface of the sound-absorbing material. The first surface of the first substrate may have a first CIELAB color value of $L^*_1, a^*_1, b^*_1$. The first surface of the sound-absorbing material may have a second CIELAB color value of $L^*_2, a^*_2, b^*_2$. The difference $\Delta E^*$ between the first and second CIELAB color values may be less than 6, less than 5, less than 4, less than 3, less than 2, or less than 1. The first surface of the first substrate may have a first reflectivity to a wavelength of light emitted by the light-emitting elements. The first surface of the sound-absorbing material may have a second reflectivity to a wavelength of light emitted by the light-emitting elements. The first and second reflectivities may be equal to each other ±20%, ±15%, ±10%, ±5%, ±2%, or ±1%.

The lighting system may include one or more protective panels disposed over the first light panel. The protective panel may define therethrough a plurality of first apertures and a plurality of second apertures. The first apertures may be sized, shaped, and positioned to allow light emitted from the first light-emitting elements to pass through the first apertures. The second apertures may be aligned with the plurality of apertures defined through the first substrate. The outer perimeter of at least one of the second apertures may substantially conform to the outer perimeter of at least one of the apertures defined through the first substrate. The protective panel may include, consist essentially of, or consist of plastic, foam, and/or sound-absorbing material. The first substrate may have a first surface and a second surface opposite the first surface. The protective panel may have a first surface and a second surface opposite the first surface. The first surface of the first substrate may face, directly mechanically contact, or be adhered or attached to the second surface of the protective layer. The first surface of the first substrate may have a first CIELAB color value of $L^*_1, a^*_1, b^*_1$. The first surface of the protective panel may have a second CIELAB color value of $L^*_2, a^*_2, b^*_2$. The difference $\Delta E^*$ between the first and second CIELAB color values may be less than 6, less than 5, less than 4, less than 3, less than 2, or less than 1. The first surface of the first substrate may have a first reflectivity to a wavelength of light emitted by the light-emitting elements. The first surface of the protective panel may have a second reflectivity to a wavelength of light emitted by the light-emitting elements. The first and second reflectivities may be equal to each other ±20%, ±15%, ±10%, ±5%, ±2%, or ±1%. The sound-absorbing material may have a first surface and a second surface opposite the first surface. The second surface of the protective panel may face, directly mechanically contact, or be adhered or attached to the first surface of the sound-absorbing material. For at least one of (or even all of) the second apertures, a cross-sectional area of the second aperture at the first surface of the protective panel may be larger than a cross-sectional area of the second aperture at the second surface of the protective panel. For the at least one of the second apertures, the cross-sectional area of the second aperture at the second surface of the protective panel may be substantially equal to a cross-sectional area of an aperture defined through the first substrate and directly underlying the second aperture.

The lighting system may include an optic disposed above and spaced apart from the first light-emitting elements. The optic may include, consist essentially of, or consist of a lens, an optical diffuser, a refractive optic, a reflective optic, a Fresnel optic, a fabric, a polymer, stone, and/or a graphic panel. The optic may include, consist essentially of, or consist of an optical diffuser. The optical diffuser may have an optical transmissivity greater than 10%, greater than 25%, greater than 45%, or greater than 60% for a wavelength of light emitted by the first light-emitting elements. The plurality of first light-emitting elements may be spaced apart at a first pitch. The optical diffuser may be spaced apart from the first light-emitting elements by a first spacing. The first spacing may be greater than the first pitch.

The lighting system may include a second light panel. The second light panel may include, consist essentially of, or consist of a second substrate, third and fourth spaced-apart power conductors disposed on the second substrate, a plurality of second light-emitting elements disposed on the second substrate and electrically connected to the third and fourth power conductors by a plurality of second conductive traces, a third connector electrically connected to the third power conductor, and a fourth connector electrically connected to the fourth power conductor. The first connector may be configured for connection to the third connector, thereby electrically coupling the first power conductor to the third power conductor. The second connector may be configured for connection to the fourth connector, thereby electrically coupling the second power conductor to the fourth power conductor. The lighting system may include a second sound-absorbing material. The second substrate may be disposed over, in direct mechanical contact with, or adhered or attached to the second sound-absorbing material. None of the apertures defined through the second substrate may intersect the third and fourth spaced-apart power conductors, the plurality of second light-emitting elements, or the plurality of second conductive traces. The second light panel may include a fifth connector electrically connected to the third power conductor. The second light panel may include a sixth connector electrically connected to the fourth power conductor.

The lighting system may include a power distribution bus. The power distribution bus may include, consist essentially of, or consist of first and second power distribution lines, a seventh connector electrically connected to the first power distribution line, and an eighth connector electrically connected to the second power distribution line. The seventh connector may be configured for connection to the fifth connector, thereby electrically coupling the third power conductor to the first power distribution line. The eighth connector may be configured for connection to the sixth connector, thereby electrically coupling the fourth power conductor to the second power distribution line. The power distribution bus may be separate from the first and second light panels and/or first and second substrates. No light-emitting elements may be disposed on the power distribution bus. The first light panel, second light panel, and/or power distribution bus may have a thickness less than 3 inches. The lighting system may include a rigid support structure disposed between the first substrate and the sound-absorbing material. The rigid support structure may define a plurality of second apertures therethrough. The second apertures may be aligned with (i.e., may partially overlap with, may have a perimeter edge disposed partially or completely within the perimeter edge of, may have a perimeter edge that partially or completely encompasses the perimeter edge of, or may have a perimeter edge that substantially conforms to the perimeter edge of) the apertures defined through the first substrate. Outer perimeters of the second apertures may substantially conform to outer perimeters of the apertures defined through the first substrate. One or more (or even all) of the second apertures may have an outer perimeter that substantially conforms to the outer perimeter of the aperture defined through the first substrate disposed immediately thereabove. An electrical conductor may extend from the first light panel and be configured to electrically connect to and receive power from an external power source. The electrical conductor may not extend through or otherwise intersect the sound-absorbing material. The electrical conductor may not directly contact the sound-absorbing material. The cross-sectional area of at least one of (or even all of) the apertures may be smaller than a cross-sectional area of a top surface of at least one of (or even all of) the first light-emitting elements.

In yet another aspect, embodiments of the invention feature a lighting system that includes, consists essentially of, or consists of a first light panel. The first light panel includes, consists essentially of, or consists of a first substrate, first and second spaced-apart power conductors disposed on the first substrate, a plurality of first light-emitting elements disposed on the first substrate, and a sound-absorbing material. The first light-emitting elements are electrically connected to the first and second power conductors (e.g., by a plurality of conductive traces). The sound-absorbing material defines a plurality of apertures therethrough. The sound-absorbing material is disposed over the first substrate. The apertures are sized, shaped, and positioned to allow light emitted from the first light-emitting elements to pass through the sound-absorbing material.

In another aspect, embodiments of the invention feature a lighting system that includes, consists essentially of, or consists of a first substrate having first and second opposed surfaces and defining a plurality of apertures therethrough, first and second spaced-apart power conductors disposed on the first surface of the first substrate, a plurality of first light-emitting elements disposed on the first substrate and electrically connected to the first and second power conductors by a plurality of conductive traces, a frame in which the first substrate is disposed, a diffuser suspended in or on the frame and over and spaced away from the first surface of the first substrate, and a sound-absorbing material disposed beneath the second surface of the first substrate. At least a portion of the frame protrudes beyond the first surface of the first substrate. None of the apertures intersects the first and second power conductors, the plurality of first light-emitting elements, or the plurality of conductive traces.

In an aspect, embodiments of the invention feature an acoustic lighting system that includes, consists essentially of, or consists of a rigid sound-absorbing material having first and second opposing surfaces, and a plurality of light panels disposed over the first surface of the sound-absorbing material and spaced apart from each other such that the sound-absorbing material is exposed through gaps between the light panels. One or more, or even each (but not necessarily each) light panel includes, consists essentially of, or consists of (i) a substrate and (ii) a plurality of light-emitting elements disposed over the substrate.

Embodiments of the invention may include one or more of the following in any of a variety of combinations. The acoustic lighting system may include means for suspending the lighting system from a wall or ceiling. The suspension means may extend from the second surface of the sound-absorbing material. At least a portion of the second surface of the sound-absorbing material may be exposed to thereby absorb sound deflecting from the wall or ceiling. An optic may be disposed over all or a portion of the light panels. The optic may include, consist essentially of, or consist of a lens, an optical diffuser, a refractive optic, a reflective optic, a Fresnel optic, a fabric, a polymer, stone, and/or a graphic panel. The optic may include, consist essentially of, or consist of an optical diffuser. The optical diffuser may have an optical transmissivity greater than 25% for a wavelength of light emitted by at least some of the light-emitting elements. The light-emitting elements may be spaced apart at a first pitch. The optical diffuser may be spaced apart from the light-emitting elements by a first spacing. The first spacing may be greater than the first pitch.

The light panels may be electrically connected to form a plurality of independently powered and controllable groups of light panels. All of the light panels may be electrically connected to each other. The light panels may be electrically connected via one or more electrical conductors over the first surface of the sound-absorbing material. The sound-absorbing material may define a hole therethrough. At least one said electrical conductor may extend through the hole to the second surface of the sound-absorbing material. The sound-absorbing material may include, consist essentially of, or consist of fiberglass, sound-absorbing foam, mineral wool, mineral fiber, acoustic fleece, polyester, polyester felt, polyethylene terephthalate, acoustic ceiling tile, and/or fiberglass foam. The sound-absorbing material may be a multi-layer structure including, consisting essentially of, or consisting of at least one rigid layer and at least one layer that is flexible and/or soft. One or more, or even each, substrate may be disposed on and in direct mechanical contact with the sound-absorbing material. One or more, or even each, light panel may be attached to the sound-absorbing material with an adhesive and/or a mechanical fastener.

Each substrate may have a first surface and a second surface opposite the first surface. The second surface of each substrate may face the first surface of the sound-absorbing material. The first surface of each substrate may have a first CIELAB color value of $L^*_1$, $a^*_1$, $b^*_1$. The first surface of the sound-absorbing material may have a second CIELAB color value of $L^*_2$, $a^*_2$, $b^*_2$. A difference $\Delta E^*$ between the first and second CIELAB color values may be less than 8, less than 7, less than 6, less than 5, less than 4, less than 3, less than 2, or less than 1. The first surface of each substrate may have a first reflectivity to a wavelength of light emitted by the light-emitting elements. The first surface of the sound-absorbing material may have a second reflectivity to a wavelength of light emitted by the light-emitting elements. The first and second reflectivities may be equal to each other ±20%, ±15%, ±10%, ±5%, ±2%, or ±1%.

A protective panel may be disposed over one or more, or even all, of the light panels. The protective panel may define therein a plurality of first apertures and a plurality of second apertures. The first apertures may be positioned to allow light emitted from the light-emitting elements to pass through the first apertures. The second apertures may at least partially overlap with the gaps between the light panels. The protective panel may include, consist essentially of, or consist of plastic, foam, and/or sound-absorbing material. Each substrate may have a first surface and a second surface opposite the first surface. The protective panel may have a first surface and a second surface opposite the first surface. The first surface of each substrate may face the second surface of the protective panel. The first surface of each substrate may have a first CIELAB color value of $L^*_1$, $a^*_1$, $b^*_1$. The first surface of the protective panel may have a second CIELAB color value of $L^*_2$, $a^*_2$, $b^*_2$. A difference $\Delta E^*$ between the first and second CIELAB color values may be less than 8, less than 7, less than 6, less than 5, less than 4, less than 3, less than 2, or less than 1. The first surface of each substrate may have a first reflectivity to a wavelength of light emitted by the light-emitting elements. The first surface of the protective panel may have a second reflectivity to a wavelength of light emitted by the light-emitting elements. The first and second reflectivities may be equal to each other ±20%, ±15%, ±10%, ±5%, ±2%, or ±1%.

In another aspect, embodiments of the invention feature an acoustic lighting system that includes, consists essentially of, or consists of a rigid support panel having first and second opposing surfaces, a light panel, and a plurality of sections of a sound-absorbing material having gaps therebetween. The light panel is disposed over the first surface of the support panel. The light panel includes, consists essentially of, or consists of (i) a substrate having one or more apertures or cut-out regions defined therein and (ii) a plurality of light-emitting elements disposed over the substrate. The sections of the sound-absorbing material are disposed between the support panel and the light panel. At least portions of at least some of the sections are exposed through the one or more apertures or cut-out regions in the light-panel.

Embodiments of the invention may include one or more of the following in any of a variety of combinations. The acoustic lighting system may include means for suspending the lighting system from a wall or ceiling. The suspension means may extend from the second surface of the sound-absorbing material. An optic may be disposed over all or a portion of the light panel. The optic may include, consist essentially of, or consist of a lens, an optical diffuser, a refractive optic, a reflective optic, a Fresnel optic, a fabric, a polymer, stone, and/or a graphic panel. The optic may include, consist essentially of, or consist of an optical diffuser. The optical diffuser may have an optical transmissivity greater than 25% for a wavelength of light emitted by at least some of the light-emitting elements. The light-emitting elements may be spaced apart at a first pitch. The optical diffuser may be spaced apart from the light-emitting elements by a first spacing. The first spacing may be greater than the first pitch.

The support panel may define one or more apertures therethrough to expose sound-absorbing material via the second surface of the support panel. One or more, or even each, section of the sound-absorbing material may include, consist essentially of, or consist of fiberglass, sound-absorbing foam, mineral wool, mineral fiber, acoustic fleece, polyester, polyester felt, polyethylene terephthalate, acoustic ceiling tile, and/or fiberglass foam. One or more, or even each, section of the sound-absorbing material may be a multi-layer structure including, consisting essentially of, or consisting of at least one rigid layer and at least one layer that is flexible and/or soft. The substrate may be disposed over or disposed on and in direct mechanical contact with the sections of the sound-absorbing material. The light panel may be attached to the sections of the sound-absorbing material with an adhesive and/or one or more mechanical fasteners.

The substrate may have a first surface and a second surface opposite the first surface. Each section of the sound-absorbing material may have a first surface and a second surface opposite the first surface. The second surface of the substrate may face the first surfaces of the sections of the sound-absorbing material. The first surface of the substrate may have a first CIELAB color value of $L^*_1$, $a^*_1$, $b^*_1$. The first surfaces of the sections of the sound-absorbing material may have a second CIELAB color value of $L^*_2$, $a^*_2$, $b^*_2$. A difference $\Delta E^*$ between the first and second CIELAB color values may be less than 8, less than 7, less than 6, less than 5, less than 4, less than 3, less than 2, or less than 1. The first surface of the substrate may have a first reflectivity to a wavelength of light emitted by the light-emitting elements. The first surfaces of the sections of the sound-absorbing material may have a second reflectivity to a wavelength of light emitted by the light-emitting elements. The first and second reflectivities may be equal to each other ±20%, ±15%, ±10%, ±5%, ±2%, or ±1%.

A protective panel may be disposed over the light panel. The protective panel may define therein a plurality of first apertures and a plurality of second apertures. The first apertures may be positioned to allow light emitted from the light-emitting elements to pass through the first apertures. The second apertures may at least partially overlap with one or more apertures or cut-out regions in the light panel. The protective panel may include, consist essentially of, or consist of plastic, foam, and/or sound-absorbing material. The substrate may have a first surface and a second surface opposite the first surface. The protective panel may have a first surface and a second surface opposite the first surface.

The first surface of the substrate may face the second surface of the protective panel. The first surface of the substrate may have a first CIELAB color value of $L^*_1$, $a^*_1$, $b^*_1$. The first surface of the protective panel may have a second CIELAB color value of $L^*_2$, $a^*_2$, $b^*_2$. A difference $\Delta E^*$ between the first and second CIELAB color values may be less than 8, less than 7, less than 6, less than 5, less than 4, less than 3, less than 2, or less than 1. The first surface of the substrate may have a first reflectivity to a wavelength of light emitted by the light-emitting elements. The first surface of the protective panel may have a second reflectivity to a wavelength of light emitted by the light-emitting elements. The first and second reflectivities may be equal to each other ±20%, ±15%, ±10%, ±5%, ±2%, or ±1%.

In yet another aspect, embodiments of the invention feature an acoustic lighting system that includes, consists essentially of, or consists of a rigid sound-absorbing material having first and second opposing surfaces, and a first light panel disposed over the first surface of the sound-absorbing material. The first light panel includes, consists essentially of, or consists of (i) a substrate and (ii) a plurality of light-emitting elements disposed over the substrate. The first light panel includes, consists essentially of, or consists of (i) a first elongated portion extending in a first direction, (ii) first and second power conductors extending over the substrate in the first elongated portion, (iii) a plurality of second elongated portions extending from the first elongated portion in a second direction different from the first direction. Each second elongated portion includes a plurality of light-emitting elements thereon. Power is supplied to the light-emitting elements by the first and second power conductors. The second elongated portions are separated by gaps therebetween such that the sound-absorbing material is exposed through the gaps between the second elongated portions.

Embodiments of the invention may include one or more of the following in any of a variety of combinations. The first direction may be substantially perpendicular (e.g., within ±5°, ±4°, ±3°, ±2°, or ±1° of perpendicular) to the second direction. The light-emitting elements may be electrically configured as a plurality of light-emitting strings each including, consisting essentially of, or consisting of a plurality of series-connected light-emitting elements. Each light-emitting string may be disposed on a different second elongated portion. At least one, or even each, light-emitting string may extend along a plurality of second elongated portions. No light-emitting elements may be disposed on the first elongated portion.

The acoustic lighting system may include means for suspending the lighting system from a wall or ceiling. The suspension means may extend from the second surface of the sound-absorbing material. At least a portion of the second surface of the sound-absorbing material may be exposed to thereby absorb sound deflecting from the wall or ceiling. An optic may be disposed over all or a portion of the first light panel. The optic may include, consist essentially of, or consist of a lens, an optical diffuser, a refractive optic, a reflective optic, a Fresnel optic, a fabric, a polymer, stone, and/or a graphic panel. The optic may include, consist essentially of, or consist of an optical diffuser. The optical diffuser may have an optical transmissivity greater than 25% for a wavelength of light emitted by at least some of the light-emitting elements. The light-emitting elements may be spaced apart at a first pitch. The optical diffuser may be spaced apart from the light-emitting elements by a first spacing. The first spacing may be greater than the first pitch.

The sound-absorbing material may include, consist essentially of, or consist of fiberglass, sound-absorbing foam, mineral wool, mineral fiber, acoustic fleece, polyester, polyester felt, polyethylene terephthalate, acoustic ceiling tile, and/or fiberglass foam. The sound-absorbing material may be a multi-layer structure including, consisting essentially of, or consisting of at least one rigid layer and at least one layer that is flexible and/or soft. The substrate may be disposed on and in direct mechanical contact with the sound-absorbing material. The first light panel may be attached to the sound-absorbing material with an adhesive and/or a mechanical fastener.

The substrate may have a first surface and a second surface opposite the first surface. Each section of the sound-absorbing material may have a first surface and a second surface opposite the first surface. The second surface of the substrate may face the first surface of the sound-absorbing material. The first surface of the substrate may have a first CIELAB color value of $L^*_1$, $a^*_1$, $b^*_1$. The first surface of the sound-absorbing material may have a second CIELAB color value of $L^*_2$, $a^*_2$, $b^*_2$. A difference $\Delta E^*$ between the first and second CIELAB color values may be less than 8, less than 7, less than 6, less than 5, less than 4, less than 3, less than 2, or less than 1. The first surface of the substrate may have a first reflectivity to a wavelength of light emitted by the light-emitting elements. The first surface of the sound-absorbing material may have a second reflectivity to a wavelength of light emitted by the light-emitting elements. The first and second reflectivities may be equal to each other ±20%, ±15%, ±10%, ±5%, ±2%, or ±1%.

A protective panel may be disposed over the first light panel. The protective panel may define therein a plurality of first apertures and a plurality of second apertures. The first apertures may be positioned to allow light emitted from the light-emitting elements to pass through the first apertures. The second apertures may at least partially overlap with the gaps between the second elongated portions. The protective panel may include, consist essentially of, or consist of plastic, foam, and/or sound-absorbing material. The substrate may have a first surface and a second surface opposite the first surface. The protective panel may have a first surface and a second surface opposite the first surface.

The first surface of the substrate may face the second surface of the protective panel. The first surface of the substrate may have a first CIELAB color value of $L^*_1$, $a^*_1$, $b^*_1$. The first surface of the protective panel may have a second CIELAB color value of $L^*_2$, $a^*_2$, $b^*_2$. A difference $\Delta E^*$ between the first and second CIELAB color values may be less than 8, less than 7, less than 6, less than 5, less than 4, less than 3, less than 2, or less than 1. The first surface of the substrate may have a first reflectivity to a wavelength of light emitted by the light-emitting elements. The first surface of the protective panel may have a second reflectivity to a wavelength of light emitted by the light-emitting elements. The first and second reflectivities may be equal to each other ±20%, ±15%, ±10%, ±5%, ±2%, or ±1%.

In another aspect, embodiments of the invention feature a lighting system that includes, consists essentially of, or consists of a first light panel. The first light panel includes, consists essentially of, or consists of a first substrate, first and second spaced-apart power conductors disposed on the first substrate, a plurality of first light-emitting elements disposed on the first substrate, and a sound-absorbing material. The first substrate defines a plurality of cut-out regions therein. The sound-absorbing material may be rigid. The first light-emitting elements are electrically connected to the first and second power conductors by a plurality of conductive traces. The first substrate is disposed over the sound-absorbing material. The first substrate may be disposed in direct mechanical contact with the sound-absorbing material. The first substrate may be adhered or attached to the sound-absorbing material via, e.g., an adhesive or other fastener(s). None of the cut-out regions defined in the substrate intersects the first and second spaced-apart power conductors, the plurality of first light-emitting elements, or the plurality of conductive traces.

Embodiments of the invention may include one or more of the following in any of a variety of combinations. The top surface of the first light panel may be shaped as a rectangle, square, circle, triangle, parallelogram, trapezoid, pentagon, or hexagon. The first light panel may include a first connector and/or a second connector. The first connector may be electrically connected to the first power conductor. The second connector may be electrically connected to the second power conductor. The first connector may be disposed on a tab (e.g., a flat, planar tab, which may include, consist essentially of, or consist of the same material as the first substrate). The tab may protrude from the first substrate. The first substrate and the tab may be coplanar. The second connector may be disposed on a tab, which may protrude from the first substrate. The sound-absorbing material may not directly underlie a portion of or an entirety of the tab and/or the first connector. The sound-absorbing material may not directly underlie the first connector and/or the second connector. The first connector and the second connector may be differently gendered or polarized. The first connector may be a male connector and the second connector may be a female connector. The first connector may be a female connector and the second connector may be a male connector.

The plurality of cut-out regions may collectively have an area that is at least 10%, at least 15%, at least 25%, at least 50%, at least 70%, or at least 80% of a surface area of the first light panel. Proximate one of the cut-out regions, at least one of the first power conductor, the second power conductor, or at least one said conductive trace may not extend in a straight line. Opposing sides of the first power conductor, second power conductor, or at least one conductive trace may not be parallel to each other proximate one of the cut-out regions. At least one of the opposing sides may conform to curvature of the cut-out region. Proximate the one of the cut-out regions, the at least one of the first power conductor, the second power conductor, or at least one said conductive trace may curve away from the cut-out region. The first light panel may have a noise reduction coefficient of at least 0.5, at least 0.7, at least 0.8, at least 0.9, or at least 0.95.

The sound-absorbing material may include, consist essentially of, or consist of fiberglass, sound absorbing foam, mineral wool, mineral fiber, acoustic fleece, acoustic ceiling tile, and/or fiberglass foam. All or a portion of the sound-absorbing material may be rigid. All or a portion of the sound-absorbing material may be flexible and/or soft. Below the cut-out regions defined through the first substrate, the sound-absorbing material may have no apertures or cut-out regions defined therethrough (i.e., the sound-absorbing material may define no apertures or cut-out regions therethrough that partially or completely overlap with cut-out regions defined through the first substrate). The sound-absorbing material may be a multi-layer structure including, consisting essentially of, or consisting of at least one rigid layer and at least one layer that is flexible and/or soft. The first substrate may be disposed on and in direct mechanical contact with the sound-absorbing material. The sound-absorbing material may be attached to the first substrate with an adhesive and/or one or more mechanical fasteners. At least a portion of the outer perimeter of the sound-absorbing material may substantially conform to at least a portion of the outer perimeter of the first substrate. The sound-absorbing material may include, consist essentially of, or consist of a rigid sound-absorbing panel. At least a portion of the outer perimeter of the sound-absorbing panel may substantially conform to at least a portion of the outer perimeter of the first substrate. The first substrate may be attached and/or adhered to the sound-absorbing panel.

The first substrate may have a first surface and a second surface opposite the first surface. The sound-absorbing material may have a first surface and a second surface opposite the first surface. The second surface of the first substrate may face, directly mechanically contact, or be adhered or attached to the first surface of the sound-absorbing material. The first surface of the first substrate may have a first CIELAB color value of $L^*_1$, $a^*_1$, $b^*_1$. The first surface of the sound-absorbing material may have a second CIELAB color value of $L^*_2$, $a^*_2$, $b^*_2$. The difference $\Delta E^*$ between the first and second CIELAB color values may be less than 6, less than 5, less than 4, less than 3, less than 2, or less than 1. The first surface of the first substrate may have a first reflectivity to a wavelength of light emitted by the light-emitting elements. The first surface of the sound-absorbing material may have a second reflectivity to a wavelength of light emitted by the light-emitting elements. The first and second reflectivities may be equal to each other ±20%, ±15%, ±10%, ±5%, ±2%, or ±1%.

The lighting system may include one or more protective panels disposed over the first light panel. The protective panel may define therethrough a plurality of first apertures and/or cut-out regions and a plurality of second apertures and/or cut-out regions. The first apertures and/or cut-out regions may be sized, shaped, and positioned to allow light emitted from the first light-emitting elements to pass through the first apertures and/or cut-out regions. The second apertures and/or cut-out regions may be aligned with the plurality of cut-out regions defined through the first substrate. The outer perimeter of at least one of the second apertures or cut-out regions may substantially conform to the outer perimeter of at least one of the cut-out regions defined through the first substrate. The protective panel may include, consist essentially of, or consist of plastic, foam, and/or sound-absorbing material. The first substrate may have a first surface and a second surface opposite the first surface. The protective panel may have a first surface and a second surface opposite the first surface. The first surface of the first substrate may face, directly mechanically contact, or be adhered or attached to the second surface of the protective layer. The first surface of the first substrate may have a first CIELAB color value of $L^*_1, a^*_1, b^*_1$. The first surface of the protective panel may have a second CIELAB color value of $L^*_2, a^*_2, b^*_2$. The difference $\Delta E^*$ between the first and second CIELAB color values may be less than 6, less than 5, less than 4, less than 3, less than 2, or less than 1. The first surface of the first substrate may have a first reflectivity to a wavelength of light emitted by the light-emitting elements. The first surface of the protective panel may have a second reflectivity to a wavelength of light emitted by the light-emitting elements. The first and second reflectivities may be equal to each other ±20%, ±15%, ±10%, ±5%, ±2%, or ±1%. The sound-absorbing material may have a first surface and a second surface opposite the first surface. The second surface of the protective panel may face, directly mechanically contact, or be adhered or attached to the first surface of the sound-absorbing material. For at least one of (or even all of) the second apertures or cut-out regions, a cross-sectional area of the second aperture or cut-out region at the first surface of the protective panel may be larger than a cross-sectional area of the second aperture or cut-out region at the second surface of the protective panel. For the at least one of the second apertures or cut-out regions, the cross-sectional area of the second aperture or cut-out region at the second surface of the protective panel may be substantially equal to a cross-sectional area of a cut-out region defined through the first substrate and directly underlying the second aperture or cut-out region.

The lighting system may include an optic disposed above and spaced apart from the first light-emitting elements. The optic may include, consist essentially of, or consist of a lens, an optical diffuser, a refractive optic, a reflective optic, a Fresnel optic, a fabric, a polymer, stone, and/or a graphic panel. The optic may include, consist essentially of, or consist of an optical diffuser. The optical diffuser may have an optical transmissivity greater than 10%, greater than 25%, greater than 45%, or greater than 60% for a wavelength of light emitted by the first light-emitting elements. The plurality of first light-emitting elements may be spaced apart at a first pitch. The optical diffuser may be spaced apart from the first light-emitting elements by a first spacing. The first spacing may be greater than the first pitch.

The lighting system may include a second light panel. The second light panel may include, consist essentially of, or consist of a second substrate, third and fourth spaced-apart power conductors disposed on the second substrate, a plurality of second light-emitting elements disposed on the second substrate and electrically connected to the third and fourth power conductors by a plurality of second conductive traces, a third connector electrically connected to the third power conductor, and a fourth connector electrically connected to the fourth power conductor. The first connector may be configured for connection to the third connector, thereby electrically coupling the first power conductor to the third power conductor. The second connector may be configured for connection to the fourth connector, thereby electrically coupling the second power conductor to the fourth power conductor. The lighting system may include a second sound-absorbing material. The second substrate may define a plurality of cut-out regions therein. The second substrate may be disposed over, in direct mechanical contact with, or adhered or attached to the second sound-absorbing material. None of the cut-out regions defined through the second substrate may intersect the third and fourth spaced-apart power conductors, the plurality of second light-emitting elements, or the plurality of second conductive traces. The second light panel may include a fifth connector electrically connected to the third power conductor. The second light panel may include a sixth connector electrically connected to the fourth power conductor.

The lighting system may include a power distribution bus. The power distribution bus may include, consist essentially of, or consist of first and second power distribution lines, a seventh connector electrically connected to the first power distribution line, and an eighth connector electrically connected to the second power distribution line. The seventh connector may be configured for connection to the fifth connector, thereby electrically coupling the third power conductor to the first power distribution line. The eighth connector may be configured for connection to the sixth connector, thereby electrically coupling the fourth power conductor to the second power distribution line. The power distribution bus may be separate from the first and second light panels and/or first and second substrates. No light-emitting elements may be disposed on the power distribution bus. The first light panel, second light panel, and/or power distribution bus may have a thickness less than 3 inches. The lighting system may include a rigid support structure disposed between the first substrate and the sound-absorbing material. The rigid support structure may define a plurality of second cut-out regions therethrough. The second cut-out regions may be aligned with (i.e., may partially overlap with, may have a perimeter edge disposed partially or completely within the perimeter edge of, may have a perimeter edge that partially or completely encompasses the perimeter edge of, or may have a perimeter edge that substantially conforms to the perimeter edge of) the cut-out regions defined through the first substrate. Outer perimeters of the second cut-out regions may substantially conform to outer perimeters of the cut-out regions defined through the first substrate. One or more (or even all) of the second cut-out regions may have an outer perimeter that substantially conforms to the outer perimeter of the cut-out region defined through the first substrate disposed immediately thereabove. An electrical conductor may extend from the first light panel and be configured to electrically connect to and receive power from an external power source. The electrical conductor may not extend through or otherwise intersect the sound-absorbing material. The electrical conductor may not directly contact the sound-absorbing material. The cross-sectional area of at least one of (or even all of) the cut-out regions may be smaller than a cross-sectional area of a top surface of at least one of (or even all of) the first light-emitting elements.

In yet another aspect, embodiments of the invention feature a lighting system that includes, consists essentially of, or consists of a first light panel. The first light panel includes, consists essentially of, or consists of a first substrate, first and second spaced-apart power conductors disposed on the first substrate, a plurality of first light-emitting elements disposed on the first substrate, and a sound-absorbing material. The first light-emitting elements are electrically connected to the first and second power conductors (e.g., by a plurality of conductive traces). The sound-absorbing material defines a plurality of cut-out regions therein. The sound-absorbing material is disposed over the first substrate. The cut-out regions are sized, shaped, and positioned to allow light emitted from the first light-emitting elements to pass through the sound-absorbing material.

In another aspect, embodiments of the invention feature a lighting system that includes, consists essentially of, or consists of a first substrate having first and second opposed surfaces and defining a plurality of cut-out regions therein, first and second spaced-apart power conductors disposed on the first surface of the first substrate, a plurality of first light-emitting elements disposed on the first substrate and electrically connected to the first and second power conductors by a plurality of conductive traces, a frame in which the first substrate is disposed, a diffuser suspended in or on the frame and over and spaced away from the first surface of the first substrate, and a sound-absorbing material disposed beneath the second surface of the first substrate. At least a portion of the frame protrudes beyond the first surface of the first substrate. None of the cut-out regions intersects the first and second power conductors, the plurality of first light-emitting elements, or the plurality of conductive traces.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the terms "about," "approximately," and "substantially" mean±10%, and in some embodiments, ±5%. The term "consists essentially of" means excluding other materials that contribute to function, unless otherwise defined herein. Nonetheless, such other materials may be present, collectively or individually, in trace amounts.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other. As used herein, the terms "phosphor," "wavelength-conversion material," and "light-conversion material" refer to any material that shifts the wavelength of light striking it and/or that is luminescent, fluorescent, and/or phosphorescent.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 4A-4E, 5A, and 5B are schematics of portions of a frame element in accordance with various embodiments of the invention;

FIGS. 5C and 5D are schematics of a frame element in accordance with various embodiments of the invention;

FIGS. 6 and 7A-7C are schematics of illumination systems in accordance with various embodiments of the invention;

FIGS. 7D-7F are schematics of tiled lighting panels in accordance with various embodiments of the invention;

FIG. 19E is a perspective view of a light panel or light sheet having folded peripheral portions in accordance with various embodiments of the invention;

FIG. 19F is a schematic comparison of power conductor width of folded and unfolded light sheets or light panels in accordance with various embodiments of the invention;

FIGS. 25A and 25B are a schematic plan-view and a schematic cross-sectional view, respectively, of a lighting panel in accordance with various embodiments of the invention;

FIGS. 26A and 26B are a schematic plan-view and a schematic cross-sectional view, respectively, of a lighting panel in accordance with various embodiments of the invention;

FIGS. 26E and 26F are a schematic plan-view and a schematic cross-sectional view, respectively, of a portion of a lighting panel in accordance with various embodiments of the invention;

FIGS. 27A and 27B are a schematic plan-view and a schematic cross-sectional view, respectively, of a lighting panel in accordance with various embodiments of the invention;

FIG. 28A is a schematic plan view of a lighting panel in accordance with various embodiments of the invention;

FIG. 28B is a schematic of a fastener in accordance with various embodiments of the invention;

FIG. 28C is a schematic cross-sectional view of a portion of a lighting panel in accordance with various embodiments of the invention;

FIGS. 29A-29D are schematic plan views of lighting panels in accordance with various embodiments of the invention;

FIG. 29E is a schematic plan view of a portion of a lighting panel in accordance with various embodiments of the invention;

FIGS. 30A and 30B are a schematic plan-view and a schematic cross-sectional view, respectively, of a lighting panel in accordance with various embodiments of the invention;

FIGS. 32A and 32B are schematic cross-sections of test configurations in accordance with various embodiments of the invention;

FIGS. 33A and 33B are a schematic plan-view and a schematic cross-sectional view, respectively, of a lighting panel in accordance with various embodiments of the invention;

FIGS. 34A and 34B are a schematic plan-view and a schematic cross-sectional view, respectively, of a lighting panel in accordance with various embodiments of the invention;

FIGS. 35A-35C are schematic cross-sectional views of portions of lighting panels in accordance with various embodiments of the invention;

FIGS. 35D and 35E are schematic isometric views of portions of lighting panels in accordance with various embodiments of the invention;

FIGS. 36A-36D are schematic cross-sectional views of lighting systems in accordance with various embodiments of the invention;

FIGS. 38A and 38B are a schematic plan-view and a schematic cross-sectional view, respectively, of an acoustic lighting panel in accordance with various embodiments of the invention;

FIGS. 39A and 39B are a schematic plan-view and a schematic cross-sectional view, respectively, of an acoustic lighting panel in accordance with various embodiments of the invention;

FIGS. 39F and 39G are schematic cross-sectional views of a portion of an acoustic lighting panel in accordance with various embodiments of the invention;

FIGS. 39I-39K are schematic views of strain reliefs in accordance with various embodiments of the invention;

FIGS. 40A-40E are a schematic views of acoustic lighting panels in accordance with various embodiments of the invention;

FIG. 40F is a schematic plan-view of an acoustic lighting panel in accordance with various embodiments of the invention;

FIGS. 40G and 40H are schematic cross-sectional views of lighting systems incorporating the lighting panel of FIG. 40F in accordance with various embodiments of the invention.

DETAILED DESCRIPTION

Figure 1B:
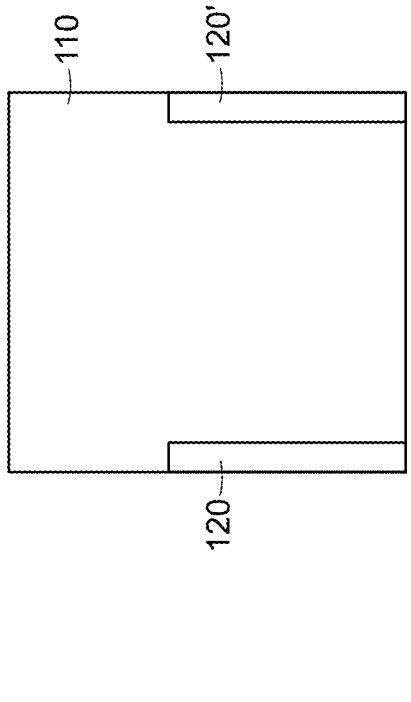
FIGS. 1A-1E are schematics of lighting panels in accordance with various embodiments of the invention.
Figure 1A:
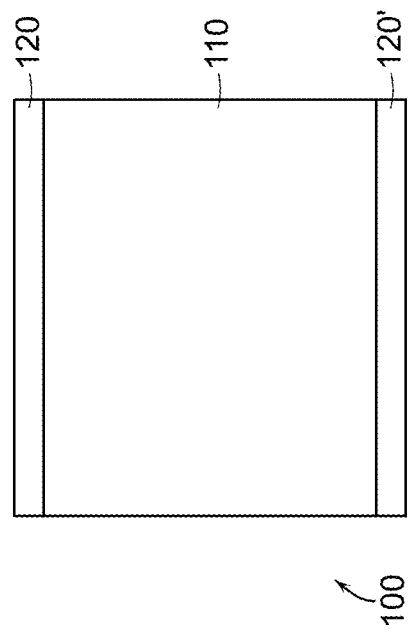

FIG. 1A depicts an exemplary lighting panel 100 in accordance with embodiments of the present invention, although alternative systems with similar functionality are also within the scope of the invention. In various embodiments, lighting panel 100 includes or consists essentially of one or more flexible light sheets 110 and optionally one or more flexible, positionable, semi-rigid, substantially rigid, or rigid frame elements 120. (FIG. 1A depicts two such frame elements, frame elements 120, 120'.) Frame elements 120, 120' may be disposed on all or portions of one or more edges of light sheet 110. While FIG. 1A shows lighting panel 100 having two frame elements 120, 120' on opposite sides of light sheet 110, this is not a limitation of the present invention, and in other embodiments lighting panel 100 may have frame elements 120 on one side of light sheet 110, three sides of light sheet 110, or four sides of light sheet 110 (i.e., one or more sides, or even all sides, of a polygonal light sheet 110). In various embodiments of the present invention lighting panel 100 may not include any frame elements. In various embodiments, one or more frame elements 120 may be disposed on a non-edge region of light sheet 110, e.g., a center portion within the edges defining light sheet 110, while in other embodiments one or more portions of a frame element 120 may be disposed such that a portion of the frame element 120 extends beyond one or more edges of light sheet 110.

Figure 1E:
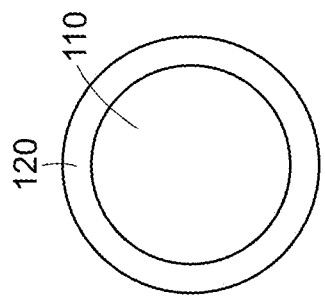
Figure 1D:
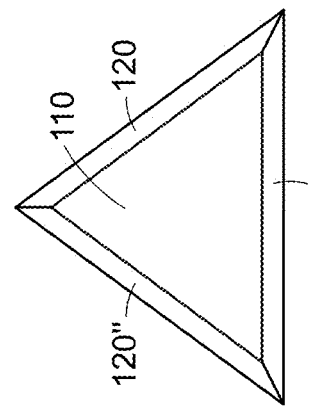
Figure 1C:
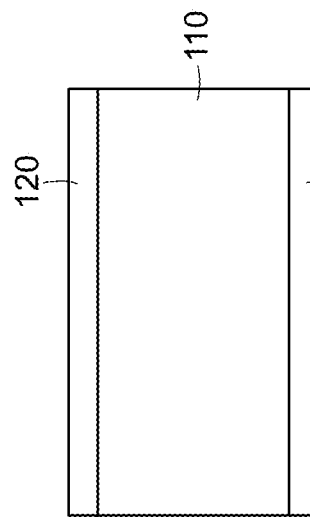

While FIG. 1A shows frame elements 120 having a length about the same as the length of the side of light sheet 110 on which they are formed, this is not a limitation of the present invention, and in other embodiments frame elements 120 may be longer or shorter than the associated dimension of light sheet 110. FIG. 1B shows an example of frame element 120 having a length shorter than the associated dimension of light sheet 110; however, in other embodiments frame element 120 may have a length longer than the associated dimension of light sheet 110. While FIGS. 1A and 1B show light sheet 110 as substantially square, this is not a limitation of the present invention, and in other embodiments light sheet 110 may be rectangular, triangular, wedge or pie-section shaped, rhombohedral, hexagonal, circular, ellipsoidal, or have any arbitrary shape. FIGS. 1C, 1D, and 1E show examples of rectangular, triangular, and circular light sheets 110 respectively.

In various embodiments, light sheet 110 includes or consists essentially of an array of light-emitting elements (LEEs) electrically coupled by conductive traces formed on a flexible substrate, for example as described in U.S. patent application Ser. No. 13/799,807, filed Mar. 13, 2013 (the '807 application), or U.S. patent application Ser. No. 13/970,027, filed Aug. 19, 2013 (the '027 application), the entire disclosure of each of which is herein hereby incorporated by reference.

In various embodiments, various elements such as frame elements, substrates, or light sheets are "flexible" in the sense of being pliant in response to a force and resilient, i.e., tending to elastically resume an original or substantially original configuration upon removal of the force. Such elements may have a radius of curvature of about 50 cm or less, or about 20 cm or less, or about 5 cm or less, or about 1 cm or less, or even about 0.5 cm or less. In various embodiments, flexible elements may have a Young's Modulus less than about $50 \times 10^9$ N/m$^2$, less than about $10 \times 10^9$ N/m$^2$, or even less than about $5 \times 10^9$ N/m$^2$. In various embodiments, flexible elements may have a Shore A hardness value less than about 100; a Shore D hardness less than about 100; and/or a Rockwell hardness less than about 150. In various embodiments, such elements may permit folding and or creasing, for example folding of the element over on itself (e.g., folding a portion of the element through substantially 180°, such that the folded portion lays on and is substantially parallel to the non-folded portion) without substantially impairing the functionality of conductive traces on the substrate and/or the functionality of the substrate. For example, in various embodiments, the functionality of the conductive trace may include a resistance or conductance value, a reliability metric, a mechanical metric, or the like. In various embodiments, the functionality of the substrate may include a resistance value, a reliability metric, a mechanical metric, or the like. In various embodiments, a folded or creased element may have a radius of curvature of less than 2 mm, or less than 1 mm or less than 0.05 mm. In various embodiments of the present invention, the elements may be folded or creased without damage or substantial damage to the elements, for example to the substrate and/or conductive trace. In various embodiments of the present invention, the elements may be folded or creased without changing or substantially changing the electrical and/or mechanical and/or thermal and/or optical properties of the elements.

In various embodiments, various elements such as substrates, light sheets, or frame elements may be positionable, in the sense that they are pliant in response to a force, as with a flexible element, but upon removal of the force, retain or substantially retain the deformed shape. In various embodiments such positionable characteristics may be achieved by plastic deformation of the element; however, this is not a limitation of the present invention, and in other embodiments the positionable characteristic may be achieved without substantial plastic deformation of the element. Such elements may have essentially any radius of curvature, but in particular may have a radius of curvature of about 50 cm or less, or about 20 cm or less, or about 5 cm or less, or about 1 cm or less, or even about 0.5 cm or less.

In various embodiments, elements such as frame elements may be rigid or substantially rigid, in the sense that they are not pliant in response to a force, i.e., tending to break or crack in response to a force. In various embodiments, various elements such as substrates, light sheets, or frame elements are semi-rigid, i.e., having a deformation characteristic between that of a flexible element and a rigid or substantially rigid element. Such elements may have a radius of curvature greater than about 50 cm.

Figure 2A:
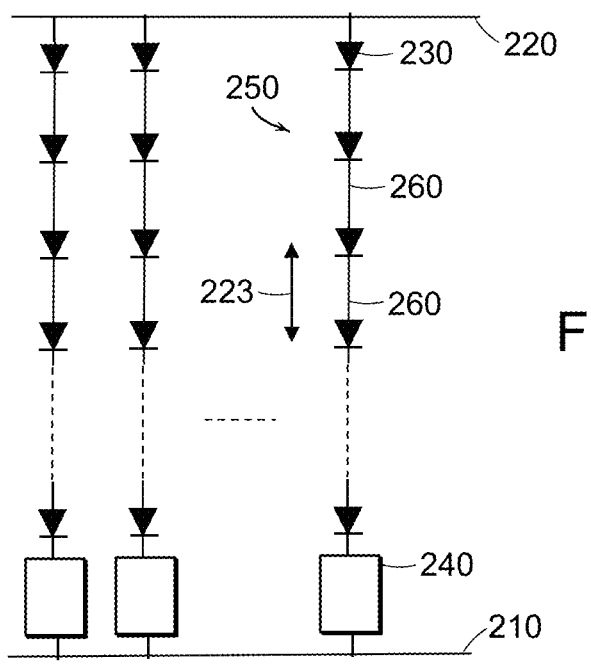
FIG. 2A is a partial circuit diagram of a light sheet in accordance with various embodiments of the invention.

FIG. 2A depicts an exemplary circuit topology, in accordance with embodiments of the present invention, which features conductive traces 260, at least two power conductors 210, 220, multiple LEEs 230, and optional control elements (CEs) 240. In various embodiments, LEEs 230 may be configured in a regular periodic array, for example a substantially square or rectangular array, where LEEs 230 are separated by pitch (or "spacing") 223 in the one direction (for example vertical direction) by pitch 225 in a substantially orthogonal direction (for example the horizontal direction; see FIG. 2C). In various embodiments, pitch 225 is the same as or substantially the same as pitch 223.

FIG. 2A shows two power conductors 210, 220, which may be used to provide power to strings 250 of LEEs 230. Each string 250 may include two or more electrically coupled LEEs 230. LEEs 230 in string 250 may be electrically coupled in series, as shown in FIG. 2A; however, this is not a limitation of the present invention, and in other embodiments other examples of electrical coupling may be utilized, for example LEEs in parallel or in any combination of series and parallel connections. FIG. 2A shows CE 240 in series with string 250; however, this is not a limitation of the present invention, and in other embodiments CE 240 may have different electrical coupling between power conductors 210, 220, or may be absent altogether. For example, in various embodiments CE 240 may be separately electrically coupled to power conductors 210, 220 and to the LEE string 250, while in other embodiments each CE 240 may be electrically coupled to two or more strings. The number of strings electrically coupled to each CE 240 is not a limitation of the present invention. Combinations of structures described herein, as well as other electrical connections, all fall within the scope of the present invention. Power conductors 210, 220 may be used to provide power to strings 250, for example AC power, DC power, or power modulated by any other means. Each control element 240 may be, for example electrically connected to at least one light-emitting string 250 and configured to utilize power supplied from the power conductors 210, 220 to control power (e.g., supply a substantially constant current) to the light-emitting string(s) 250 to which it is electrically connected.

Figure 2B:
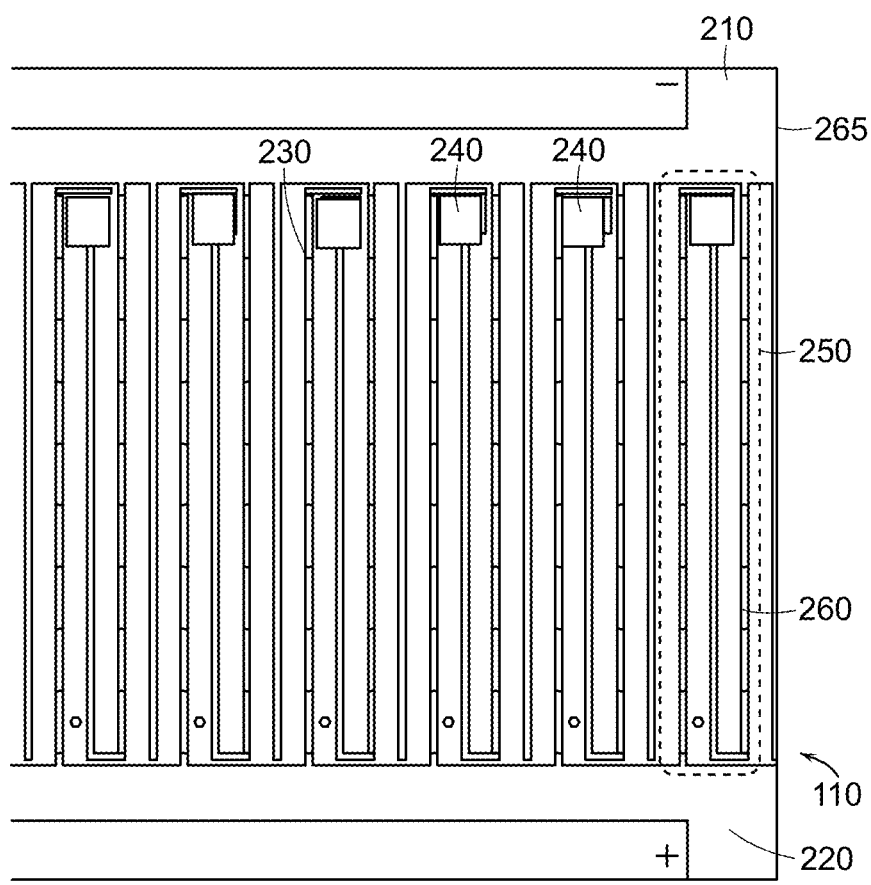
FIGS. 2B and 2C are partial schematics of light sheets in accordance with various embodiments of the invention.
Figure 2C:
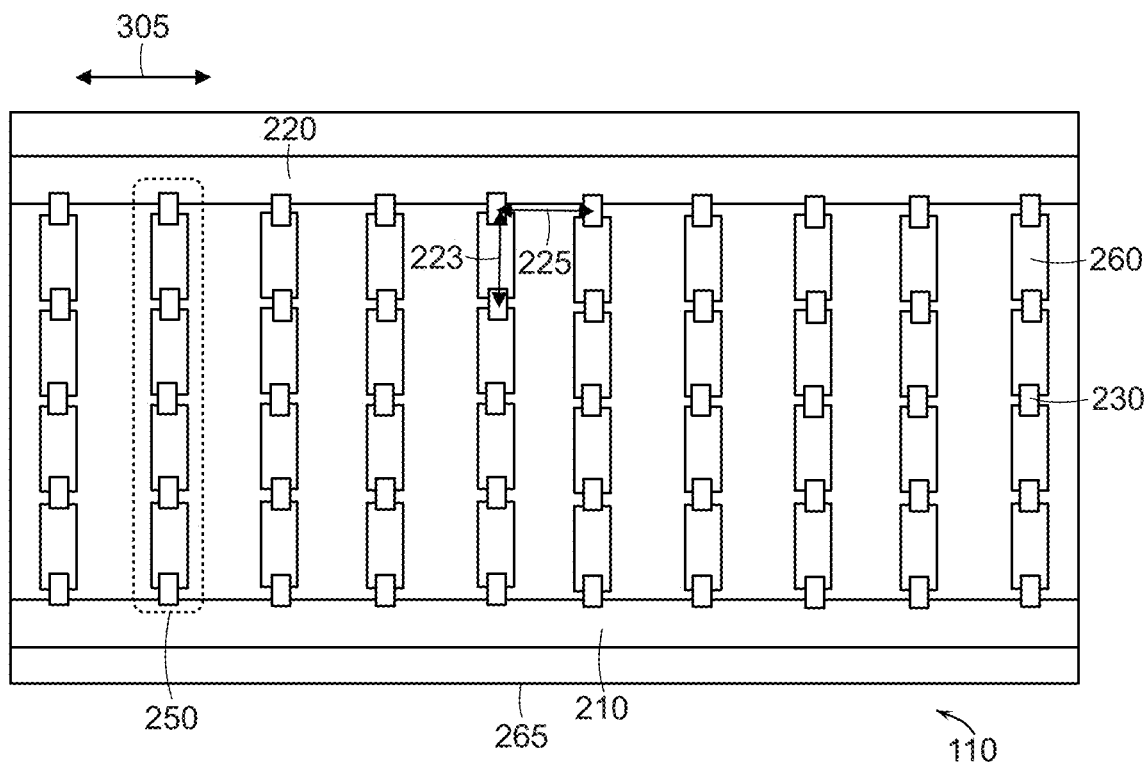

Referring to FIGS. 2B and 2C that depict schematics of exemplary light sheets 110, light sheet 110 features an array of LEEs 230 each electrically coupled between conductive traces 260, and power conductors 210 and 220 providing power to conductive traces 260 and CEs 240, all of which are disposed over a substrate 265. As utilized herein, a "wiring board" refers to a substrate for LEEs with or without additional elements such as conductive traces or CEs. A wiring board may also be referred to as a light sheet or a circuit board. FIG. 2B shows an enlarged portion of an exemplary light sheet 110. In the exemplary embodiment depicted in FIG. 2B, power conductors 210, 220 are spaced apart from each other and light-emitting strings (or simply "strings") 250 are connected in parallel across power conductors 210, 220. In various embodiments, for example as shown in FIG. 2B, strings 250 do not cross (i.e., intersect) each other. In other words, power conductors 210, 220 are oriented in one direction and strings 250 are oriented such that they span power conductors 210, 220 in a different direction. As shown in FIG. 2B, strings 250 may be substantially perpendicular to power conductors 210, 220. However, this is not a limitation of the present invention, and in other embodiments at least some segments (i.e., portions connecting two or more LEEs 230), or even the entire strings 250, may define a line (not necessarily a straight line) that is not perpendicular to power conductors 210, 220 yet is (at least for an entire string 250) not parallel to power conductors 210, 220. In other embodiments strings 250 may intersect, for example one string 250 splitting into two or more strings 250, or two or more strings 250 joining to form a reduced number of strings 250. In various embodiments, conductive traces 260 may cross over each other without being electrically coupled to each other, and in various embodiments, strings 250 may cross over or under each other without being electrically coupled to each other. In various embodiments, all or a portion of one or more strings 250 may extend beyond the area disposed between the power conductors 210, 220. Various examples of string geometries and conformations utilized in embodiments of the present invention are detailed in the '807 and '027 applications.

As shown in FIGS. 2B and 2C, LEEs 230 may be positioned across substrate 265 in a regular periodic array, although this is not a limitation of the present invention, and in other embodiments LEEs 230 may occupy any positions on light sheet 110. Power conductors 210 and 220 provide power to each LEE string, for example the string 250 encircled by the dashed line in FIG. 2B. Each LEE string 250 typically includes multiple conductive traces 260 that interconnect multiple LEEs 230, as well as one or more CEs 240, which in FIG. 2B is in series with LEEs 230. String 250 shown in FIG. 2B is a folded string, i.e., a string that has three segments electrically coupled in series but positioned as three adjacent segments. A string segment is a portion of a string spanning all or a portion of the region between power conductors (e.g., power conductors 210 and 220 in FIG. 2B). In light sheet 110, some string segments may include LEEs 230 and others may not. However, in other embodiments, the distribution and position of LEEs 230 along conductive elements 260 and string segments may be different. In various embodiments, a string 250 may be a straight string, i.e., a string with no folds, as shown in FIG. 2C. (The example shown in FIG. 2C does not include CEs 240.) In a straight string, one end of string 250 is electrically coupled to power conductor 210, while the other end of string 250 is electrically coupled to power conductor 220 with no turns or corners therebetween. As will be discussed, the number of segments in a string 250 is not a limitation of the present invention. Various examples of straight and folded strings utilized in embodiments of the present invention are detailed in the '807 and '027 applications.

FIGS. 2A and 2B illustrate three aspects of various embodiments in accordance with embodiments of the present invention. The first is the multiple strings 250 that are powered by the set of power conductors 210, 220. The second is the positional relationship between the locations of LEEs 230 and CE 240, which is disposed between the conductive traces 260 and between power conductors 210, 220. The third is the inclusion of a CE 240 in each string of series-connected LEEs 230. Combinations of these three aspects enable light sheet 110 to be economically manufactured in very long lengths, for example in a roll-to-roll process, and cut to specified lengths, forming light sheets, while maintaining the ability to tile, or place light sheets adjacent to each other (e.g., in the length direction), with no or substantially no change in pitch between LEEs 230 or in the optical characteristics across the joint between two adjacent light sheets, as discussed in more detail in the '807 and '027 applications.

In an exemplary embodiment, CE 240 is configured to regulate the current or maintain a constant or substantially constant current through LEEs 230 of string 250. For example, in various embodiments, a constant or substantially constant voltage may be applied to power conductors 210, 220, which may, under certain circumstances may have some variation, or the sum of the forward voltages of LEEs 230 in different strings may be somewhat different, for example as a result of LEE manufacturing tolerances, or the component and/or operational values of the element(s) within CE 240 may vary, for example as a result of manufacturing tolerances or changes in operating temperature, and CE 240 acts to maintain the current through LEEs 230 substantially constant in the face of these variations. In other words, in various embodiments the input to the light sheet is a constant voltage that is applied to power conductors 210, 220, and CEs 240 convert the constant voltage to a constant or substantially constant current through LEEs 230. As will be described herein, the design of CE 240 may be varied to provide different levels of control or variation of the current through LEEs 230. In various embodiments, CEs 240 may control the current through LEEs 230 to be substantially constant with a variation of less than about ±25%. In various embodiments, CEs 240 may control the current through LEEs 230 to be substantially constant with a variation of less than about ±15%. In various embodiments, CEs 240 may control the current through LEEs 230 to be substantially constant with a variation of less than about ±10%. In various embodiments, CEs 240 may control the current through LEEs 230 to be substantially constant with a variation of less than about ±5%.

In various embodiments, as described herein, CEs 240 may, in response to a control signal, act to maintain a constant or substantially constant current through LEEs 230 until instructed to change to a different constant or substantially constant current, for example by an external control signal. In various embodiments, as described herein, all CEs 240 on a sheet may act in concert, that is maintain or change the current through all associated LEEs 230; however, this is not a limitation of the present invention, and in other embodiments one or more CEs 240 may be individually controlled and/or energized.

Figure 2D:
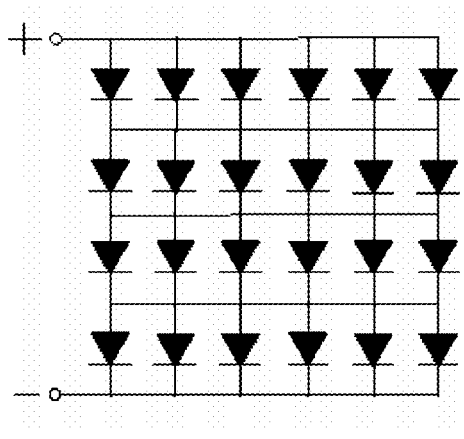
FIGS. 2D and 2E are partial circuit topologies of light sheets in accordance with various embodiments of the invention.
Figure 2E:
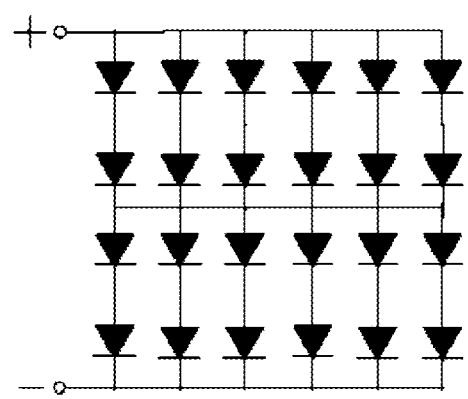

While FIG. 2A shows one exemplary circuit topology, this is not a limitation of the present invention, and in other embodiments other circuit topologies may be utilized. For example, in various embodiments the circuit may not include any CEs 240. In various embodiments of the present invention, the electrical topology may include one or more cross-connecting elements, for example which may electrically couple conductive elements in in separate strings, for example as described in U.S. patent application Ser. No. 13/378,880, filed on Dec. 16, 2011, and U.S. patent application Ser. No. 13/183,684, filed on Jul. 15, 2011, the entirety of each of which is incorporated by reference herein. FIGS. 2D and 2E show two examples of such a cross-connection topology. In the circuit shown in FIG. 2D, each LEE 230 is cross-connected with adjacent LEEs 230, while in FIG. 2E, only some of LEEs 230 are cross-connected with adjacent LEEs 230.

In various embodiments of the present invention, frame elements 120 provide a rigid or semi-rigid support for light sheet 110. In various embodiments, a frame element 120 may include or consist essentially of a plastic material, for example acrylic, acrylonitrile butadiene styrene (ABS), polyethylene, thermoplastic polyurethane (TPU), or the like. In various embodiments, frame element 120 may include or consist essentially of one or more metals, such as aluminum, copper, or the like, or silicone, wood or other materials. In various embodiments, frame element 120 may include or consist essentially of a combination of materials.

In various embodiments of the present invention, frame elements 120 provide a flexible support for light sheet 110. In various embodiments of the present invention, frame elements 120 provide a positionable support for light sheet 110.

Figure 4A:
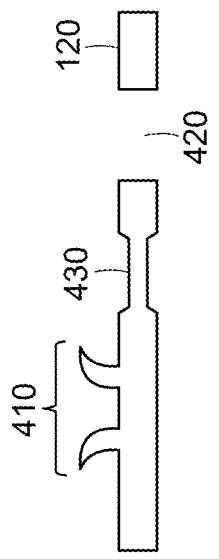
Figure 3:
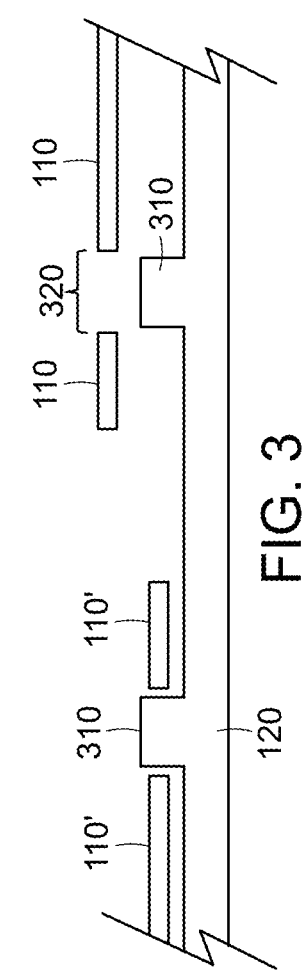
FIG. 3 is a schematic of portions of a frame element in accordance with various embodiments of the invention.

In various embodiments, light sheet 110 has one or more openings (or "holes"), for example along the edge of light sheet 110, that mate to frame element 120, and frame element 120 has one or more corresponding locating pins over which the holes are positioned, to provide accurate and repeatable positioning of light sheet 110 in frame element 120. FIG. 3 shows a schematic of one embodiment that features locating pins 310 on frame element 120 and locating holes 320 in light sheet 110. FIG. 3 shows two light sheets, 110 and 110'. Light sheet 110 is positioned above frame element 120 while light sheet 110' is positioned on frame element 120 such that locator pin 310 is at least partially inserted into locating hole 320. FIG. 3 shows one additional aspect of various embodiments of the present invention, in which a frame element 120 may be used to couple two or more light sheets 110 together into a single lighting system. While the structures shown in FIGS. 3 and 4A-4C use pins and holes to align one or more light sheets 110 to one or more frame elements 120, this is not a limitation of the present invention, and in other embodiments other techniques and/or structures may be utilized to align and/or hold light sheet 110 in frame element 120. For example, light sheet 110 may be aligned to frame element 120 using alignment marks on light sheet 110 and/or frame element 120. In various embodiments, light sheet 110 may be attached or fastened to frame element 120 by other means, for example screws, nuts and bolts, adhesive, glue, external clamps, magnets, heat stakes, or the like. For example, FIG. 4D shows a two-piece frame element 120 fastened to light sheet 110 using a clamp or spring clamp 450. FIG. 4E shows another example in which frame element 120 (having a hinge 430) is fastened to light sheet 110 using an adhesive 460. In various embodiments, adhesive 460 may include or consist essentially of glue, tape, double-sided tape, or the like. The method of attaching light sheet 110 to frame element 120 is not a limitation of the present invention.

Figure 4C:
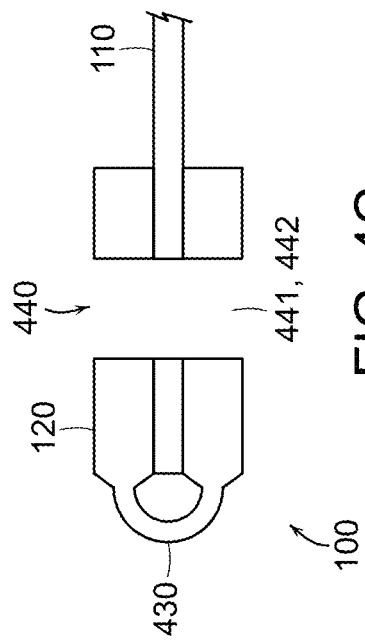
Figure 4B:
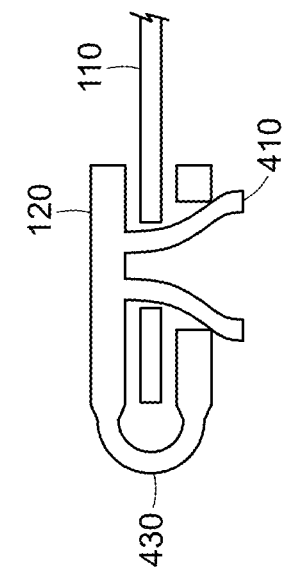

In various embodiments, frame element 120 has one or more hinges, such that the frame element 120 may be folded over and clamped to light sheet 110. In various embodiments, the locating pins in frame element 120 may act as a fastener that keeps (or helps keep) frame element 120 closed around light sheet 110. FIGS. 4A and 4B show a schematic of one embodiment of the present invention. FIG. 4A shows an unfolded frame element 120 that includes or consists essentially of a hinge 430, a locating pin 410 (that is composed of two or more protrusions), and a locating hole 420. In the depicted embodiment, locating pin 410 is designed to be compressed before being inserted through locating hole 420 and then to spring open to lock frame element 120 in the folded or closed position, as shown in FIG. 4B. In various embodiments, locating pin 410 may include or consist essentially of a snap hook instead of a compression element, as shown in FIGS. 5A (unfolded, or "open," conformation) and 5B (folded, or "closed," conformation). FIG. 4B shows light sheet 110 clamped into a folded frame element 120, where locating pin 410 has been inserted through locating hole 320 in light sheet 110 and through locating hole 420 in frame element 120. In various embodiments, frame element 120 and/or light sheet 110 may include holes that may be used for mounting frame element 120. FIG. 4C shows one example of such an embodiment, in which the light panel 100 has mounting hole 440 that goes through light sheet 110 and frame element 120. As described herein, mounting hole 440 includes or consists essentially of mounting hole 441 in frame element 120 and mounting hole 442 in light sheet 110. FIGS. 5C and 5D show schematic views of one embodiment of frame element 120 in the open and closed positions, respectively.

Figure 6:
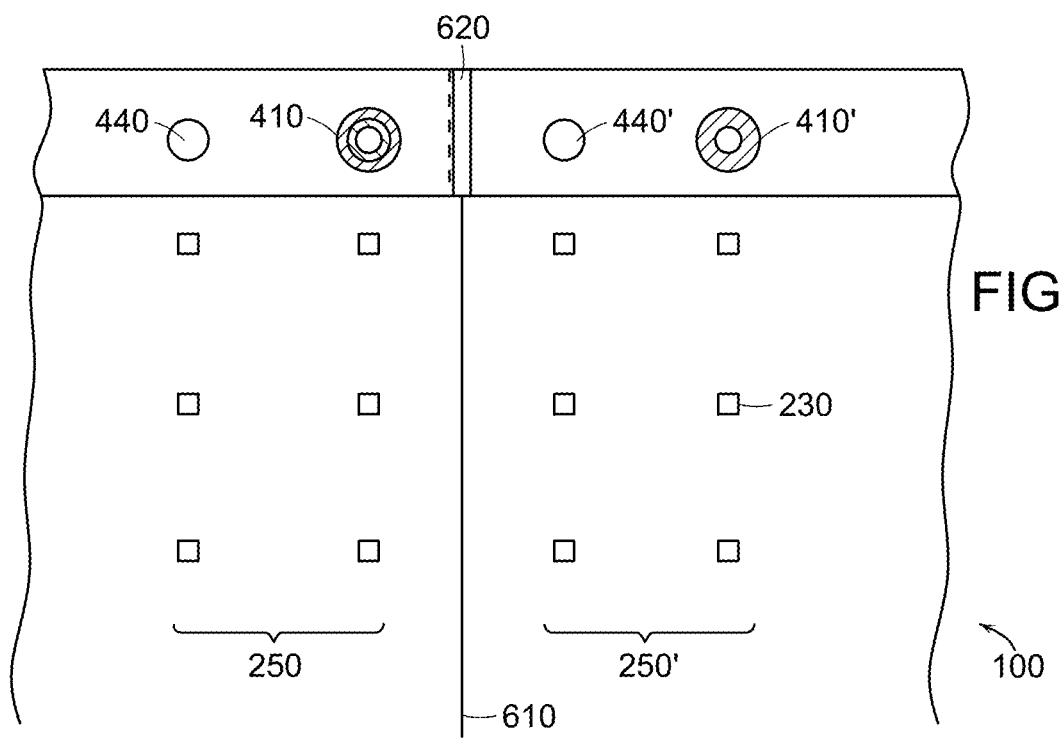

As described herein, light panel 100 may be designed to be cut to length, for example between strings 250, such that at least one and optionally both sections are operable after separation. In various embodiments, light panel 100 includes locating pins 310 and/or locating pins and holes 410, 420 and/or mounting holes 441, 442, to permit locating, clamping, and/or mounting of light panel 100 after light panel 100 (including or consisting substantially of one or more light sheets 110 and one or more frame elements 120) has been cut or separated into one or more portions. FIG. 6 shows a schematic of one embodiment showing two strings 250 and 250' and a separation or cut region 620 on frame element 120 and a separation or cut region 610 on light sheet 110. As shown, the section including string 250 also includes mounting hole 440 and locating pin/fastener 410, and the section including string 250' also includes mounting hole 440' and locating pin/fastener 410'. If lighting panel 100 is separated along cur regions 620 and 610, each section has its own mounting hole and locating pin/fastener. In various embodiments, frame element 120 and light sheet 110 are designed to facilitate separation of lighting panel 100, for example by incorporating identified separation lines or regions on frame element 120 and/or light sheet 110. For example, in various embodiments separation line 610 may be formed on light sheet 110 by printing, or by a pattern in one or more conductive elements 260 and/or one or both power conductors 210, 220. In various embodiments, cut region 610 may be free of or substantially free of conductive elements 265. In various embodiments, light sheet 110 may include a coating over all or portions of substrate 265, power conductors 210, 220 and conductive elements 265 and separation line 610 may be formed in the coating material, or by the absence of the coating material in separation region 610. In various embodiments, separation line 620 on frame element 120 may include or consist essentially of markings on frame element 120, for example that are formed in frame element 120 or printed on frame element 120. In various embodiments, separation line 620 may include or consist essentially of a region engineered to separate more easily than adjacent regions of frame element 120, for example by having a reduced thickness compared to adjacent regions of frame 120 and/or perforations defined therein. In various embodiments, light panel 100 may be separated by cutting through frame element 120 in region 620 and light sheet 110 in region 610, for example with a scissors or knife or other cutting implement. The means of separation of light panel 100 is not a limitation of the present invention.

In various embodiments, light panel 100 may be mounted (e.g., to a mounting surface such as a wall, a ceiling, or a fixture), for example using screws or nails or other fasteners that may be inserted through mounting holes 440; however, this is not a limitation of the present invention, and in other embodiments light panel 100 may be mounted by other means, for example staples, tape, double-sided tape, magnets, a hook-and-loop fastener such as Velcro, or the like. In various embodiments, frame element 120 may include or incorporate mounting elements, for example double-sided tape or barbed pins that may be used to mount light panel 100 to a mounting surface.

Figure 7A:
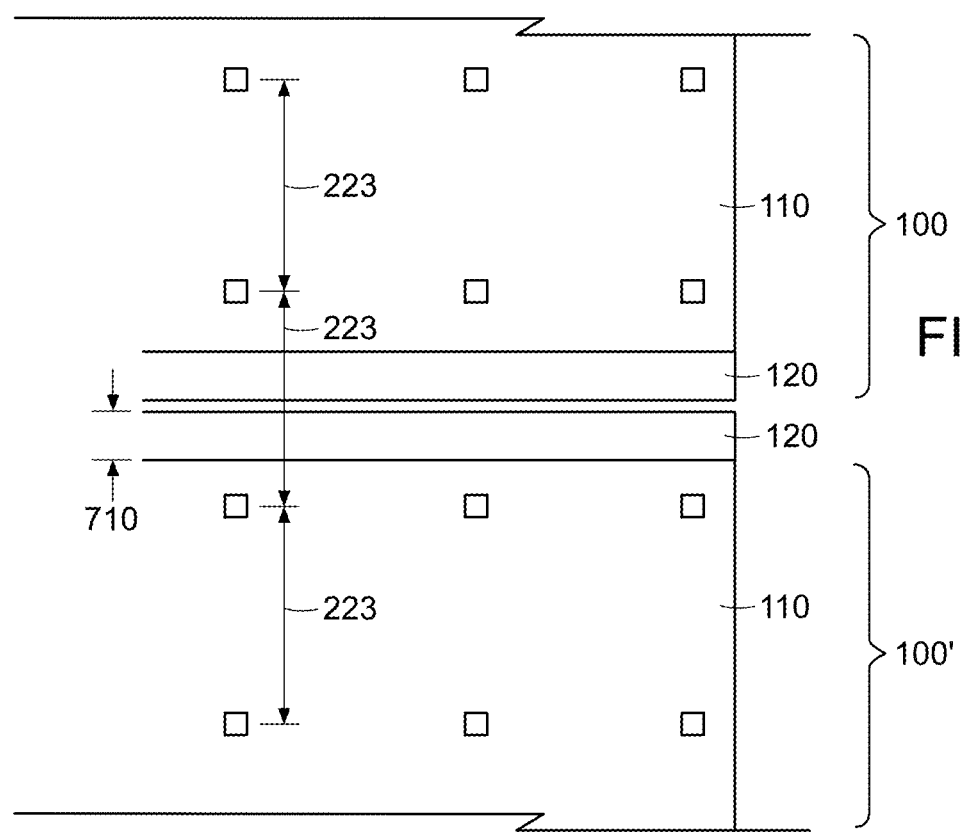

In various embodiments, frame element 120 may be designed to have a width less than one-half of the pitch between LEEs 230 in the direction between frame elements 120 of adjacent light panels 100, such that if two light panels 100 are positioned next to each other, the pitch between nearest neighbor LEEs 230 on adjacent light panels 100 may be the same or substantially the same as the pitch between nearest neighbor LEEs 230 on each light panel 100. FIG. 7A shows a schematic of one example of this embodiment, depicting two light panels 100 and 100', each featuring frame elements 120 and light sheets 110. As shown, a pitch 223 between LEEs 230 in the direction between frame elements is the same on light panels 100 and 100' as it is between LEEs 230 on adjacent light sheets 110 and separated by frame elements 120. For example, in various embodiments LEE pitch 223 may be about 30 mm and frame element 120 may have a width in the range of about 5 mm to about 14 mm. In various embodiments, the width 710 of frame element 120 may be less than about 0.95×(pitch 223/2). In various embodiments, LEE pitch 223 may be about 20 mm and frame width 710 may be in the range of about 3 mm to about 9 mm.

Figure 7B:
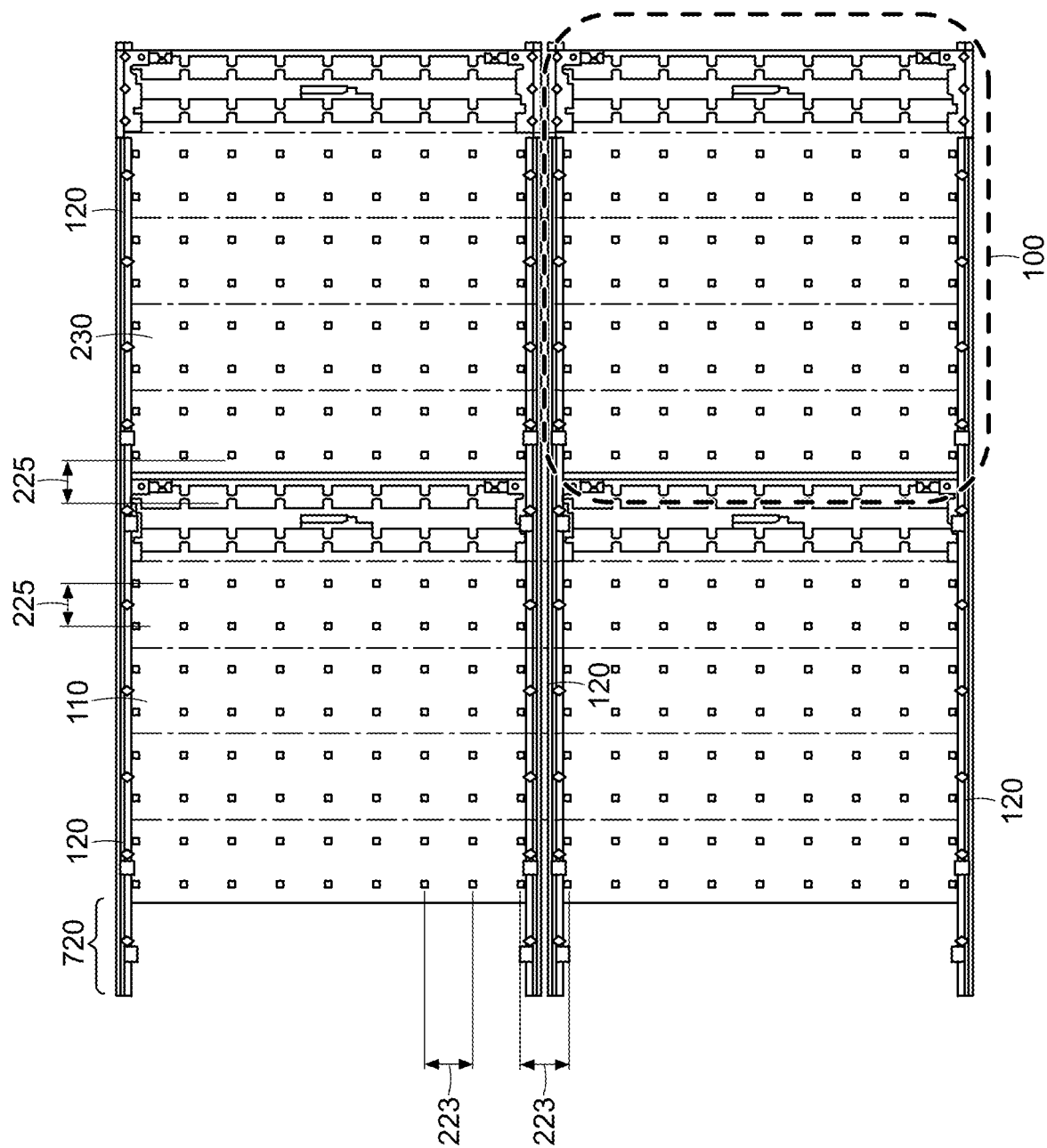

FIG. 7B shows an example featuring four light panels 100 (one panel is encircled in a heavy dashed line), each panel 100 including two frame elements 120 on opposite sides of light sheet 110. As shown, pitch 223 is the same on one sheet as it is across frame elements 120 on adjacent sheets. In this example LEE pitch 223 is about 30 mm and frame width 710 is about 10 mm.

FIG. 7B shows an additional feature that may be incorporated in various embodiments of the present invention, identified as connector 720. Connector 720 may be utilized to join together two frame elements 120. In various embodiments, connector 720 may be designed such that pitch 225 is the same between nearest-neighbor LEEs 230 on adjacent light sheets 110 as it is on a single light sheet 110. In various embodiments, connector 720 may include or consist essentially of a portion of frame element 120 that extends beyond the length of light sheet 110 and includes a mechanism for attaching to an adjacent frame element 120. For example in various embodiments, as shown in FIG. 7C, connector 720' may include a locating hole 730' in frame element 120' and that fits over a locating pin 740 on an adjacent frame element 120. In various embodiments, there may be a corresponding section 720 on the other end of frame element 120 (i.e., away from connector 720', not shown in FIG. 7C). Locating hole 730' and locating pin 740 are preferably positioned such that pitch 225 between LEEs in the direction along frame elements 120, 120' is the same between light panels 100 as on an individual light panel 100, irrespective of the interface between the light panels 100. In various embodiments, locating pin 740 may also be used to position light sheet 110, similar to the approach discussed in reference to FIG. 3. In various embodiments, connector 720 may include a conventional electrical connector, such as a pin and jack system, where adjacent light sheets 120 are electrically coupled through the electrical connector. For example, a frame element may feature a connector electrically coupled to a power conductor on the light sheet, and the connector may be electrically coupled to a corresponding connector on an adjacent frame element. In various embodiments, the electrical connectors (or electrical portions of the connector) may mate directly, while in other embodiments a jumper wire may be used to electrically couple the two connectors. In various embodiments, such a system may be employed to electrically couple two or more light panels that are spaced apart from each other.

In various embodiments, the system shown in FIG. 7B includes frame elements 120 that, when attached to light sheet 110, have a width 710 of about 10 mm. In this example light sheet 110 has a square shape with a side length of about 300 mm. LEEs 230 have a pitch 223 of about 33 mm and a pitch 225 of about 30 mm. In this example connector 720 has a length beyond light sheet 110 in the range of about 5 mm to about 30 mm. These dimensions are exemplary and not limitations of the present invention.

The ability to tile light panels 100 in multiple directions provides a system that may be utilized to make arbitrarily large assemblies having uniform illuminance with no relatively darker areas in the joint regions between adjacent panels.

While the systems described in reference to FIGS. 6 and 7A-7C pertain to rectilinear light panels, this is not a limitation of the present invention, and in other embodiments other light panel shapes may be used. For example FIG. 7D shows a light panel system incorporating triangular light panels, FIG. 7E shows a system incorporating diamond-shaped light panels, and FIG. 7F shows a system incorporating hexagonal light panels. The shapes depicted in FIGS. 7D-7F are meant to be exemplary and are not limitations of the present invention.

In various embodiments, frame elements 120 provide support for light sheets 110 and a means for providing electrical connections to light sheet 110, for example to provide power to power conductors 210, 220. In various embodiments, frame elements 120 enable electrical coupling of one or more control signals, for example to dim or change the intensity of one or more LEEs 230 on light sheet 110, or to change the color of light emitted by LEEs 230, to light sheet 110.

Figure 8A:
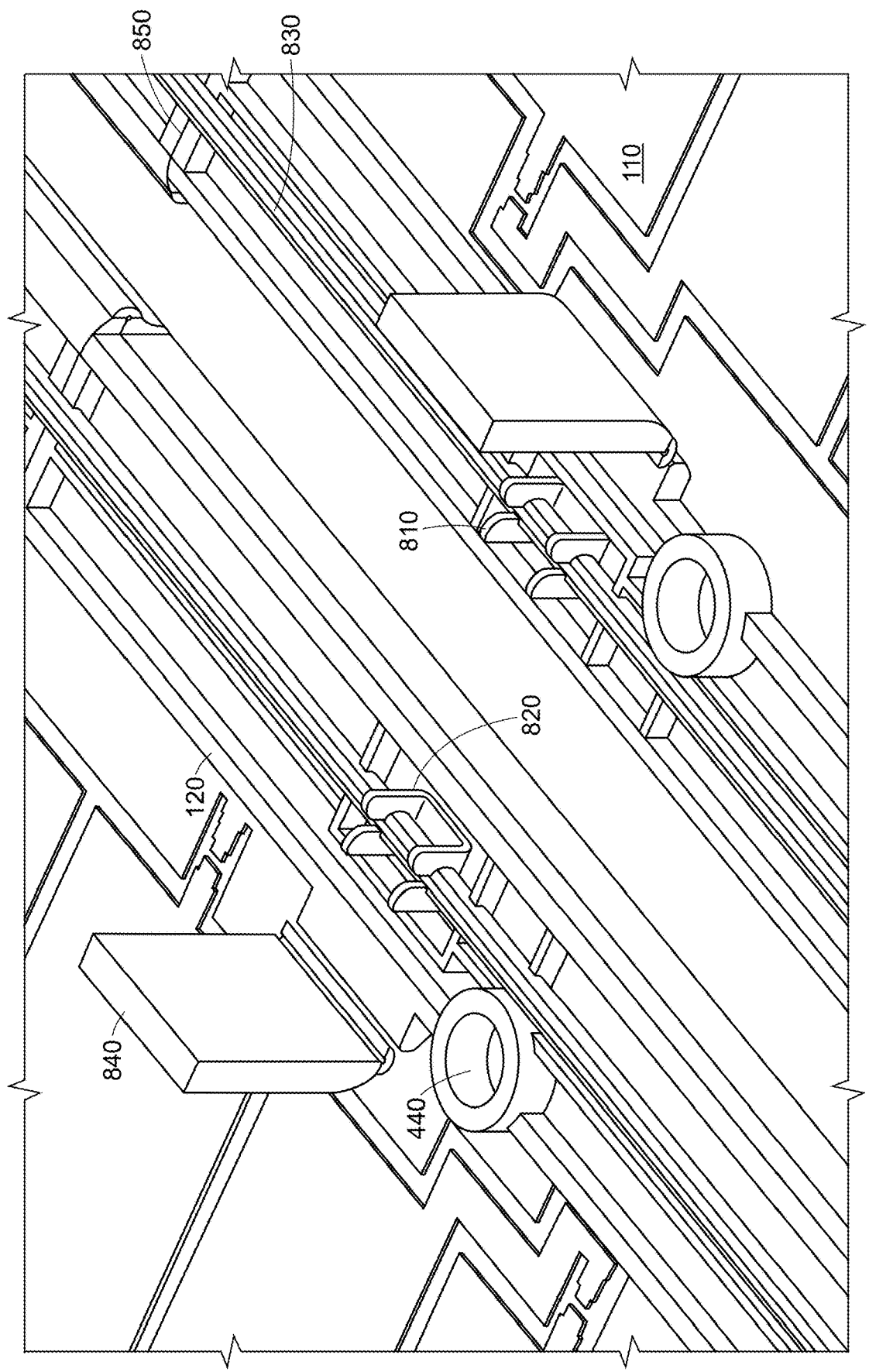
FIG. 8A is a perspective view of a frame element incorporating an insulation-displacement connector in accordance with various embodiments of the invention.
Figure 8B:
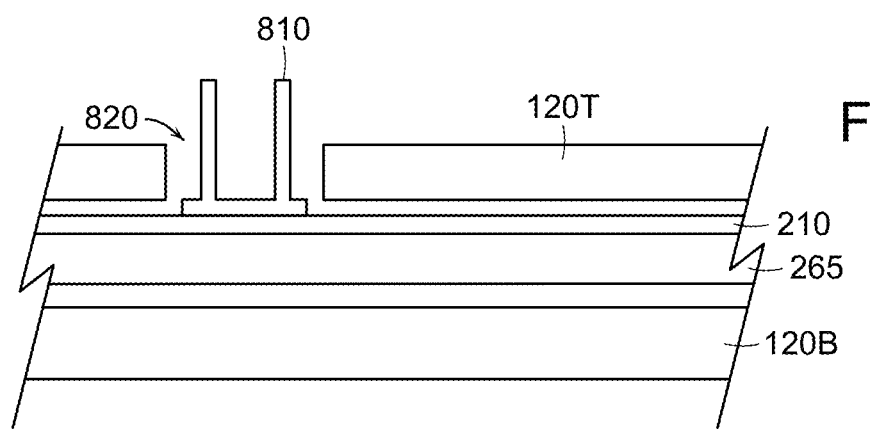
FIG. 8B is a cross-sectional view of a portion of the frame element of FIG. 8A.

FIG. 8A shows one embodiment of a frame element 120 that incorporates an insulation-displacement connector (IDC) 810 that is electrically coupled to one of power conductors 210, 220 on light sheet 110. (As utilized herein, an IDC is an electrical connector designed to be connected to the conductor(s) of an insulated wire or cable by a connection process that forces a selectively sharpened blade or blades (or other cutting or piercing element) through the insulation, bypassing the need to strip the wire of insulation before connecting.) Note that FIG. 8A shows two adjacent light panels. IDC 810 is formed or disposed into a hole in frame element 120, permitting access to it when light sheet 110 is attached to frame element 120. A wire 830, preferably an insulated wire, is inserted in IDC 810, which then provides electrical connection to power conductors 210, 220 on light sheet 110. FIG. 8B shows a cross-sectional schematic of such a structure, including a bottom portion 120B of the frame element, a top portion 120T of the frame element, and a hole 820 through which IDC 810 is inserted. IDC 810 is electrically coupled to power conductor 210, for example using solder, conductive adhesive, anisotropic conductive adhesive, or the like. Power conductor 210 is disposed on substrate 265. Referring back to FIG. 8A, after frame 120 is attached to light sheet 110, wire 830 is inserted into IDC 810 to electrically couple wire 830 to the underlying conductive element (not shown in FIG. 8A, and in FIG. 8B is exemplified by power conductor 210). Optional cap 840 may be used to aid in insertion of wire 830 into IDC 810 and/or to provide a protective cover over IDC 810. Optional guide elements 850 may be utilized to hold wire 830 into place on frame element 120. FIG. 8A also shows mounting holes 440. In the depicted embodiment, frame element 120 is installed substantially parallel to and over power conductors 210, 220 on light sheet 110.

Figure 8C:
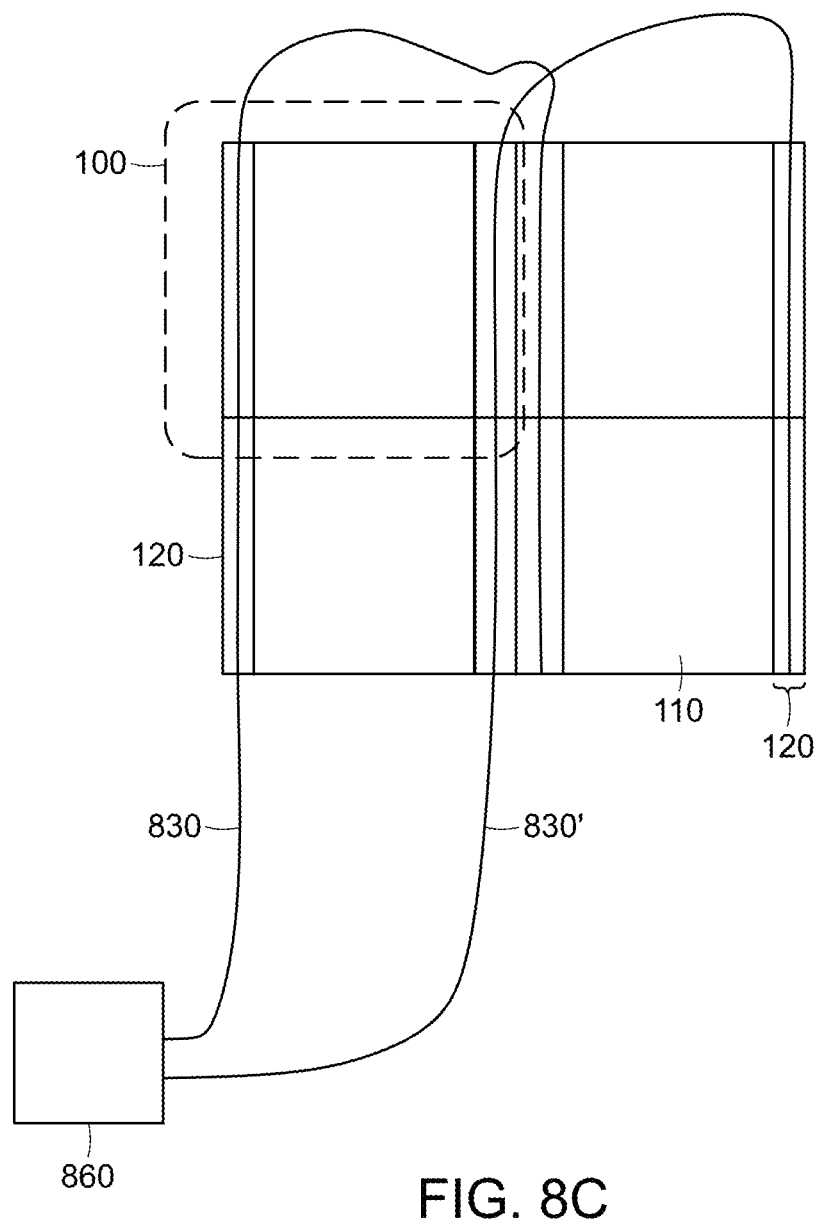
FIG. 8C is a schematic illustration of a lighting system incorporating four light panels in accordance with various embodiments of the invention.
Figure 9A:
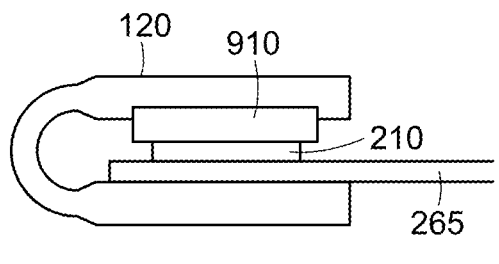
FIGS. 9A and 9B are cross-sectional schematics of conductive elements incorporated into frame elements in accordance with various embodiments of the invention.
Figure 9B:
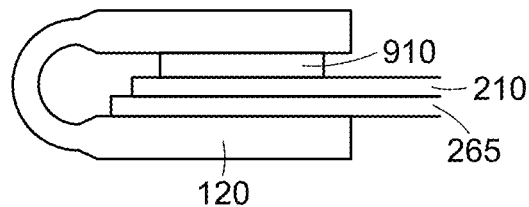

FIG. 8C shows a schematic of a lighting system incorporating four light panels 100. The lighting system is powered by a driver 860, which is electrically coupled to light panels 100 through wires 830 and 830'. In various embodiments, this and similar arrangements permit the assembly of very large lighting systems without the need for the power conductors 210, 220 to have sufficient conductivity to support the entire assembly, because wires 830, 830' have relatively larger conductivity and provide a low resistance shunt to power conductors 210, 220. In various embodiments, for example where it may be desirable to separate the light panel into smaller sections (e.g., in reference to FIG. 6), several IDCs 810 may be incorporated on light sheet 110 to permit separation into two or more portions, each of which has an IDC 810. In various embodiments, one or more electrical conductors may be incorporated into frame element 120. For example, in various embodiments, frame element 120 features a conductive element 910 that is attached to or embedded or partially embedded into frame element 120, as shown in FIG. 9A. Frame element 120 is clamped onto light sheet 110, forming an electrical and mechanical connection between conductive element 910 and power conductor 210. In various embodiments, conductive element 910 may be mounted on a surface of frame element 120, as shown in FIG. 9B. In various embodiments, conductive element 910 includes or consists essentially of one or more electrically conductive materials such as metals such as aluminum, copper, silver, gold, or the like. In various embodiments, conductive element 910 may include or consist essentially of a metal foil or metal strip. In various embodiments, conductive element 910 includes an electrically conductive tape, for example one that is conductive in both the lateral and z (i.e., through-thickness) directions, such that a low-resistance pathway forms between power conductor 210 and conductive element 910 and conductive element 910 forms a low-resistance pathway in parallel with power conductor 210. In various embodiments, conductive element 910 includes or consists essentially of a combination of materials, for example a metal layer over which is disposed a conductive adhesive or a conductive tape. In various embodiments, IDC 810 may be replaced by a pin or a barbed pin that mates with a corresponding connector or pierces a conductive element 910 mounted in frame element 120.

Figure 10A:
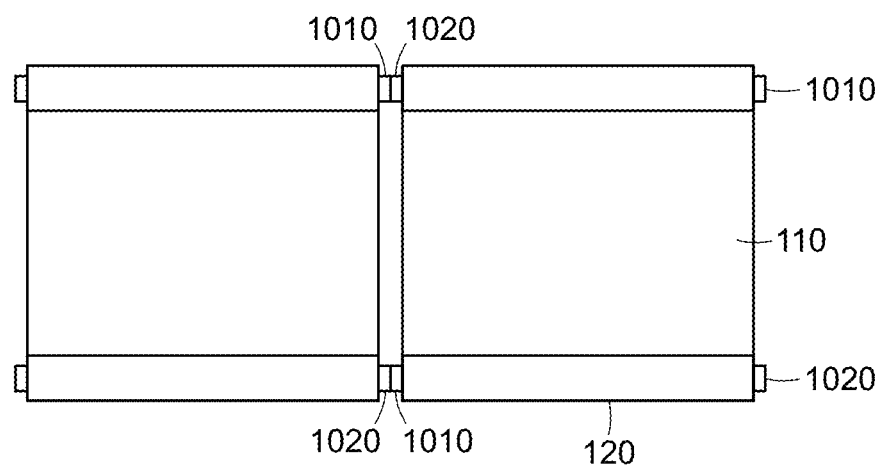
FIG. 10A is a plan-view schematic of joined light panels in accordance with various embodiments of the invention.

Electrical connection between adjacent light panels 100 and between light panels 100 and one or more power supplies or drivers may be formed through frame elements 120. In various embodiments, magnets of the appropriate polarity may be mounted or formed within or at the ends of frame elements 120, such that each frame may be mechanically and electrically connected through the magnets, for example as shown in FIG. 10A. In FIG. 10A, the opposing faces of magnets 1010 and 1020 have opposite polarities, so that the light panels may only be connected in one way. In various embodiments, this prevents incorrect connection of multiple light panels 100.

Figure 10B:
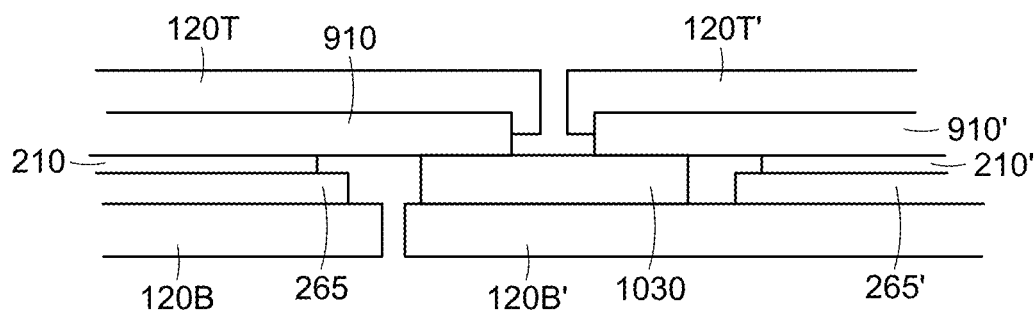
FIG. 10B is a cross-sectional schematic of joined frame elements in accordance with various embodiments of the invention.

In various embodiments, frame element 120 may include one or more connectors or mechanisms for electrical coupling. In various embodiments, conductive elements such as conductive elements 910, as shown in FIGS. 9A and 9B, may be used to electrically couple two frames. FIG. 10B shows one example featuring the joining of frames 120 and 120'. In this example, the top portion 120T of frame element 120 and conductive element 910 extend beyond the end of substrate 265. In the second frame, the bottom portion 120B' of frame element 120' and conductive element 910' extend beyond the edge of substrate 265'. Conductive elements 910 and 910' are electrically coupled through a conductive element 1030, which may be, for example, a metallic conductor or a conductive adhesive, conductive glue, or conductive tape. FIG. 10B shows one embodiment of electrically coupling light panels 100; however, this specific method is not a limitation of the present invention, and in other embodiments other methods of electrically coupling light panels 100 may be employed.

In various embodiments, wires may be soldered or otherwise electrically coupled to power conductors 210, 220, and multiple light panels 100 may be electrically coupled through standard wiring techniques, for example using connectors, wire nuts, soldering, or the like. For example, in various embodiments connectors may be formed on frame elements 120 and electrically conductive jumpers may be used to electrically couple adjacent light panels 100. While much of the discussion herein has been related to lighting systems in which the light panels are butted up next to each other, this is not a limitation of the present invention, and in other embodiments one or more light panels in a system may be spaced apart from the others. In such embodiments, relatively longer jumpers may be used to connect the light panels together.

Figure 11A:
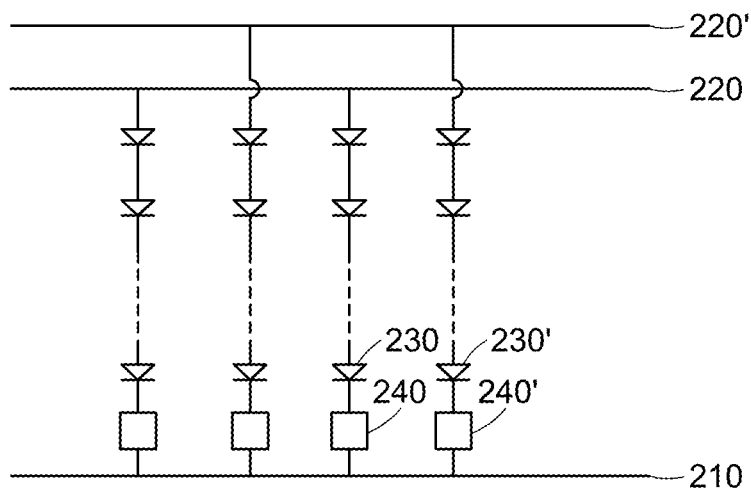
FIG. 11A is a partial circuit diagram of a portion of a system in accordance with various embodiments of the invention.

In various embodiments, a frame element 120 may include more than one conductive element 910. For example, conductive elements in frame element 120 may be used, in addition to powering light panel 100, to provide communication and control signals to and from light panel 100. In various embodiments, conductive elements in or on frame 120 may be used to provide electrical crossovers, i.e., to permit additional circuitry complexity while still using only one layer of conductive elements 260 on substrate 265. For example, FIG. 11A shows an electrical schematic of a system having two different LEEs 230, 230'. In various embodiments, LEE 230 may have a different color than LEE 230', or a different intensity, or a different light distribution pattern, or a difference in any other electrical and/or optical property. In various embodiments, LEEs 230 and 230' may both emit white light, but with different color temperatures, and the color temperature of the light panel may be adjusted by changing the light intensity emitted by strings with different color-temperature LEEs. For example in various embodiments LEEs 230 may have a correlated color temperature (CCT) of about 2000K and LEEs 230' may have a CCT of about 10,000K, and the CCT of the ensemble may be varied between about 2000K and about 10,000K by varying the power delivered to strings having LEEs 230 and 230'. In various embodiments, LEEs 230 may have a CCT of about 2700K and LEEs 230' may have a CCT of about 6000K, and the CCT of the ensemble may be varied between about 2700K and about 6000K by varying the power delivered to strings having LEEs 230 and 230'.

In various embodiments, the lighting system is driven by a substantially constant voltage supply that is pulse-width modulated, that is the voltage is kept substantially the same during the "on" phase and the light intensity is varied by changing the duty cycle, or the ratio of "on" to "off" time of the power signal. The circuit of FIG. 11A requires the power to the two different types of strings to be modulated separately, and thus requires three, or perhaps four (if separate returns are required) conductors. As shown in the schematic of FIG. 11A, this may require an electrical cross-over. While light sheets with multiple conductive layers may be manufactured, these are relatively more expensive. In various embodiments of the present invention, conductive elements within frame element 120 may form one or more electrical cross-overs, permitting circuits such as that shown in FIG. 11A to be realized with a light sheet with only one conductive layer.

Figure 11B:
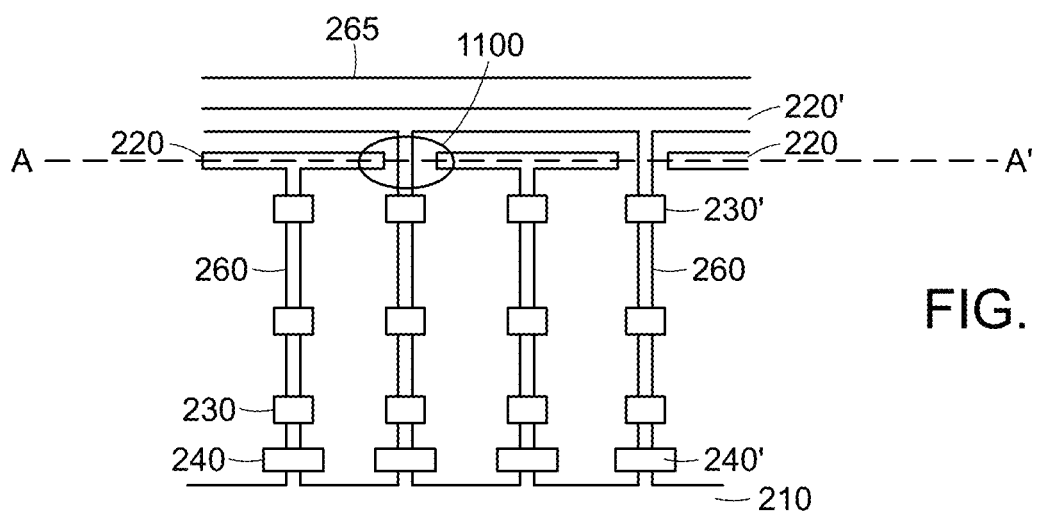
FIG. 11B is a plan-view schematic of a portion of a light sheet in accordance with various embodiments of the invention.
Figure 11C:
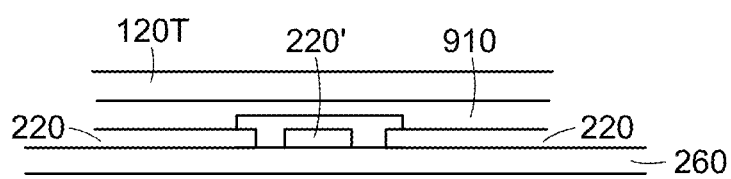
FIG. 11C is a cross-sectional schematic of the light-sheet portion of FIG. 11B.
Figure 11D:
FIG. 11D is a cross-sectional schematic of the interior of a frame element in accordance with various embodiments of the invention.

FIG. 11B shows one example of a pattern of power conductor traces for power conductors 220 and 220', that, combined with the frame element of FIG. 11C, permit realization of circuits requiring crossovers with a light sheet having a single conductive layer. FIG. 11B shows a portion of a light sheet, including substrate 265 on which power conductors 220 and 220' as well as conductive elements 260 have been formed. Conductive elements 260 electrically couple LEEs 230, such that LEEs 230' are electrically coupled to power conductor 220' and LEEs 230 are electrically coupled to power conductor 220. However, as shown in FIG. 11B, power conductor 220 is discontinuous and requires a crossover in a region 1100 to form a complete circuit. FIG. 11C shows a cross-section of the structure of FIG. 11B through cut-line A-A'. As shown in FIG. 11C, conductive element 910 associated with power conductor 220 in top frame 120T is formed such that it does not electrically couple with power conductor 220'. In various embodiments, this may be achieved by spacing conductive element 910 apart from power conductor 220', while in other embodiments an insulating layer, for example plastic or insulating tape or paper may be positioned between power conductor 220' and conductive element 910. Not shown in FIG. 11C is conductive element 910', which is associated with power conductor 220', in top frame element 120T. FIG. 11D shows a plan view of the inside of top frame element 120T, showing both conductive elements 910 and 910', where conductive element 910 has region 1100 that is designed to prevent electrical coupling to the underlying portion of power conductor 220'.

While FIGS. 11A-11D show a system having one level of cross-over, this is not a limitation of the present invention, and in other embodiments more than one level of cross-over may be utilized. In various embodiments, two levels may be utilized, with a light panel having two frame elements, with each frame element having one level of cross-over. In various embodiments, more than one level of cross-over may be utilized in a single frame element 120. It should be noted that the system shown in FIG. 11B has three LEEs 230 in each string; however, this is not a limitation of the present invention, and in other embodiments more LEEs may be utilized in each string. While FIG. 11C shows one form of cross-over, this is not a limitation of the present invention, and in other embodiments other types of cross-overs may be formed. For example, cross-overs may be formed using any of the approaches described herein for electrically coupling multiple frame elements together.

Figure 12A:
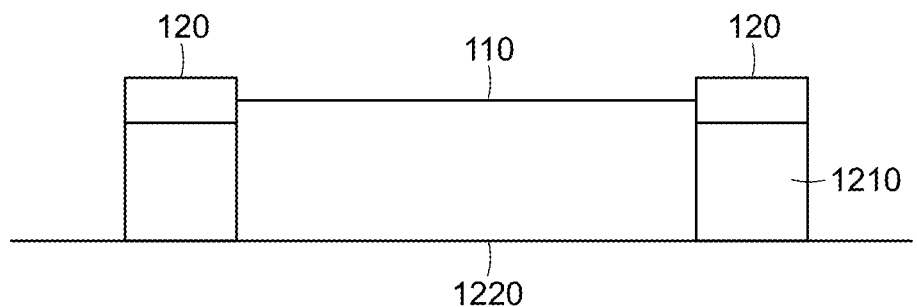
FIGS. 12A-12D are cross-sectional schematics of frame elements in accordance with various embodiments of the invention.
Figure 12B:
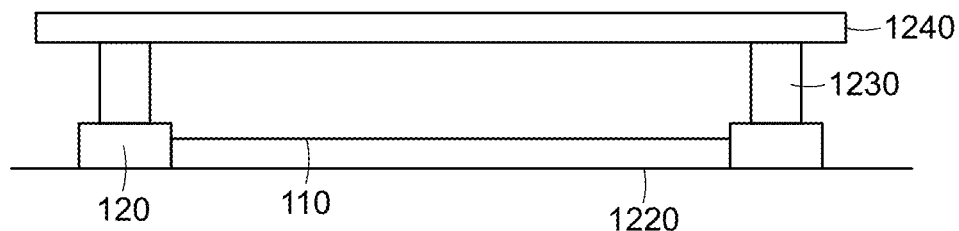
Figure 12C:
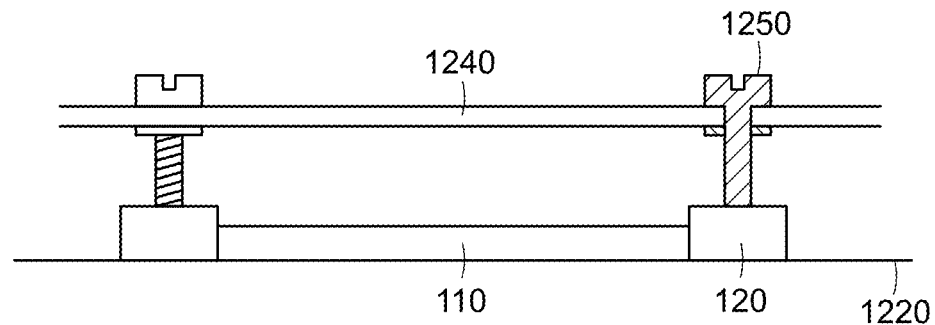

In various embodiments, additional elements may be added to frame element 120 to provide added functionality. For example, in various embodiments frame element 120 may include one or more spacers 1210 to space light panel 100 away from a mounting surface 1220, as shown in FIG. 12A. In various embodiments, frame element 120 may include spacers to aid in maintaining a specific gap between the light sheet and an overlying optic, diffuser or translucent panel, and/or graphic panel 1240. (Herein, a "graphic panel" is a panel overlying a lighting system that includes therein or thereon a pattern (e.g., words, images, graphics, etc.) for display when illuminated by the lighting system.) In various embodiments, such spacers may be fixed spacers 1230, as shown in FIG. 12B, or they may be adjustable spacers 1250, for example as shown in FIG. 12C where the spacers 1250 screw into the frame element 120, thereby controlling the offset distance. In various embodiments, diffuser 1240 may be positioned along the shaft of spacer 1250, for example by using clamps, a threaded shaft and bolts, or by other means. In various embodiments, frame element 120 may include a track or slot 1260 to hold one or more overlying panels or diffusers, as shown in FIG. 12D.

Figure 12D:
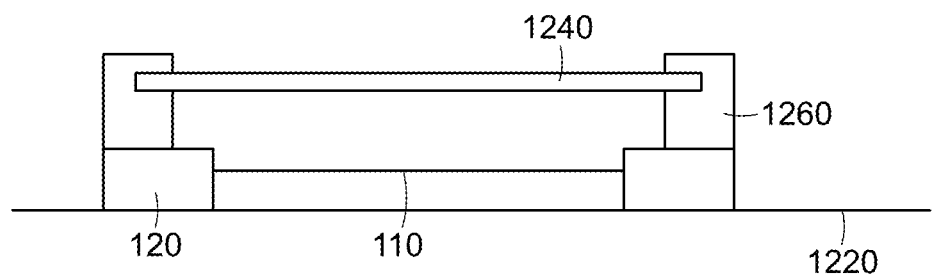

While FIGS. 12B-12D show one or more spacers 1230 attached to (or part of) frame element 120, this is not a limitation of the present invention, and in other embodiments one or more spacers 1230 may be disposed on light sheet 110, for example on light sheet 110 between LEEs 230. In various embodiments, spacers 1230 may be positioned, shaped, or constructed of one or more materials to minimize the impact of the spacer on the spatial and/or spectral light distribution. For example, in various embodiments of the present invention, a spacer or a portion of a spacer may include or consist essentially of a transparent material. In various embodiments, a spacer or a portion of a spacer may be reflective to a wavelength of light emitted by LEEs 230. For example, the spacer (or portion thereof) may have a reflectance greater than 75% to a wavelength of light emitted by LEEs 230. In various embodiments of the present invention, a spacer or a portion of the spacer may have specular reflectance or a diffuse reflectance. In various embodiments, a spacer or a portion of a spacer may have a white surface or be coated with a white material having a diffuse reflectance to a wavelength of light emitted by LEEs 230. In various embodiments, a portion of the conductive trace material may be removed from the substrate in one or more spacer regions, for example to aid in positioning of the spacer. In various embodiments, a portion of the substrate material may be removed in one or more spacer regions, for example to facilitate the mounting of the spacer to the underlying support structure.

Figure 13A:
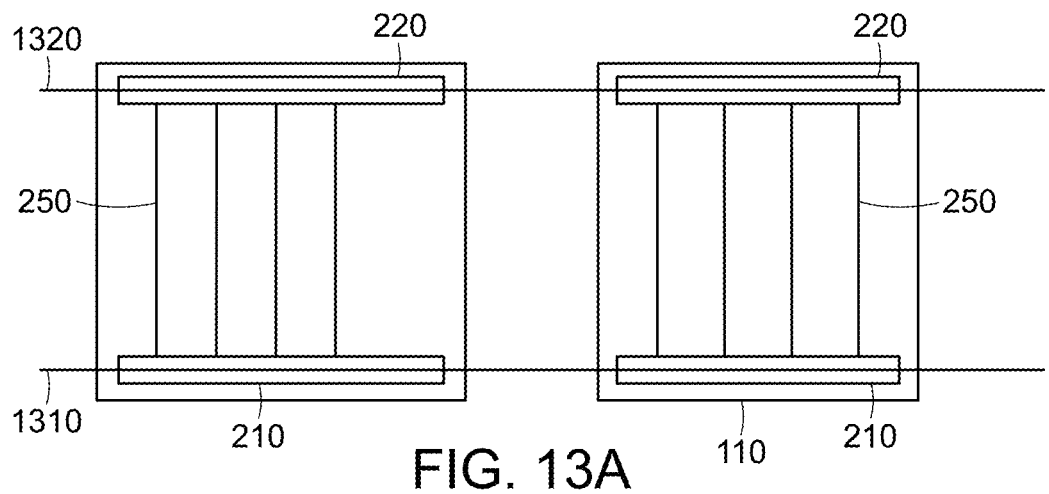
FIG. 13A is a schematic diagram of an illumination system featuring two electrically connected light sheets in accordance with various embodiments of the invention.
Figure 13B:
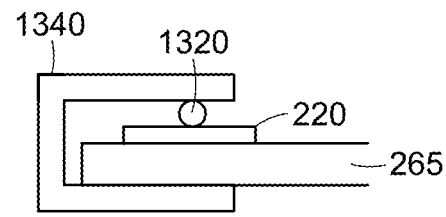
FIG. 13B is a schematic cross-section of a clamping mechanism in accordance with various embodiments of the invention.

In various embodiments, light sheets may be electrically connected together through an array of conductive elements mounted over the mounting surface. FIG. 13A shows an example of such a system that includes or consists of power elements 1310 and 1320 to which one or more light sheets 110 may be electrically coupled and mechanically attached. Power elements 1310 and 1320 may be metallic conductors, for example wires, bare wires, or bus bars, that are mounted on the mounting surface. In this approach, the layout of power elements 1310 and 1320 in part determines the position of light sheets 100, i.e., they determine the position in one direction, while the position in the orthogonal direction may be varied by moving the light sheet along the power elements. As shown in FIG. 13A, light sheets 110 may be spaced apart; however, this is not a limitation of the present invention, and in other embodiments they may be butted together to maintain LEE 230 pitch between adjacent light sheets 110. In various embodiments, light sheet 110 may be electrically and mechanically coupled to power elements 1310, 1320 by a clamp mechanism, for example a clamp 1340, as shown in FIG. 13B. Other methods for electrically coupling and mechanically attaching light sheet 110 to power elements 1310, 1320 include conductive tape, adhesive, screws, rivets, or the like. In various embodiments, a frame element may be combined with this approach to permit attachment and electrical coupling of the light panel to the power elements by an attachment in frame element 120. One aspect of this approach is that length adjustment of light sheet 110 may be accomplished by cutting the light sheet itself and mounting it to power elements that have been previously fabricated to the desired length. In various embodiments, the features described with respect to FIGS. 12A-12D may be incorporated into this embodiment featuring an array of power lines. In various embodiments, one or more signal or control lines may also be incorporated to provide a means for control and communication to one or more light panels or light sheets, or signals may be incorporated or modulated on the power supply lines.

Figure 14:
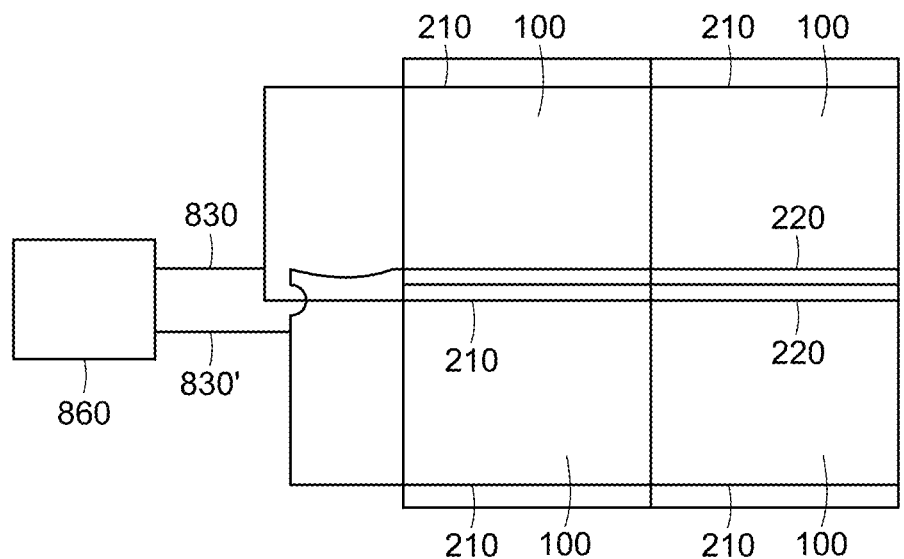
FIG. 14 is a schematic diagram of a lighting system in accordance with various embodiments of the invention.

FIG. 14 shows an example of a lighting system of the present invention, including power supply or driver 860 and four light panels 100. While four light panels are shown in FIG. 14, this is not a limitation of the present invention, and in other embodiments fewer or more light panels may be incorporated. In some embodiments, a system may include more than 20 light panels or more than 100 light panels. In various embodiments, wires 830 and 830' may be connected to the same edge of light panel 100, as shown in FIG. 14, in contrast to the wiring schematic shown in FIG. 8C. In the system of FIG. 14, each light panel 100 includes power conductors 210, 220. Power conductors 210 are electrically coupled to wire 830, while power conductors 220 are electrically coupled to wire 830. In this way, the array of light panels 100 may be energized from only one side of the array. (Not shown in FIG. 14 for clarity, but discussed herein, are optional frame 120 and electrical connections between power conductors 210, 220 on adjacent sheets.)

In various embodiments, driver 860 is a substantially constant voltage supply, the output of which is pulse-width modulated to permit dimming of LEEs 230 on light panels 100. In various embodiments, the lighting system is a UL class 2 system having an operating voltage not exceeding 60 V.

In various embodiments, light panel 100 is square, having a side dimension in the range of about 10 cm to about 100 cm. In various embodiments, LEE pitches 223 and 225 are each in the range of about 5 mm to about 50 mm.

Figure 15A:
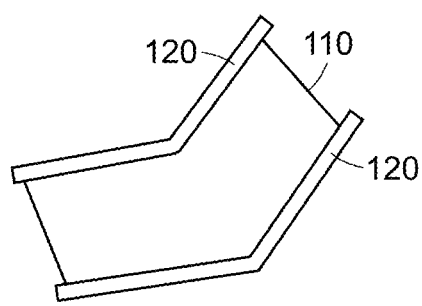
FIGS. 15A-15E are schematic diagrams of light panels in accordance with various embodiments of the invention.
Figure 15B:
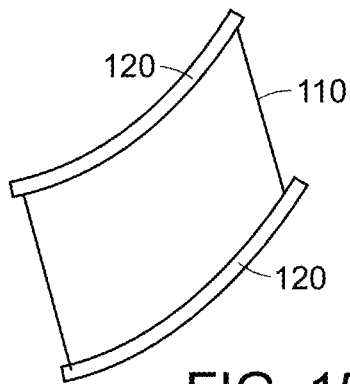
Figure 15C:
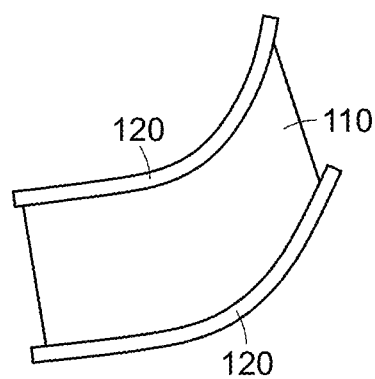
Figure 15D:
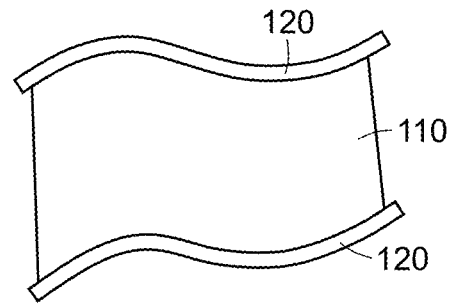
Figure 15E:
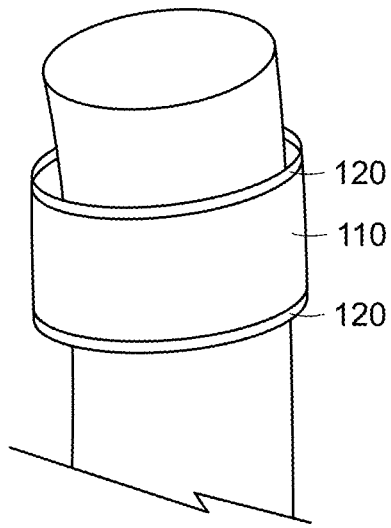

While frame elements 120 in FIGS. 5A-5D, 6, 7A, 7B, 8A, and 8C have been depicted as straight or substantially straight, this is not a limitation of the present invention, and in other embodiments frame elements may have more than one straight portions, as shown in FIG. 15A, or may be curved, as shown in FIG. 15B, or may include straight or curved elements, as shown in FIG. 15C. The shape or geometry of frame element 120 is not a limitation of the present invention. For example, the structure shown in FIG. 15B may be used to form a free-standing or partially free-standing light panel structure as shown in FIG. 15D, or may be mounted to a shaped surface having substantially the same shape as the shaped light panel, as shown in FIG. 15E. In various embodiments, structures such as those shown in FIGS. 15D and 15E may also be formed using flexible or semi-rigid light panels.

Figure 16:
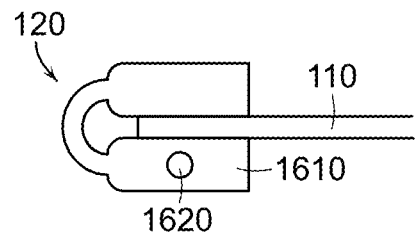
FIG. 16 is a cross-sectional schematic of a portion of a light panel in accordance with various embodiments of the invention.

In various embodiments of the present invention, the light panel may be positionable. In such embodiments, the light panel may be flexible, but when deformed, it retains the deformed position, or substantially the deformed position, after the deforming force is removed. Such embodiments may also be used to form structures such as those shown in FIGS. 15A-15E. In various embodiments, a positionable frame element 110 may include or consist essentially of a flexible material combined with a deformable but relatively inflexible material, such as a wire. FIG. 16 depicts a cross-section of an exemplary positionable frame element including a flexible body 1610 surrounding a wire or positionable element 1620; however, this is not a limitation of the present invention, and in other embodiments other means may be utilized to construct a positionable frame element or a positionable light panel.

In various embodiments of the present invention, light panel 100 may be water-resistant or waterproof. In various embodiments, light panel 100 may meet IP65, IP66, IP67, or IP68 environmental ratings. (One method for rating different levels of environmental protection is an IP rating as specified by International Protection Marking in International Electrotechnical Commission (IEC) standard 60529, providing classification of degrees of protection provided by enclosures for electrical equipment, the entirety of which is hereby incorporated by reference herein. In general for an IP XY rating, "X" indicates the level of protection for access to electrical parts and ingress to solid foreign objects, while "Y" indicates the level of protection for ingress of harmful water. For example, an IP44 rating provides access and ingress protection for objects greater than about 1 mm and protection from water splashing on the system. In another example, an IP66 rating provides a dust-tight enclosure and protection from water jets incident on the system. Specific details of the requirements and test method are detailed within the IP specification.) In various embodiments, light sheet 110 may be encased or encapsulated in a waterproof or substantially waterproof coating, for example including or consisting essentially of silicone, polyurethane, or the like, as detailed in U.S. patent application Ser. No. 14/301,859, filed on Jun. 11, 2014, the entire disclosure of which is incorporated by reference herein. In various embodiments, the coating may be a conformal coating, for example having a thickness in the range of about 20 μm to about 1000 μm. In various embodiments, light sheet 110 may be potted, encased or encapsulated in a layer of waterproof or substantially waterproof material, for example silicone or polyurethane or the like.

Figure 17A:
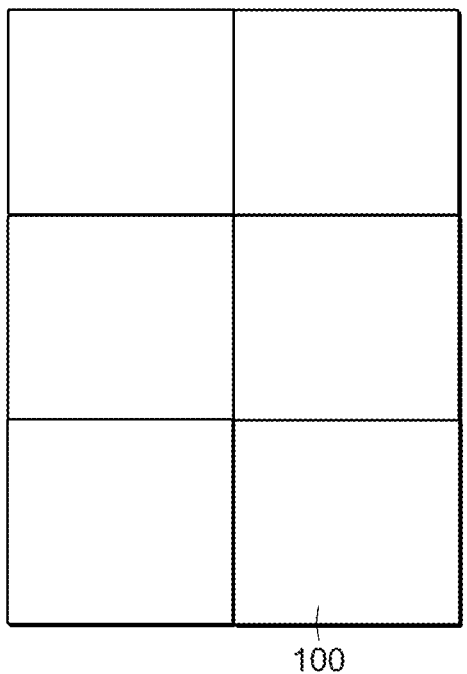
FIGS. 17A-17C are schematic plan views of lighting systems in accordance with various embodiments of the invention.
Figure 17B:
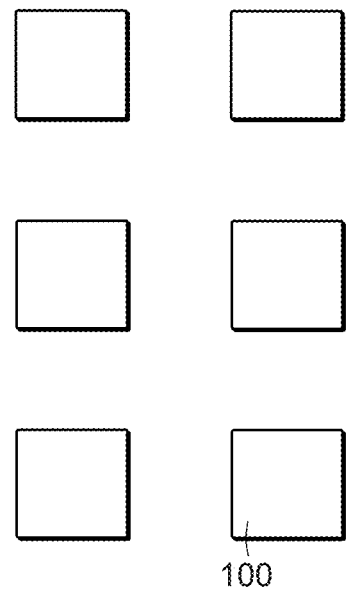
Figure 17C:
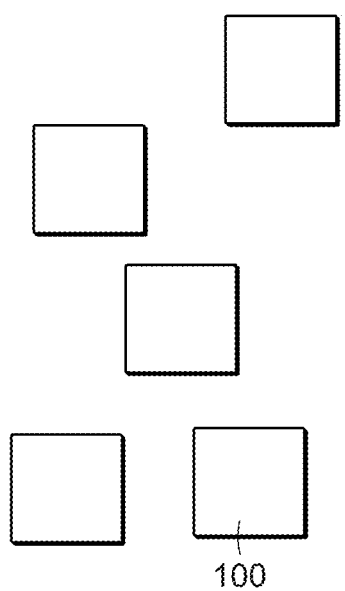

In various embodiments of the present invention, a lighting system may include or consist essentially of multiple light panels 100, as shown in FIG. 17A. FIG. 17A shows six light panels 100, arranged in a 2×3 array; however, this is not a limitation of the present invention, and in other embodiments other array geometries or layouts may be used. For example, light panels 100 in FIG. 17A are tiled together such that the edges of adjacent light panels 100 meet or are relatively close together, for example such that the LEE pitch between two adjacent light panels 100 (that is the LEE pitch that spans across the edges of two adjacent light panels 100) is the same or substantially the same as the LEE pitch within a single light panel 100. However, this is not a limitation of the present invention, and in other embodiments light panels 100 may be spaced apart, for example in a substantially regular pattern, for example as shown in FIG. 17B or in an arbitrary pattern, for example as shown in FIG. 17C. Electrical connections between light panels 100 are not shown for clarity in FIGS. 17A-17C. While FIGS. 17A-17C depict light panels 100, this is not a limitation of the present invention, and in other embodiments similar configurations may be formed using light sheets 110.

Figure 18A:
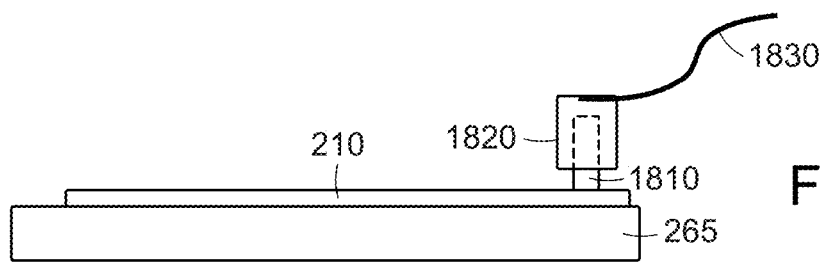
FIGS. 18A-18D are cross-sectional schematics of light panels or light sheets incorporating electrical connectors in accordance with various embodiments of the invention.
Figure 18B:
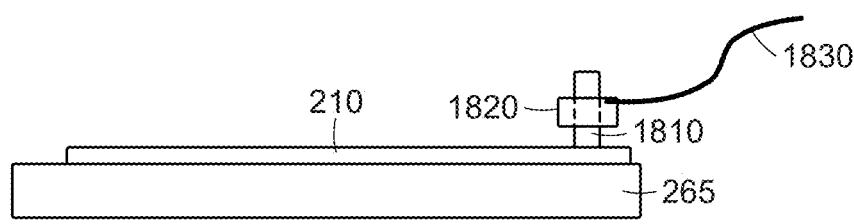

In various embodiments of the present invention, the means for electrical coupling to or between light panels 100 or light sheets 110 may include or consist essentially of a vertical connector, in which the connection mechanism is activated or deactivated by movement of at least one connector component in a direction substantially perpendicular to the surface of the light panel in the region of the connector. FIG. 18A shows one embodiment of a vertical connector that includes or consists essentially of a pin 1810 that mates with a socket 1820. In various embodiments of the present invention, pin 1810 is electrically coupled and/or mounted on conductive trace 210. Wire 1830 is electrically coupled to socket 1820 and may be used to provide electrical coupling (i.e., provide electrical power and/or communication and/or control signals) through socket 1820 and pin 1810 to one or more conductive traces 210 disposed over substrate 265. FIG. 18B shows another embodiment of the present invention in which the vertical socket 1820 fits over pin 1810 and a portion of pin 1810 protrudes through and is visible over the socket 1820 when the socket 1820 is in place. Such connectors may include, for example the 400 series connectors available from Bender & Wirth GmbH & Co of Kierspe, Germany.

Figure 18C:
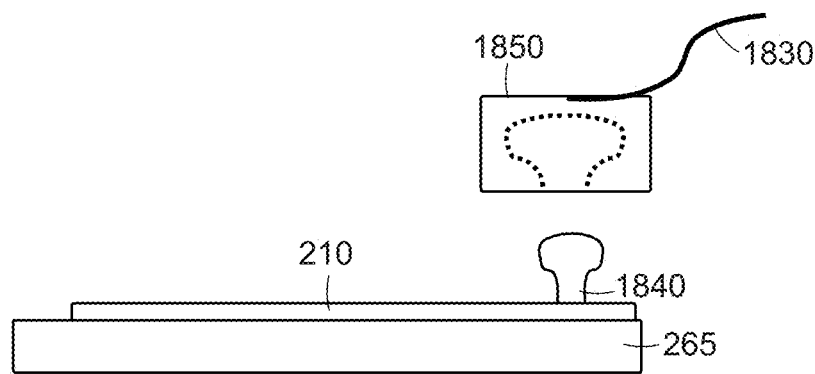
Figure 18D:
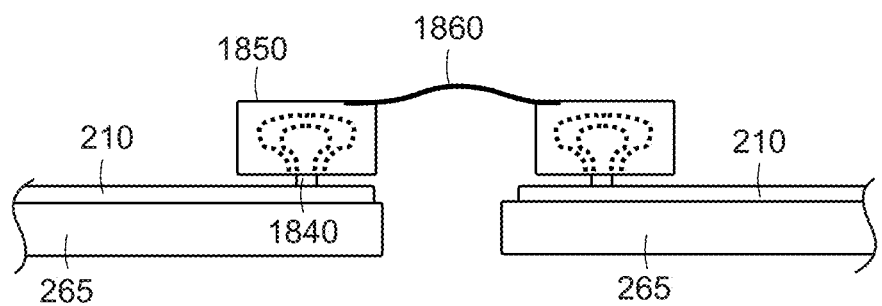

FIG. 18C shows another embodiment of the present invention that features a snap connector including or consisting essentially of at least two parts, identified in FIG. 18C as a button 1840 and a button socket 1850. Button 1840 and button socket 1850 are shown as disengaged in FIG. 18C and engaged in FIG. 18D. In some embodiments of the present invention, button 1840 is electrically coupled and/or mounted on a conductive trace 210. As with the vertical connector shown in FIG. 18A, button socket 1850 may be electrically coupled to one or more wires 1830. In various embodiments, light panels may be electrically coupled by a jumper 1860 between two connectors, as shown in FIG. 18D.

Figure 18E:
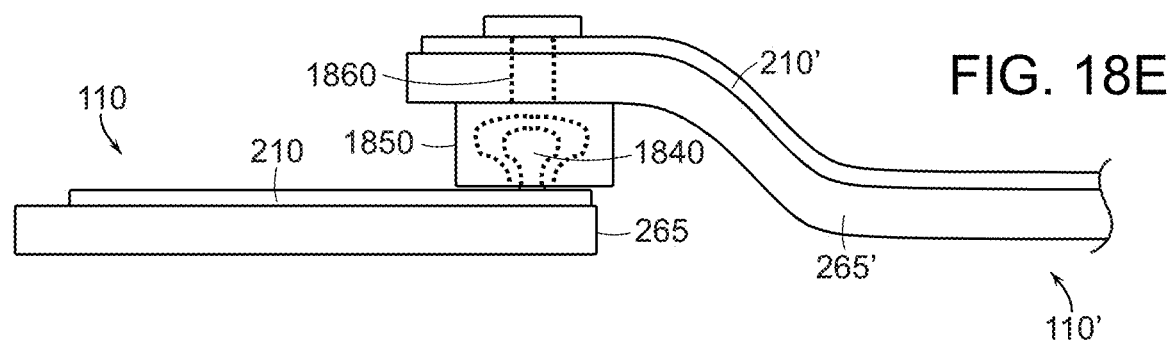
FIGS. 18E and 18F are cross-sectional schematics of light panels or light sheets joined via electrical connectors in accordance with various embodiments of the invention.
Figure 18F:
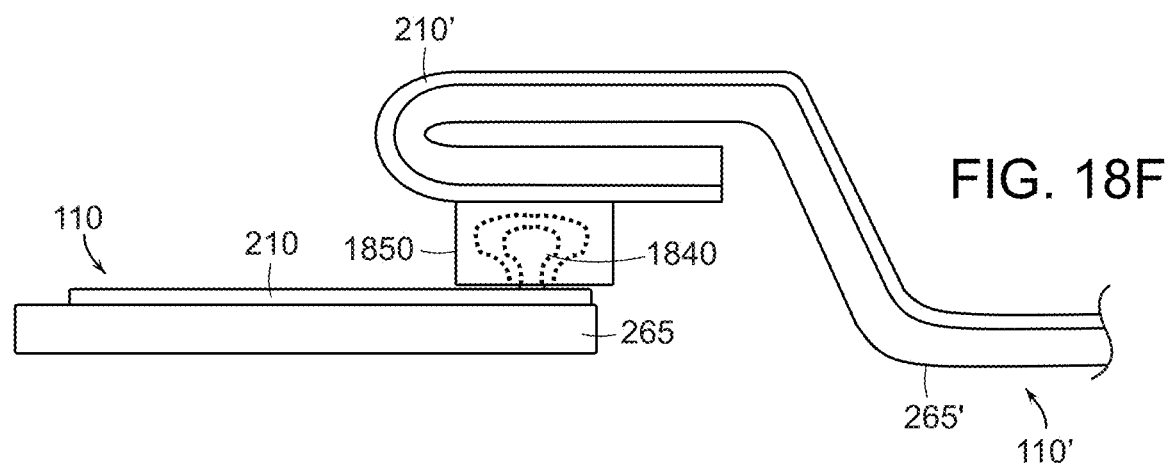

In various embodiments of the present invention, button socket 1850 may be mounted on or to one light sheet 110, and button 1840 may be mounted on or to a second light sheet 110', permitting direct connection between two light panels, as shown in FIG. 18E. In various embodiments of the present invention, button 1840 and button socket 1850 may be formed on opposite sides of the two light sheets, for example either the button 1840 or button socket 1850 may be mounted on the front surface of one light sheet while the mating connector may be mounted on the back surface of a second light sheet. For example, in the structure shown in FIG. 18E, button 1840 is mounted on the front side of light sheet 110 and button socket 1850 is mounted on the back side of light sheet 110'. As shown in FIG. 18E, a via 1860 electrically couples button socket 1850 to conductive trace 210' through substrate 265'. In various embodiments of the present invention, via 1860 may include or consist essentially of a rivet, a staple, a crimp or piercing connector, or the like. In various embodiments of the present invention, button 1840 and button socket 1850 may be formed on the same side of the light sheet; for example, as shown in FIG. 18F, button 1840 and button socket 1850 are formed on the same side (e.g., front side) of light sheets 110 and 110', and a portion of light panel 110' is folded over to facilitate connection of button socket 1850 to button 1840.

Figure 18G:
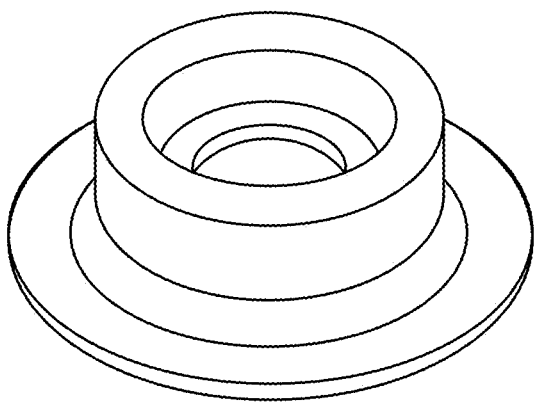
FIGS. 18G and 18H are views of electrical connectors in accordance with various embodiments of the invention.
Figure 18H:
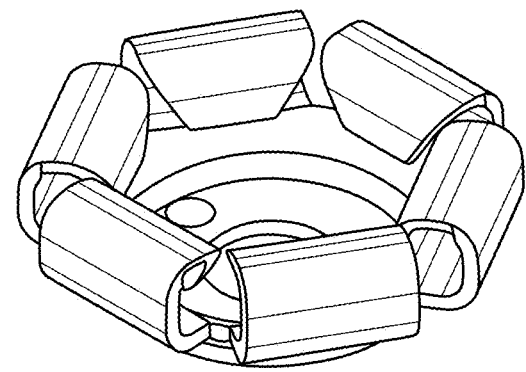

In various embodiments of the present invention, the snap connector may include or consist essentially of a 9V battery connector. 9V battery connectors have male and female components, as shown in FIGS. 18G and 18H respectively.

In various embodiments of the present invention, the snap connectors may be electrically coupled to conductive trace 210 and/or mechanically coupled to conductive trace 210 and/or substrate 265 using a variety of means, for example solder, conductive adhesive, anisotropic conductive adhesive, eyelets, rivets, crimp connectors, piercing connectors, or the like. The method of attachment of the snap connectors to a light sheet or light panel is not a limitation of the present invention.

Figure 19A:
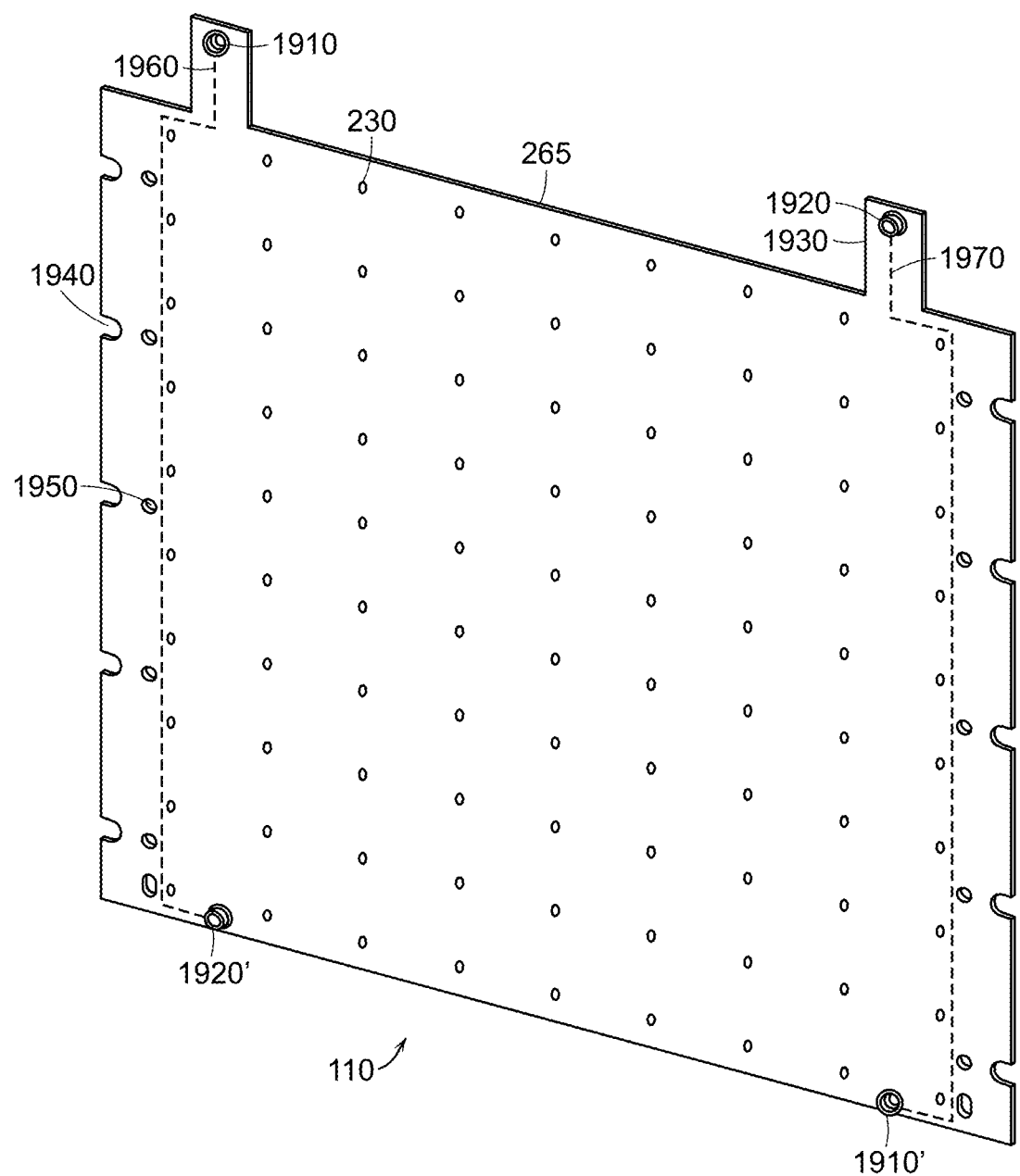
FIG. 19A is a perspective view of a light panel or light sheet incorporating tabs and electrical connectors in accordance with various embodiments of the invention.

FIG. 19A shows one embodiment of a light sheet 110 that features LEEs 230 and connectors 1910, 1910', 1920, and 1920' disposed on substrate 265. Conductive traces providing electrical coupling between LEEs 230 and current control elements and power conductors 1960 and 1970 are not shown for clarity in FIG. 19A. In various embodiments of the present invention, connectors 1910, 1910', 1920, and 1920' may include, consist essentially of, or consist of vertical connectors or snap connectors; however, this is not a limitation of the present invention and in other embodiments other forms of connectors may be used. In various embodiments of the present invention, connectors 1910 and 1910' may include or consist essentially of female 9V battery connectors as shown in FIG. 18H, and connectors 1920 and 1920' may include or consist essentially of male 9V battery connectors as shown in FIG. 18G. In the embodiment shown in FIG. 19A, the connectors are all disposed on the same side of light sheet 110; however, this is not a limitation of the present invention, and in other embodiments various connectors may be formed on different sides of light sheet 110, for example as discussed in reference to FIG. 18E.

In various embodiments, the connectors may be used to provide power to the light sheet. For example, in various embodiments of the present invention, power to light sheet 110 may be provided through connectors 1910' and 1920'. For example, in various embodiments, connector 1910' may be used for the positive power supply connection and connector 1920' may be used for the negative or ground power supply connection; however, this is not a limitation of the present invention, and in other embodiments other configurations for powering the light sheet may be utilized.

In various embodiments of the present invention, for example as shown in FIG. 19A, connectors 1920' and 1910 may be electrically coupled together by an electrical trace 1960 (shown in FIG. 19A as a dashed line), and connectors 1910' and 1920 may be electrically coupled together by a conductive trace 1970 (shown in FIG. 19A as a dashed line). In various embodiments of the present invention, multiple light sheets 110 may be electrically coupled together, for example by connecting connector 1910 on a first light sheet to connector 1920' on a second light sheet and by connecting connector 1920 on a first light sheet to connector 1910' on a second light sheet.

Figure 19B:
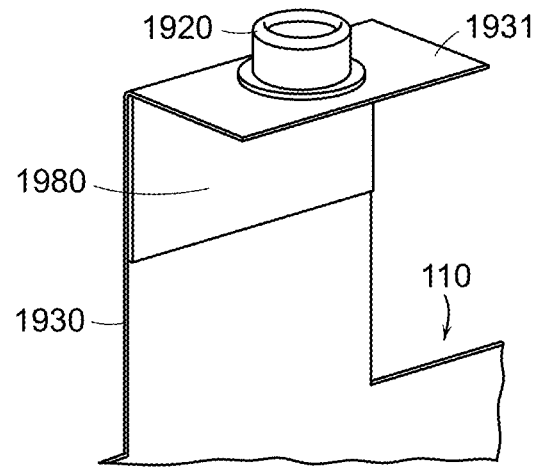
FIGS. 19B-19D are magnified views of portions of light panels or light sheets that are folded and feature electrical connectors in accordance with various embodiments of the invention.
Figure 19C:
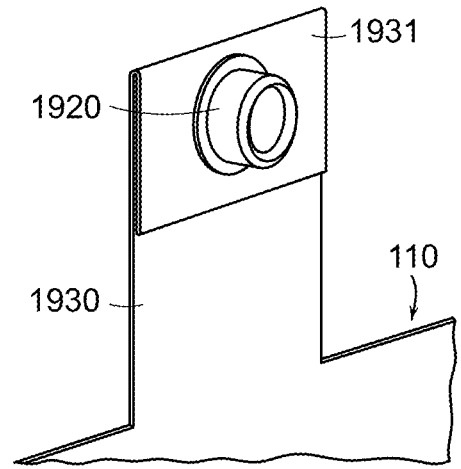
Figure 19D:
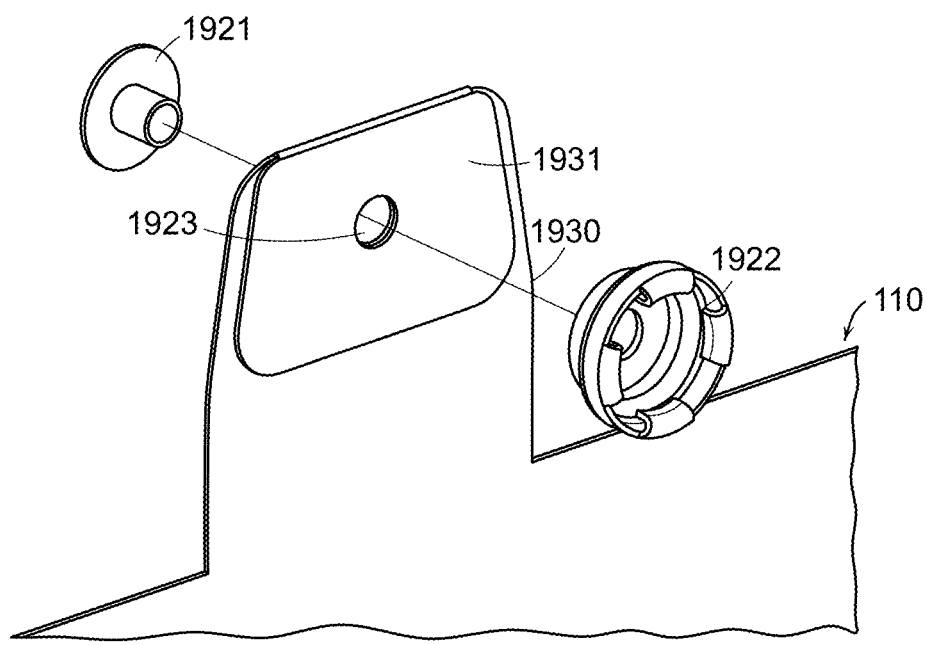

In various embodiments of the present invention, one or more connectors may be positioned on a tab extending out from the main portion of the light sheet, for example tab 1930 as shown in FIG. 19A. In various embodiments of the present invention, a portion of tab 1930 may be folded over (see, e.g., folded portion 1931 in FIG. 19B), for example as discussed in reference to FIG. 18F, to facilitate connection to another light sheet. FIG. 19B shows a schematic of a portion of a tab 1930 containing connector 1920 disposed on a partially folded-over portion 1931, while FIG. 19C shows a schematic of a portion of tab 1930 containing connector 1920 in a completely or substantially completely folded-over position. In various embodiments of the present invention, the folded-over portion may be held in place by an adhesive, glue, tape or the like, for example adhesive 1980 in FIG. 19B. In various embodiments of the present invention, a portion of connector 1920 may extend through a portion of folded portion 1931 or portions of both tab 1930 and folded portion 1931. FIG. 19D shows an example of an embodiment of the present invention featuring light sheet 110 having a tab 1930 with a portion 1931 folded over prior to the connector being disposed on the sheet. In this example, the connector includes or consists essentially of two parts, identified as a back connector part 1921 and a front connector part 1922, which are mated through a hole 1923. In this example, hole 1923 is formed through both tab 1930 and the folded over portion of tab 1931 prior to completing formation of the connector. However, this is not a limitation of the present invention, and in other embodiments, one or both of back connector part 1921 and front connector part 1922 may pierce or otherwise form a hole in tab 1930 and/or folded portion of the tab 1931 during placement of the connector. In the example shown in FIG. 19D, mating of back connector part 1921 and front connector part 1922 may include mechanically bringing the two parts together and deforming a portion of one or both connector parts to bind the two portions together. The structure of the connector and/or the method of forming a connector from two or more connector parts are not limitations of the present invention.

Figure 19G:
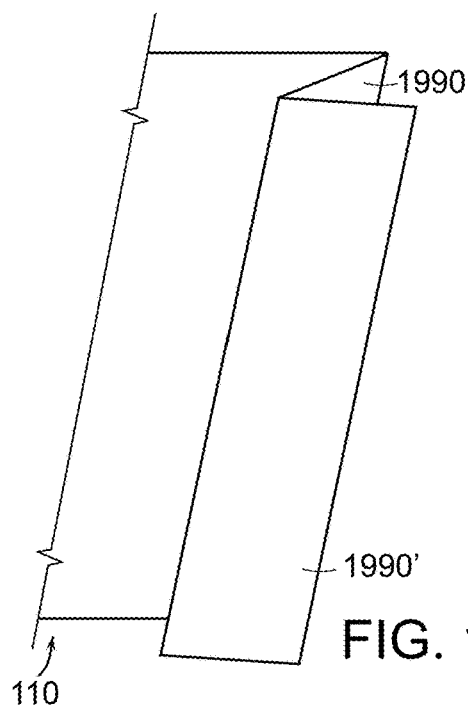
FIG. 19G is a schematic of a portion of a light sheet or light panel incorporating multiple folds in accordance with various embodiments of the invention.
Figure 19I:
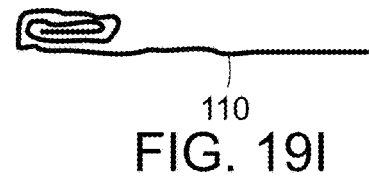
FIG. 19I is a schematic of a portion of a light sheet or light panel incorporating multiple folds in accordance with various embodiments of the invention.

In various embodiments of the present invention, a folded portion 1990 of the light sheet may be folded over, for example as shown in FIG. 19E. In various embodiments, all or a portion of power conductor 210 or 220, for example as shown in FIG. 2C, may be disposed on or in the folded portion 1990. In various embodiments, the placement of all or a portion of power conductor 210 or 220 on folded portion 1990 may be used to decrease the resistance per unit length of the power conductor, for a given width light sheet, by increasing the effective width of power conductor 210 or 220. As shown in FIG. 19E, light sheet 100 has a width 1992, not including folded portions 1990. Folded portions 1990 each have a width 1997. FIG. 19F shows a detailed schematic of a portion of light sheet 110, showing a comparison of light sheet 110 with and without a folded portion 1990. Light sheet 110 without folded portion 1990 has power conductor 210 having a width 1994. Light sheet 110 with folded portion 1990 has power conductor 210' having an additional width 1996, for a total width equal to the sum of width 1994 and width 1996. For a power conductor 210 having a substantially constant thickness and resistivity, the resistance per unit length is inversely proportional to the width of power conductor 210. For the example shown in FIG. 19E, the conductance of power conductor 210' (including portions 1994 and 1996) is (1994+1996)/1994 times that of power conductor 210 (having width 1994). In various embodiments of the present invention, folded portion 1990 may have a width 1996 in the range of about 2 mm to about 50 mm. In various embodiments of the present invention, power conductor 210 may have a width of 1994 of about 3 mm and power conductor 210' may have a width (1994+1996) of about 9 mm, resulting in power conductor 210' having a resistance about 3× lower than that of power conductor 210. In various embodiments of the present invention, power conductor 210' may have a resistance in the range of about 1.5 to about 10 times lower than that of power conductor 210. While FIG. 19F shows one folded portion 1990, this is not a limitation of the present invention, and in other embodiments light sheet 110 may have multiple folded portions. For example FIG. 19G shows light sheet 110 having two folded portions 1990 and 1990'. However, this is not a limitation of the present invention, and in other embodiments light sheet 110 may have more than two folded portions. While FIG. 19G shows the folds in a fan-fold configuration, this is not a limitation of the present invention and in other embodiments the folding configuration may be different. For example in various embodiments the folds may be rolled-over or folded over, as shown in FIG. 19I, or may have other fold configurations or combinations of configurations. In various embodiments, the folded portions or parts of the folded portions may be adhered or fastened to each other or to the unfolded part of the light sheet, for example using glue, adhesive, tape, lamination, staples, rivets, or the like.

In various embodiments of the present invention, light sheets 110 having folded portions 1990 may be combined with frame elements, for example frame elements 120, 120'. In various embodiments of the present invention, folded portion 1990 of light sheet 110 may be folded or wrapped around a portion of frame element 120 or 120' as shown in FIG. 19H; however, this is not a limitation of the present invention, and in other embodiments folded portion 1990 of light sheet 110 may be disposed under or over frame element 120, 120', or light sheet 110 with one or more folded portions 1990 may be utilized without any frame elements.

In various embodiments of the present invention, a portion of light sheet 110 may be adhered or attached to frame 120 or to a portion of frame 120, for example using adhesive, glue, tape, double-sided tape, or the like. For example, in various embodiments a portion of light sheet 110 may be adhered to a portion of frame 120, for example all, substantially all or a portion of the top and/or the bottom and/or the sides of frame 120 may be adhered to light sheet 110. In various embodiments of the present invention, a lighting system may include or consist essentially of an assemblage of multiple light sheets 110 and/or light panels 100 and an associated connector system. In various embodiments of the present invention, the connector system utilizes the same type of connectors, or snap connectors or 9V battery connectors that are used on light sheets 110 and/or light panels 100.

While FIG. 19F shows portions 1994 and 1996 having the same or substantially the same shape, this is not a limitation of the present invention, and in other embodiments they may have different shapes. For example, FIG. 19J shows an example of an embodiment of the present invention in which portion 1994 has a different shape than that of portion 1996. While FIG. 19F shows portions 1994 and 1996 as one contiguous area, this is not a limitation of the present invention, and in other embodiments portions 1994 and 1996 may have one or more spaces between them or gaps 1997 (areas not containing the electrically conductive trace material) in them, for example as shown in FIGS. 19K and 19L.

Figure 19H:
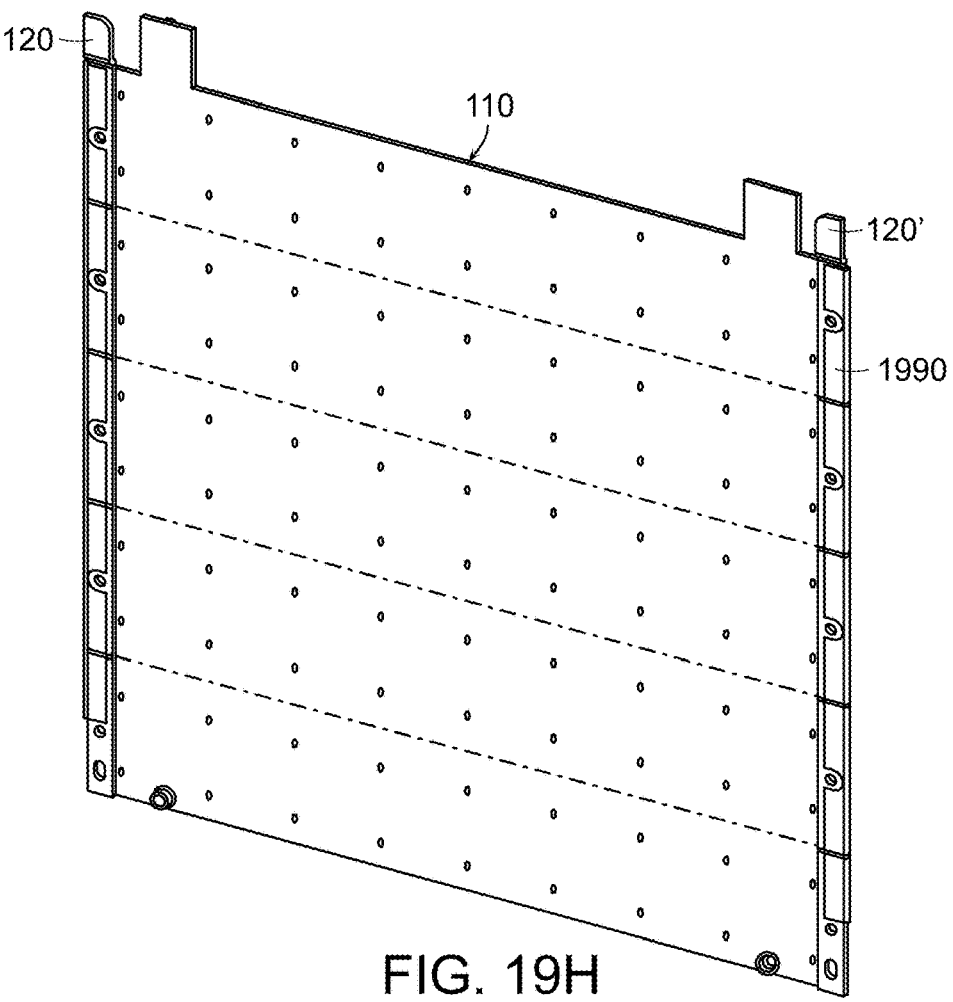
FIG. 19H is a perspective view of a light panel or light sheet having folded peripheral portions in accordance with various embodiments of the invention.
Figure 19J:
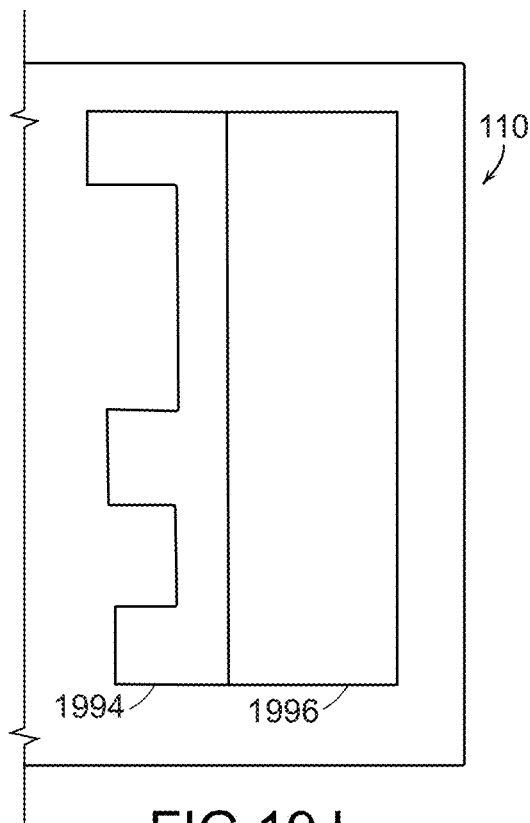
FIGS. 19J, 19K, and 19L are schematics of power conductor configurations in accordance with various embodiments of the invention.
Figure 19K:
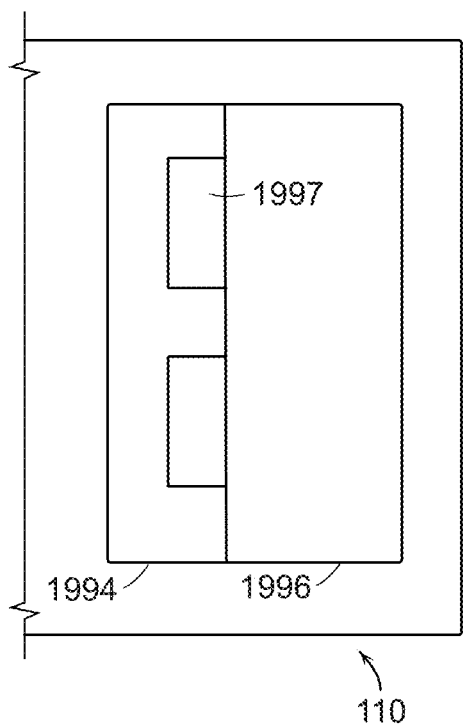
Figure 19L:
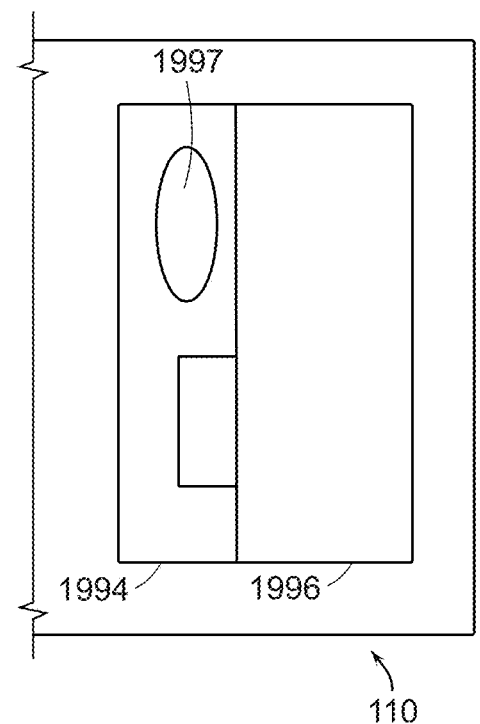

In various embodiments the light panel, for example as shown schematically in FIGS. 1A, 2B, 19H, and other figures herein, may have a thickness in the range of about 0.25 mm to about 20 mm, or in the range of about 0.4 mm to about 5 mm.

Figure 20A:
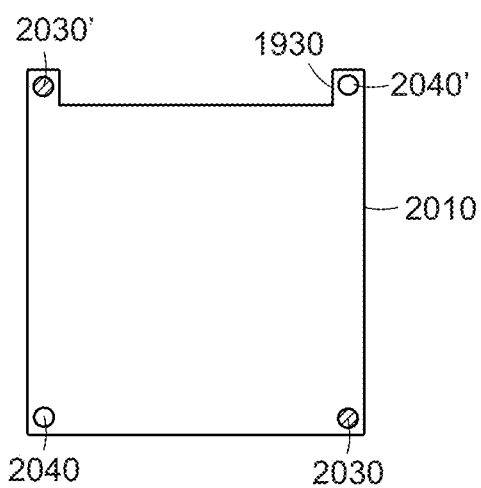
FIGS. 20A and 20B are schematic plan views of light panels or light sheets in accordance with various embodiments of the invention.
Figure 20B:
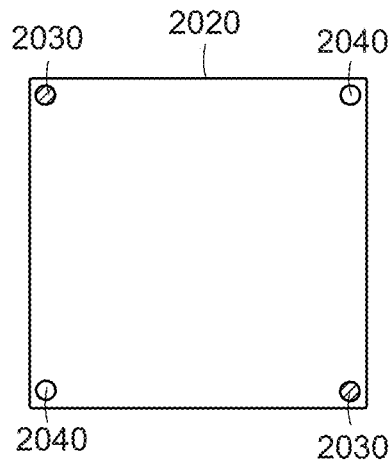
Figure 20C:
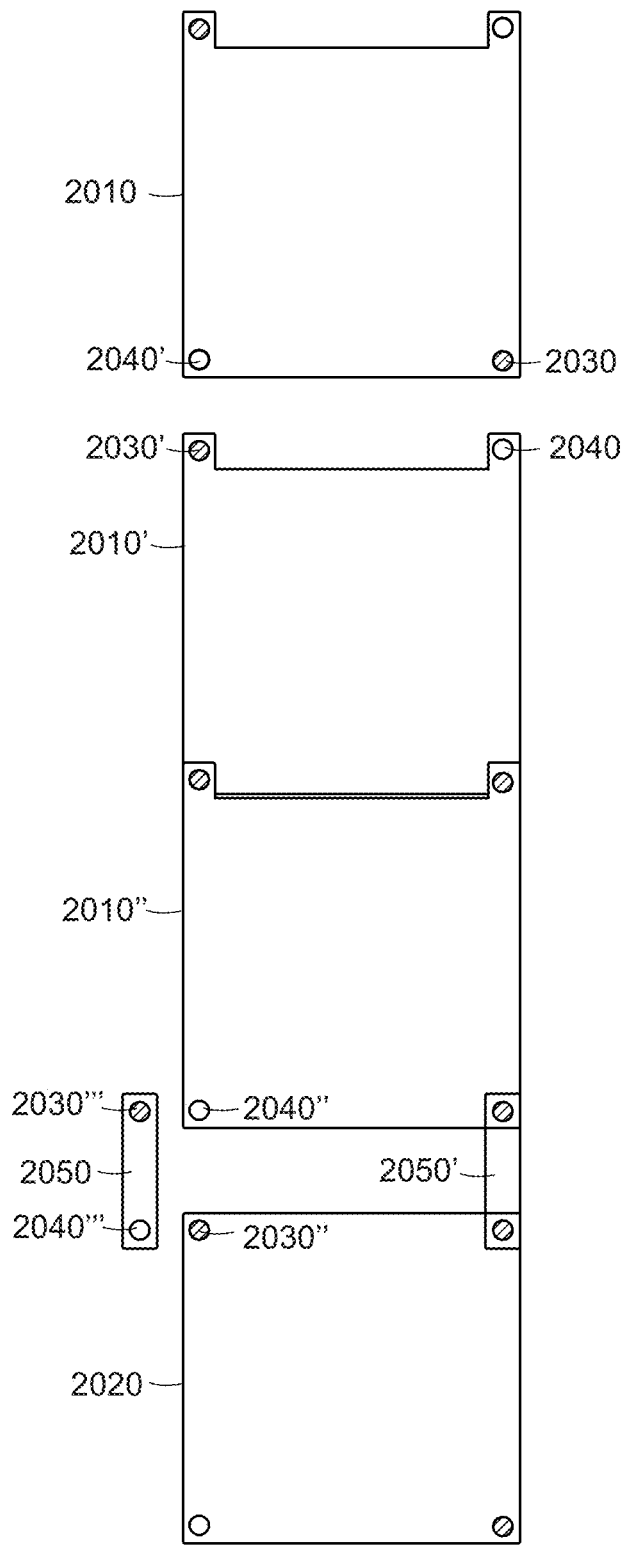
FIGS. 20C and 21A-21E are schematic plan views of lighting systems incorporating electrically connected light panels or light sheets in accordance with various embodiments of the invention.

FIGS. 20A and 20B show two types of light sheets or light panels 2010 and 2020, respectively, in accordance with embodiments of the present invention. Panel 2010 has tabs 1930, each of which has a connector disposed thereon. Panel 2020 does not have tabs 1930, and the connectors are disposed on the main panel body of the light panel or light sheet (e.g., near the periphery and/or corners of the panel or sheet). In this embodiment of the present invention, the connector system includes or consists essentially of two mating connectors 2030 and 2040. (Physically similar or identical connectors, but formed in different locations on the light sheet or light panel are identified by one or more apostrophes, for example 2030 and 2030' are the same physical type of connector, but disposed in different locations on the light sheet or light panel.) Connectors 2030 and 2040 mate to each other and in some embodiments of the present invention are polarized (e.g., one connector is male and the other is female) to prevent misconnection of the light panels or light sheets. However, this is not a limitation of the present invention, and in other embodiments connectors 2030 and 2040 may not be polarized. In the schematics of FIGS. 20A-20C, connectors 2030 are identified by the grey filled-in circles, and connectors 2040 are identified by the white filled-in circles. In various embodiments of the present invention, when multiple light sheets or light panels are connected, connector 2040 is electrically coupled to connector 2030' and connector 2030 is electrically coupled to connector 2040', for example as discussed in reference to FIG. 19A. This permits multiple light panels or light sheets to be electrically coupled through these connectors, for example as discussed in reference to FIG. 20C below.

In various embodiments of the present invention, other connector configurations may be utilized, for example a portion of one sheet may overlap a portion of an adjacent sheet to permit alignment and mating of the electrical connectors. In various embodiments of the present invention, the electrical connectors may be mated by coupling in a direction parallel to or substantially parallel to the surface of the light sheet.

FIG. 20C shows an embodiment of a lighting system of the present invention that is partially assembled, and that includes or consists essentially of three panels 2010, 2010', and 2010" and one panel 2020. Panels 2010' and 2010" have been electrically coupled together. Panel 2010 is awaiting assembly, which is completed by connecting connector 2040' on panel 2010 to connector 2030' on panel 2010' and connecting connector 2030 on panel 2010 to connector 2040 on panel 2010'. Panel 2020 is awaiting assembly into the lighting system, which is completed using jumpers 2050, 2050' (jumper 2050' has already been connected) by connecting connector 2030'" on jumper 2050 to connector 2040" on panel 2010" and connecting connector 2040'" on jumper 2050 to connector 2030" on panel 2020. Jumper 2050 may have any length and may be straight, as shown in FIG. 20C, or may be curved or have any shape. While jumper 2050 is shown in FIG. 20C as connecting a 2010-type panel to a 2020-type panel, this is not a limitation of the present invention, and in other embodiments one or more jumpers 2050 may connect two 2010-type panels (i.e., panels having one or more protruding tabs) or two 2020-type panels (i.e., panels lacking protruding tabs) or any other style or configuration of panels. In various embodiments of the present invention, the connectors on the left side (top and bottom) of each light sheet or light panel are electrically coupled together and the connectors on the right side (top and bottom) of each light sheet or light panel are electrically coupled together, permitting multiple light sheets or light panels to be powered by connection from one end of the array of light panels or light sheets (i.e., from one end of the assembled lighting system). The order of assembly of the components with reference to FIG. 20C (including but not limited to light sheets, light panels, and jumpers) is one example of how these components may be assembled. In other embodiments of the present invention, the assembly order may be different and/or other components may be utilized.

In various embodiments of the present invention, jumper 2050 may be constructed in a similar fashion to the light panel, while in other embodiments, jumper 2050 may have a different construction from that of the light panel. In various embodiments of the present invention, jumper 2050 may include or consist essentially of one or more wires or wire harnesses with connectors. In various embodiments of the present invention, jumper 2050 may include or consist essentially of a flexible substrate having conductive traces disposed on the substrate and connectors electrically coupled to the conductive traces (i.e., in the style of light sheets as described herein).

In various embodiments of the present invention, a light sheet or light panel may have one or more connector wires directly attached to one or more power conductors or other conductive elements. In such embodiments, the other end of the wire (the end not electrically coupled to a portion of the light sheet or light panel) may be a flying lead, i.e., just the wire, or may be terminated with a connector, or may be integrated into a wiring harness, or may be contacted by other means.

Figure 21A:
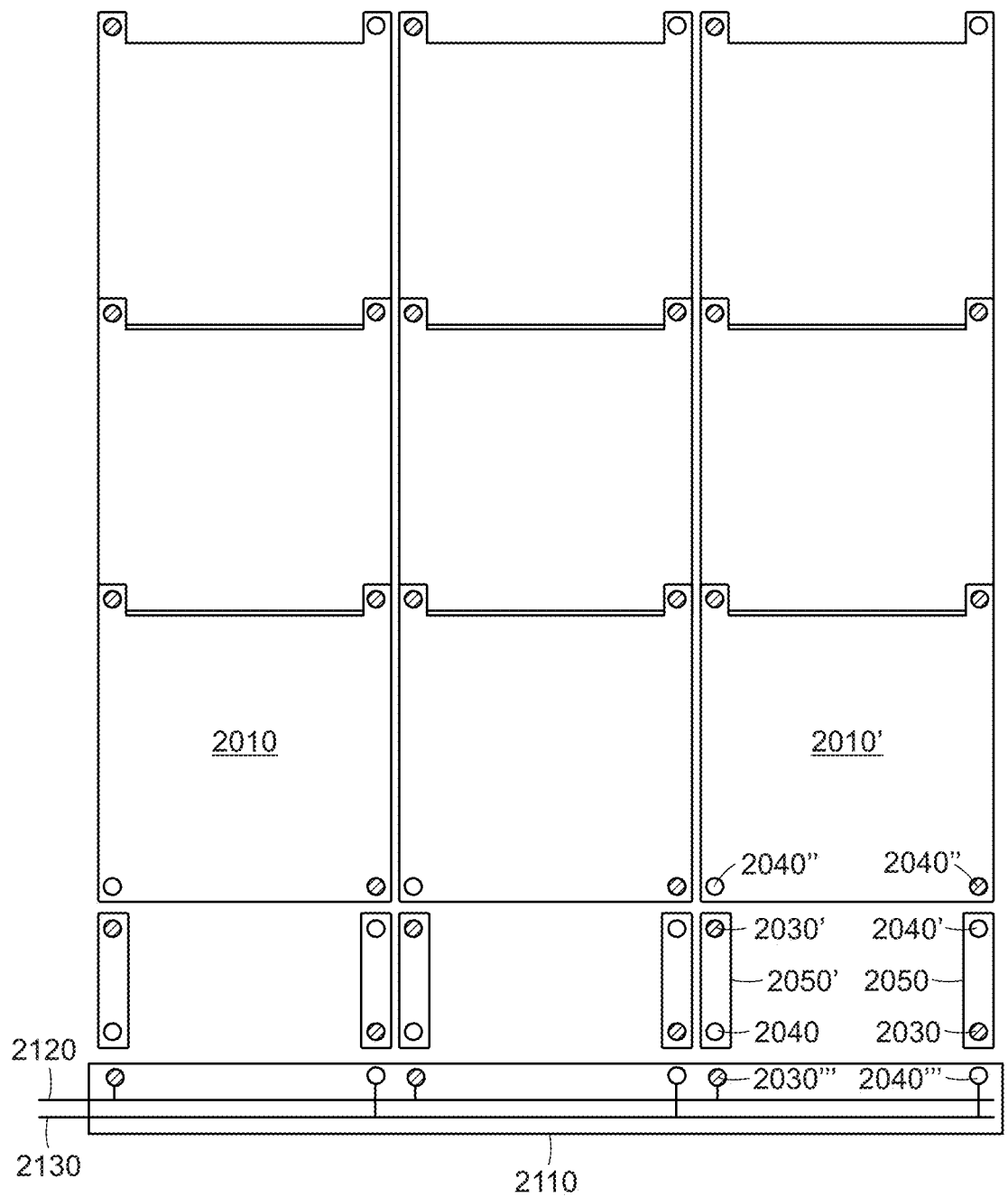

In various embodiments of the present invention, jumpers may be used to electrically couple one or more light panels or light sheets to a power bus or power supply. FIG. 21A shows a lighting system including or consisting essentially of nine light panels or light sheets 2010. The nine light panels have been connected into three vertically oriented groups of three panels each, and the system is ready for connection to a power supply. While the system of FIG. 21A shows a lighting system including or consisting essentially of nine light sheets or light panels, this is not a limitation of the present invention, and in other embodiments the lighting system may have fewer or more light sheets or light panels.

In various embodiments of the present invention, a power bus or power wiring harness 2110 may include or consist essentially of one or more power conductors, for example power conductors 2120 and 2130, and one or more connectors, for example connectors 2030''' and 2040' (other connectors are shown in FIG. 21A, but not identified with separate identification numbers). In various embodiments, connector 2030' is electrically coupled to power conductor 2120 and connector 2040' is electrically coupled to power conductor 2030 (other connectors are shown as electrically coupled, but not identified in FIG. 21A with separate identification numbers). To continue assembly of the lighting system, connector 2030''' on power bus 2110 is connected to connector 2040 on jumper 2050', connector 2040' on power bus 2110 is electrically connected to connector 2030 on jumper 2050, connector 2030' on jumper 2050' is electrically connected to connector 2040'' on panel 2010', and connector 2040' on jumper 2050 is electrically connected to connector 2040'' on panel 2010'. While the system shown in FIG. 21A uses light panels or light sheets with protruding tabs, this is not a limitation of the present invention, and in other embodiments tab-less panels may be used or a mixture tabbed and tab-less panels may be used, or any other type or style of light sheets or panels may be used. While the system shown in FIG. 21A shows panels 2010 as close coupled, i.e., all of the panels are connected together with relatively little space between each panel, both in the horizontal and vertical directions, this is not a limitation of the present invention, and in other embodiments, additional space between adjacent panels, for example in the horizontal direction or vertical direction or both directions may be part of the present invention.

In various embodiments of the present invention, the light sheets or light panels are configured and positioned such that the distance between adjacent LEEs between adjacent light sheets or light panels is the same or substantially the same as the distance between adjacent LEEs on one light sheet or light panel, i.e., the pitch between LEEs on a light panel or light sheet is the same or substantially the same as the pitch between adjacent LEEs across the joint or interface between two adjacent light sheets or light panels. In various embodiments of the present invention, the lighting system includes or consists essentially of multiple light panels or light sheets and the pitch or distance between adjacent LEEs is the same, independent of whether the LEEs are on one light sheet or light panel or on separate light panels or light sheets. In various embodiments of the present invention, the LEEs are spaced in a rectangular array on the light sheet or light panel with a first pitch in a first direction and a second pitch in a second direction that is substantially perpendicular to the first direction, and the system includes or consists essentially of multiple light sheets or light panels, and the pitch in the first direction between adjacent light sheets is the same as the first pitch on the light sheet or light panel, and the pitch in the second direction between adjacent light sheets is the same as the second pitch on the light sheet or light panel. For example, in various embodiments, the pitch between all LEEs in a system including multiple light panels, for example the system shown in FIG. 21A, is the same or substantially the same.

Figure 21B:
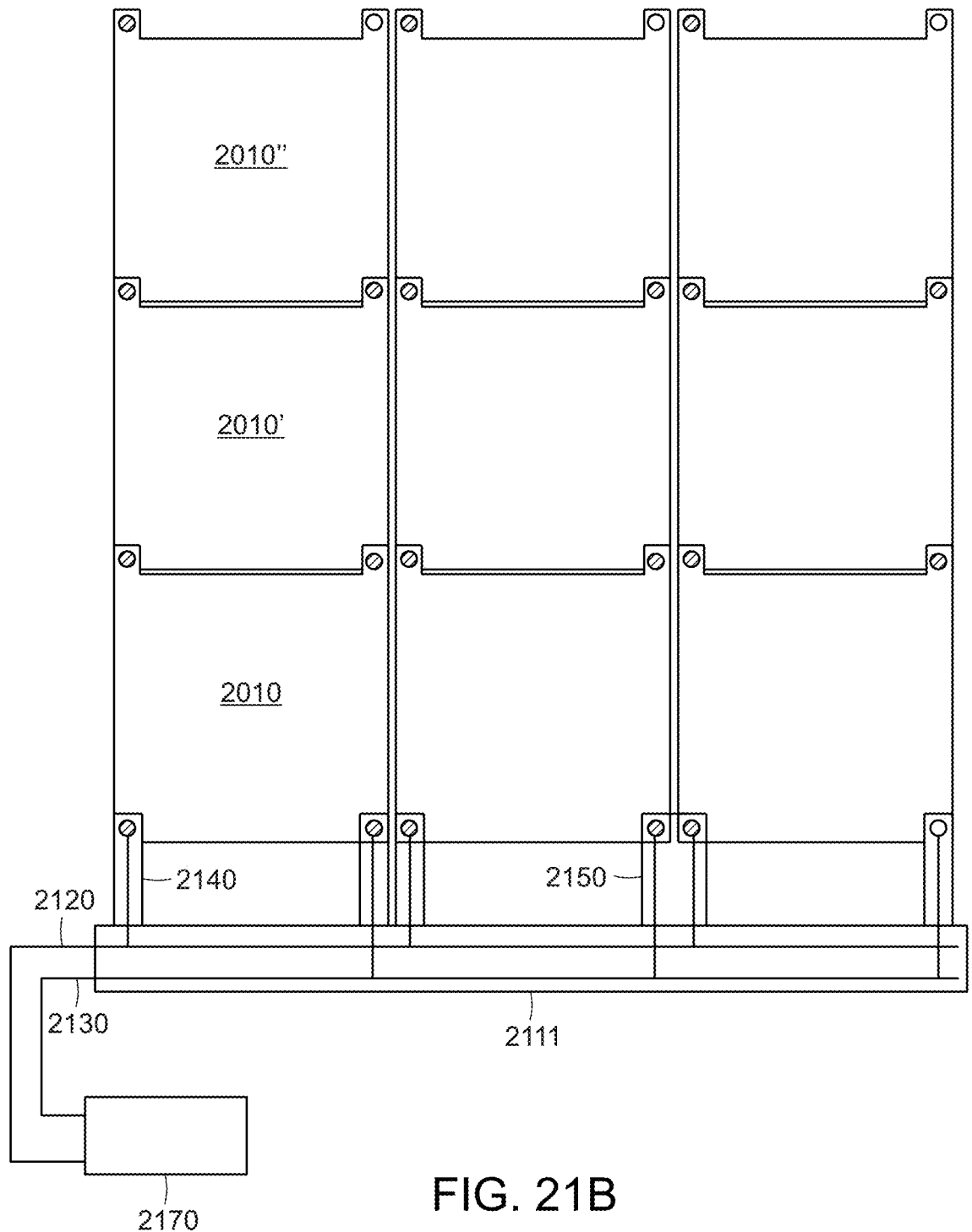

While the lighting system shown in FIG. 21A includes nine light panels or light sheets 2010, this is not a limitation of the present invention, and in other embodiments fewer or more light panels and/or light sheets 2010 may be utilized. In various embodiments of the present invention, a lighting system may include or consist essentially of at least 50 light panels and/or light sheets, or at least 100 light panels and/or light sheets, or at least 500 light sheets and/or light panels, or at least 5000 light sheets and/or light panels FIG. 21B shows an embodiment of a lighting system of the present invention similar to that of the lighting system of FIG. 21A; however, in the system of FIG. 21B, power bus or power wiring harness 2111 differs from power bus or power wiring harness 2110 by elimination of jumpers 2050. Jumpers 2050 are replaced by tabs or extensions 2140 on which are disposed the connectors that connect to a connector on a light sheet or light panel. In various embodiments of the present invention, tabs or extensions 2140 may each include one connector; however, this is not a limitation of the present invention, and in other embodiments a tab or extension 2140 may include more than one connector, as shown by tab or extension 2150. While tab or extension 2150 includes two connectors, this is not a limitation of the present invention, and in other embodiments tab or extension 2150 may include more than two connectors. In various embodiments of the present invention, power bus or power wiring harness 2111 does not include tabs or extensions

Figure 21C:
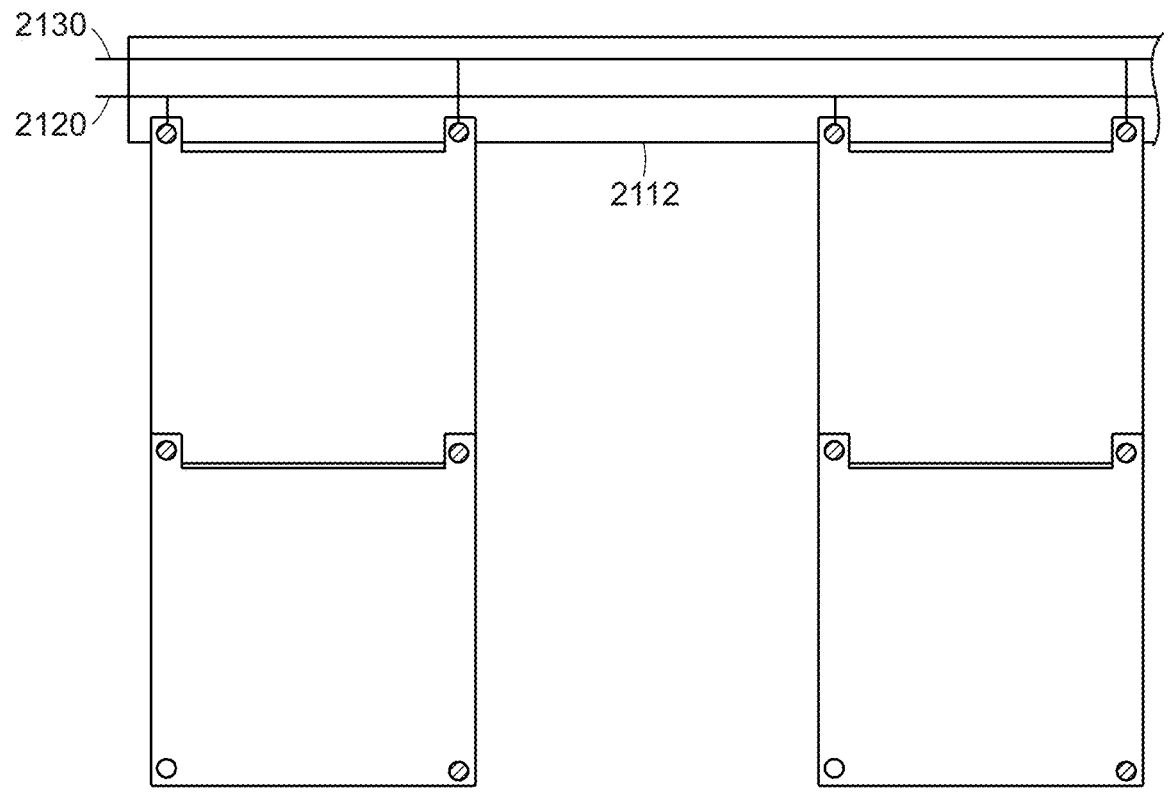

2140 or 2150, and the connectors are formed on the body of power bus or power wiring harness 2111, as shown in FIG. 21C. In various embodiments of the present invention the power bus or power wiring harness includes or consists essentially of one or more wires, optionally bundled together with connectors wired to the main power lines in the power bus.

In various embodiments of the present invention, the connectors on the left side (top and bottom) of each light sheet or light panel are electrically coupled together and the connectors on the right side (top and bottom) of each light sheet or light panel are electrically coupled together, permitting multiple light sheets or light panels to be powered by connection from one end of the array of light panels or light sheets. For example, in the lighting system of FIG. 21B, a power supply 2170 provides power through power bus 2111 to the bottom three light panels. This power is then conveyed through the bottom light sheet or light panel to the light sheet or light panel to which it is electrically coupled, and so on. For example, light panel 2010 is powered from power bus 2111, light panel 2010' is provided power from light panel 2010, and light panel 2010" is provided power from light panel 2010'. In various embodiments of the present invention, this permits powering or energizing of large linear assemblies of light panels or light sheets with only one power connection, and in some embodiments from only one end of the assembly. In various embodiments of the present invention, different configurations of connection of two or more connectors may be utilized.

In the example in FIG. 21B, power bus 2111 is electrically coupled to power supply 2170. In various embodiments of the present invention, power supply 2170 provides power to energize light panels 2010. In various embodiments of the present invention, power supply 2170 provides a constant voltage power to power bus 2111; however, this is not a limitation of the present invention, and in other embodiments power supply 2170 may provide constant current, AC-based power, or any other type of power. In various embodiments of the present invention, power supply 2170 is energized from a mains power supply, for example an AC mains power source; however, this is not a limitation of the present invention, and in other embodiments power supply 2170 may be energized from a battery or batteries, rechargeable battery or batteries, photovoltaic generation systems, wind generation systems, gas or other fuel based generator systems, energy harvesting systems, another power supply, or other power sources. In various embodiments of the present invention, power supply 2170 may provide a constant voltage that is modulated, for example using pulse-width modulation (PWM), to permit dimming of light-emitting elements on light panels 2010; however, this is not a limitation of the present invention, and in other embodiments dimming may be accomplished by other means, for example by modification of the current to each light panel, modification of the voltage to each light panel, or by other means.

In various embodiments of the present invention, a power bus or power wiring harness 2111 or 2112 may also support control or communication signals to the light sheets or light panels, or from the light sheets or light panels, for example to provide control and/or communication signals between a power source, for example power supply 2170 and light panels 2010. In various embodiments, control or communication signals may be used to selectively energize or de-energize individual or groups of light panels or light sheets in a lighting system, or to selectively energize or de-energize portions of individual or groups of light panels or light sheets or to modify the intensity of light emitted by individual or groups of light panels or light sheets in a system, or to modify the intensity of light emitted by portions of individual or groups of light panels or light sheets, or to modify other optical characteristics of individual or groups of light panels or light sheets or portions of individual or groups of light panels or light sheets, for example correlated color temperature (CCT), color rendering index (CRI), R9, spectral power distribution, light distribution pattern, or the like.

FIG. 21C shows an embodiment of the present invention in which a power bus or power wiring harness 2112 without tabs or extensions 2140 or 2150 is connected to light panels or light sheets 2010. In the lighting system of FIG. 21C, the vertical columns of light panels or light sheets are spaced apart from each other, in contrast to the system of FIG. 21B, in which the light panels or light sheets are positioned substantially next to each other. Furthermore, in the system of FIG. 21C, power bus or power wiring harness 2112 extends beyond the limits of the figure, and may provide power to one or more additional groups of light sheets or light panels. The number of groups of light sheets or light panels powered by the power bus or power wiring harness is not a limitation of the present invention.

Figure 21D:
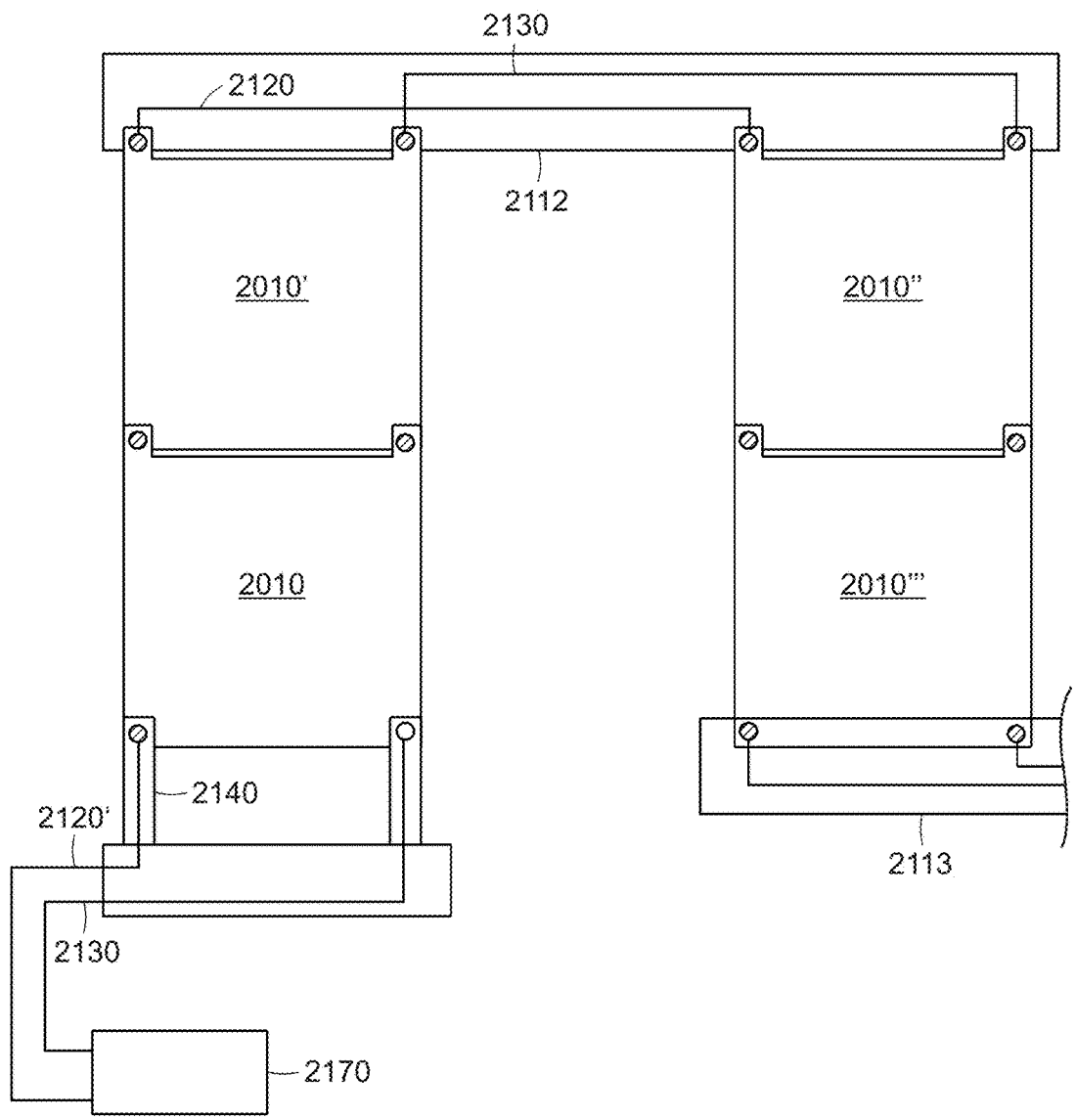

FIG. 21D shows a schematic of another embodiment of the present invention in which power is supplied to multiple columns of light panels or light sheets from one end of the assembly. Power supply 2170 supplies power to light sheet 2010, which provides power to light sheet 2010'. Power is then conveyed from light sheet 2010' through power bus 2112 to light sheet 2010", which provides power to light sheet 2010'''. Power is then conveyed from light sheet 2010' through power bus 2113 to the next array of light sheets (not shown).

Figure 21E:
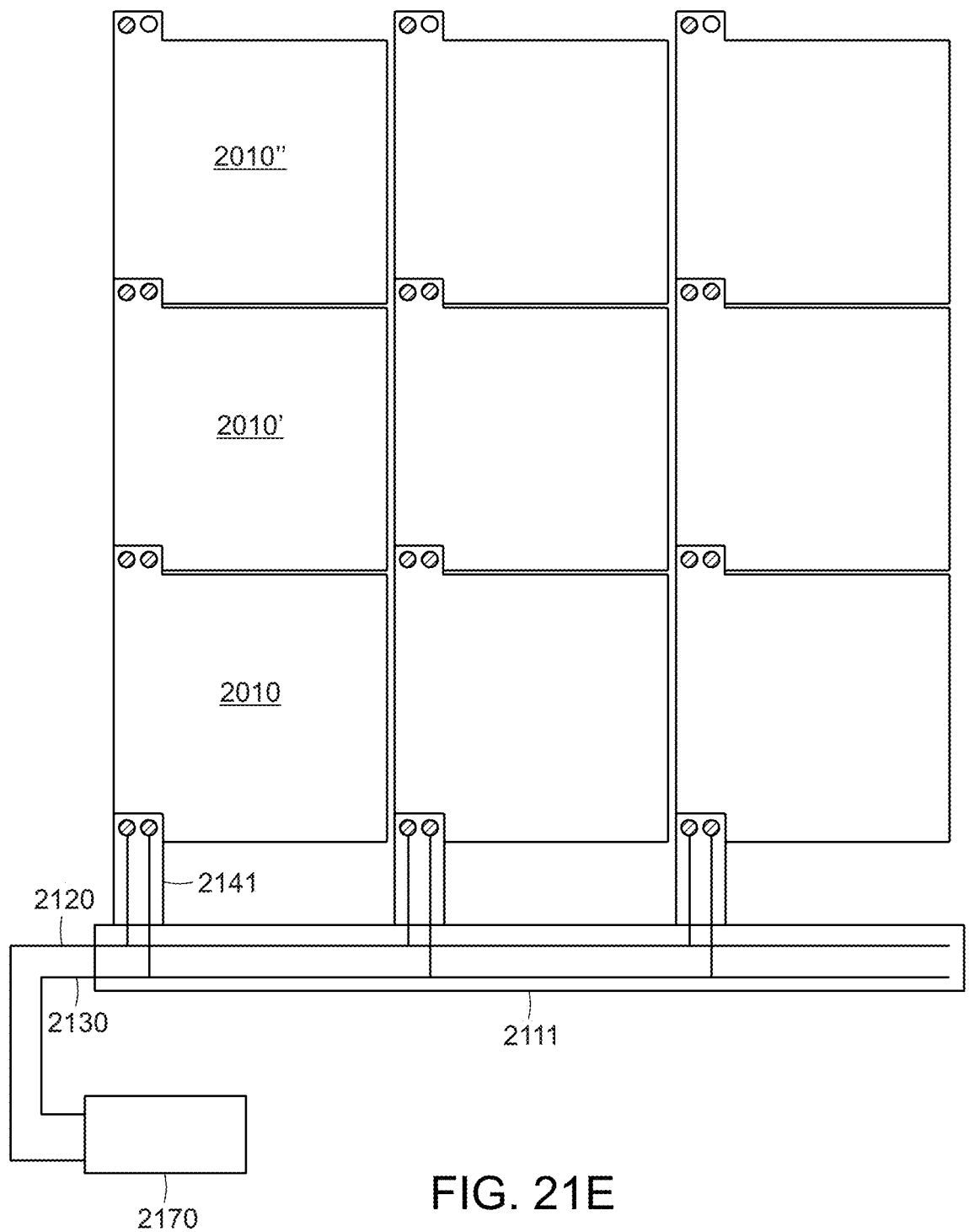

FIG. 21E shows a schematic of another embodiment of the present invention in which the connectors are grouped on one tab, with each tab having multiple connectors. For example, power bus 2111 has one tab connecting to each light panel, for example tab 2141 connecting to panel 2010. In various embodiments, one tab may include two or more connectors, while in other embodiments each connector may include or consist essentially of multiple separate electrical conductors.

Power buses or power wiring harnesses may incorporate one or more tabs or no tabs, and various types of power buses or power wiring harnesses as well as combinations of various types of power buses or power wiring harnesses are within the scope of this invention.

While the systems shown in FIGS. 19A, 19H, 20A-20C, and 21A-21C depict substantially square light panels or light sheets, this is not a limitation of the present invention, and in other embodiments light panels or light sheets may have other shapes, for example rectangular, hexagonal, triangular, parallelogram, or any arbitrary shape. While FIGS. 21A-21C show square arrays of light sheets or light panels, this is not a limitation of the present invention, and in other embodiments the light sheets or light panels may be configured or positioned in a rectangular array, a hexagonal array, a triangular array, or any other array, whether periodic or not.

Figure 21F:
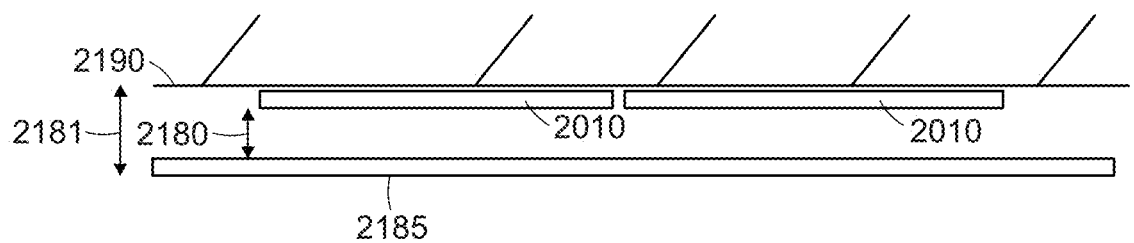
FIG. 21F is a schematic side view of an installed lighting system in accordance with various embodiments of the invention.

FIG. 21F shows an embodiment of a lighting system of the present invention including or consisting essentially of light panels 2010 attached to a support 2190 and covered or partially covered by an optic 2185 (the details of support 2190 and of optic 2185 are not shown for clarity, nor are they limitations of the present invention). As shown in FIG. 21F, optic 2185 is spaced apart from light panels 2010 by a spacing 2180. In various embodiments of the present invention, optic 2185 may be in contact with light panel 2010 or substantially in contact with light panel 2010, while in other embodiments optic 2185 may be in contact or substantially in contact with the LEEs on light panel 2010, or may be spaced apart from light panel 2010 as shown in FIG. 21F. In various embodiments of the present invention, spacing 2180 may be in the range of about 0.5× to about 5×, or in the range of about 1× to about 2×, the spacing or pitch of LEEs on light panel 2010. In various embodiments of the present invention, spacing 2180 may be in the range of about 5 mm to about 500 mm, or in the range of about 10 mm to about 100 mm. In various embodiments of the present invention, support 2190 may include or consist essentially of a wall, ceiling, floor, column, sub-structure, substrate, or other feature to which light panel or panels 2010 may be attached or mounted. In various embodiments of the present invention, optic 2185 may include or consist essentially of a lens, a diffuser, a refractive optic, a reflective optic, a Fresnel optic, a fabric, a translucent material such as plastic or stone, a graphic panel, a membrane or the like. In various embodiments of the present invention, optic 2185 may include or consist essentially of a plurality of optical elements, for example as described in U.S. patent application Ser. No. 13/693,632, filed on Dec. 4, 2012, the entire disclosure of which is incorporated by reference herein. In various embodiments of the present invention, optic 2185 may include or consist essentially of glass, stone, plastic, fabric, foam, paper, or the like.

In various embodiments of the present invention, the total thickness 2181 of the lighting system shown in FIG. 21F, i.e., the distance between the back of light panel 2010 to the front of optic 2185, may be in the range of about 1× to about 5× the spacing or pitch of LEEs on light panel 2010, or in the range of about 1.5× to about 4× the spacing or pitch of LEEs on light panel 2010. In various embodiments of the present invention, a total thickness 2181 of the lighting system shown in FIG. 21F may be in the range of about 1 cm to about 10 cm, or in the range of about 1.5 cm to about 5 cm.

As described herein, various embodiments of the present invention include columnar arrays of light panels in which each light panel includes power conductors that provide power to the light-emitting elements of each panel and also provide a means of transmitting power to adjacent light panels within the columns. In various embodiments of the present invention, multiple columns may be positioned next to each other, for example adjacent to but spaced apart from the adjacent column, or adjacent to and in contact with the adjacent column, to create very large illuminated surfaces or arrays. In various embodiments of the present invention, one or more columns of light panels may be energized from a power bus system electrically coupled to one or both ends of the column of light panels.

Figure 22A:
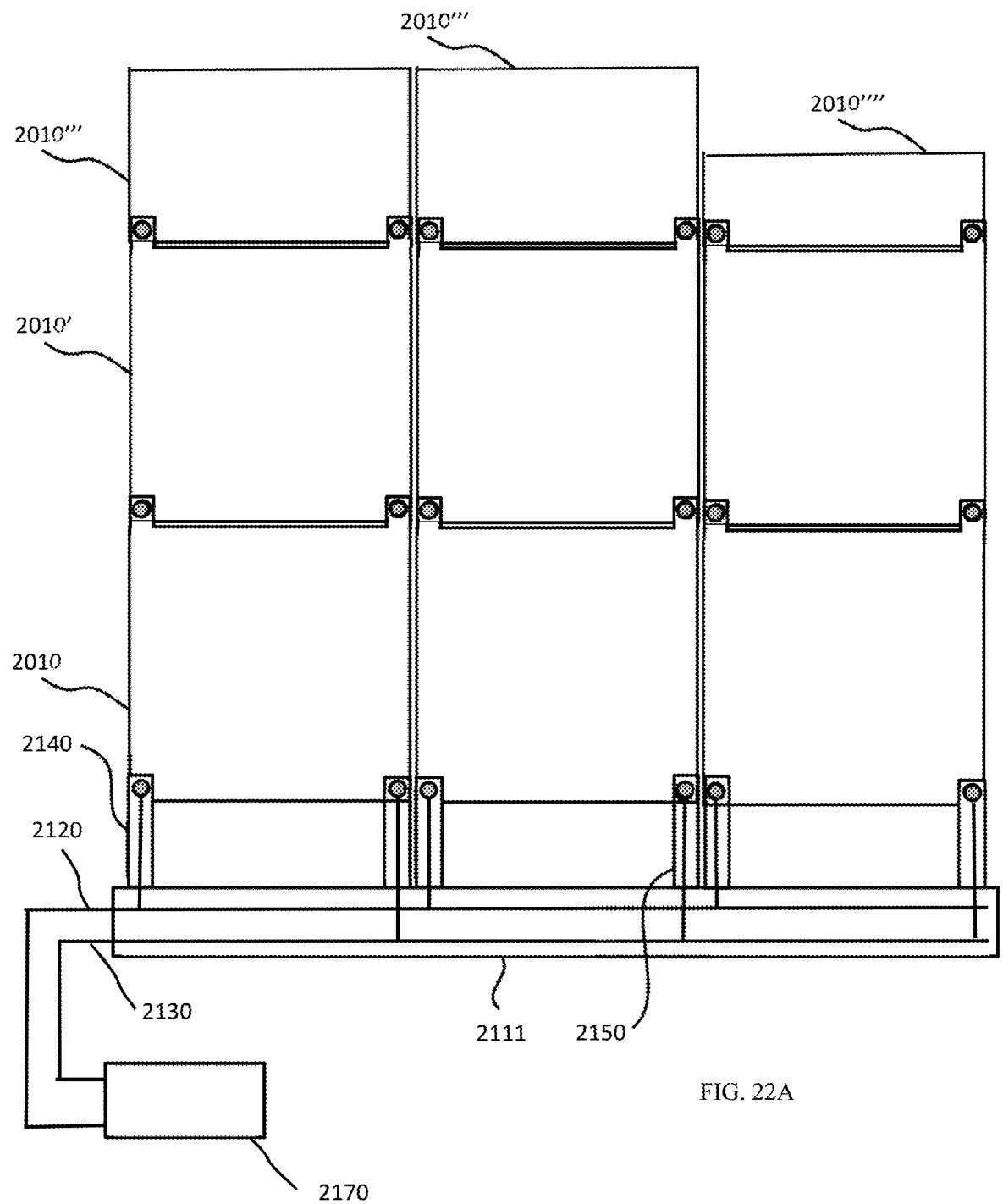
FIGS. 22A, 22B, 23A, and 23B are schematic plan views of lighting systems incorporating electrically connected light panels or light sheets in accordance with various embodiments of the invention.
Figure 22B:
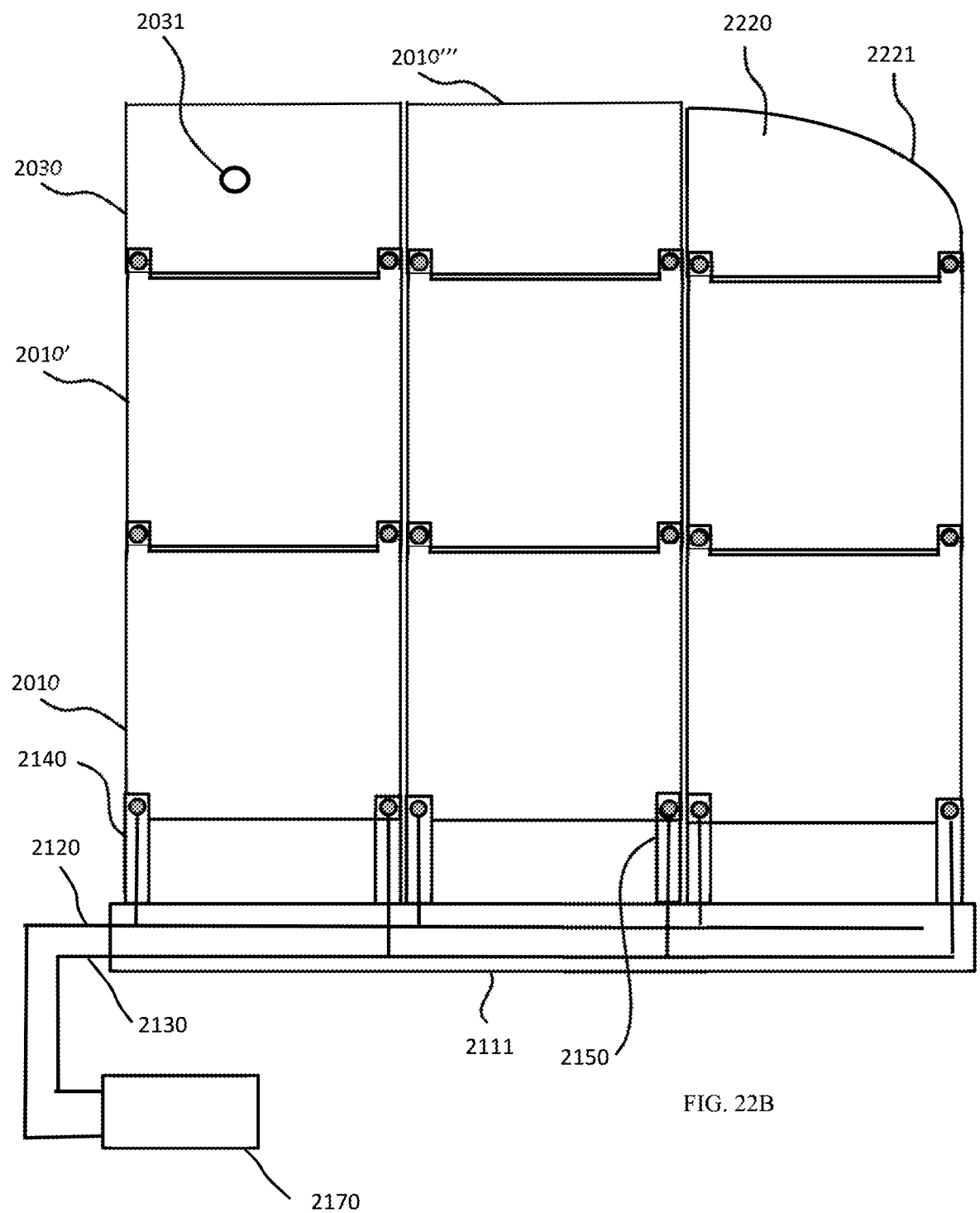

While the systems shown in FIGS. 19A, 19H, 20A-20C, and 21A-21C depict substantially square light panels or light sheets, this is not a limitation of the present invention, and in other embodiments light panels or light sheets may have other shapes, for example rectangular, hexagonal, triangular, parallelogram, or any arbitrary shape. While FIGS. 21A-21C show square arrays of light sheets or light panels, this is not a limitation of the present invention, and in other embodiments the light sheets or light panels may be configured or positioned in a rectangular array, a hexagonal array, a triangular array, or any other array, whether periodic or not. For example, FIG. 22A shows a schematic of another embodiment of the present invention that includes three different shaped light panels. Specifically, light panels 2010 and 2010' have one shape, light panels 2010''' have a second shape, and light panel 2010'''' has a third shape. In the example shown in FIG. 22A, light panels 2010, 2010', 2020''', and 2010'''' are all rectangular; however, this is not a limitation of the present invention, and in other embodiments the light panels may have other shapes. For example, FIG. 22B shows an exemplary embodiment of the present invention similar to that of FIG. 22A, in which light panel 2010' is replaced by a light panel 2220 having a curved edge 2221.

In various embodiments, each light panel may have a closed surface, i.e., a surface that does not define any holes or apertures within it; however, this is not a limitation of the present invention, and in other embodiments one or more light panels may define one or more openings or holes therein or therethrough. For example, a light panel may include a hole such that other elements or features of the surface may extend through the light panel surface, for example a head for a fire suppression system (for example a water sprinkler head, a chemical extinguisher dispenser head, or the like), a smoke or fire sensor or detector, a duct or vent for heating, air conditioning and ventilation (HVAC), an antenna or receiver for various one or two-way communication systems, a camera (for example, a video or still surveillance camera), a power outlet, a light source (for example, a spot light or down light to provide localized light), a stand-off or other support element for a diffuser, optic, or other material positioned in front of the light panel, a structural or other element that is part of the surface on which the light panel is mounted, or any element which is desired to protrude through the light panel. FIG. 22B shows an example of a light panel 2030 defining a through-hole 2031 through the light panel 2030. While FIG. 22B shows hole 2031 having a circular or substantially circular shape, this is not a limitation of the present invention, and in other embodiments hole 2031 may be square, rectangular, hexagonal, octagonal or have any arbitrary shape and/or size. While FIG. 22B shows light panel 2030 having one hole 2031, this is not a limitation of the present invention, and in other embodiments a light panel may define more than one hole 2031. While FIG. 22B shows the lighting system having one light panel with a hole, this is not a limitation of the present invention, and in other embodiments a lighting system may include multiple light panels, with one or more light panels defining one or more holes.

In various embodiments, the shapes of light panels such as light panels 2010, 2010', 2020''', and 2010' may be pre-determined, for example they may be manufactured to one or more specific sizes, and a system may include multiple light panels, each having the same size and shape, or some or all light panels may have different shapes and sizes. In various embodiments, these light panels of one or more shape and size may be assembled together to achieve the final desired shape and size, while in other embodiments one or more light panels may be cuttable or separable in one or more directions to permit formation of assemblies of panels of different sizes and shapes by removal of a portion of a panel, for example as described in U.S. patent application Ser. No. 13/799,807, filed on Mar. 13, 2013, U.S. patent application Ser. No. 13/970,027, filed on Aug. 19, 2013, U.S. patent application Ser. No. 15/182,700, filed on Jun. 15, 2016, and U.S. patent application Ser. No. 15/182,704, filed on Jun. 15, 2016, the entire disclosure of each of which is incorporated by reference herein.

Figure 23A:
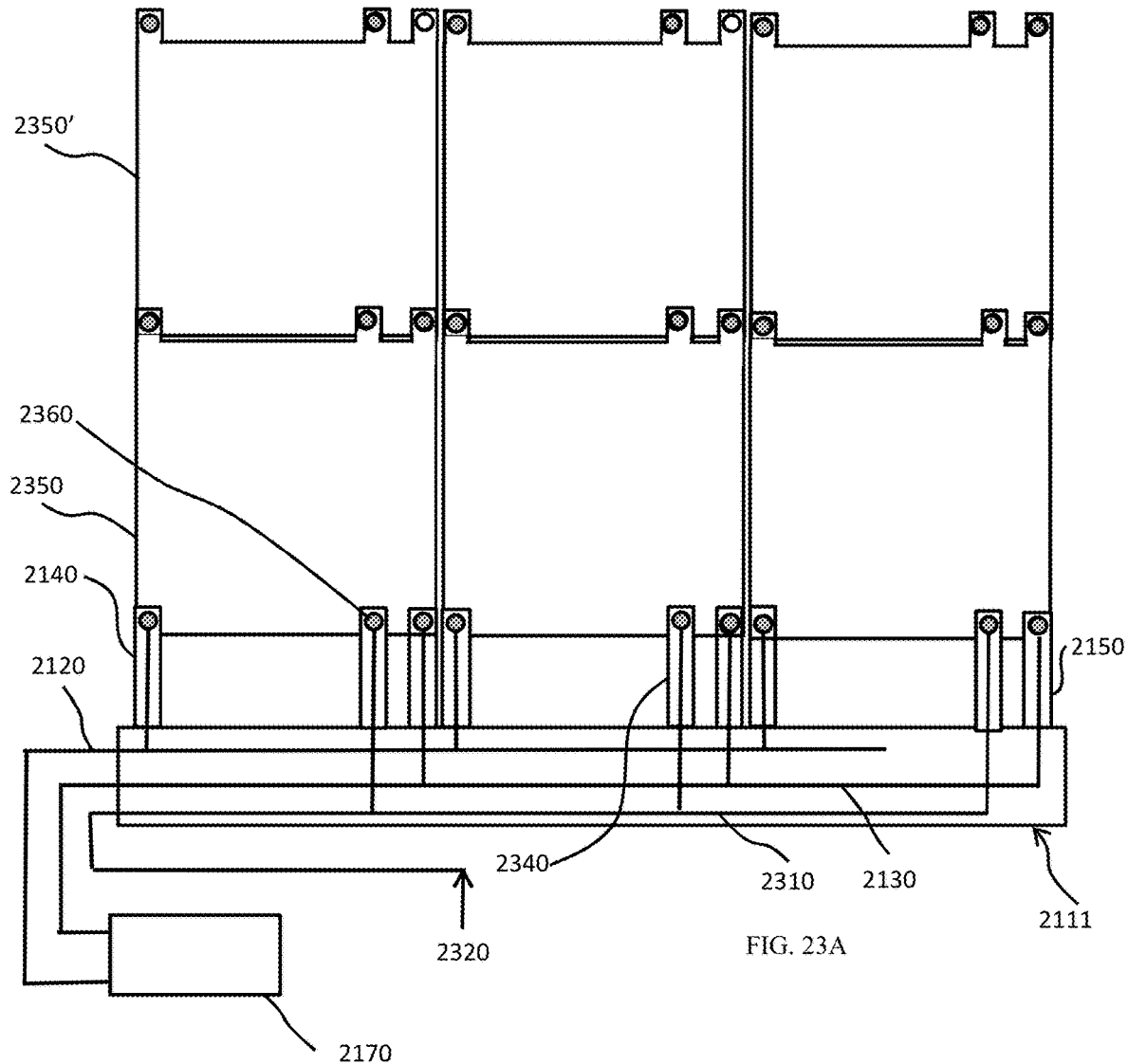

In various embodiments of the present invention, control signals and/or communication signals may be carried over one or more electrical conductors separate from power conductors 2120 and 2130. For example, FIG. 23A shows an example of an embodiment of the present invention in which power bus 2111 includes a control conductor 2310 as well as power conductors 2120 and 2130. Similar to the distribution of power throughout a system of light panels described herein, control and/or communication signals may be distributed through all or a portion of a system of light panels over control conductor 2310, which may electrically couple to one or more electrical lines or conductors disposed on or in one or more of the light panels in the lighting system. While FIG. 23A shows one control conductor 2310, this is not a limitation of the present invention, and in other embodiments more than one control conductor 2310 may be utilized. In various embodiments, a control or communication signal or signals may be transmitted to the light panels via control conductor 2310. For example, in various embodiments control or communication signal 2320 may be sent over control conductor 2310 as shown in FIG. 23A. In various embodiments of the present invention, control or communication signal 2320 may be applied directly to control conductor 2310, as shown in FIG. 23A; however, this is not a limitation of the present invention, and in other embodiments control or communication signal 2320 may be applied to power supply 2170 and then to control conductor 2310 through power supply 2170. In various embodiments, control or communication signal 2320 may be provided to control conductor 2310 through a wireless system, for example a radio- or light-transmission-based system. In various embodiments, control or communication signal 2320 may include, consist essentially of, or consist of one or more of a voltage or current signal (for example a 0-10 V signal), a modulated signal (for example a pulse-width-modulated signal), a digital signal, an analog signal, a signal based on various protocols used in the lighting and/or building industry (for example DALI, DMX, BacNET), and the like. The specific communication or control signal protocol is not a limitation of the present invention.

In various embodiments of the present invention, the lighting system may include or consist essentially of one or more master light panels 2350 and one or more slave light panels 2350'. In various embodiments of the present invention, one or more slave light panels 2350' may be electrically coupled to one master light panel 2350 as detailed herein. In various embodiments of the present invention, master light panel 2350 may include one or more control or communication modules, for example capable of receiving a control or communication signal and modifying a characteristic of the master light panel 2350 and any slave light panels 2350' that are electrically coupled to master light panel 2350. For example, the control signal may represent (and/or direct a change in) a light intensity, a color, for example a CCT, a CRI, R9, spectral power distribution, spatial light distribution pattern, or the like. For example, in reference to the system of FIG. 23A, master light panel 2350 may include a communication or control module (or "controller," not shown in FIG. 23A for clarity) electrically coupled to control or communication line 2130. For example as shown in FIG. 23A, control or communication line 2130 may be electrically coupled to master light panel 2350 through one or more snap connectors 2360; however, this is not a limitation of the present invention, and in other embodiments control or communication line 2130 line may be electrically coupled to master light panel 2350 by other means, for example by a wireless system (e.g., a wireless receiver incorporated onto the master light panel 2350). In various embodiments of the present invention, control or communication signal 2320 may incorporate and/or be configured for one-way or two-way transmission. For example, in a one-way transmission system control signals may be passed to the light panels, and in a two-way transmission system not only may control signals be passed to the light panels, but information may be transmitted from the light panels back to a control system and/or to the power bus 2111. In various embodiments, such information may include data on light panel status, for example operational time, light panel operating status, or may also include other signals for example from sensors, for example signals from sensors such as fire, smoke, temperature, occupancy, light intensity (for example for daylight harvesting), light color or other parameters related to light panel operation or information about the ambient environment. In exemplary embodiments, the controller on master light panel 2350 may incorporate a wireless transmission system to communicate the information, and/or other transmission circuitry to communicate the information on communication line 2130.

The control system (or "controller") in accordance with embodiments of the present invention may include or consist essentially of a general-purpose computing device in the form of a computer including a processing unit (or "computer processor"), a system memory, and a system bus that couples various system components including the system memory to the processing unit. Computers typically include a variety of computer-readable media that can form part of the system memory and be read by the processing unit. By way of example, and not limitation, computer readable media may include computer storage media and/or communication media. The system memory may include computer storage media in the form of volatile and/or nonvolatile memory such as read only memory (ROM) and random access memory (RAM). A basic input/output system (BIOS), containing the basic routines that help to transfer information between elements, such as during start-up, is typically stored in ROM. RAM typically contains data and/or program modules that are immediately accessible to and/or presently being operated on by processing unit. The data or program modules may include an operating system, application programs, other program modules, and program data. The operating system may be or include a variety of operating systems such as Microsoft WINDOWS operating system, the Unix operating system, the Linux operating system, the Xenix operating system, the IBM AIX operating system, the Hewlett Packard UX operating system, the Novell NETWARE operating system, the Sun Microsystems SOLARIS operating system, the OS/2 operating system, the BeOS operating system, the MACINTOSH operating system, the APACHE operating system, an OPENSTEP operating system or another operating system of platform.

Any suitable programming language may be used to implement without undue experimentation the functions described herein. Illustratively, the programming language used may include assembly language, Ada, APL, Basic, C, C++, C*, COBOL, dBase, Forth, FORTRAN, Java, Modula-2, Pascal, Prolog, Python, REXX, Matlab, Labview, R, and/or JavaScript for example. Further, it is not necessary that a single type of instruction or programming language be utilized in conjunction with the operation of systems and techniques of the invention. Rather, any number of different programming languages may be utilized as is necessary or desirable.

The computing environment may also include other removable/nonremovable, volatile/nonvolatile computer storage media. For example, a hard disk drive may read or write to nonremovable, nonvolatile magnetic media. A magnetic disk drive may read from or write to a removable, nonvolatile magnetic disk, and an optical disk drive may read from or write to a removable, nonvolatile optical disk such as a CD-ROM or other optical media. Other removable/nonremovable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The storage media are typically connected to the system bus through a removable or non-removable memory interface.

The processing unit that executes commands and instructions may be a general-purpose computer processor, but may utilize any of a wide variety of other technologies including special-purpose hardware, a microcomputer, mini-computer, mainframe computer, programmed micro-processor, micro-controller, peripheral integrated circuit element, a CSIC (Customer Specific Integrated Circuit), ASIC (Application Specific Integrated Circuit), a logic circuit, a digital signal processor, a programmable logic device such as an FPGA (Field Programmable Gate Array), PLD (Programmable Logic Device), PLA (Programmable Logic Array), RFID processor, smart chip, or any other device or arrangement of devices that is capable of implementing the steps of the processes of embodiments of the invention.

Figure 23B:
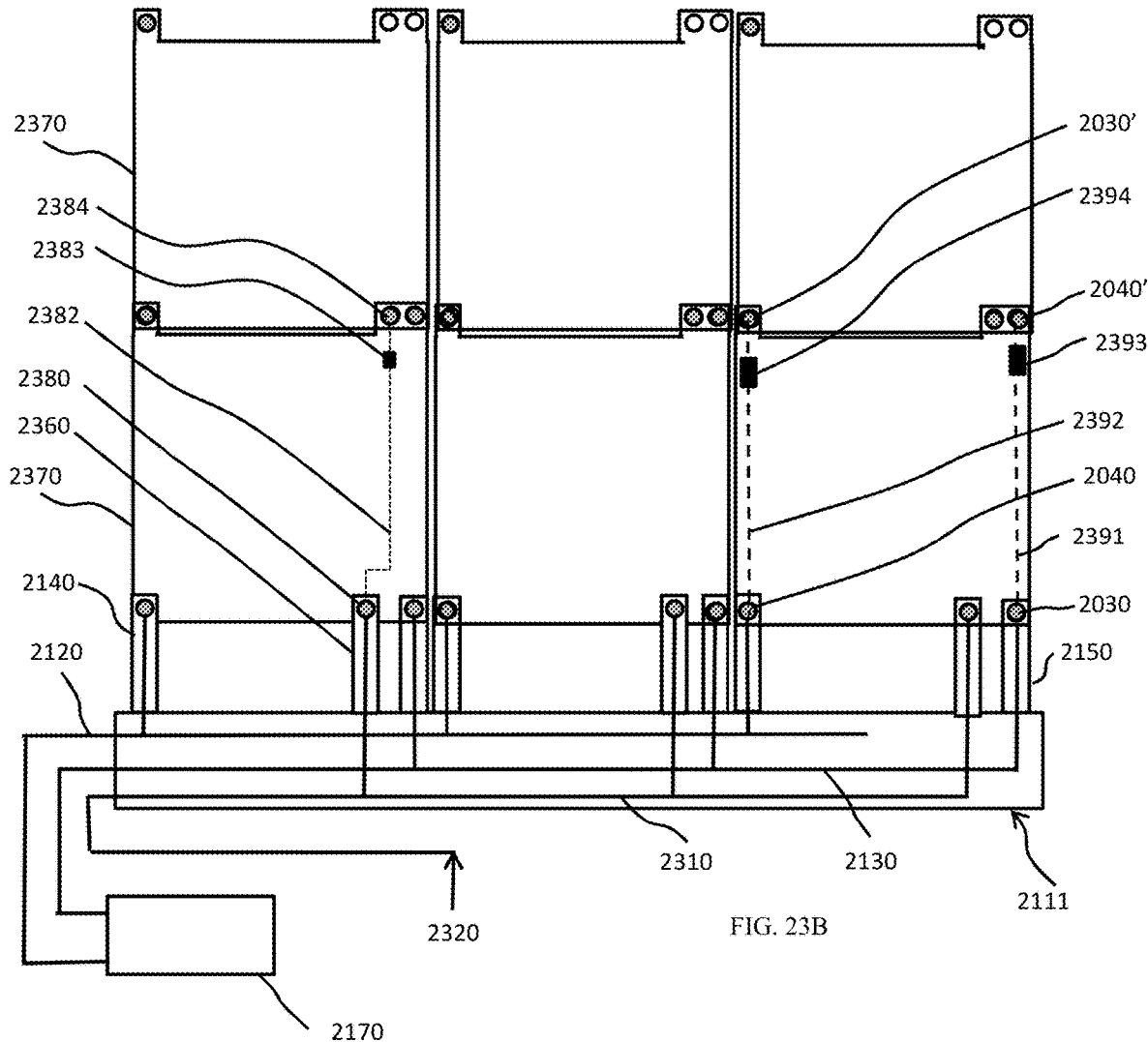

In various embodiments, the control or communication signal may be distributed to all light panels in the lighting system, for example in a similar fashion to power transmission from panel to panel as described herein. For example, FIG. 23B shows an exemplary system having three connectors on the side of each light panel, in which two are utilized for power transmission and one is utilized for a communication and/or control signal or signals. In FIG. 23B, power from power conductors 2120 and 2130 is supplied through jumpers 2140 and 2150, respectively, to light panel 2370, while control or communication signal 2310 is supplied through jumper 2360 to light panel 2370. One or more (or even all) of the light panel 2370 may have three connectors on one or more sides, two for power and one for control/communication, and the control/communication signal is distributed to all sheets using a control/communication conductor on each sheet. For example, communication and control line 2310 may be electrically coupled through jumper 2360 to a connector 2380 (e.g., a snap connector or other vertical connector) on light sheet 2370. Light sheet 2370 has a control conductor 2382, shown as a dashed line, that electrically couples control line 2310 to connector 2384 and thus to the light panel attached to connector 2384. In various embodiments, control conductor 2382 may have the same configuration as power conductors 210 and 220 on light panel 110; for example, control conductor 2382 may include or consist essentially of a conductive trace disposed on, over, or within the substrate of light panel 110. In various embodiments of the present invention, a control or communication module may be included on or as a portion of light panel 2370, which may utilize one or more signals from communication conductor 2380 to control operation of light panel 2370 or provide information regarding the status of light panel 2370 or any associated sensors or other connected elements. While FIGS. 23A and 23B show control or communication signal 2320 being transmitted on one wire or conductor 2310, this is not a limitation of the present invention, and in other embodiments more than one wire or conductor 2310 may be utilized. In various embodiments, multiple conductor control lines 2310 may be coupled to multiple connectors or jumpers 2360 or to one connector having multiple contacts.

In various embodiments of the present invention, power bus or power wiring harness 2111 may include a substrate similar to that of substrate 265 used for light sheet or light panel 110, e.g., a flexible planar substrate having one or more conductive traces and/or other elements defined thereon. In various embodiments of the present invention, power conductors 2120 and 2130 may each include or consist essentially of one or more conductive traces formed over or disposed over or on the substrate. In various embodiments of the present invention, the connectors on the power bus may include, consist essentially of, or consist of one or more snap connectors or other vertical connectors, for example a 9 volt battery connector or a pin connector, similar to the connectors on light sheet 110. In various embodiments of the present invention, the power bus may have a thickness less than about 5 mm or less than about 2 mm or less than about 1 mm.

In various embodiments, control conductor 2382 may electrically couple to one or more control connectors 2383 (e.g., portions of a control system on the light panel) configured to provide connection to control conductor 2382, for example to permit access to control conductor 2382. In various embodiments, control conductor 2382 may be an electrical control conductor 2382, and one or more control connectors 2383 may be electrically coupled to control conductor 2382. In various embodiments, control connector 2383 may provide access to communication or control signals transmitted on control conductor 2382. In various embodiments, one or more sensor devices, for example smoke sensors, fire sensors, occupancy sensor, light sensors, heat sensors, humidity sensors, pressure sensors or the like may be connected to control conductor 2382 through control connector 2383. In various embodiments, one or more devices, for example still cameras, video cameras, speakers, microphones, or other devices may be connected to control conductor 2382 through control connector 2383. In various embodiments, control conductor 2382 may provide for a network configuration, permitting access, control, and communication to a wide variety of networked sensors or other networked devices. In various embodiments, such a network may utilize Ethernet protocol, DALI, DMX or other protocols; the network protocol s not a limitation of the present invention. While FIG. 23B shows one control connector 2383 on light panel 2370, this is not a limitation of the present invention, and in other embodiments more than one control connector 2383 may be connected to control conductor 2382, either on one light panel, for example light panel 2370, or on multiple different light panels.

In various embodiments of the present invention, one or more additional connectors may be electrically coupled to power conductors 2391 and 2392 to provide access to power from power supply 2170. In various embodiments, power conductor 2391 electrically couples connector 2030 to connector 2040', and connector 2393 is a connector available for connection, and power conductor 2392 electrically couples connector 2040 to connector 2030', and connector 2394 is a connector available for connection. In various embodiments, connectors 2393 and 2394 may be used to access power from power supply 2170 for, e.g., powering of other devices or components connected to the lighting system. Connectors 2393, 2394 may include or consist essentially of, for example, vertical connectors such as snap or pin connectors, or any other type of connector described herein.

In various embodiments, as shown in FIG. 23B, the lighting system may also provide access to other devices and/or sensors to control or communication signals or a network through one or more control connectors 2383 and access to power through one or more connectors 2393 and 2394.

Figure 24A:
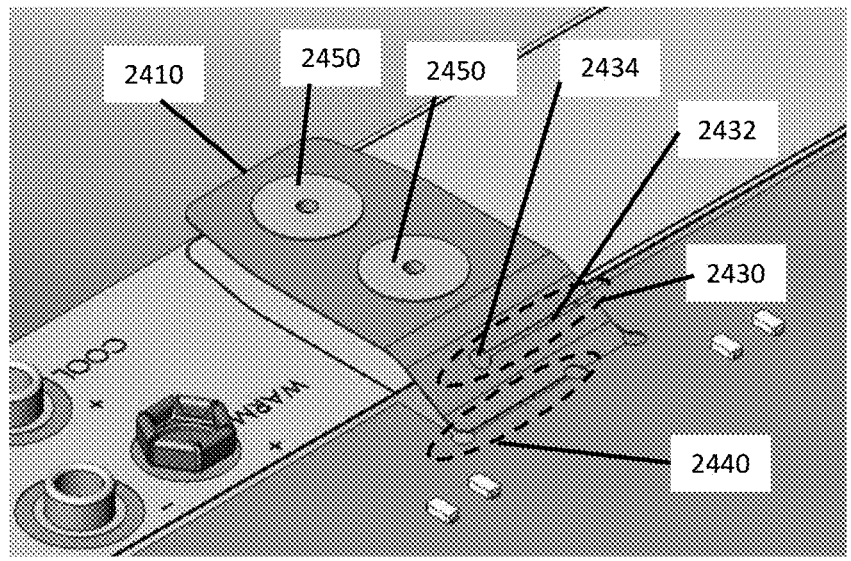
FIGS. 24A and 24B are perspective views of a light panel tab in accordance with various embodiments of the invention.

In various embodiments of the present invention, one or more tabs on light panel 110, for example tab 1930, may include a strain relief feature to provide some compliance or flexibility to the connections between light panels. FIG. 24A shows an example of a tab 2410 that includes strain relief features 2430 and 2440 in accordance with various embodiments of the present invention. In various embodiments, each strain relief feature may include, consist essentially of, or consist of a perforation or cut (e.g., cut 2432) to permit independent or semi-independent movement of the portions of the sheet or substrate on either side of the strain relief feature. Such cuts may not penetrate through the entire width of the tab, and multiple cuts may terminate at different (e.g., opposite) sides of the tab. In various embodiments, the relative movement may include movement in a direction perpendicular or substantially perpendicular to the cut, within the plane of the cut, and/or out of the plane of the cut. In various embodiments, a strain relief feature may include a termination feature 2434 at one or both ends of the cut, for example to reduce the tendency of the cut to extend (e.g., extend its length) when the tab is deformed. For example, termination feature 2434 may include, consist essentially of, or consist of an aperture connected to the cut but having one or more dimensions (e.g., a width, length, or diameter) larger than that of the cut. In various embodiments, the termination feature 2434 may be at least partially curved (e.g., circular, elliptical, etc.) and may provide a larger radius of curvature than would be the case in which the cut simply terminated without termination feature 2434. In various embodiments, cut 2432 may be straight or linear; however, this is not a limitation of the present invention, and in other embodiments cut 2432 may be curved or have any arbitrary path. In various embodiments, cut 2432 may have two ends (e.g., termination points), as shown in FIG. 24A; however, this is not a limitation of the present invention, and in other embodiments a cut may have more than two ends and/or may define more than one linear or curved segment. While FIG. 24A shows a tab 2410 having two strain relief features 2430 and 2440, this is not a limitation of the present invention, and in other embodiments tab 2410 may include only one strain relief feature or may include more than two strain relief features. As shown in FIG. 24A, tab 2410 includes two connectors 2450 (for, e.g., connection to another light panel); however, this is not a limitation of the present invention, and in other embodiments tab 2410 may include only one connector or more than two connectors.

Figure 24B:
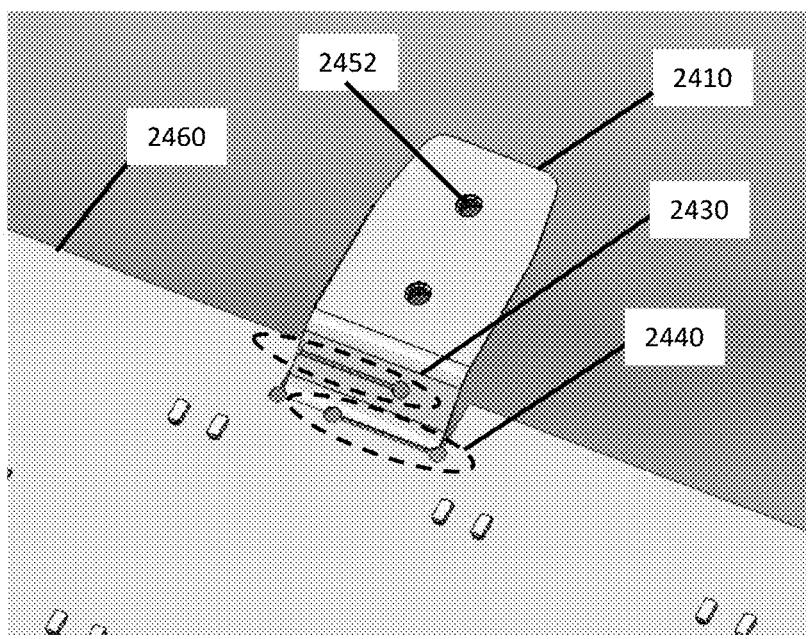
Figure 24C:
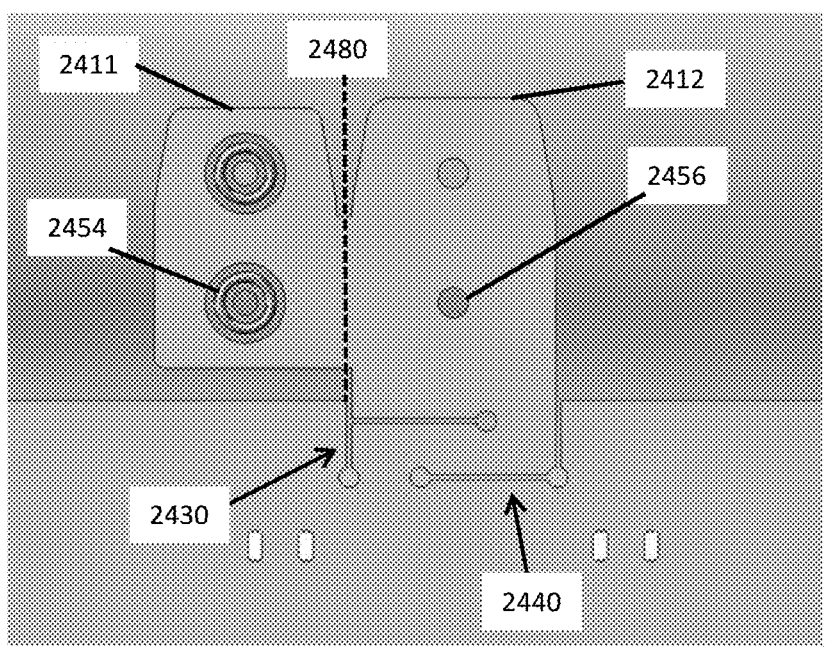
FIG. 24C is a plan view of a multi-layer light tab panel in an unfolded configuration in accordance with various embodiments of the invention.

FIG. 24B shows an example of a tab 2410 in accordance with embodiments of the present invention before connectors 2450 have been installed in holes 2452 in tab 2410. In various embodiments, tab 2410 may include one layer of the material of the substrate 2460, as shown in FIG. 24B, while in other embodiments tab 2410 may include more than one layer of the material of the substrate 2460. For example, FIG. 24C shows an exemplary tab having two layers of the material of the substrate 2460, the two layers being formed by folding one layer over and adjacent to another layer, for example folding tab portion 2411 over tab portion 2412 across fold line 2480. In various embodiments, tab portion 2411 and tab portion 2412 may define holes therein of different shapes and/or sizes (e.g., different holes 2454 and 2456 respectively as shown in FIG. 24C). In various embodiments of the present invention, portions of one or more conductive traces may be formed near or surrounding or partially surrounding holes 2452, 2454, and/or 2456 to be electrically coupled to one or more connectors installed in such holes.

In various embodiments of the present invention, lighting panels and/or lighting systems may incorporate features to help control noise or unwanted sound. In interior spaces, some sources of noise or unwanted sound may include noise generated within the space (e.g., sound from human activities (talking, walking, work activities, etc.) and/or mechanical system noise (heating and air conditioning systems, elevator systems, generators, etc.), noise or sound transmission from other spaces (inter-room noise transfer, for example) or sound or noise from the outside environment. Approaches to reduce noise from outside of the space in consideration, sometimes called soundproofing, may include blocking the sound, absorbing the sound, or providing acoustic isolation from the sound source. Approaches to reduce noise generated from within the space in consideration, sometimes called sound absorption, may generally include approaches to absorb the undesired sound or noise.

Techniques to absorb sound have traditionally included use of soft or sound absorbing materials such as rugs, carpets, curtains as well as the use of acoustic (i.e., sound absorbing) wall or ceiling materials, such as fabrics or acoustic ceiling panels. One disadvantage to various conventional approaches is that sound-absorbing materials are typically soft or porous (in order to effectively absorb the sound), which may make them more prone to wear and in need of relatively frequent maintenance. For example, a carpeted floor will provide a higher level of sound absorption than a stone floor, but it will require more maintenance and require much more frequent replacement. In general, the same holds true for acoustic materials used on walls, particularly if they are positioned to permit soiling and/or damage from human activities.

The use of acoustic ceiling materials or panels addresses some of the issues with sound-absorbing materials on floors and walls, but the sound-reduction potential decreases as the ceiling area is consumed by other ceiling elements such as lighting. Additionally, the use of open ceiling concepts, in which the entire ceiling is not covered, reduces the area available for sound absorption.

Various embodiments of the present invention feature a lighting panel or a lighting system incorporating the capability to provide both illumination and sound absorption. As detailed above, light panels in accordance with embodiments of the invention may define one or more openings or holes therein or therethrough, and such openings may be beneficially utilized to improve the sound-absorption capability of the light panel. For example, in various embodiments of the present invention, a lighting panel or lighting system includes a substrate containing an array of light-emitting elements backed by a sound-absorbing material, where the substrate incorporates openings or apertures through the substrate exposing the underlying sound-absorption material, such that sound incident upon the lighting panel or lighting system may pass through the openings and be absorbed in the sound absorbing material. In various embodiments, such lighting systems and/or lighting panels may be used to augment the sound-absorption capacity in a space or may be used to replace a portion of or an entire ceiling, while providing both illumination and sound absorption capability. In various embodiments, one or more portions of the sound-absorption material may even protrude into one or more of the holes in the light panel and may even protrude beyond and over the top surface of the light panel. Such portions of the sound-absorption material may have increased thickness compared to portions of the material underlying closed portions of the light panel, which may enhance the sound absorption of the material. In addition, as detailed above, one or more other objects (e.g., spacers, connectors, fasteners, hooks, etc.) may be disposed on and/or through the sound-absorption material and protrude through one or more of the apertures defined in the lighting panel.

FIGS. 25A and 25B depict an exemplary lighting panel 2500 in accordance with embodiments of the present invention, although alternative systems with similar functionality are also within the scope of the invention. FIG. 25B shows a cross-section of the structure of FIG. 25A through cut-line A-A'. In various embodiments, lighting panel 2500 includes, consists essentially of, or consists of one or more substrates 2510, an array of LEEs 230 and one or more apertures 2031 that form an opening or hole through substrate 2510. While FIG. 25A shows apertures 2031 as rectangles, in other embodiments apertures 2031 may have other shapes, for example squares, circles or any arbitrary shape. The shape of apertures 2031 is not a limitation of the present invention. In various embodiments, all apertures 2031 may have the same size and shape, while in other embodiments lighting panel 2500 may include apertures with different shapes and/or sizes. As shown in FIG. 25A, single apertures 2031 may be positioned between rows of LEEs 230 such that, across each portion of lighting panel 2500, only a single aperture 2031 extends across the width of lighting panel 2500.

One aspect of apertures 2031 is that the apertures are positioned in non-electrically active portions of the light panel; that is, they do not interfere with nor do the edges of apertures 2031 cut through the electrical circuitry of the lighting panel material nor is any edge of aperture 2031 electrically coupled to the electrical circuit powering and/or controlling LEEs 230. For example, in various embodiments of the present invention, substrate 2510 may include electrical components such as LEEs 230 and CEs 240 as well as conductive traces or electrical connections such as conductive traces 260 and power conductors 210 and 220 as described in reference to FIG. 2A, and apertures 2031 are positioned such that they do not cut through or encompass any conductive trace 260 or any power conductor 210, 220 or any LEEs 230, CEs 240 or any other circuitry.

Figure 26C:
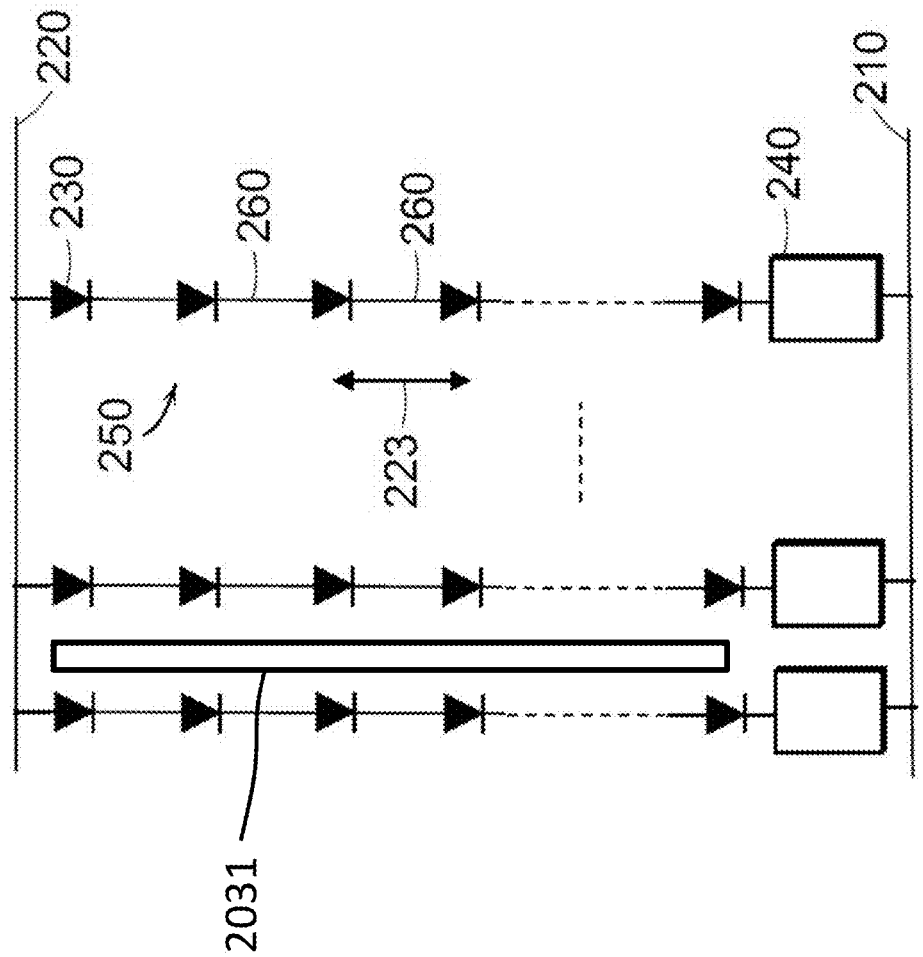
FIG. 26C is a partial circuit diagram of a light sheet in accordance with various embodiments of the invention.

FIG. 26C shows the partial electrical schematic of FIG. 2A with a representation of aperture 2031 overlaid on the partial electrical schematic in accordance with embodiments of the present invention, indicating the positioning of aperture 2013 in a region that does not contain any part of the electrical circuit. In various embodiments of the present invention, aperture 2031 may cut through a portion of conductive material on substrate 2510; however, in such embodiments the portion of conductive material is not electrically coupled to the electrical circuit powering and/or controlling LEEs 230.

Figure 26D:
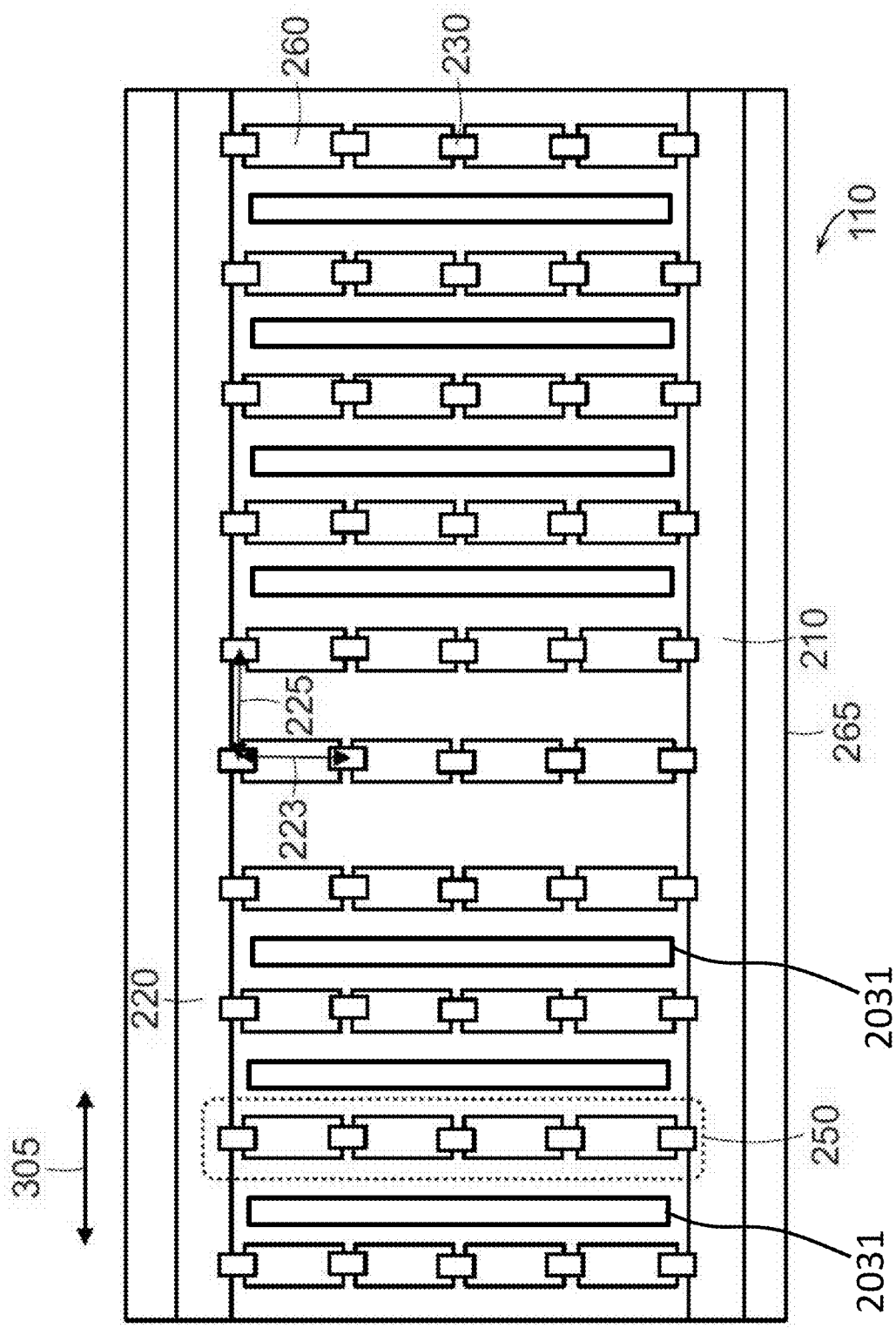
FIG. 26D is a partial schematic of a light sheet in accordance with various embodiments of the invention.

FIG. 26D shows the partial schematic of FIG. 2C with a representation of aperture 2013 overlaid on the partial schematic in accordance with embodiments of the present invention, indicating the positioning of aperture 2031 in a region that does not contain any part of the electrical circuit. In various embodiments of the present invention, apertures 2031 may be positioned and/or the area of apertures 2031 may be maximized without affecting or disrupting the pitch of LEEs 230, for example, referring to FIG. 26D, apertures 2031 may be sized and positioned without requiring a change in pitch 223 or 225. Thus, in various embodiments of the invention, LEEs 230 are spaced apart at a string pitch 225, and the width of apertures 2031 may be less than the string pitch 225 (e.g., between approximately 10% and approximately 80% of pitch 225, between approximately 20% and approximately 70% of pitch 225, or between approximately 30% and approximately 60% of pitch 225). As mentioned above, the LEE pitch 223 within one or more strings of LEEs may be, in various embodiments, approximately the same as string pitch 225.

FIGS. 26A and 26B depict an exemplary lighting panel 2600 in accordance with embodiments of the present invention, although alternative systems with similar functionality are also within the scope of the invention. FIG. 26B shows a cross-section of the structure of FIG. 26A through cut-line B-B'. Lighting panel 2600 is similar to lighting panel 2500 described in reference to FIGS. 25A and 25B but with the addition of sound-absorbing material 2610. As shown in FIG. 26B, sound-absorbing material 2610 is positioned on the back of substrate 2510, i.e., it is on the side opposite LEEs 230; however, this is not a limitation of the present invention and in other embodiments sound-absorbing material may be positioned on the front of substrate 2510, that is on the same side as LEEs 230 or may be positioned on both the front and back sides of substrate 2510. For example, sound-absorbing material may be positioned on the back side of the substrate beneath one or more (or even all) of the apertures 2031 and on the front side of the substrate in one or more areas between the apertures 2031, thereby increasing or maximizing sound absorption of the lighting panel 2600. In various embodiments of the present invention, apertures 2031 permit sound to pass through substrate 2501 and impinge on sound-absorbing material 2610, where all or a portion of the sound may be absorbed. In various embodiments of the present invention, lighting panel 2600 may be used to both provide illumination and to provide a reduction in the noise or sound level in the environment in which the light panel is installed.

In various embodiments, the surface of the sound-absorbing material 2610 may have approximately the same size and shape as that of the substrate 2510 (i.e., without considering the apertures defined through the substrate). That is, the outer perimeter of the sound-absorbing material 2610 may substantially conform to the outer perimeter of the substrate 2510; i.e., the outer perimeter of the sound-absorbing material may conform to the outer perimeter of the substrate 2510 ±5 mm, ±2 mm, or ±1 mm.

In embodiments in which sound-absorbing material 2610 is disposed on the front side of substrate 2510, the sound-absorbing material 2610 may itself define apertures therethrough in order to facilitate emission of light from the LEEs 230 into the space. For example, single apertures may be defined over single LEEs 230, multiple LEES 230, or even one or more strings of LEEs 230. Despite such absent portions of the sound-absorbing material 2610, embodiments of the invention will still exhibit favorable sound-absorbing properties. In various embodiments, an overlying sound-absorbing material 2610 may have solid portions that overlap, or even entirely cover, one or more of the apertures 2031 defined in the substrate 2510. Thus, in such embodiments, the effective thickness (and thus sound-absorbing capability) of the sound-absorbing material disposed between LEEs is increased when compared to embodiments in which sound-absorbing material 2610 is disposed only beneath substrate 2510. In embodiments in which apertures are defined in an overlying sound-absorbing material 2610 (see also FIGS. 26E and 26F), such apertures may be disposed over one or more LEEs, and at least portions of the interior surfaces of such apertures may be diffusely or specularly reflective to light emitted by the LEEs. For example, at least portions of the interior surfaces of such apertures may be coated with a reflective coating.

A standard method of quantitatively determining the level of sound absorption of a particular material or structure is ASTM Procedure C 432-09a, *Standard Test method for Sound Absorption Coefficients by the Reverberation Room Method*, which is hereby incorporated by reference. The standard is available from ASTM or at www.astm.org. This test method provides the absorption coefficient as a function of frequency, for example from about 40 Hz to about 10 kHz. It also provides two single-value (or scalar) representations of the amount of sound energy that is absorbed upon striking a particular surface, called the noise reduction coefficient (NRC) and the Sound Absorption Average (SAA). The NRC is the average of four sound absorption coefficients of the particular surface at four ⅓ octave frequencies (250 Hz, 500 Hz, 1000 Hz, and 2000 Hz). The SAA is the average sound absorption coefficients of the particular surface at twelve ⅓ octave frequencies from 200 Hz to 2500 Hz. These frequency ranges approximately cover sound from human speech and thus provides an approximate quantification of how well the surface will absorb human voice. A NRC or SAA value of 0 indicates substantially perfect reflection of sound while a NRC or SAA value of 1 indicates substantially perfect absorption of sound. Note that in some cases measured values of NRC and/or SAA may be above 1, related to certain measurement conditions, for example thick test samples in which sound may be absorbed by the edges. While sound-absorption capabilities have been described herein in reference to ASTM C 432-09a, this is not a limitation of the present invention, and in other embodiments other methods or standards may be used to evaluate, quantify and/or compare sound-absorption capabilities.

In various embodiments, sound-absorbing material 2610 may include, consist essentially of, or consist of at least one of fiberglass, foam (e.g., sound-absorbing foam), cellulose, mineral wool, mineral fiber, fleece (e.g., acoustic fleece), acoustic ceiling tile, polyester, polyester felt, polyethylene terephthalate (PET), recycled PET, or fiberglass foam or other materials. In various embodiments, sound-absorbing material 2610 may be substantially rigid, as exemplified by Whispertone Tackboard or Whispertone Wallboard manufactured by Johns Manville or Cirrus or Cirrus High NRC manufactured by Armstrong World Industries, while in other embodiments sound-absorbing material 2610 may flexible or soft or in batting form, as exemplified by Akustikvlies (acoustic fleece) manufactured by Pongs or QuietZone Pink Fiberglas Acoustic batt insulation manufactured by Owens Corning. In various embodiments of the present invention, sound-absorbing material 2610 may include, consist essentially of, or consist of one or more panels of polyester or PET or recycled PET having a thickness in the range of about 4 mm to about 50 mm, or in the range of about 6 mm to about 25 mm, or in the range of about 8 mm to about 15 mm. In various embodiments of the present invention, sound-absorbing material 2610 may include, consist essentially of, or consist of one or more panels of polyester or PET or recycled PET having a weight in the range of about 1 kg/m' to about 40 kg/m$^2$, or in the range of about 3 kg/m$^2$ to about 25 kg/m$^2$, or in the range of about 4 kg/m$^2$ to about 15 kg/m$^2$. In various embodiments of the present invention, sound-absorbing material 2610 may include, consist essentially of, or consist of one or more panels of polyester or PET or recycled PET having a density in the range of about 40 kg/m$^3$ to about 500 kg/m$^3$, or in the range of about 100 kg/m$^3$ to about 350 kg/m$^3$, or in the range of about 150 kg/m$^3$ to about 300 kg/m$^3$.

In various embodiments of the present invention, "soft" sound-absorbing material may have a hardness as measured on the Shore 00 scale less than about 30, less than about 15, or less than about 7. In various embodiments of the present invention, sound-absorbing material 2610 may have a noise reduction coefficient greater than about 0.25, greater than about 0.6, or greater than about 0.7 (e.g., as measured in accordance with ASTM C 432-09a). In various embodiments, sound-absorbing material may be "deformable" in the sense of conformally yielding to a force, but the deformation may or may not be permanent; that is, the material may not be resilient. Flexible materials used herein may or may not be deformable (i.e., they may elastically respond by, for example, bending without undergoing structural distortion), and deformable materials may or may not be flexible (i.e., they may undergo permanent structural distortion in response to a force).

In various embodiments of the present invention, the quantity, shape, size, and position of the apertures may be modified to achieve a particular NRC value or to achieve as high as NRC value as possible. In various embodiments of the present invention, the NRC value of the lighting panel is proportional or substantially proportional to the exposed area of sound-absorbing material 2610. For example, consider a lighting panel having a total surface area of value P and total aperture area A. In various embodiments of the present invention, NRC (lighting panel) is equal to or approximately equal to NRC (sound-absorbing material)* (A/P). Examination of this relationship indicates that increasing the ratio of total aperture area to light panel area (A/P) will increase the NRC of the lighting panel. In various embodiments of the present invention, the ratio of total aperture area to light panel area (A/P) may be greater than about 0.25, greater than about 0.5, greater than about 0.7, or greater than about 0.8. In various embodiments of the present invention, the substrate design may be optimized to maximize the ratio of total aperture area to light panel area (A/P). In various embodiments of the present invention increasing or maximizing the aperture area and/or the A/P ratio is done with the constraint that the aperture does not interfere with the electrically active portions of the light panel or the electrical circuitry on the light panel. In various embodiments of the present invention, apertures 2031 may be configured to occupy all of the area of lighting panel 2600 or substrate 2510 to within an aperture setback 2615 of LEEs 230 (and/or rows, columns, and/or strings thereof), other electronic components, circuitry, and/or the edges of the lighting panel. Referring to FIG. 26A, aperture 2615 has aperture setback 2615 around LEEs 230 and between the edge of aperture 2032 and the edge of substrate 2510. In various embodiments of the present invention, aperture setback 2615 may be less than about 10 mm, or less than about 5 mm, or less than about 2.5 mm.

In various embodiments of the present invention, sound-absorption material 2610 may have a thickness in the range of 0.5 inch to about 3 inches; however, this is not a limitation of the present invention, and in other embodiments the thickness of sound absorption material 2610 may be less than 0.5 inch or greater than 3 inches. In various embodiments of the present invention, a lighting panel may have a NRC value greater than about 0.2, greater than about 0.5, or greater than about 0.7. The NRC value may be less than about 1.

FIGS. 26E and 26F depict a portion of an exemplary lighting panel 2601 in accordance with embodiments of the present invention, although alternative systems with similar functionality are also within the scope of the invention. FIG.

26F shows a cross-section of the structure of FIG. 26E through cut-line C-C'. In various embodiments, lighting panel 2601 includes, consists essentially of, or consists of one or more substrates 2510, an array of LEEs 230 and sound-absorption material 2610 mounted or positioned on top of substrate 2510, that is on the same side of substrate 2510 as LEEs 230, having one or more apertures 2620 that form an opening or hole through sound-absorbing material 2610 and exposing LEEs 230. While FIG. 26E shows apertures 2620 having sloped sidewalls 2630 this is not a limitation of the present invention, and in other embodiments sidewalls 2630 may be vertical or have any arbitrary fixed or varying slope. In various embodiments of the present invention, the area of sound-absorbing material may be maximized by setting the size 2640 (e.g., width, diameter, or area) of the opening in sound-absorbing material 2610 to less than about 10 times the size 2650 of LEE 230, or to less than about 5 times the size 2650 of LEE 230, or to less than about 3 times the size 2650 of LEE 230, or to less than about 2 times the size 2650 of LEE 230. In various embodiments, lighting panels may have LEEs 230 disposed on both sides of substrate 2510, and sound-absorbing material 2610 may be disposed on both sides of the substrate as depicted for a single side in FIGS. 26E and 26F.

FIGS. 27A and 27B depict an exemplary lighting panel 2700 in accordance with embodiments of the present invention, although alternative systems with similar functionality are also within the scope of the invention. FIG. 27B shows a cross-section of the structure of FIG. 27A through cut-line D-D'. Lighting panel 2700 is similar to lighting panel 2600 described in reference to FIGS. 26A and 26B; however, lighting system 2700 also includes connectors 2030, 2030', 2040, and 2040' as described herein. In various embodiments, the use of connectors 2030, 2030', 2040, and 2040' facilitates the supply of electrical power to the lighting panel 2700 without the need to provide electrical wires or connections through the sound-absorbing material 2610 itself; such wires or connections may compromise the structural integrity or sound-absorbing properties of the sound-absorbing material 2610.

In various embodiments of the present invention, one or more connectors may be positioned or mounted on tabs, positioned or mounted on the back side of substrate 2510, and/or on tabs facing the back side (the side opposite the side on which LEEs 230 are positioned) of substrate 2510, and such connectors and/or tabs may be configured to overlap and electrically connect to a connector that faces the opposite direction (e.g., the front side of substrate, i.e., the same side of substrate 2510 as LEEs 230) on an adjacent light panel. FIGS. 27A and 27B depict connectors 2030' and 2040' positioned on tabs and which may be configured to electrically couple or connect to connectors 2040 and 2030 respectively on an adjacent light panel. Connectors 2030, 2030', 2040, and 2040' may have different genders and may each be disposed on (and thus face away from) either the front surface of the substrate or the back surface of the substrate. As discussed herein, in various embodiments of the present invention the connectors may be positioned on the tabs and the substrates such that the pitch between adjacent LEEs 230 on adjacent sheets is the same as or substantially the same as the pitch between adjacent LEEs 230 on each substrate. As shown, tabs containing connectors and/or portions of substrates on which connectors are disposed may not have sound-absorbing material 2610 disposed immediately therebelow, in order to provide access to the connectors (e.g., vertical connectors such as snap connectors) for connection thereof. In various embodiments, light panels and tiled light panels may have sound-absorbing material 2610 disposed immediately below connectors and/or tabs (see, e.g., FIG. 33B). In such embodiments, the sound-absorbing material 2610 may be disposed beneath the light panel(s) after interconnection of the tabs, and/or the areas of the light panel(s) proximate the connectors or tabs may not be affixed to the sound-absorbing material 2610 to enable access to and operation of the connectors.

As shown in FIGS. 27A and 27B, lighting panel 2700 also includes adhesive 2710 that may be used in various embodiments to adhere or bond substrate 2510 to sound-absorbing material 2610. In various embodiments, adhesive 2710 may include, consist essentially of, or consist of a spray adhesive, an epoxy, a glue, double-sided tape, or other adhesive means. The means of adhering lighting panel 2510 to sound-absorbing material 2610 is not a limitation of the present invention. While FIG. 27B shows adhesive 2710 over the entire surface of sound absorbing material 2710 that is adjacent to substrate 2510, this is not a limitation of the present invention, and in other embodiments adhesive 2710 may only cover a portion of the surface of sound absorbing material 2710 that is adjacent to substrate 2510 while in other embodiments adhesive 2710 may cover all or a portion or none of the surface of sound absorbing material 2610 under apertures 2031. For example, in various embodiments the adhesive 2710 may only be present beneath one or more solid portions of the substrate 2510, and not present beneath one or more of the apertures 2031. In other embodiments, the adhesive 2710 may be present beneath both one or more solid portions of the substrate 2510 and one or more of the apertures 2031.

FIG. 28A depicts an exemplary lighting panel 2800 in accordance with embodiments of the present invention, although alternative systems with similar functionality are also within the scope of the invention. Apertures 2031 in lighting panel 2800 have a different shape and size than those in lighting panels 2700, 2600 and 2500, as depicted in FIGS. 27A, 26A and 25A. In various embodiments of the present invention, substrate 2510 may be attached to sound-absorbing material 2610 by mechanical means, for example one or more mechanical connectors 2810. In various embodiments of the present invention, mechanical connector 2810 may include a barbed connector as shown in FIGS. 28B and 28C; however, this is not a limitation of the present invention, and in other embodiments other mechanical means may be used to attach substrate 2510 to sound-absorbing material 2610, for example one or more screws, bolts and nuts, nails, staples, or the like. The means of attaching or adhering substrate 2510 to sound-absorbing material 2610 is not a limitation of the present invention. In embodiments in which barbed connectors are utilized, as shown in FIGS. 28B and 28C, the terminal barbed portion of the connector may penetrate into but not through the sound-absorbing material 2610, as shown; in other embodiments, all or a portion of the barbed end of the connector may penetrate and protrude through the sound-absorbing material 2610.

FIG. 29A depicts an exemplary lighting panel 2901 in accordance with embodiments of the present invention, although alternative systems with similar functionality are also within the scope of the invention. In various embodiments of the present invention, apertures 2031 may have different shapes and sizes, for example as exemplified by apertures 2031 in FIG. 25A, apertures 2031' in FIG. 28A, apertures 2031" in FIG. 29, apertures 2031''' in FIG. 30, or apertures 2031' in FIG. 31A; however, the position, shapes, sizes and quantities of apertures are not a limitation of the present invention. While FIGS. 25A-28A show apertures having a rectangular shape this is not a limitation of the present invention, and in other embodiments the apertures may have any other shapes, for example a square, circle, triangle, parallelogram, trapezoid, pentagon, hexagon, or any arbitrary shape.

While FIGS. 25A-28A depict a rectangular lighting panel, this is not a limitation of the present invention, and in other embodiments lighting panels may have any other shapes, for example a square, circle, triangle, parallelogram, trapezoid, pentagon, hexagon or any arbitrary shape. FIG. 29A shows lighting panel 2900 having one rounded corner, for example to provide illumination to an object with a curved shape or in a curved corner of a space. FIG. 29B shows lighting panel 2901 having a hexagonal shape. FIG. 29C shows lighting panel 2902 having a triangular shape. In various embodiments of the present invention, the apertures in a lighting panel may have different shapes and/or sizes. For example, lighting panel 2901 has apertures with three different shapes and sizes, identified as apertures 2031'', 2931, and 2931', while lighting panel 2902 has three different size trapezoidal apertures 2932, 2932', and 2932''. FIG. 29D shows lighting panel 2903 having a rectangular shape with a relatively large array of relatively small apertures 2933, while FIG. 29E shows a magnified view of region 2950 of lighting system 2903 in FIG. 29D. Thus, in various embodiments of the invention, one or more (or even each) of the apertures 2933 may have a size (e.g., diameter or width or area) smaller than that of one or more of the LEEs 230.

While FIGS. 29D and 29E show apertures 2933 as circular this is not a limitation of the present invention, and in other embodiments apertures 2903 may have other shapes for example, square, rectangle, triangle, pentagon, hexagon or any arbitrary shape. While FIGS. 29D and 29E show apertures 2933 in a periodic array this is not a limitation of the present invention, and in other embodiments apertures 2903 may be positioned with other patterns, for example a hexagonal array, or may be positioned randomly. In various embodiments of the present invention, apertures 2933 may have a size or diameter in the range of about 0.1 mm to about 10 mm, or in the range of about 0.5 mm to about 5 mm. In various embodiments of the present invention, the A/P ratio may be greater than about 0.25, greater than about 0.5, greater than about 0.7, or greater than about 0.8.

FIGS. 30A and 30B depict an exemplary lighting panel 3000 in accordance with embodiments of the present invention, although alternative systems with similar functionality are also within the scope of the invention. FIG. 30B shows a cross-section of the structure of FIG. 30A through cut-line E-E'. Lighting panel 3000 is similar to lighting panel 2600 described in reference to FIGS. 26A and 26B with the addition of various connectors. In various embodiments, lighting panel 3000 may include connectors that are electrically connected to power conductors to provide power to LEEs 230. In various embodiments, lighting panel 3000 may include connectors as described herein, for example connectors 2030, 2030', 2040, and 2040'.

In various embodiments of the present invention, lighting panel 3000 may include a stiffener 3010 having one or more apertures 3020 therethrough. In various embodiments of the present invention, stiffener 3010 may provide stiffness to lighting panel 3000, for example if sound-absorbing material 2610 is not rigid, for example when using batting or fleece as the sound-absorbing material. In various embodiments, substrate 2510 may be flexible, in which case stiffener 3010 may be used, particularly in conjunction with soft and/or flexible sound-absorbing material 2610', as shown in FIG. 30B. In various embodiments of the present invention, apertures 3020 may correspond in position, quantity, size, and shape to apertures 2031' in substrate 2510, to minimize or eliminate any blocking or reflection of incident sound by stiffener 3010. In various embodiments of the present invention, stiffener 3010 may include, consist essentially of, or consist of sound-absorbing material itself. For example, in various embodiments stiffener 3010 may include, consist essentially of, or consist of a rigid sound-absorbing material and sound-absorbing material 2610' may include, consist essentially of, or consist of a soft and/or flexible sound-absorbing material. In such embodiments, one or more sound-absorbing properties (e.g., NRC) of the stiffener 3010 may be approximately equal to or superior to those of sound-absorbing material 2610'. In other embodiments, the stiffener 3010 may be rigid but exhibit one or more sound-absorbing properties (e.g., NRC) that are inferior to those of sound-absorbing material 2610'. For example, the NRC of stiffener 3010 may be less than 0.5, less than 0.3, less than 0.2, or less than 0.1.

Figure 31A:
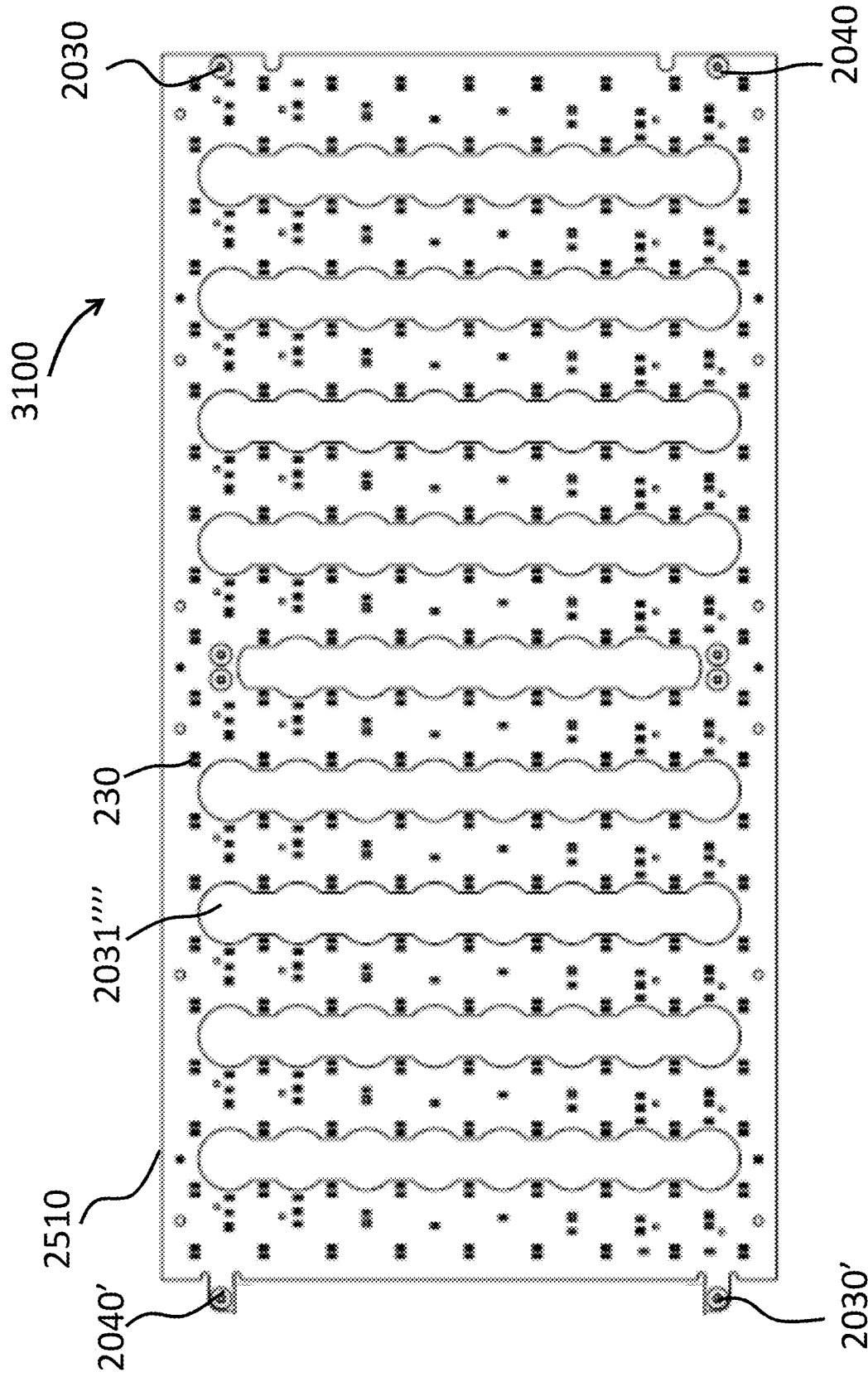
FIG. 31A is a schematic plan view of a lighting panel in accordance with various embodiments of the invention.
Figure 31B:
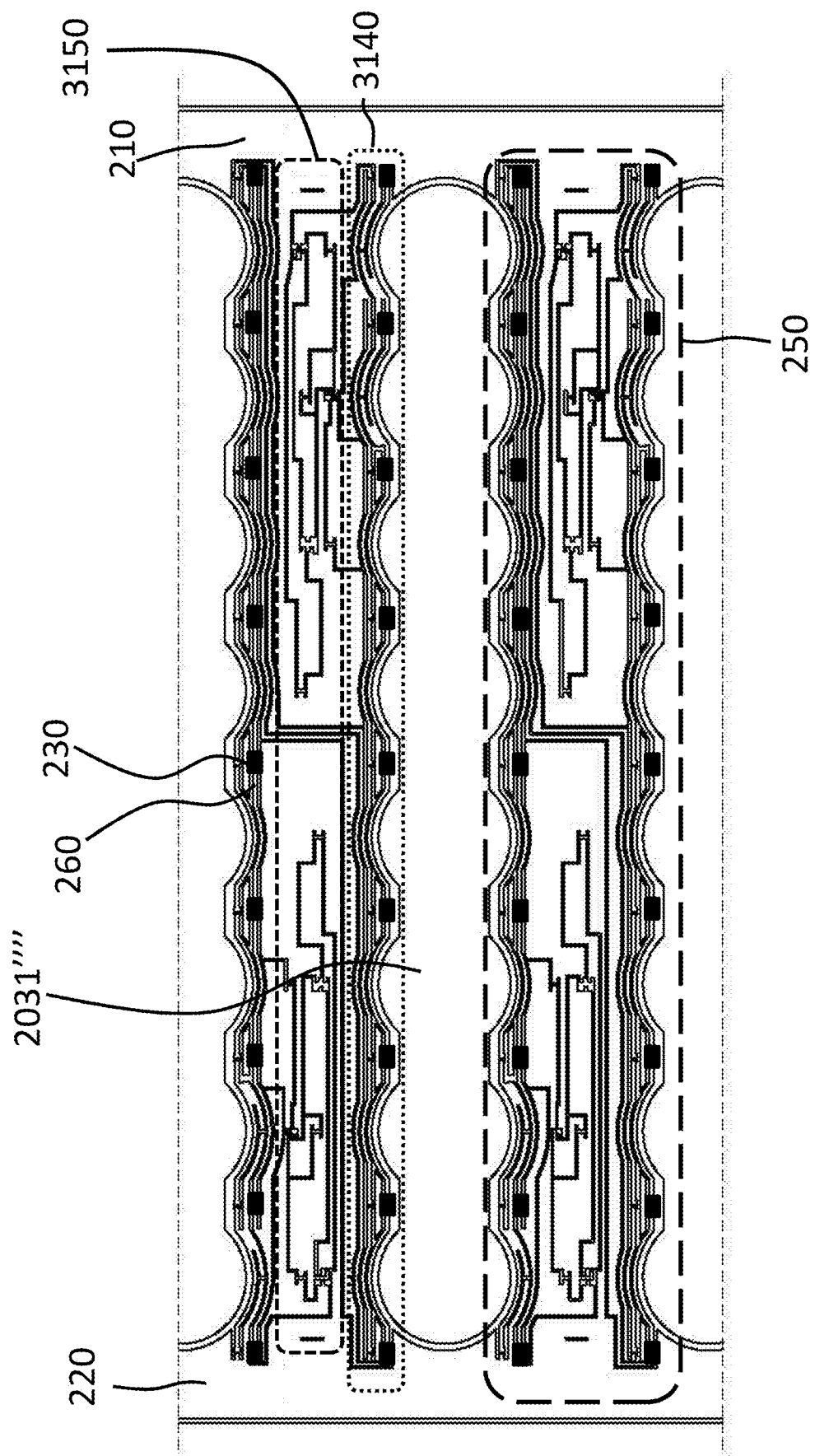
FIG. 31B is a schematic plan view of a portion of a lighting panel in accordance with various embodiments of the invention.

FIG. 31A depicts an exemplary lighting panel 3100 in accordance with embodiments of the present invention, although alternative systems with similar functionality are also within the scope of the invention. In various embodiments of the present invention, the area of apertures 2031 (e.g., apertures 2031'''' in FIG. 31A) may be maximized to provide the largest area for access to underlying sound absorption material 2610 to maximize the NRC of the lighting panel. FIG. 31B depicts an enlarged view of a portion of lighting panel 3100 of FIG. 31A, and FIG. 31B depicts power conductors or power bus lines 210 and 220 and conductive traces 260 and strings 250 of electrically connected LEEs 230, as described in reference to FIGS. 2B and 2C. Referring to both FIGS. 31A and 31B, connectors 2030' and 2040 may be electrically connected to power conductor 220 and connectors 2040' and 2030 may be electrically connected to power conductor 210. In the embodiment shown in FIG. 31B, string 250 includes LEEs 230 as well as well as a current control element (CE) 240 in area 3150 (the individual elements of CE 240 are not shown in FIG. 31B for simplicity). As depicted in FIG. 31B, conductive traces 260 have been laid out to maximize the area of aperture 2031' while maintaining the regular position and pitch of LEEs 230 as well as ensuring aperture 2031'''' does not intersect or interfere with any of the electrical circuitry. In other words, all electrical components and circuitry are positioned outside of aperture 2031'. The total aperture area of lighting panel 3100 is about 30% of the total surface area of lighting panel 3100. In various embodiments of the present invention, the position of LEEs 230, conductive traces 260, optional CEs 240 and any other elements may be adjusted to maximize the total aperture area. In various embodiments of the present invention, the total aperture area of lighting panel 3100 may be greater than 25% of the total surface area of lighting panel 3100, or greater than 50% of the total surface area of lighting panel 3100, or greater than 70% of the total surface area of lighting panel 3100.

As shown in FIG. 31B, portions of the electrical traces 260 and/or power conductors 210, 220 may change direction (e.g., be curved) proximate one or more portions of the aperture 2031''''. For example, an electrical trace 260 may be straight in portions directly connected to one or more LEEs 230 and change direction (e.g., be curved) in one or more regions between LEEs 230. Such configurations may enable the use of larger aperture areas than configurations in which electrical traces or connections extend in straight lines between light-emitting devices. While electrical traces and/or power conductors having curved portions and/or one or more directional changes will have longer lengths than if they followed substantially straight lines, any potential disadvantages related thereto (e.g., higher overall electrical resistance) may be considered to be a trade-off for the enhanced sound-absorption properties afforded by the larger apertures enabled by such traces and/or power conductors.

Three configurations of a surface-mounted lighting system were tested using ASTM Procedure C 423-09a to determine their NRC and Sound Absorption Average (SAA) values. The lighting systems were mounted using the E-400 configuration with acoustic test signal 3260 impinging on a fabric 1240 as shown in FIGS. 32A and 32B. FIG. 32A shows a schematic of lighting system 3200 including a frame 3210, a fabric diffuser 1240, and a lighting panel 3220 that includes substrate 2510, LEEs 230 and solid back panel 3230, mounted in a test system 3250 with a spacing 3240 behind the back of solid back panel 3230 installed in test system 3250. Substrate 2510 includes apertures 2031, but these are blocked or closed from the back by solid back panel 3230 and lighting panel 3220 does not include any sound-absorption material.

FIG. 32B shows a schematic of lighting system 3201 including frame 3210, diffuser 1240 and lighting panel 3221 that includes substrate 2510, LEEs 230, perforated back panel 3231 and sound-absorbing material 1640, installed in test system 3250 with a spacing 3240 between the back of sound absorbing material 1640 and test system 3250. Substrate 2510 includes apertures 2031, which were matched by openings in perforated back panel 3230, thus exposing sound-absorbing material 1640 through perforated back panel 3231 and substrate 2510.

Lighting systems 3200 and 3201 each had a length of about 10 feet and a width of about 12 feet. Spacing 3240 was set at about 400 mm. Diffuser 1240 was a fabric diffuser, but this is not a limitation of the present invention and in other embodiment other materials may be utilized for diffuser 1240. Two different sound-absorbing materials 2610 were evaluated, as listed in Table 1. Table 1 shows an improvement in NRC with the addition of sound-absorbing material by a factor between about 2 and about 2.6 for this lighting system. In this configuration the ratio of the total aperture 2031 area to total substrate area was about 32%.

TABLE 1

| Lighting System | Sound Absorbing Material | NRC | SAA |
|---|---|---|---|
| 3200 | None | 0.25 | 0.26 |
| 3201 | Soft Acoustic Fleece Batt | 0.50 | 0.51 |
| 3201 | 2" Fibreglass Foam Panel | 0.65 | 0.63 |

In various embodiments a lighting system including one or more lighting panels may have a NRC value greater than about 0.2, greater than about 0.5, greater than about 0.6, or greater than about 0.7.

In various embodiments, two or more lighting panels may be tiled together, i.e., placed adjacent to each other and/or interconnected together. FIGS. 33A and 33B show exemplary plan view and cross-sectional views, respectively, of four lighting panels that are tiled together. FIG. 33B shows a cross-section of the structure of FIG. 33A through cut-line F-F'. In various embodiments of the present invention, connectors on lighting panel 2510' are electrically connected to connectors on lighting panel 2510, and connectors on lighting panel 2510' are electrically connected to connectors on lighting panel 2510" as described herein. In various embodiments of the present invention, connectors on lighting panel 2510' and 2510" are connected to power conductors 2120 and 2130 to provide power from power supply 2170 to the lighting panels, as described herein. As shown more clearly in FIG. 33B, in embodiments featuring connectors 2030', 2040' disposed on protruding tabs, the sound-absorbing material 2610 may not underlie the tabs in order to facilitate tiling of the lighting panels without overlapping the sound-absorbing material 2610 (while still having sound-absorbing material 2610 gaplessly underlie the tiled lighting panels).

In various embodiments of the present invention, lighting panels are tiled so that, when connected together, or when installed, the spacing or pitch between adjacent LEEs 230 is the same or substantially the same on one light panel as it is across the interface between adjacent light panels, as described herein. As discussed in reference to FIG. 2B, in various embodiments of the present invention LEEs 230 may be positioned in a periodic array, for example a substantially square or rectangular array, where LEEs 230 are separated by pitch (or "spacing") 223 in the one direction and by pitch 225 in an orthogonal or substantially orthogonal direction. Referring to FIG. 33A, in various embodiments of the present invention, lighting panels with sound-absorbing material 2610 may be tiled so that pitch 225 between adjacent LEEs 230 on one lighting panel is the same as or substantially the same as pitch 225' between adjacent LEEs 230 on adjacent lighting panels and pitch 223 between adjacent LEEs 230 on one lighting panel is the same as or substantially the same as pitch 223' between adjacent LEEs 230 on adjacent lighting panels.

Figure 33C:
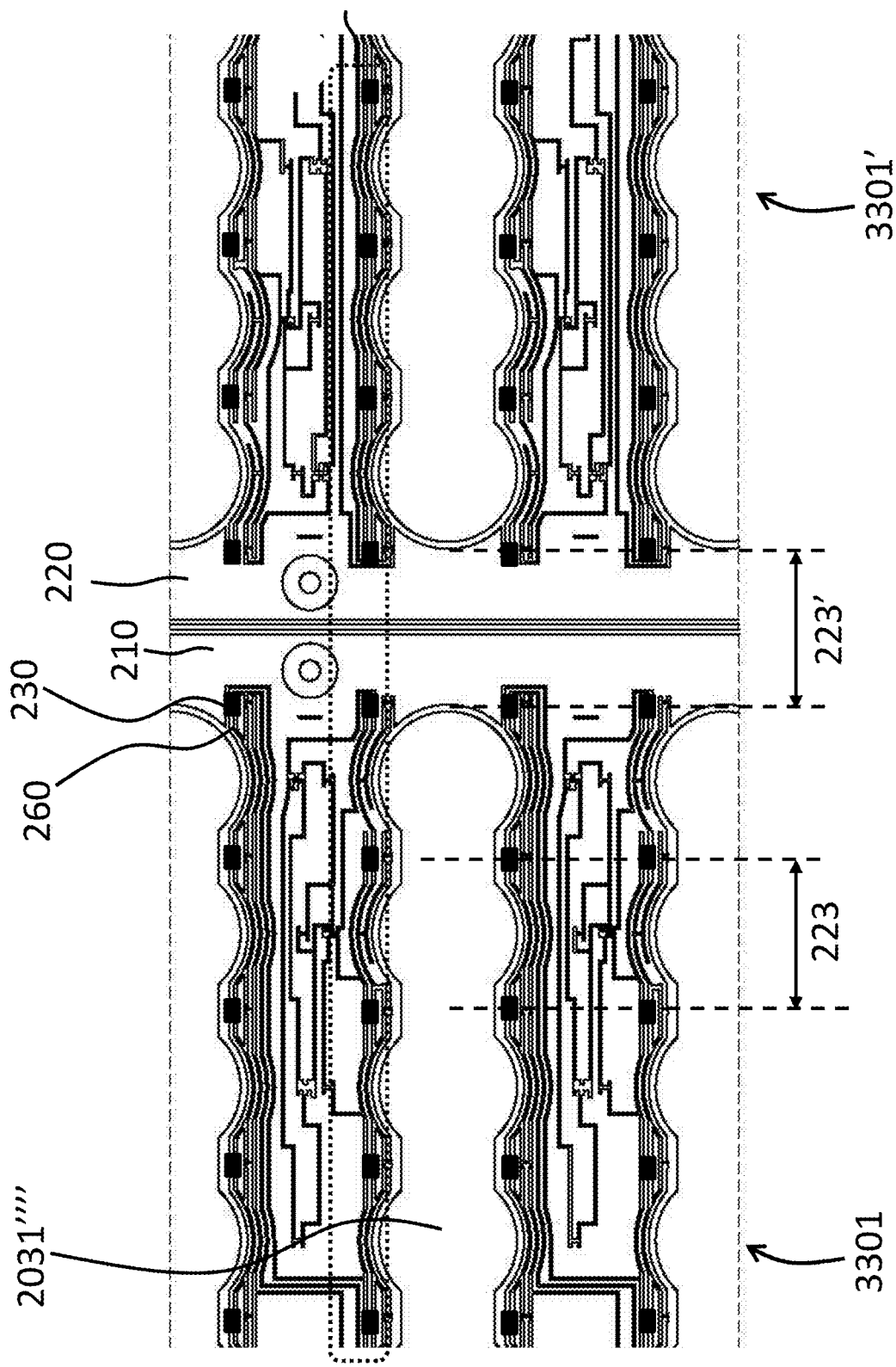
FIG. 33C is a schematic plan view of portions of a lighting panel in accordance with various embodiments of the invention.

FIG. 33C shows a portion of two lighting panels 3301 and 3301' tiled together such that, in various embodiments of the present invention, pitch 223 between adjacent LEEs 230 on one lighting panel is the same as or substantially the same as pitch 223' between adjacent LEEs 230 on adjacent lighting panels. In various embodiments of the present invention, conductive traces 260 may be routed or positioned to maximize the area of the apertures in the light panels so as to maximize the noise reduction coefficient of the lighting panel.

Referring to FIGS. 26A and 26B, sound-absorbing material 2610 is shown in FIGS. 26A and 26B as having the same or substantially the same size and shape as substrate 2510; however, this is not a limitation of the present invention, and in other embodiments sound-absorbing material 2610 may be smaller or large in size than substrate 2510 and/or may have a different shape than substrate 2510. That is, the sound-absorbing material 2610 may protrude inward or outward beneath the substrate 2510 on one or more edges thereof. In various embodiments, sound-absorbing material 2610 may be the same or substantially the same size and shape as substrate 2510 or may be smaller than substrate 2510, that is, the edges of sound-absorbing material 2610 may not extend beyond the edges of substrate 2510 so as to permit tiling of lighting panels 2600 adjacent to each other as shown in FIG. 33A.

FIGS. 34A and 34B depict an exemplary lighting panel 3400 in accordance with embodiments of the present invention, although alternative systems with similar functionality are also within the scope of the invention. FIG. 34B shows a cross-section of the structure of FIG. 34A through cut-line G-G'. Lighting panel 3400 is depicted with a portion of substrate 2510 removed for clarity to show the surface of the underlying sound-absorption material 2610, identified as 3410.

Figure 34C:
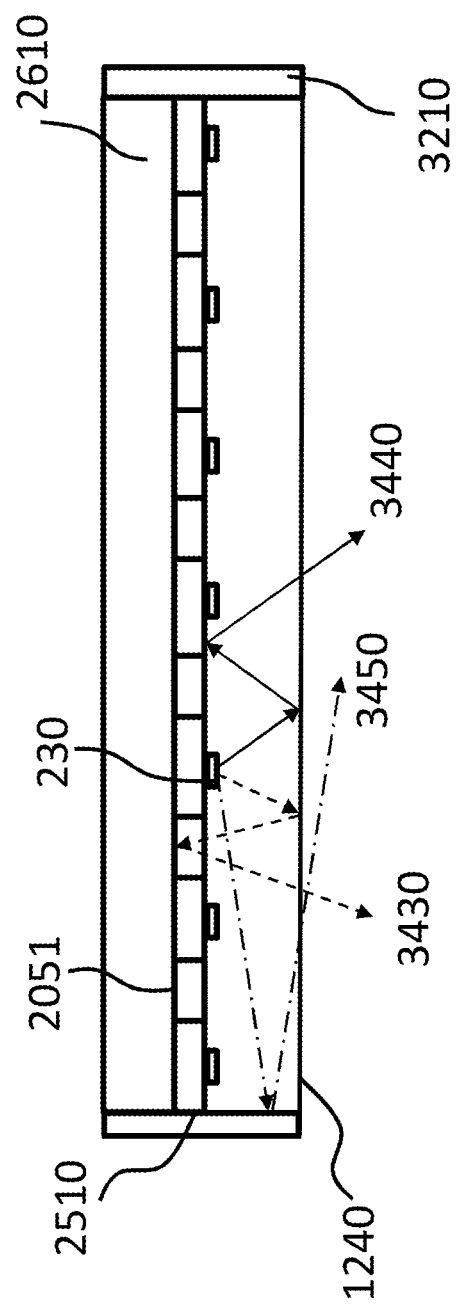
FIG. 34C is a schematic cross-sectional view of a lighting system in accordance with various embodiments of the invention.

In various embodiments of the present invention, a light panel may be overlaid or covered with an overlying optic, diffuser or translucent panel, and/or graphic panel 1240 as shown in FIG. 34C to soften or eliminate the image of individual LEEs 230 and/or to provide a homogeneous color and/or brightness over the entire area of the diffuser. Light emitted by LEEs 230 may reflect of off the diffuser or other surfaces within the optical cavity (for example the region between the diffuser and the lighting panel) and further reflect off of the lighting panel before being emitted into the exterior environment.

In various embodiments of the present invention, the lighting panel may have multiple surfaces from which light may reflect. In various embodiments of the present invention, light may reflect from the top surface of substrate 2510, identified as 3420 in FIGS. 34A and 34B, and from the top surface of sound-absorbing material 2610, identified as 3410 in FIGS. 34A and 34B. Referring to FIG. 34C, a portion of light emitted from LEEs 230 may reflect off of diffuser 1240, reflect from surface 3410 of sound-absorbing material 2610, and then be transmitted through diffuser 1240 (identified as light 3430). In various embodiments of the present invention, a portion of light emitted from LEEs 230 may reflect off of diffuser 1240 but then reflect from surface 3420 of substrate 2510 and be transmitted through diffuser 1240 (identified as light 3440). In various embodiments of the present invention, a portion of light emitted from LEEs 230 may reflect off of the surface of frame 3210 and be transmitted through diffuser 1240 (identified as light 3450). If the optical properties of surface 3410 of sound-absorbing material 2610 and/or surface 3420 of substrate 2510 and/or the surface of frame 3210 are sufficiently different, light 3430 and 3440 may have a visibly different color and/or intensity, which in some embodiments of the present invention may be undesirable. Note that while three types of reflections are described in reference to FIG. 34C this is not a limitation of the present invention, and in other embodiments other reflections may occur that may impact the color and/or intensity of the light viewed through diffuser 1240. For example, light from LEEs 230 may reflect off of frame 3210, reflect off of diffuser 1240 and reflect off of substrate 2510 before being transmitted through diffuser 1240.

The inventors have found that such undesirable variations in color and/or brightness may be reduced or eliminated by controlling the surfaces from which light may be reflected within the lighting system, for example within the optical cavity (the region in the lighting system exposed directly or indirectly to light emitted by LEEs 230) such that the color and/or intensity of light that reflects off of each of the surfaces is the same or substantially the same.

In various embodiments of the present invention, the surfaces of substrate 2510, sound-absorbing material 2610, and frame 3210 may constitute the main surfaces that may be controlled; however, this is not a limitation of the present invention, and in other embodiments other materials or surfaces may affect the viewed color or intensity and thus may be controlled as well.

In various embodiments of the present invention, such intensity and/or color variations may be minimized when the reflectivity of surfaces 3410 and/or 3420 and/or the surface of frame 3210 are the same or substantially the same. In various embodiments of the present invention, surfaces 3410 and 3420 may have an average reflectance in the range of about 0.6 to about 0.95 over a range of wavelengths emitted by LEEs 230. In various embodiments of the present invention, surfaces 3410 and 3420 may have an average reflectance in the range of about 0.5 to about 0.95 over a wavelength range from about 450 nm to about 750 nm. In various embodiments of the present invention, the difference in the average reflectance values of surfaces 3410 and 3420 may be less than about ±20% or less than about ±10%, or less than about ±5% or less than about ±2% or less than ±1%.

In various embodiments of the present invention interior portions of a lighting system may be painted with paint or pigment (e.g., white paint) to minimize color and/or intensity variations to match a surface color (e.g., a white surface color) of substrate 2510. In various embodiments of the present invention, a white gloss paint having a reflectance of about 0.69 may be used as a coating for interior portions of a lighting system (for example frame 3210 as described in reference to FIGS. 32A and 32B), and substrate 2510 may include a white solder mask having a reflectance of about 0.82; the difference in reflectivity of the white solder mask referenced to the white gloss paint being about 19%. In various embodiments of the present invention, a flat/matte white paint having a reflectance of about 0.83 may be used as a coating for interior portions of a lighting system (for example frame 3210 as described in reference to FIGS. 32A and 32B), and substrate 2510 may include a white solder mask having a reflectance of about 0.82; the difference in reflectivity of the white solder mask referenced to the flat/matt white paint being about 1%. In various embodiments of the present invention, a white gloss paint having a reflectance of about 0.69 may be used as a coating for interior portions of a lighting system (for example frame 3210 as described in reference to FIGS. 32A and 32B), and substrate 2510 may include exposed or uncovered aluminum conductors where, for example, aluminum conductors may have a reflectance of about 0.87; the difference in reflectivity of the aluminum conductors referenced to the white flat/matte paint being about 26%.

In various embodiments of the present invention such intensity and/or color variations may be minimized when the color of surfaces 3410 and/or 3420 and/or the surface of frame 3210 are the same or substantially the same. Color may be measured using a variety of color scales. One such scale is the CIE XYZ tristimulus scale. Another color scale that may have a better correlation with visual attributes is the CIE 1976 (L*a*b*) or CIELAB color scale, available as ISO 11664-4:2008(E)/CIE S 014-4/B: Joint ISO/CIE Standard: Colorimetry-Part4: CIE 1976 L*a*b* Colour Space (2007), available for example from the CIE or at www.Cie.Co.at, the entire disclosure of which is hereby incorporated by reference. CIELAB uses three numerical values to define the color; L* defines lightness, a* denotes the red/green value, and b* denotes the yellow/blue value. CIELAB is a color space specified in 1976 by the International Commission on Illumination. In the CIELAB color scale color differences are denoted as $\Delta E^* = [(\Delta L^*)^2 + (\Delta a^*)^2 + (\Delta b^*)^2]^{1/2}$ where $\Delta L^*$, $\Delta a^*$ and $\Delta b^*$ are the differences of the individual L*, a* and b* values. While colors and color differences have been described using CIELAB herein, this is not a limitation of the present invention, and in other embodiments other methods or standards may be used to evaluate, quantify and/or compare color and/or color differences.

In various embodiments of the present invention, different solder mask materials (for example inks and coverlays may have a CIELAB color values of about (94.3,0.9,−0.1), about (97.3,0.6,−0.7) or about (96.6, 0.0,−1.3) while a white reference (BaSO₄) may have a CIELAB color value of about (100,0,0). In various embodiments of the present invention, the color difference between surfaces to be controlled as determined by $\Delta E^*$ may be less than about 6, or less than about 3, or less than about 1. (A coverlay is a layer of material formed over the substrate, for example to provide a reflective surface, and for example may include, consist essentially of, or consist of PET, acrylic, polyester, or the like.)

A standard that is used to measure and compare whiteness is the ASTM E313 yellowness index, which is used to determine the degree to which a sample's color deviates from an ideal white. This is available from ASTM or from www.astm.org and is hereby incorporated by reference. In various embodiments of the present invention, different solder mask materials (for example inks and coverlays) may have Yellowness Index YI of about 0.45, about −1.05, or about −2.62, while a white reference ($BaSO_4$) may have a YI of about −0.07. In various embodiments of the present invention, the absolute value of the Yellowness difference between surfaces to be controlled as determined by $\Delta YI$ may be less than about 5, less than about 3, less than about 1.5, or less than about 0.75.

In various embodiments of the present invention, all or a portion of surface 3410 of sound-absorption material 2610 may be colored and/or coated to match (as described herein) the color and/or reflectivity of surface 3420 of substrate 2510. In various embodiments of the present invention, such coloring may be incorporated into sound-absorbing material 2610 itself; however, this is not a limitation of the present invention and in other embodiments such coloring may be implemented using a layer formed over or on sound-absorbing material 2610. In various embodiments, such a layer may include, consist essentially of, or consist of an ink, a paint, a dye, or the like. In various embodiments, such a layer may include, consist essentially of, or consist of a separate material overlaid on or adhered to surface 3410, for example a fabric, a polymer or the like. In various embodiments of the present invention, the layer may easily permit the transmission of sound therethrough, for example such a layer may have a sound transmission percentage of at least 50%, at least 75%, or at least 85%. In various embodiments, such a layer may be the same or similar to the material used in a fabric diffuser, for example as discussed in reference to FIG. 34C; that is, the same type of fabric or other material used for diffuser 1240 may be utilized to cover at least the exposed areas of sound-absorbing material 2610.

In various embodiments of the present invention, the surface 3410 of sound-absorption material 2610 may be colored to have a white color and a relatively high reflectivity. In various embodiments of the present invention, the surface of sound-absorbing material 2610 may have a YI between about −5 and about 5, or between about −2.5 and about 2.5, or between about −1 and about 1, or between about −0.5 and 0.5. In various embodiments of the present invention, the surface 3410 of sound-absorbing material 2610 may have a reflectivity greater than about 30%, or greater than about 50%, or greater than about 75%. In various embodiments of the present invention, sound-absorbing material 2610 may have a CIELAB L* value of at least 50, or at least 75, or at least 85.

In various embodiment of the present invention, a lighting panel may include a layer configured to protect LEEs during manufacture, shipping and installation. In various embodiments of the present invention, LEEs 230 (and optionally other components) may be mounted on substrate 2510, for example using means such as soldering, adhesive, or conductive adhesive, and during handling such LEEs may be subject to forces that may damage them or cause them to be removed from substrate 2510. Substrate 2510 may also be subject to possible damage, for example substrate 2510 may include, consist essentially of, or consist of a rigid or flexible printed circuit board (PCB) and may be subject to forces that may damage or cut the conductive traces on the PCB.

Figure 35F:
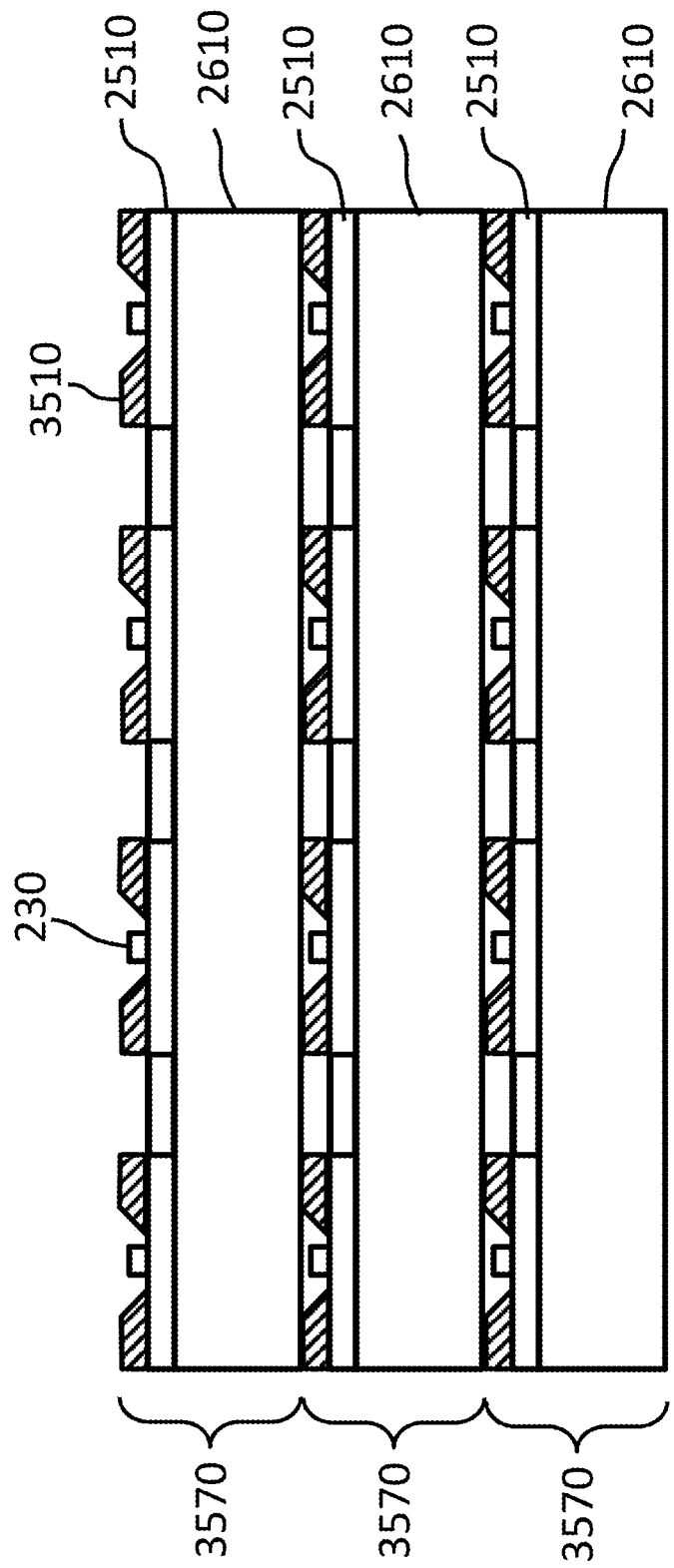
FIG. 35F is a schematic cross-sectional view of lighting panels in accordance with various embodiments of the invention.

FIGS. 35A-35F depict examples of a protective layer 3510 that may be disposed over substrate 2510 to protect LEEs 230 (and other optional components) and/or substrate 2510. In various embodiments, protective layer 3510 may include, consist essentially of, or consist of one or more rigid or flexible layers having openings or apertures to expose LEEs 230 and openings or apertures to expose sound-absorbing material 2610 through apertures 2031 in substrate 2510 (and/or openings to expose portions of sound-absorbing material that may be present on the top surface of substrate 2510). FIG. 35A shows a cross-section of an exemplary lighting panel including protective layer 3510 having openings 3540 for LEEs 230 and openings 3530 to expose sound-absorbing material 2610 through apertures 2031 in substrate 2510. While FIG. 35A shows openings 3530 in protective layer 3510 as the same or substantially the same size and shape as apertures 2031 in substrate 2510, this is not a limitation of the present invention, and in other embodiments openings 3530 in protective layer 3510 may have a different size and shape as apertures 2031 in substrate 2510. In various embodiments the NRC value of the lighting panel may be maximized by making openings 3530 in protective layer 3510 with a shape and size to fully expose apertures 2031 in substrate 2510; that is, the dimensions (e.g., width, diameter, area, etc.) of the openings 3530 may be larger than those of apertures 2031.

In various embodiments of the present invention, protective layer 3510 may have a height 3517 that is the same as, substantially the same as, or greater than the height of the top of LEE 230 above substrate 2510, identified as 3515 in FIG. 35A, e.g., to protect LEEs 230 from being damaged. In various embodiments of the present invention, height 3517 of protective layer 3510 may be at least equal to the height 3515 of LEE 230, or height 3517 of protective layer 3510 may be about 1.5 times height 3415 of LEE 230, or height 3517 of protective layer 3510 may be about 2 times height 3515 of LEE 230.

FIG. 35B shows a cross-section of an exemplary lighting panel including protective layer 3510 having openings 3550 that are sufficiently large to expose LEEs 230 and sound-absorbing material 2610 through apertures 2031 in substrate 2510.

FIG. 35C shows a cross-section of an exemplary lighting panel similar to that described in reference to FIG. 35A; however, protective layer 3510 in FIG. 35C incorporates a sloped sidewall 3560 around LEEs 230 to minimize possible shadowing or blockage of light emitted by LEEs 230 by protective layer 3510. While sloped wall 3560 is shown as a linearly sloped wall this is not a limitation of the present invention, and in other embodiments other slopes, for example a curved slope or a stepped slope, may be utilized. In various embodiments, the slope angle of wall 3560 may be different from a slope angle of the perimeter of apertures 2031. For example, the apertures 2031 may be surrounded by substantially vertical sidewalls; such sidewalls may enhance sound absorption by the underlying sound-absorbing material by not spuriously reflecting sound impinging upon the lighting panel and/or by maximizing the exposed area of any underlying sound-absorbing material.

FIGS. 35D and 35E show isometric views of an exemplary lighting panel similar to that described in reference to FIG. 31A, but including protective layer 3510. FIG. 35E shows a magnified view of the encircled region 3580 in FIG. 35D. Protective layer 3510 having openings 3540 for LEEs 230 and openings 3550 that expose both LEEs 230 and sound-absorbing material 2610 through apertures 2031 in substrate 2510. In the example shown in FIGS. 35D and 35E both openings 3540 and 3550 have sloped sidewalls 3560 as described herein.

In various embodiments, protective layer 3510 may include, consist essentially of, or consist of a polymer, metal, glass, phenolic, fiberglass, or the like. In various embodiments protective layer 3510 may include, consist essentially of, or consist of a vacuum-formed or thermoformed plastic layer. In various embodiments, protective layer 3510 may include, consist essentially of, or consist of acrylic, thermoplastic polyurethane, polyethylene, ABS, or the like. The material of construction of protective layer 3510 is not a limitation of the present invention.

As shown in FIGS. 35A-35E, protective layer 3510 has a top surface 3520. As discussed with reference to FIGS. 34A-34C, light emitted by LEEs 230 may also reflect from surface 3520 and/or the surface of sloped region 3560. Thus, surface 3520 and/or the surface of sloped region 3560 may represent another set of surfaces that are exposed directly or indirectly to light emitted by LEEs 230, and the color and/or intensity of light that reflects off of surface 3520 and/or the surface of sloped region 3560 is desirably the same or substantially the same as the color and/or intensity of light that reflects off of other surfaces within the optical cavity. Thus, the reflectance and/or color of such surfaces may be matched to that of one or more other surfaces of the lighting panel as detailed above.

In various embodiments of the present invention, the absolute value of the Yellowness difference between surfaces to be controlled as determined by ΔYI may be less than about 5, less than about 3, less than about 1.5, or less than about 0.75. In various embodiments of the present invention, the difference in the average reflectance values of surfaces 3410 and 3420 may be less than about ±20% or less than about ±10%, or less than about ±5% or less than about ±2% or less than ±1%.

In various embodiments of the present invention, all or a portion of surface 3410 of sound-absorption material 2610 may be colored and/or coated to match (as described herein) the color and/or reflectivity of surface 3520 of protective layer 3510. In various embodiments of the present invention, such coloring may be incorporated into sound-absorbing material 2610 itself; however, this is not a limitation of the present invention and in other embodiments such coloring may be implemented using a layer disposed over or on sound-absorbing material 2610. In various embodiments, such a layer may include, consist essentially of, or consist of an ink, a paint, a dye or the like. In various embodiments, such a layer may include, consist essentially of, or consist of a separate layer overlaid on or adhered to surface 3410, for example a fabric, a polymer or the like. In various embodiments of the present invention, the layer may easily permit the transmission of sound therethrough, for example such a layer may have a sound transmission percentage of at least 50%, or at least 75% or at least 85%. In various embodiments, such a layer may be the same or similar to the material used in a fabric diffuser, for example as discussed in reference to FIG. 34C; that is, the same fabric or material used for diffuser 1240 may be utilized to cover at least the exposed areas of sound-absorbing material 2610.

In various embodiments of the present invention, the surface of protective layer 3510 may be colored and/or coated to have a white color and a relatively high reflectivity. In various embodiments of the present invention, the surface of protective layer 3510 may have a YI between about −5 and about 5, or between about −2.5 and about 2.5, or between about −1 and about 1, or between about −0.5 and 0.5. In various embodiments of the present invention, the surface of protective layer 3510 may have a reflectivity greater than about 30%, or greater than about 50%, or greater than about 75%. In various embodiments of the present invention, the surface of protective layer 3510 may have a CIELAB L* value of at least 50, or at least 75, or at least 85.

FIG. 35F depicts multiple lighting panels 3570 stacked on top of each other, for example as might be arranged in a box for shipping. As shown in FIG. 35F, protective layer 3510 prevents the overlying sound-absorbing material 2610 from touching or damaging LEEs 230, permitting cost-effective packaging without the requirement of additional protective layers between lighting panels.

Figure 36A:
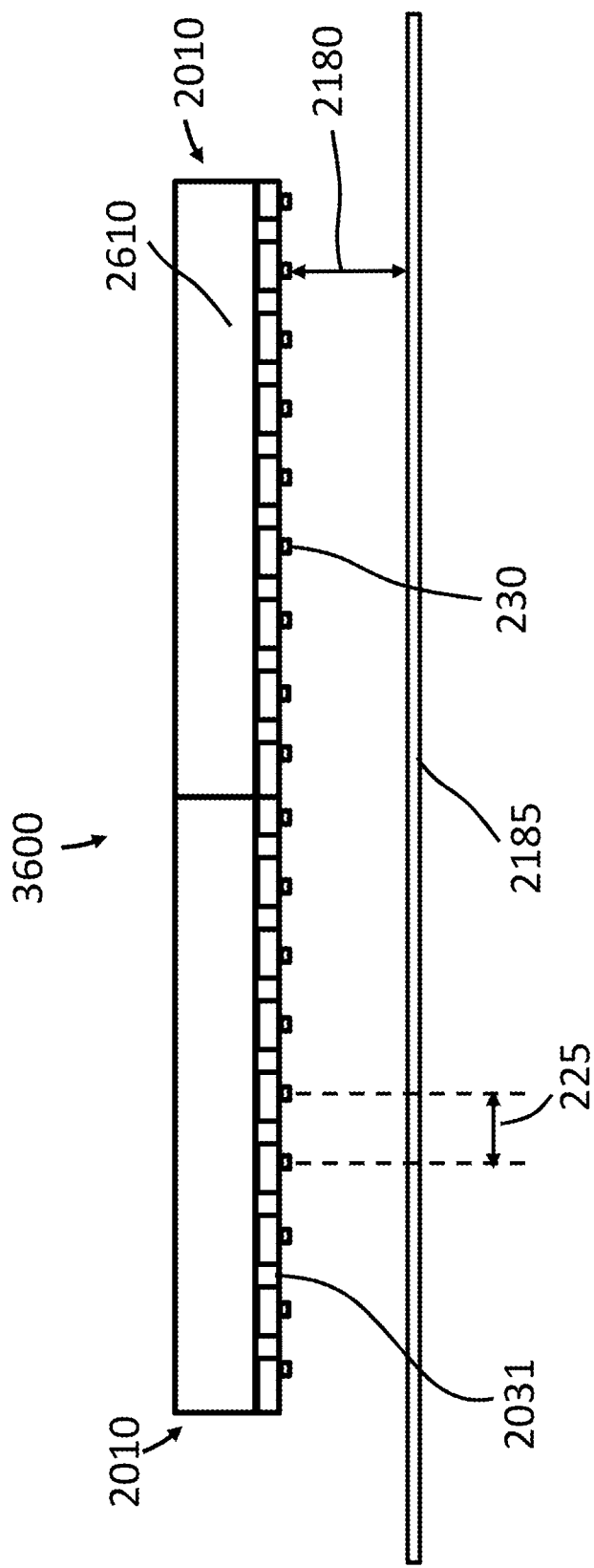

FIG. 36A shows a lighting system 3600 similar to that described in reference to FIG. 21F but incorporating sound-absorbing material 2610. In various embodiments of the present invention, spacing 2180 may be in the range of about 0.5 to about 5 times, or in the range of about 1 to about 2 times the spacing or pitch of LEEs on light panel 2010. In various embodiments of the present invention, spacing 2180 may be in the range of about 5 mm to about 500 mm, or in the range of about 10 mm to about 100 mm. In various embodiments of the present invention, optic 2185 may include, consist essentially of or consist of a lens, a diffuser, a refractive optic, a reflective optic, a Fresnel optic, a fabric, a translucent material such as plastic or stone, a graphic panel, a membrane or the like.

FIG. 36B depicts an exemplary lighting system 3602 in accordance with embodiments of the present invention, although alternative systems with similar functionality are also within the scope of the invention. Lighting system 3602 includes a frame 3210, diffuser 1240, a perforated back panel 3231, substrate 2510, LEEs 230 and sound-absorbing material 1640. While sound-absorbing material 1640 is shown in FIG. 36B as having a size or extent smaller than perforated back panel 3231, this is not a limitation of the present invention, and in other embodiments perforated back panel 3231 may have a size or extent the same or substantially the same size or extent or a larger size or extent as perforated back panel 3231.

In various embodiments of the present invention, lighting systems may be mounted in various configurations, for example suspended from a surface, mounted directly on a surface, spaced apart from a surface, recessed into a surface or the like. The mounting configuration is not a limitation of the present invention.

FIG. 36C depicts an exemplary lighting system 3602 in accordance with embodiments of the present invention, which is mounted in a suspended mounting configuration, although alternative systems with similar functionality are also within the scope of the invention. Lighting system 3602 is suspended from a mounting surface 3610 by one or more mounting elements 3620. In various embodiments of the present invention, mounting surface 3610 may include a ceiling, mounting elements in, on, or attached to the ceiling, for example frames or frame portions (such as Unitstrut products, available from Unistrut of Harvey, Ill.), or other similar mounting surfaces. In various embodiments of the present invention, mounting elements 3620 may include, consist essentially of, or consist of cable, aircraft cable, threaded rods, rods, or the like. In various embodiments of the present invention, mounting elements 3620 may be flexible or rigid. In various embodiments, a distance 3625 from the back of luminaire 3602 to mounting surface 3610 may be in the range of about 100 mm to about 10 m, or in the range of about 200 mm to about 3 m; however, the distance 3625 is not a limitation of the present invention.

FIG. 36D depicts an exemplary lighting system 3602 in accordance with embodiments of the present invention, which is mounted in a spaced-apart mounting configuration, although alternative systems with similar functionality are also within the scope of the invention. Lighting system 3602 is spaced apart from mounting surface 3610 by one or more mounting elements 3630. In various embodiments of the present invention, mounting surface 3610 may include a ceiling, mounting elements in, on or attached to the ceiling, for example frames or frame portions (such as Unitstrut products, available from Unistrut of Harvey, Ill.), or other similar mounting surfaces. In various embodiments of the present invention, mounting elements 3630 may include, consist essentially of, or consist of threaded rods, rods, posts, or the like. In various embodiments of the present invention, mounting elements 3630 may be flexible or rigid. In various embodiments, a distance 3635 from the back of sound-absorbing material 1640 to mounting surface 3610 may be in the range of about zero (0) mm to about 500 mm, or in the range of about 20 mm to about 250 mm; however, the distance 3635 is not a limitation of the present invention. In various embodiments, a distance 3637 from the back of luminaire 3602 to mounting surface 3610 may be in the range of about zero (0) mm to about 500 mm, or in the range of about 50 mm to about 250 mm; however, the distance 3637 is not a limitation of the present invention.

In various embodiments of the present invention, diffuser or optic 2185 may have an acoustic transmittance of at least about 25%, or at least about 50%, or at least about 75%. In various embodiments of the present invention, diffuser or optic 2185 may allow a certain amount of the sound incident on the diffuser or optic to transmit through the optic, for example so that it may be absorbed or partially absorbed by sound-absorbing material 2610. In various embodiments of the present invention, diffuser or optic 2815 may have an acoustic absorption of at least about 10%, at least about 20%, at least about 30%, or at least about 40%. In various embodiments of the present invention, diffuser or optic 2185 may have multiple holes or perforations to allow an increased amount of sound to transmit through the diffuser or optic, for example so that it may be absorbed or partially absorbed by sound-absorbing material 2610. In various embodiments of the present invention, the sound absorption, sound reflection, and/or sound transmission may be evaluated over the human hearing range, for example from about 20 Hz to about 20 kHz, or in the range from about 100 Hz to about 15 kHz; however, this is not a limitation of the present invention, and in other embodiments other frequency ranges may be utilized.

In various embodiments, sound-absorbing material 2610 may include, consist essentially of, or consist of at least one of fiberglass, foam (e.g., sound-absorbing foam), cellulose, mineral wool, mineral fiber, fleece (e.g., acoustic fleece), acoustic ceiling tile, polyester, polyethylene terephthalate (PET), or fiberglass foam or other materials.

Figures 37A, 37B:
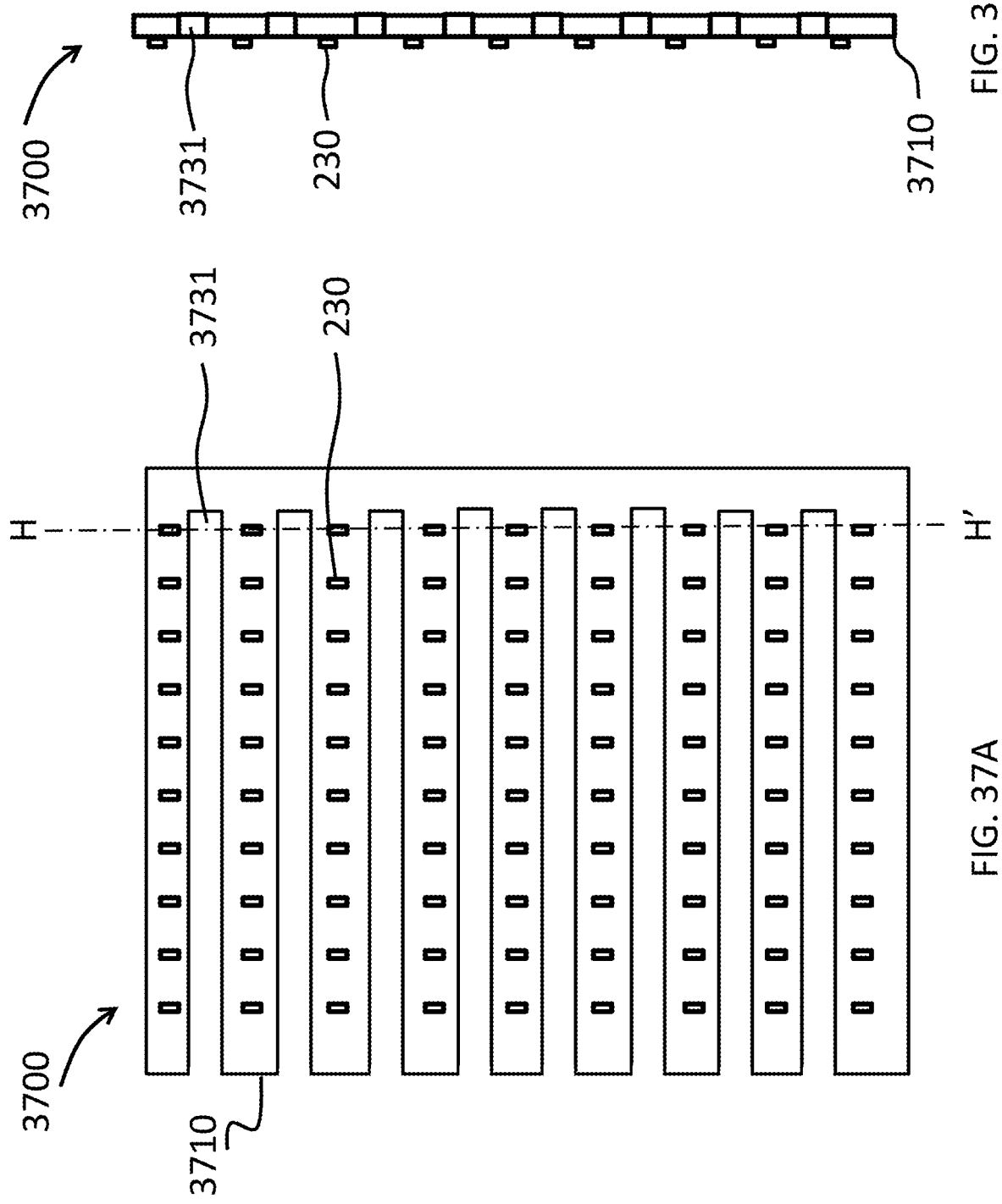
FIGS. 37A and 37B are a schematic plan-view and a schematic cross-sectional view, respectively, of a lighting panel in accordance with various embodiments of the invention.

FIGS. 37A and 37B depict an exemplary lighting panel 3700 in accordance with embodiments of the present invention, although alternative systems with similar functionality are also within the scope of the invention. FIG. 37B shows a cross-section of the structure of FIG. 37A through cut-line H-H'. In various embodiments, lighting panel 3700 includes, consists essentially of, or consists of one or more substrates 3710, an array of LEEs 230, and one or more slots or cut-out regions 3731 that form an open region within substrate 3710; in other words, a slot or cut-out region has a periphery that is partially but not completely bounded by substrate 3710, as opposed to an aperture which is completely bounded by substrate 3710. While FIG. 37A shows slots or cut-out regions 3731 as rectangles, in other embodiments cut-out regions 3731 may have other shapes, for example squares, circles or any arbitrary shape. The shape of cut-out regions 3731 is not a limitation of the present invention. In various embodiments, all cut-out regions 3731 may have the same size and shape, while in other embodiments lighting panel 3700 may include cut-out regions with different shapes and/or sizes. As shown in FIG. 37A, single cut-out region 3731 may be positioned between rows of LEEs 230 such that, across each portion of lighting panel 3700, only a single cut-out region 3731 extends across the width of lighting panel 3700, however this is not a limitation of the present invention and in other embodiments cut-out regions 3731 may be positioned in any way relative to LEEs 230.

Cut-out regions 3731, like apertures 2031 as discussed in reference to FIGS. 25A and 25B, are positioned in non-electrically active portions of the light panel; that is, they do not interfere with nor do the edges of cut-out regions 3731 cut through the electrical circuitry of the lighting panel material nor is any edge of cut-out regions 3731 electrically coupled to the electrical circuit powering and/or controlling LEEs 230. For example, in various embodiments of the present invention, substrate 3710 may include electrical components such as LEEs 230 and CEs 240 as well as conductive traces or electrical connections such as conductive traces 260 and power conductors 210 and 220 as described in reference to FIG. 2A, and cut-out regions 3731 are positioned such that they do not cut through or encompass any conductive trace 260 or any power conductor 210, 220 or any LEEs 230, CEs 240 or any other circuitry. Still, as shown in FIG. 37A, in various embodiments one or more cut-out regions 3731 may intersect one or more edges of the substrate.

In various embodiments of the present invention, the electrical circuit for a lighting system may include, consist essentially of, or consist of multiple light-emitting strings 250, each end of each light-emitting string electrically coupled to a power conductor 210, 220 to provide power to energize the the light-emitting string, as described in reference to FIG. 2A. As described in reference to FIG. 2A, each light-emitting string may include multiple LEEs 230 electrically coupled in series by conductive elements 260 and one or more optional CEs 240.

Figure 37C:
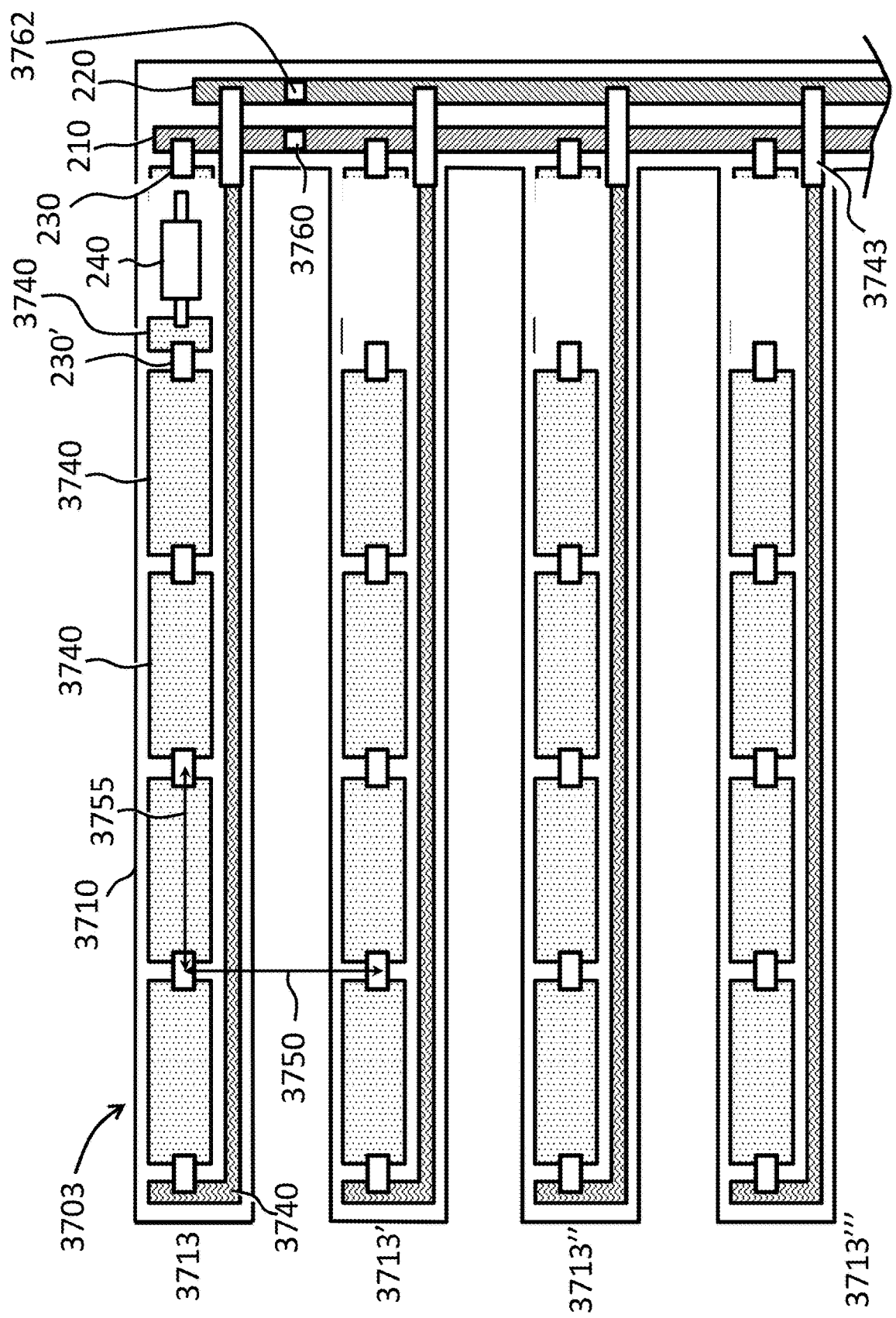
FIGS. 37C and 37D are schematic plan-views of partial lighting panels in accordance with various embodiments of the invention.

FIG. 37C shows an exemplary schematic of electrical routing on a lighting panel incorporating a cut-out region in accordance with embodiments of the present invention, although alternative systems with similar functionality are also within the scope of the invention. FIG. 37C shows a portion of a substrate 3703 including, consisting essentially of, or consisting of four (4) "fingers" 3713, i.e., protrusions separated by cut-outs; however, the number of fingers is not a limitation of the present invention, and in other embodiments substrate 3703 may have fewer than four or more than four fingers 3713. While FIG. 37C shows all fingers or protrusions 3713 having the same shape and size, this is not a limitation of the present invention, and in other embodiments different fingers or protrusions may have different sizes and/or different shapes (and or have different numbers of LEEs thereon).

In various embodiments of the present invention, a light-emitting string may occupy one (1) finger, two (2) fingers or more than two (2) fingers of substrate 3703. FIG. 37C shows a portion of lighting panel 3703 in which each light-emitting string occupies one (1) finger. As shown in FIG. 37C, each light-emitting string includes, consists essentially of, or consists of multiple LEEs 230 electrically coupled in series by conductive traces 3740, optional CE 240 electrically coupled in series with LEEs 230, and each end of the light-emitting string electrically coupled to one of power conductors 210, 220.

In various embodiments of the present invention, lighting panels 3703 may include electrical connectors that are electrically coupled to power conductors on the lighting panel and/or substrate to provide power and/or control signals to energize and/or control the LEEs. In various embodiments of the present invention, such connectors may include a plug-and-jack system, for example in the horizontal, vertical, or other orientation, insulation displacement connectors (IDCs), poke-in connectors combined with jumper wires, and/or jumper cables. In various embodiments of the present invention, connectors on lighting system 3703 may be electrically coupled to power conductors 2120 and 2130 to provide power from power supply 2170 to the lighting panels, as described herein. In various embodiments of the present invention, power may be supplied on a power bus or by a cable or separate wires.

In various embodiments of the present invention, power conductors 210, 220 may be oriented parallel to each other along the length of the panel, perpendicular to the fingers; however, this is not a limitation of the present invention, and in other embodiments power conductors 210, 220 may be oriented or laid out in any geometry. In various embodiments of the present invention, one or more electrical cross-overs 3743 may be utilized to couple a portion of a conductive trace 3740 to a power conductor, for example as shown in FIG. 37C for conductive trace 3740 electrically coupling to conductive trace 220 through cross-over 3743. In various embodiments of the present invention, a cross-over 3743 may include, consist essentially of, or consist of a zero-ohm resistor (i.e., a resistor having negligible resistance); however, this is not a limitation of the present invention, and in other embodiments cross-over 3743 may include, consist essentially of, or consist of an additional layer of conductive material in or on substrate 3710 that is electrically isolated from the power conductor or other means of crossing an electrical conductor without electrically coupling to it. In various embodiments of the present invention, cross-overs 3743 may also be used in other parts of the circuit, for example as part of conductive trace 3740.

In various embodiments of the present invention, the spacing or pitch 3755 between LEEs in a horizontal direction may be the same between all LEEs 230; however, this is not a limitation of the present invention, and in other embodiments LEEs 230 may have non-uniform spacing. In various embodiments of the present invention, the spacing or pitch 3750 between LEEs in a vertical direction may be the same between all LEEs 230 (and may or may not be equal to spacing 3755); however, this is not a limitation of the present invention, and in other embodiments LEEs 230 may have non-uniform spacing.

Figure 37D:
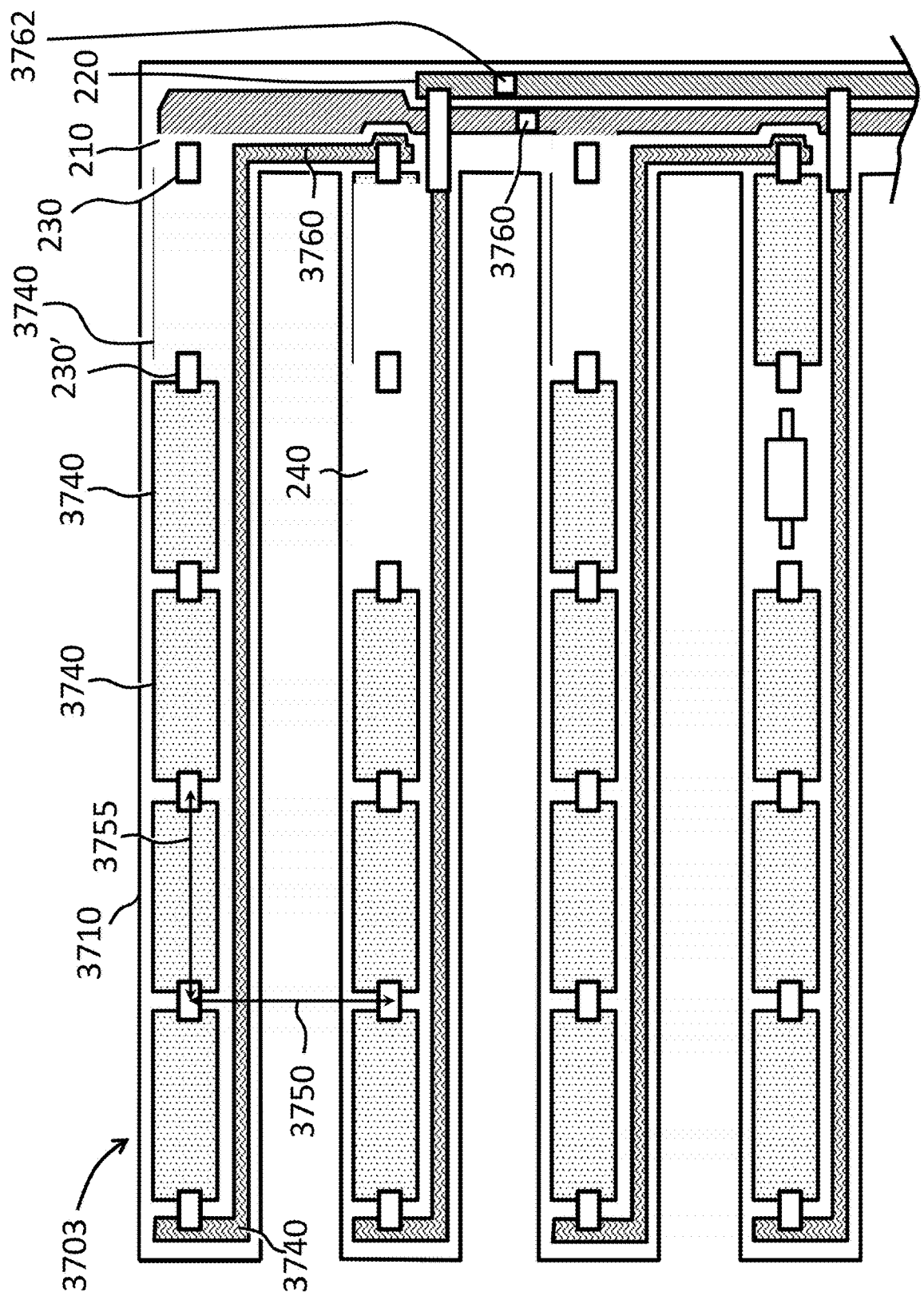

FIG. 37D shows a portion of lighting panel 3703 in which each light-emitting string occupies two (2) fingers. As shown in FIG. 37D, power conductors 210 and/or 220 may have different shapes to accommodate or provide room for additional conductive traces within one string that span more than one finger. The LEEs in each string in FIG. 37D are connected in series along two different fingers, and each string contains one optional CE 240. That is, in various embodiments, CEs 240 may be present in only some fingers but not all of them.

FIGS. 38A and 38B depict an exemplary acoustic lighting panel 3800 in accordance with embodiments of the present invention, although alternative systems with similar functionality are also within the scope of the invention. FIG. 38B shows a cross-section of the structure of FIG. 38A through cut-line I-I'. Acoustic lighting panel 3800 is similar to lighting panel 3700 described in reference to FIGS. 37A and 37B but with the addition of sound-absorbing material 2610. As shown in FIG. 38B, sound-absorbing material 2610 is positioned on the back of substrate 3710, i.e., it is on the side opposite LEEs 230; however, this is not a limitation of the present invention and in other embodiments sound-absorbing material may be positioned on the front of substrate 3710, that is on the same side as LEEs 230, or may be positioned on both the front and back sides of substrate 3710. In various embodiments of the present invention, cut-out regions 3731 permit sound to pass through substrate 3701 and impinge on sound-absorbing material 2610, where all or a portion of the sound may be absorbed. In various embodiments of the present invention, acoustic lighting panel 3800 may be used to both provide illumination and to provide a reduction in the noise or sound level in the environment in which the light panel is installed.

In various embodiments, the surface of sound-absorbing material 2610 may have approximately the same size and shape as that of the substrate 3710 (i.e., without considering the cut-out regions 3731 through the substrate); however, this is not a limitation of the present invention, and in other embodiments sound-absorbing material 2610 may have a different shape and size than substrate 3710. That is, the outer perimeter of the sound-absorbing material 2610 may substantially conform to the outer dimensions of substrate 3710, for example as shown in FIG. 38A; i.e., the outer perimeter of the sound-absorbing material may conform to the outer perimeter of the substrate 2510 ±25 mm, ±10 mm, or ±1 mm, notwithstanding portions of the outer perimeter of substrate 2510 that may be absent due to presence of the cut-out regions 3731.

Figure 38D:
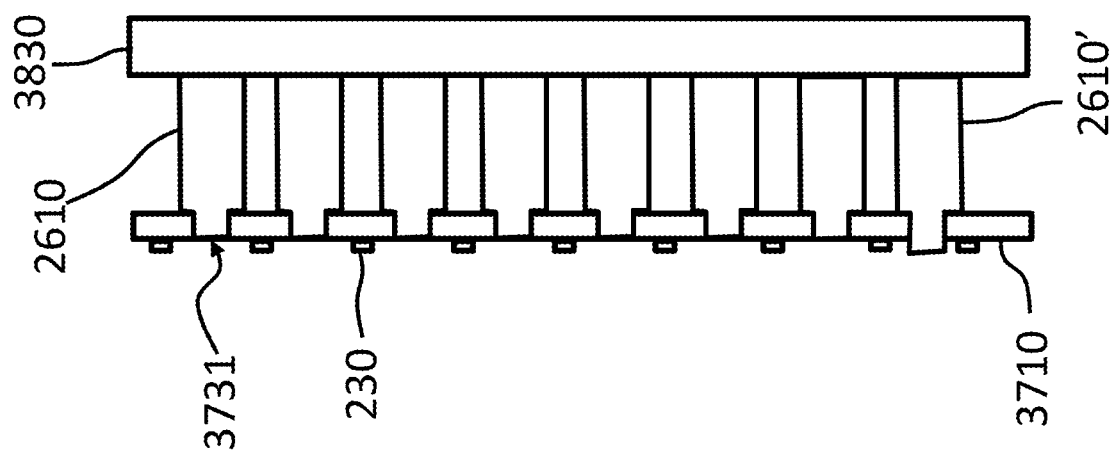
FIGS. 38C and 38D are a schematic cross-sectional views of acoustic lighting panels in accordance with various embodiments of the invention.
Figure 38C:
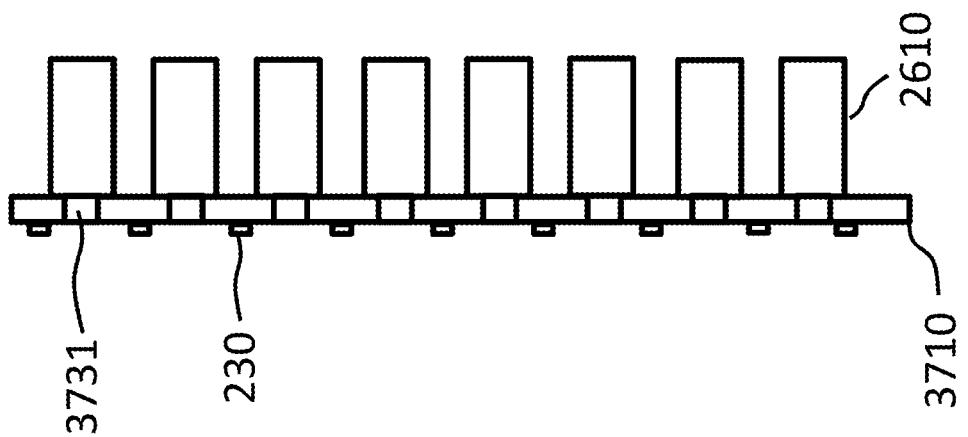

In various embodiments of the present invention, the amount of sound-absorbing material 2610 may be minimized to positions in the apertures or cut-out regions or substantially in the aperture or cut-out regions. That is, the sound-absorbing material 2610 may be absent, or present with a smaller thickness, behind portions of the acoustic lighting panel between the apertures or cut-out regions. In various embodiments of the present invention, sound-absorbing material 2610 may be positioned behind apertures or cut-out regions, for example as shown in FIG. 38C. In various embodiments of the present invention, sound-absorbing material 2610 may protrude through apertures or cut-out regions, for example as shown in FIG. 38D. In FIG. 38D, sound-absorbing material 2610 protrudes through cut-out region 3731, and the surface of sound-absorbing material 2610 is coplanar or substantially coplanar with the surface of substrate 3710. However, this is not a limitation of the present invention, and in other embodiments the surface of sound-absorbing material 2610 may be below the surface of substrate 3710 or protrude above the surface of substrate 3710, as shown in FIG. 38D for sound-absorbing material 2610'.

In various embodiments of the present invention, an additional support panel may utilized at the back of the sound-absorbing material, that is on the opposite side of the sound-absorbing material as substrate 3710. For example, FIG. 38D shows support panel 3830 positioned behind sound-absorbing material 2610 and 2610'. In various embodiments of the present invention, support panel 3830 may be attached to the sound-absorbing material (or vice versa), for example using screws, rivets or other fasteners, or with tape, adhesive, glue or the like. In various embodiments of the present invention, support panel 3830 may be utilized to support and/or position multiple portions of the sound-absorbing material, for example multiple portions of non-contiguous portions of the sound-absorbing material. Thus, the use of a support panel enables, in various embodiments, the use of multiple non-contiguous pieces or sections of sound-absorbing material with a common underlying platform. In various embodiments, the support panel 3830 may itself define one or more apertures or cut-outs therethrough to expose portions of the sound-absorbing material from the back side. In such embodiments, sound reflecting off of various surfaces toward the back surface of the support panel may be more readily absorbed by the sound-absorbing material through the apertures or cut-outs defined in the support panel.

In various embodiments of the present invention, the sound-absorbing material may be attached to substrate 3710, for example using mechanical fasteners such as screws, rivets and the like, adhesive, glue, tape or by other means.

In embodiments in which sound-absorbing material 2610 is disposed on the front side of substrate 3710, the sound-absorbing material 3710 may itself define apertures or cut-out regions therethrough in order to facilitate emission of light from the LEEs 230 into the space. For example, single apertures or cut-out regions may be defined over single LEEs 230, multiple LEES 230, or even one or more strings of LEEs 230. Despite such absent portions of the sound-absorbing material 2610, embodiments of the invention will still exhibit favorable sound-absorbing properties. In various embodiments, an overlying sound-absorbing material 2610 may have solid portions that overlap, or even entirely cover, one or more of the cut-out regions 3731 defined in substrate 2510. Thus, in such embodiments, the effective thickness (and thus sound-absorbing capability) of the sound-absorbing material disposed between LEEs is increased when compared to embodiments in which sound-absorbing material 2610 is disposed only beneath substrate 3710. In embodiments in which apertures or cut-out regions are defined in an overlying sound-absorbing material 2610 such apertures may be disposed over one or more LEEs, and at least portions of the interior surfaces of such apertures may be diffusely or specularly reflective to light emitted by the LEEs. For example, at least portions of the interior surfaces of such apertures may be coated with a reflective coating.

In various embodiments of the present invention, the quantity, shape, size, and position of the cut-out regions may be modified to achieve a particular NRC value or to achieve as high as NRC value as possible. In various embodiments of the present invention, the NRC value of the acoustic lighting panel is proportional or substantially proportional to the exposed area of sound-absorbing material 2610. For example, consider an acoustic lighting panel having a total surface area of value P and total cut-out region area A'. In various embodiments of the present invention, NRC (acoustic lighting panel) is equal to or approximately equal to NRC (sound-absorbing material)×(A'/P). Examination of this relationship indicates that increasing the ratio of total aperture area to light panel area (A'/P) will increase the NRC of the acoustic lighting panel. In various embodiments of the present invention, the ratio of total cut-out region area to acoustic light panel area (A'/P) may be greater than about 0.25, greater than about 0.5, greater than about 0.7, or greater than about 0.8. In various embodiments of the present invention, the substrate design may be optimized to maximize the ratio of total cut-out region area to acoustic light panel area (A'/P). In various embodiments of the present invention, increasing or maximizing the cut-out region area and/or the A'/P ratio is performed with the constraint that the cut-out region does not interfere with the electrically active portions of the light panel or the electrical circuitry on the light panel. In various embodiments of the present invention, cut-out region 3731 may be configured to occupy all of the area of lighting panel 3700 or substrate 3710 to within an aperture setback 3815 of LEEs 230 (and/or rows, columns, and/or strings thereof), other electronic components, circuitry, and/or the edges of the lighting panel. Referring to FIG. 38A, cut-out region 3731 has aperture setback 2615 around LEEs 230. In various embodiments of the present invention, aperture setback 2615 may be less than about 25 mm, or less than about 15 mm, or less than about 5 mm, or less than about 2.5 mm.

In various embodiments of the present invention, sound-absorption material 2610 may have a thickness in the range of 0.5 inch to about 3 inches; however, this is not a limitation of the present invention, and in other embodiments the thickness of sound absorption material 2610 may be less than 0.5 inch or greater than 3 inches. In various embodiments of the present invention, a lighting panel may have a NRC value greater than about 0.2, greater than about 0.5, or greater than about 0.7. In various embodiments the NRC value may be less than about 1.

In various embodiments, two or more acoustic lighting panels may be tiled together, i.e., placed adjacent to each other and/or interconnected together. FIGS. 39A and 39B show exemplary plan view and cross-sectional views, respectively, of four acoustic lighting panels that are tiled together to form lighting system 3900. FIG. 39B shows a cross-section of the structure of FIG. 39A through cut-line J-J'.

In various embodiments of the present invention, acoustic lighting panels are tiled so that, when connected together, or when installed, the spacing or pitch between adjacent LEEs 230 is the same or substantially the same on one acoustic light panel as it is across the interface between adjacent acoustic light panels, as described herein. As discussed in reference to FIG. 2B, in various embodiments of the present invention LEEs 230 may be positioned in a periodic array, for example a substantially square or rectangular array, where LEEs 230 are separated by pitch (or "spacing") 223 in the one direction and by pitch 225 in an orthogonal or substantially orthogonal direction. Referring to FIG. 39A, in various embodiments of the present invention, acoustic lighting panels with sound-absorbing material 2610 may be tiled so that pitch 225 between adjacent LEEs 230 on one acoustic lighting panel is the same as or substantially the same as pitch 225' between adjacent LEEs 230 on adjacent acoustic lighting panels and pitch 223 between adjacent LEEs 230 on one acoustic lighting panel is the same as or substantially the same as pitch 223' between adjacent LEEs 230 on adjacent acoustic lighting panels.

In various embodiments of the present invention, acoustic lighting panels 3800 may include electrical connectors that are electrically coupled to power conductors on the lighting panel and/or substrate to provide power and/or control signals to energize and/or control the LEEs. In various embodiments of the present invention, connectors on acoustic lighting panels 3800, 3800', 3800", and 3800''' may be electrically coupled to provide one set of connections for all acoustic lighting panels of lighting system 3900. In various embodiments of the present invention, such connectors may include a plug-and-jack system, for example in the horizontal, vertical, or other orientation, insulation displacement connectors (IDC), poke-in connectors combined with jumper wires and/or jumper cables. In various embodiments of the present invention, connectors on lighting system 3900 may be electrically coupled to power conductors 2120 and 2130 to provide power from power supply 2170 to the lighting panels, as described herein. In various embodiments of the present invention, power may be supplied on a power bus, for example 2111 as shown in FIG. 39A or by a cable or separate wires.

In various embodiments of the present invention, an acoustic light panel may be overlaid or covered with an overlying optic, diffuser or translucent panel, and/or graphic panel as discussed in reference to FIG. 34C to soften or eliminate the image of individual LEEs 230 and/or to provide a homogeneous color and/or brightness over the entire area of the diffuser. Light emitted by LEEs 230 may reflect of off the diffuser or other surfaces within the optical cavity (for example the region between the diffuser and the acoustic lighting panel) and further reflect off of the acoustic lighting panel before being emitted into the exterior environment. In various embodiments of the present invention, such an optic or diffuser may permit at least about 10% or at least about 30% or at least about 60% of the sound incident on the optic or diffuser to transmit through the diffuser, for example so that it may be absorbed or partially absorbed by sound-absorbing material 2610. In various embodiments of the present invention, the diffuser may include, consist essentially of, or consist of a fabric having an acoustic transmittance of at least about 25%, or at least about 50%. In various embodiments of the present invention, the diffuser may include, consist essentially of, or consist of a fabric having an acoustic absorption of at least about 10%, or at least about 20%, or at least about 30%. In various embodiments of the present invention the sound absorption, sound reflection, and/or sound transmission may be evaluated over the human hearing range, for example from about 20 Hz to about 20 kHz, or in the range from about 100 Hz to about 15 kHz; however, this is not a limitation of the present invention, and in other embodiments other frequency ranges may be utilized.

While acoustic lighting panel 3800 has a rectangular shape, this is not a limitation of the present invention, and in other embodiments lighting panels may have other shapes and/or configurations. FIG. 40A depicts an exemplary acoustic lighting panel 4000 in accordance with embodiments of the present invention, although alternative systems with similar functionality are also within the scope of the invention. Acoustic lighting panel 4000 is an example of a differently shaped acoustic lighting panel, having rounded corners and a notch 4010. Substrate 3710 of lighting panel 4000 includes both cut-out regions 3731 and apertures 2031. The shape of acoustic lighting panel 4000 shown in FIG. 40A is not a limitation of the present invention, and in other embodiments acoustic lighting panels may have any shape and/or size and/or configuration of one or more substrates 3710, each of which may have no apertures and/or cut-out regions or may have one or more apertures and/or one or cut-out regions or only apertures or only cut-out regions.

Figure 39C:
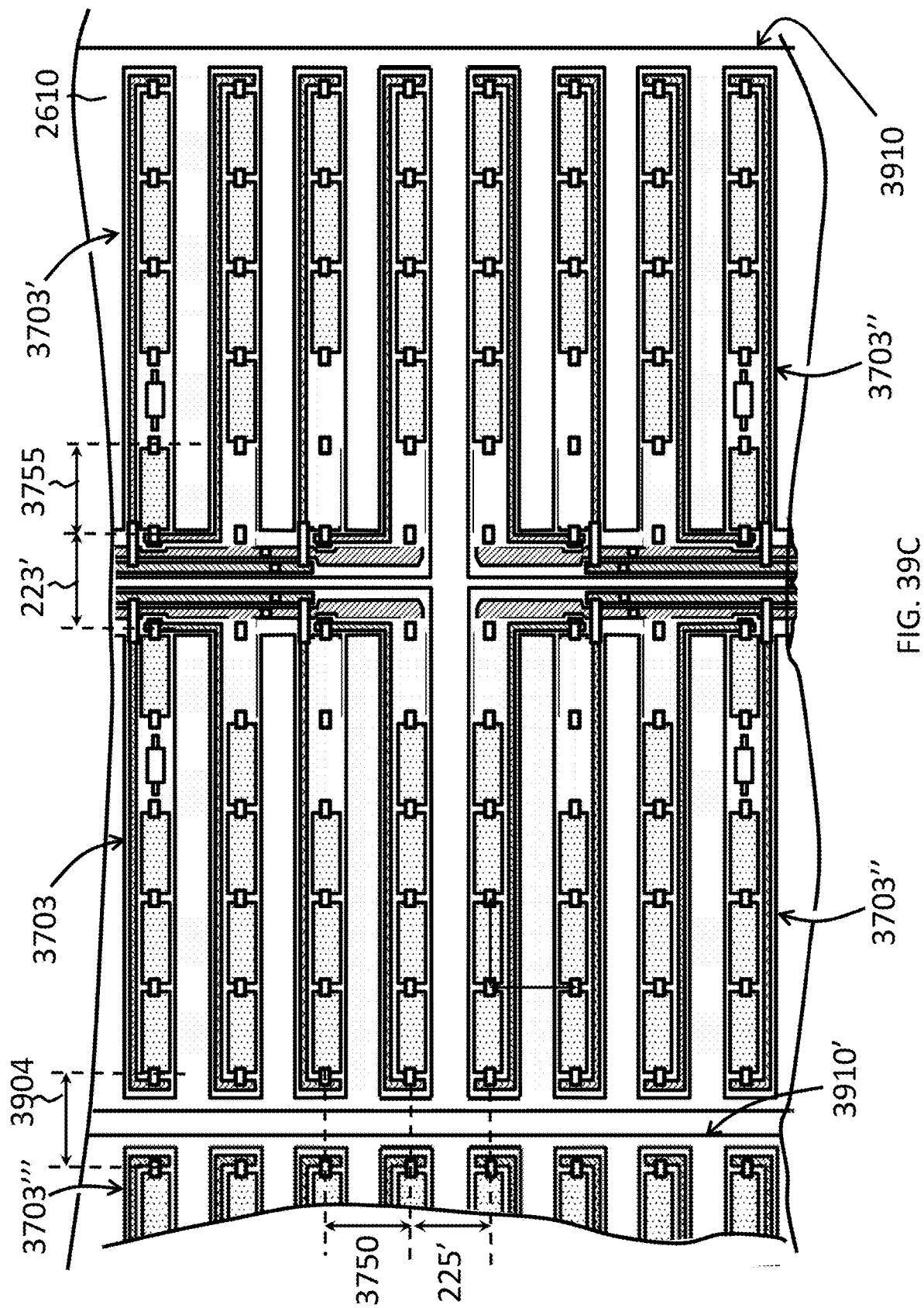
FIGS. 39C and 39D are schematic plan-views of a portion of an acoustic lighting panel in accordance with various embodiments of the invention.

FIG. 39C shows a schematic of a portion of two acoustic lighting panels 3910 and 3910' in accordance with embodiments of the present invention, although alternative systems with similar functionality are also within the scope of the invention. Acoustic lighting panel 3910 includes, consists essentially of or consists of multiple lighting panels 3703 and sound-absorbing material 2610. While FIG. 39C shows acoustic lighting panel 3910 having four (4) lighting panels 3703, this is not a limitation of the present invention, and in other embodiments acoustic lighting panel 3910 may have any number of lighting panels 3703.

As shown in FIG. 38B or FIG. 38C, sound-absorbing material 2610 is positioned on the back of substrate 3710, i.e., it is on the side opposite LEEs 230; however, this is not a limitation of the present invention, and in other embodiments sound-absorbing material may be positioned on the front of substrate 3710, that is on the same side as LEEs 230, or may be positioned on both the front and back sides of substrate 3710. In various embodiments of the present invention, cut-out regions 3731 permit sound to pass through the light panel and impinge on sound-absorbing material 2610, where all or a portion of the sound may be absorbed. In various embodiments of the present invention, acoustic lighting panel 3910 may be used to both provide illumination and to provide a reduction in the noise or sound level in the environment in which the acoustic lighting panel is installed.

In various embodiments of the present invention, lighting panels on one acoustic lighting panel are tiled so that, when connected together, or when installed, the spacing or pitch between adjacent LEEs 230 is the same or substantially the same on one light panel as it is across the interface between adjacent light panels, as described herein. As discussed in reference to FIG. 2B, in various embodiments of the present invention LEEs 230 may be positioned in a periodic array, for example a substantially square or rectangular array, where LEEs 230 are separated by pitch (or "spacing") 3755 in the one direction and by pitch 3750 in an orthogonal or substantially orthogonal direction. Referring to FIG. 39C, in various embodiments of the present invention, lighting panels 3703 may be tiled so that pitch 3750 between adjacent LEEs 230 on one lighting panel is the same as or substantially the same as pitch 225' between adjacent LEEs 230 on adjacent lighting panels and pitch 3755 between adjacent LEEs 230 on one lighting panel is the same as or substantially the same as pitch 223' between adjacent LEEs 230 on adjacent lighting panels. FIG. 39A also depicts similar arrangements of lighting panels and resulting pitch between adjacent LEEs.

In various embodiments of the present invention, lighting panels on one acoustic lighting panel are tiled so that, when connected together, or when installed, the spacing or pitch between adjacent LEEs 230 is the same or substantially the same on one acoustic light panel as it is across the interface between adjacent acoustic light panels. As discussed in reference to FIG. 2B, in various embodiments of the present invention LEEs 230 may be positioned in a periodic array, for example a substantially square or rectangular array, where LEEs 230 are separated by pitch (or "spacing") 223 in the one direction and by pitch 225 in an orthogonal or substantially orthogonal direction. Referring to FIG. 39C, in various embodiments of the present invention, acoustic lighting panels may be tiled so that pitch 3755 and/or 223' between adjacent LEEs 230 on one acoustic lighting panel is the same as or substantially the same as pitch 3904 between adjacent LEEs 230 on adjacent lighting panels and the pitch between adjacent LEEs 230 on one acoustic lighting panel (not identified in FIG. 39C for clarity of the figure) is the same as or substantially the same as pitch 3750 and/or 225' between adjacent LEEs 230 on adjacent lighting panels.

In various embodiments of the present invention, acoustic lighting panels 3910 may include electrical connectors that are electrically coupled to power conductors on the lighting panel and/or substrate to provide power and/or control signals to energize and/or control the LEEs. In various embodiments of the present invention, connectors on multiple lighting panels may be electrically coupled to provide one set of connections for all lighting panels of acoustic lighting panel 3910. In various embodiments of the present invention, such connectors may include a plug-and-jack system, for example in the horizontal, vertical, or other orientation, insulation displacement connectors (IDC), poke-in connectors combined with jumper wires and/or jumper cables. In various embodiments of the present invention, connectors on lighting system 3910 may be electrically coupled to power conductors 3762 and 3760 to provide power and or control signals from one or more power supplies and/or control systems to the lighting panels, as described herein. In various embodiments of the present invention, power may be supplied on a power bus, for example 2111 as shown in FIG. 39A or by a cable or separate wires.

Figure 39D:
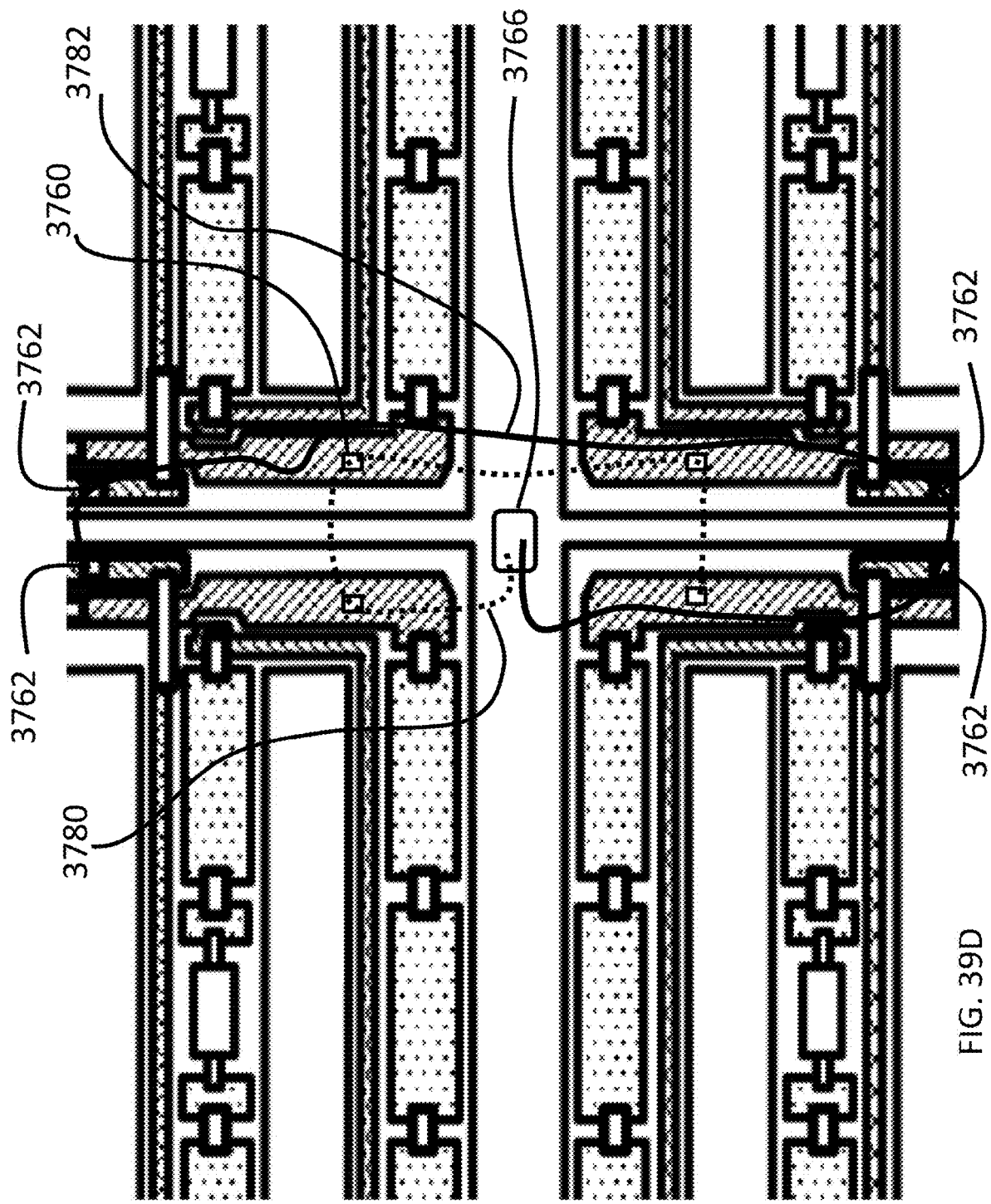

FIG. 39D shows an expanded view of a portion of acoustic lighting panel 3910 showing electrical coupling of four lighting panels 3703 in accordance with embodiments of the present invention, although alternative systems with similar functionality are also within the scope of the invention. As shown in FIG. 39D, each lighting panel 3703 includes connectors 3760, 3762, where all of the connectors 3760 are electrically coupled together by conductors 3780, and all of the connectors 3762 are electrically coupled together by conductors 3782. In various embodiments of the present invention conductors 3780 and 3782 may be a wire, multiple wires, connectorized wires, insulated wires, cables, conductive traces, or the like. The nature of conductors 3780 and 3782 is not a limitation of the present invention. In various embodiments of the present invention, connectors 3760, 3762 are IDC connectors and conductors 3780 and 3782 are wires.

In various embodiments of the present invention, it may be desirable to couple power to the lighting panel or acoustic lighting panel from the back side of the panel. In various embodiments of the present invention, one or more holes may be formed through acoustic lighting panel 3903, for example through sound-absorbing material 2610 and/or through the substrate, to provide a pathway for wires or other conductive elements to pass from the front side of the panel to the back. FIG. 39D shows a schematic of a portion of acoustic lighting panel 3900 having a hole 3766 through the panel and conductors 3780 and 3782 passing from the front of the panel through hole 3766 to the back of the panel. At the back of the panel, the conductors 3780, 3782 may be electrically coupled to a source of power and/or control; however, this is not a limitation of the present invention, and in other embodiments conductors 3780, 2782 may be unterminated (i.e., left as flying leads) or may terminate in a connector. In various embodiments of the present invention, flying leads or a connector may be electrically coupled with additional length or lengths of cabling or wiring, which may subsequently be electrically coupled to a source of power and/or control, for example to permit easy disconnection and removal of the acoustic lighting panel from the luminaire or lighting system or to provide for remote mounting of the power and/or control system, that is to provide for mounting of the power and/or control system separate from the acoustic lighting panel or the luminaire.

While FIG. 39D shows all lighting panels electrically coupled together this is not a limitation of the present invention, and in other embodiments lighting panels may be divided into multiple electrically coupled groups to allow for separate power and/or control of the individual electrically coupled groups.

Figure 39E:
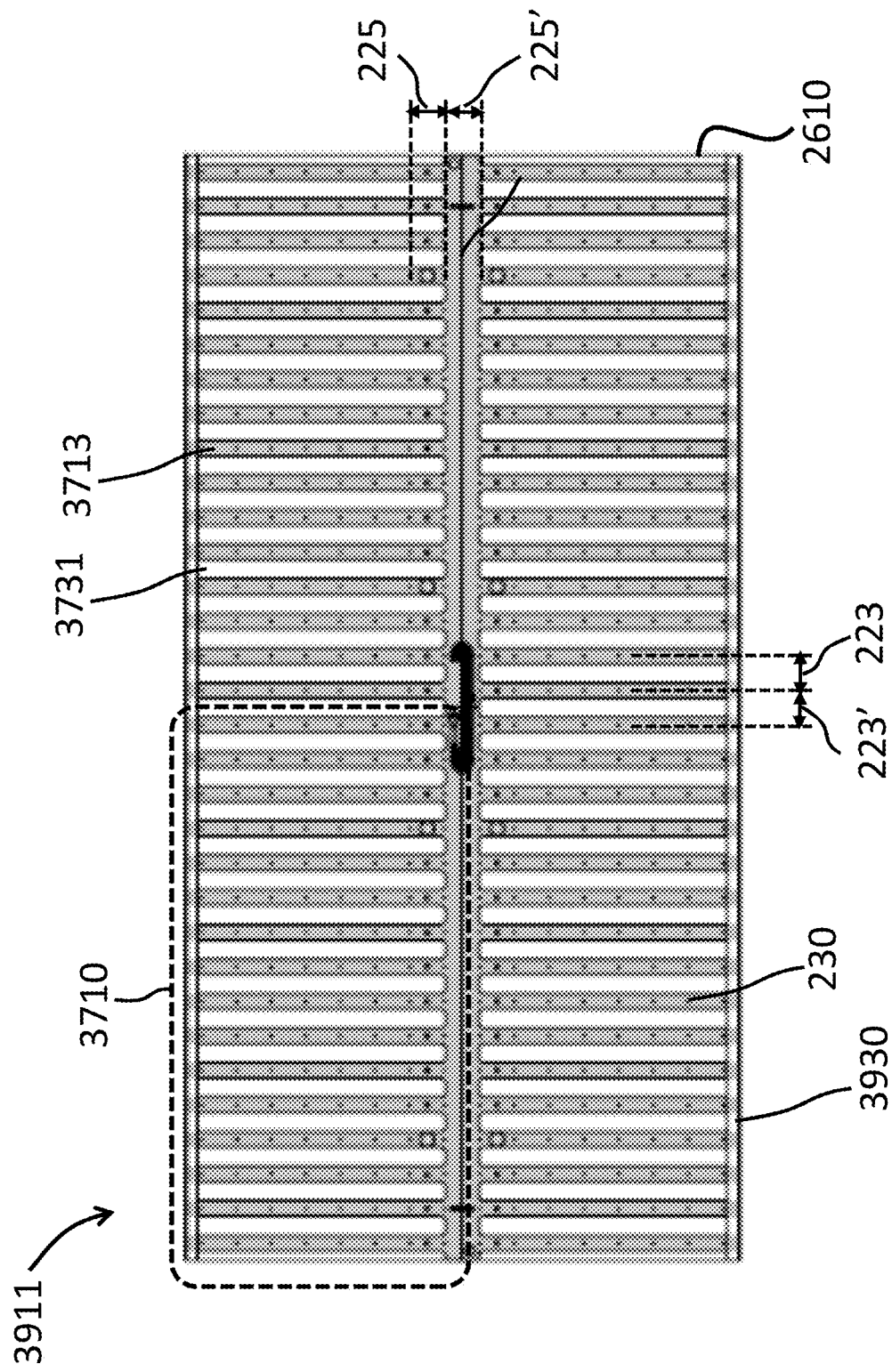
FIG. 39E is a schematic plan-view of an acoustic lighting panel in accordance with various embodiments of the invention.

In various embodiments, an acoustic lighting panel may include more than one substrate 3710. FIG. 39E shows an exemplary schematic of an acoustic lighting panel having four substrates that are tiled together to form an acoustic lighting panel 3911. Referring to FIG. 39E, in various embodiments of the present invention, acoustic lighting panel 3911 may include sound-absorbing material 2610 and one or more substrates 3710 which may be electrically coupled together to provide one electrical connection point for all substrates 3710. While FIG. 39 shows acoustic lighting panel 3911 with four substrates 3710, this is not a limitation of the present invention and in other embodiments acoustic lighting panel 3911 may include fewer than four or more than four substrates 3710. As shown in FIG. 39E, substrates 3710 include fingers or protrusions 3713 forming cut-out or slot regions 3731 exposing the underlying sound-absorbing material or panel 2610. In various embodiments of the present invention, the area of cut-out or slot regions 3731 may be maximized to achieve a higher or maximal sound absorbing capacity or NRC for the acoustic lighting panel. In various embodiments, the area of fingers or protrusions 3713 may be minimized to maximize the area of cut-out or slot regions 3731.

In various embodiments of the present invention, substrates are tiled so that, when connected together, or when installed, the spacing or pitch between adjacent LEEs 230 is the same or substantially the same on one substrate as it is across the interface between adjacent substrates, as described herein. As discussed in reference to FIG. 2B, in various embodiments of the present invention LEEs 230 may be positioned in a periodic array, for example a substantially square or rectangular array, where LEEs 230 are separated by pitch (or "spacing") 223 in the one direction and by pitch 225 in an orthogonal or substantially orthogonal direction. In various embodiments of the present invention, substrates 3710 may be tiled so that pitch 225 between adjacent LEEs 230 on one substrate is the same as or substantially the same as pitch 225' between adjacent LEEs 230 on adjacent substrates and pitch 223 between adjacent LEEs 230 on one substrate is the same as or substantially the same as pitch 223' between adjacent LEEs 230 on adjacent substrates.

In various embodiments of the present invention, acoustic lighting panels are tiled so that, when connected together, or when installed, the spacing or pitch between adjacent LEEs 230 is the same or substantially the same on one acoustic light panel as it is across the interface between adjacent acoustic light panels, and the same as the spacing or pitch between adjacent LEEs 230 on one substrate as it is across the interface between adjacent substrates, as described herein.

FIG. 39F shows an exemplary cross-sectional schematic of a portion of an acoustic lighting panel in accordance with embodiments of the present invention, although alternative systems with similar functionality are also within the scope of the invention. In various embodiments of the present invention, an acoustic lighting panel may include a rigid or relatively rigid sound-absorbing panel 2610 and a clip 3930 configured to mechanically clamp or fasten all or a portion of substrate 3710 to sound-absorbing material 2610. In various embodiments of the present invention, clip 3930 may be installed by mechanically positioning it over the end of sound-absorbing panel 2610 and the end of substrate 3710. While FIG. 39F shows clip 3930 clamping the fingers of the substrate, this is not a limitation of the present invention and in other embodiments clip 3930 may be used to clamp or fasten other portions of substrate 3710 to sound-absorbing material 2610. In various embodiments of the present invention, clip 3930 may be used in conjunction with other means of fastening or attaching substrate 3710 to sound-absorbing panel 2610, for example screws, rivets, adhesive, tape, double-sided tape or the like. In various embodiments of the present invention, clip 3930 may permit faster and/or simpler assembly of an acoustic lighting panel, for example as compared to other means such as screws or rivets.

In various embodiments of the present invention substrate 3710 may include one or more mounting holes that may be used to attach substrate 3710 to sound-absorbing material 2610. FIG. 39G shows an exemplary cross-sectional schematic of a portion of an acoustic lighting panel in accordance with embodiments of the present invention, although alternative systems with similar functionality are also within the scope of the invention. In various embodiments of the present invention, substrate 3710 may incorporate one or more through-holes 3940 that may be used in conjunction with a fastener 3950 to mechanically clamp or fasten all or a portion of substrate 3710 to sound-absorbing material 2610. In various embodiments of the present invention, fastener 3950 may include two parts, for example a pin or screw or bolt 3952 and a clip or nut 3954; however, this is not a limitation of the present invention, and in other embodiments fastener 3950 may include only one part or may include more than two parts and/or may have different configurations than described in reference to FIG. 39G. For example, in various embodiments of the present invention fastener 3950 may include one part that incorporates one or more barbs that are inserted through through-hole 3950 and are embedded into and mechanically fastened to sound absorbing material 2610.

Figure 39H:
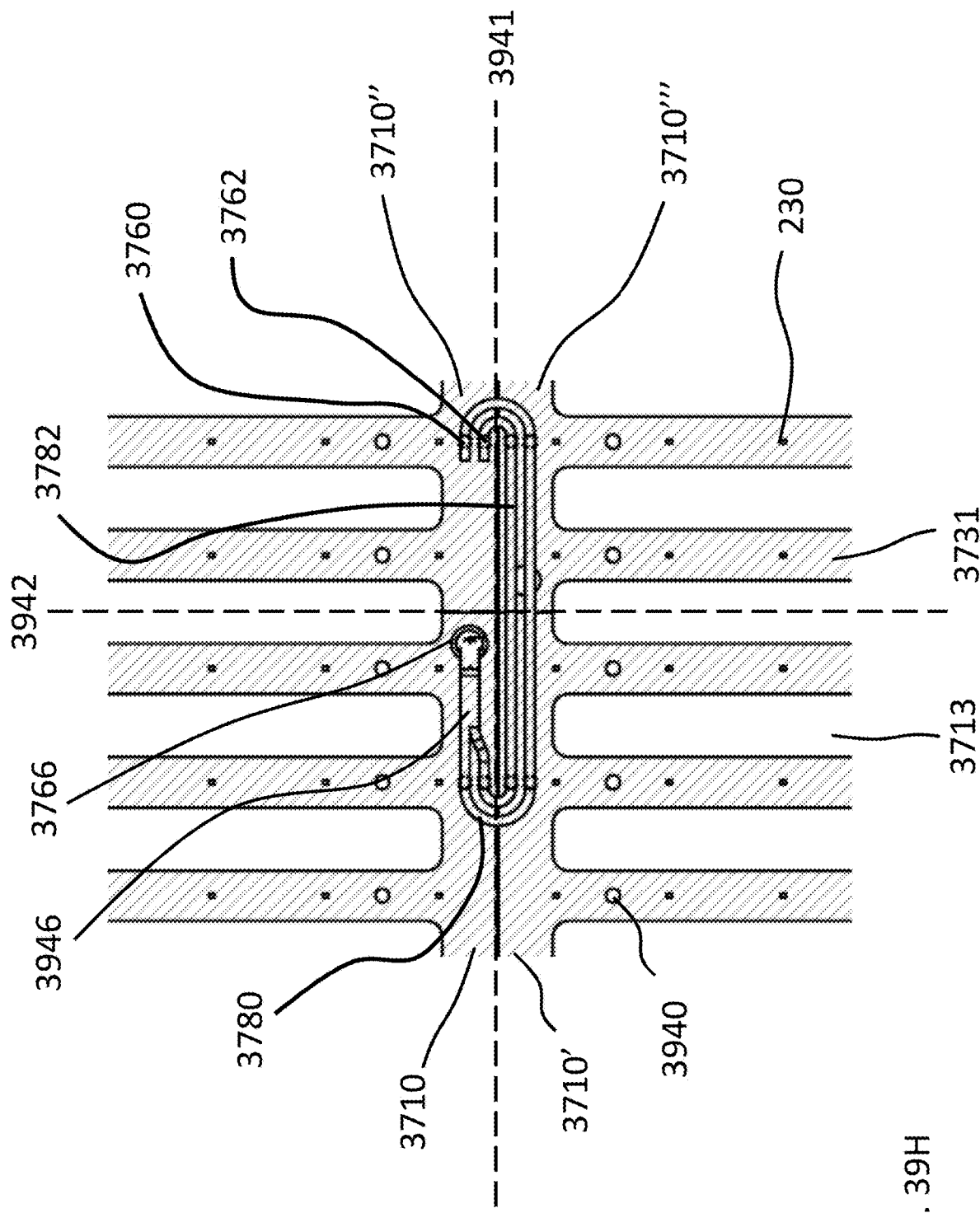
FIG. 39H is a schematic plan-view of a portion of an acoustic lighting panel in accordance with various embodiments of the invention.

FIG. 39H shows an expanded view of a portion of acoustic lighting panel 3911 showing electrical coupling of four substrates 3710 in accordance with embodiments of the present invention, although alternative systems with similar functionality are also within the scope of the invention. Dashed lines 3941 and 3942 show the interface lines between substrates 3710, 3710', 3710", and 3710'''. As shown in FIG. 39H, and with reference also to FIG. 37D, each substrate 3710 includes connectors 3760, 3762, where all of the connectors 3760 (which couple for example to power conductor 210 on the substrates) are electrically coupled together by conductors 3780, and all of the connectors 3762 (which couple for example to power conductor 220 on the substrates) are electrically coupled together by conductors 3782, thereby electrically connecting all substrates in parallel. In various embodiments of the present invention, conductors 3780 and 3782 may be a wire, multiple wires, connectorized wires, insulated wires, cables, conductive traces, or the like. The nature of conductors 3780 and 3782 is not a limitation of the present invention. In various embodiments of the present invention, connectors 3760, 3762 are insulation displacement type (IDC) connectors and conductors 3780 and 3782 are insulated solid or stranded wires. The configuration of connectors 3760, 3762 is not a limitation of the present invention, and connectors 3760, 2762 may have other configurations, such as board to board, board to wire, plug and jack or the like. In various embodiments of the present invention, it may be desirable to couple power to the lighting panel or acoustic lighting panel from the back side of the panel. In various embodiments of the present invention, one or more holes may be formed through acoustic lighting panel 3911, for example through sound-absorbing material 2610 and/or through the substrate, to provide a pathway for wires or other conductive elements to pass from the front side of the panel to the back. FIG. 39H shows a schematic of a portion of acoustic lighting panel 3911 having a hole 3766 through the panel, and conductors 3780 and 3782 passing from the front of the panel through hole 3766 to the back of the panel. At the back of the panel, the conductors 3780, 3782 may be electrically coupled to a source of power and/or control; however, this is not a limitation of the present invention, and in other embodiments conductors 3780, 2782 may be unterminated (i.e., left as flying leads) or may terminate in a connector. In various embodiments of the present invention, flying leads or a connector may be electrically coupled with additional length or lengths of cabling or wiring, which may subsequently be electrically coupled to a source of power and/or control, for example to permit easy disconnection and removal of the acoustic lighting panel from the luminaire or lighting system or to provide for remote mounting of the power and/or control system, that is to provide for mounting of the power and/or control system separate from the acoustic lighting panel or the luminaire.

In various embodiments of the present invention, lighting panels in accordance with embodiments of the present invention may include one or more strain reliefs for the wiring or conductors associated with the lighting panel. In various embodiments of the present invention, one or more strain reliefs may be applied to or attached to conductors 3780, 3782. In various embodiments of the present invention, conductors 3780, 3782 may be coupled or joined into a single cable, for example cable 3946 as shown in FIG. 39H. In various embodiments of the present invention, one or more strain reliefs may be applied or attached to a single cable. In various embodiments of the present invention a strain relief may include a means to attach or fix a conductor or cable to another material such that the conductor or cable are not detached from the strain relief by forces that might be applied to the conductor or cable during reasonable and customary use. In various embodiments of the present invention, one or more strain reliefs may be attached or fixed to a substrate 3710 and/or to the sound-absorbing material. The use of strain reliefs is well known in the art and the present invention is not limited by the type of strain relief.

FIG. 39I shows a schematic drawing of a strain relief 3960 that clamps onto cable 3961 and is anchored in panel 3962, for example as manufactured by Heyco, N.J., United States. Referring to FIG. 39I, strain relief 3960 is crimped around cable 3961 and pushed through hole 3964 in panel 3962. FIG. 39J shows a schematic of a strain relief 3066 that clamps the cable by crimping the cable when nut 3967 is tightened. FIG. 39K shows strain relief 3970 that includes mount 3972 and cable tie 3974 that clamps cables 3976 in place on one side of panel 3962; in this embodiment cables 3976 do not extend through the panel 3962.

While FIG. 39H shows all lighting panels electrically coupled together this is not a limitation of the present invention, and in other embodiments lighting panels may be divided into multiple electrically coupled groups to allow for separate power and/or control of the individual electrically coupled groups. While FIG. 39H shows each substrate 3710 having two connectors 3760, 3762 this is not a limitation of the present invention, and in other embodiments each substrate 3710 may have fewer than two or more than two connectors. For example a substrate 3710 may have multiple electrically coupled connectors 3760 and/or multiple electrically coupled connectors 3762 to permit multiple connection pathways between different substrates 3710.

FIG. 40A depicts an exemplary acoustic lighting panel 4000 in accordance with embodiments of the present invention, although alternative systems with similar functionality are also within the scope of the invention. Acoustic lighting panel 4000 is an example of an acoustic lighting panel incorporating a cut-out region 4010 in the acoustic lighting panel as well as a substrate 3710 that incorporates both cut-out regions 3731 and slots 2031 to expose underlying sound absorbing material 2610. Acoustic lighting panel cut-out region 4010 may be used to accommodate various features in the environment in which acoustic lighting panel 4000 is to be installed, for example a support or structural beam, an HVAC duct or register, or the like. While cut-out region 4010 has a rectangular or substantially rectangular region, this is not a limitation of the present invention, and in other embodiments cut-out region 4010 may have any shape. While FIG. 40A shows acoustic lighting panel 4000 having one panel cut-out region 4010, this is not a limitation of the present invention, and in other embodiments an acoustic lighting panel may have more than one panel cut-out region 4010. Note that conductive traces, connectors, optional control elements and other items are not shown in FIG. 40A for clarity.

FIG. 40B depicts an exemplary acoustic lighting panel 4002 in accordance with embodiments of the present invention, although alternative systems with similar functionality are also within the scope of the invention. Acoustic lighting panel 4002 is an example of an acoustic lighting panel incorporating multiple substrates 4020, in which substrates 4020 do not have an aperture or a cut-out region. Rather, the individual substrates 4020 are individually mounted on a shared sound-absorbing material 2610. In lighting system 4002 and other similar exemplary lighting panels, sound may be absorbed by sound-absorbing material 2610 that is exposed between substrates 4020. Note that conductive traces, optional control elements and other items are not shown in FIG. 40B for clarity.

In various embodiments of the present invention, each substrate 4020 may include one or more electrical connectors, for example electrical connectors 3760 and 3762. In various embodiments of the present invention, all substrates 4020 may be electrically coupled together, for example through conductors 3780 and 3782 as shown in FIG. 40B to provide power and/or control signals to each substrate 4020 from one or more power supplies and/or control systems that may be electrically coupled to conductors 3780, 3782, as described herein.

In various embodiments of the present invention, substrates 4020 may not all be electrically coupled together. In various embodiments of the present invention, one or more substrates 4020 may be electrically coupled to separate power and/or control systems, for example to permit separate control of one or more optical characteristics of each of the substrates 4020, for example luminous flux, intensity, color point, CCT, CRI, or the like.

While FIG. 40B shows all substrates 4020 having the same shape and size, this is not a limitation of the present invention and in other embodiments different substrates, for example substrates 4020, may have different sizes and/or shapes (and/or have different numbers of LEEs thereon).

FIG. 40C depicts an exemplary acoustic lighting panel 4004 in accordance with embodiments of the present invention, although alternative systems with similar functionality are also within the scope of the invention. Acoustic lighting panel 4004 is an example of a circular acoustic lighting panel incorporating multiple substrates 4020, in which substrates 4020 do not have an aperture or a cut-out region. Rather, the individual substrates 4020 are individually mounted on a shared sound-absorbing material 2610. In lighting system 4004 and other similar exemplary lighting panels, sound may be absorbed by sound-absorbing material 2610 that is exposed between substrates 4020.

In various embodiments of the present invention, the spacing between LEEs 230 on adjacent strips/substrates, for example spacing 225 and 225', may be the same and the same as the spacing 223 between LEEs on each strip; however, this is not a limitation of the present invention, and in other embodiments spacing 223 on one or more substrates 4020 may be the same or different. In other embodiments, the spacing between LEEs on adjacent substrates 402 may be the same or different, for example spacing 225 may be equal to spacing 225' or spacing 225 may be different from spacing 225'.

FIG. 40C shows an example of an acoustic lighting panel in which substrates 4020 are not all electrically coupled together. In various embodiments of the present invention, each substrate 4020 may include one or more electrical connectors, for example electrical connectors 3760 and 3762. In various embodiments of the present invention, two or more (or even all) substrates 402 may be electrically coupled in groups, for example one group through conductors 3780 and 3782 and a second group through conductors 3780' and 3782', as shown in FIG. 40B to provide power and/or control signals to each substrate group from one or more power supplies and/or control systems that may be electrically coupled to conductors 3780, 3782 and 3780', 3782', as described herein. While FIG. 40C shows two groups of electrically coupled substrates 4020 this is not a limitation of the present invention, and in other embodiments substrates 4020 may have any number of electrically coupled groups.

FIG. 40D depicts an exemplary acoustic lighting panel 4006 in accordance with embodiments of the present invention, although alternative systems with similar functionality are also within the scope of the invention. Acoustic lighting panel 4006 is an example of a circular acoustic lighting panel incorporating multiple substrates 4020, in which substrates 4020 do not have an aperture or a cut-out region. In acoustic lighting system 4006 and other similar exemplary acoustic lighting panels, sound may be absorbed by sound-absorbing material 2610 that is exposed between substrates 4020. Note that conductive traces, optional control elements and other items are not shown in FIG. 40D for clarity.

Referring to FIG. 40C, in acoustic lighting system 4040, LEEs 230 are aligned or substantially aligned between multiple substrates 4020, as shown by alignment line 4040; however, this is not a limitation of the present invention, and in other embodiments LEEs 230 may not be aligned between multiple substrates 4020, as shown by alignment line 4041 in FIG. 40D.

Figure 40E:
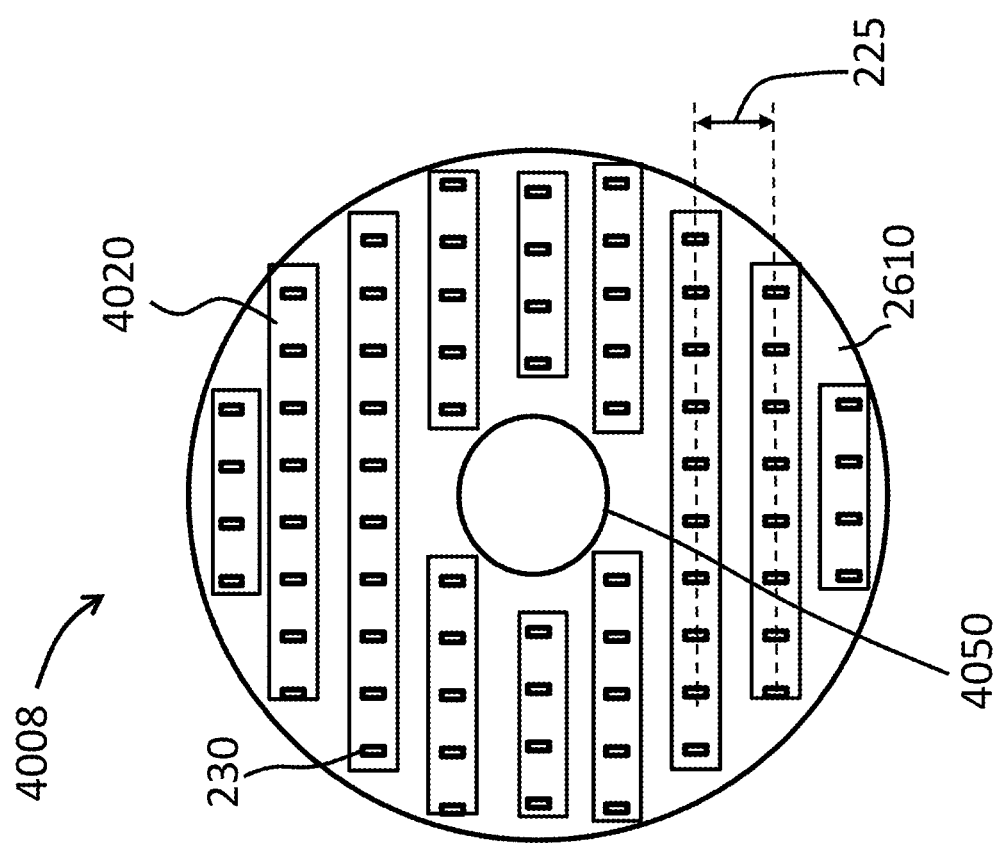

FIG. 40E depicts an exemplary acoustic lighting panel 4008 in accordance with embodiments of the present invention, although alternative systems with similar functionality are also within the scope of the invention. Acoustic lighting panel 4008 is an example of a circular acoustic lighting panel incorporating multiple substrates 4020, in which substrates 4020 do not have an aperture or a cut-out region. Acoustic lighting panel 4008 incorporates a region in the center that is not populated with substrates with LEEs. Region 4050 is shown as a circle in FIG. 40E; however, this is not a limitation of the present invention, and in other embodiments region may be a square, rectangle, triangle, hexagon or any other shape. While FIG. 40E shows acoustic lighting panel 4008 as having one region 4050, this is not a limitation of the present invention, and in other embodiments acoustic lighting panels may have more than one region 4050. In acoustic lighting system 4008 and other similar exemplary acoustic panels, sound may be absorbed by sound-absorbing material 2610 that is exposed between substrates 4020. In various embodiments of the present invention, sound-absorbing material 2610 may fill (or underlie) all, or a portion of, or none of region 4050. In various embodiments of the present invention, region 4050 may be used for a variety of purposes, for example to accommodate a sprinkler head or fire-suppression system, heating, vacuum and air conditioning duct, cameras, sensors, mechanical supports for the lighting panel or associated lighting system, or the like. Note that conductive traces, connectors, optional control elements and other items are not shown in FIG. 40E for clarity.

While not shown in FIGS. 40A-40E, in various embodiments of the present invention multiple substrates may be electrically coupled on the acoustic lighting panel, resulting in a fewer number of electrical connections to the lighting panel than the number of substrates 3710 or 4020.

FIG. 40F depicts an exemplary acoustic lighting panel 4009 in accordance with embodiments of the present invention, although alternative systems with similar functionality are also within the scope of the invention. Acoustic lighting panel 4009 includes substrates 4020 around the periphery of acoustic lighting panel 4009, leaving region 4055 without substrates 4020 and thus without illumination sources in region 4055. In various embodiments of the present invention, region 4055 may be filled or populated with sound-absorbing material 2610, i.e., sound-absorbing material 2610 may underlie all or a portion of region 4055. However, this is not a limitation of the present invention, and in other embodiments region 4055 may be partially populated with sound-absorbing material 2610 or may not include any sound-absorbing material 2610. Note that conductive traces, connectors, optional control elements and other items are not shown in FIG. 40F for clarity.

FIGS. 40G and 40H depict exemplary lighting systems in accordance with embodiments of the present invention, although alternative systems with similar functionality are also within the scope of the invention. FIG. 40G shows a cross-section of a lighting system incorporating acoustic lighting panel 4009 through cut-line K-K'. The lighting system of FIG. 40G includes side panels 4050 and back panel 4060 that partially, completely, or substantially completely covers (i.e., surround and underlie) sound-absorbing material 2610. In various embodiments of the present invention, back panel 4060 may have a relatively low sound transmittance, for example less than about 10% or less than about 5% or less than about 1%; however, this is not a limitation of the present invention, and in other embodiments back panel 4060 may have a relatively high sound transmittance, for example greater than about 10% or greater than about 25% or greater than about 50%.

FIG. 40H depicts a cross-section of a lighting system incorporating acoustic lighting panel 4009 through cut-line K-K' and side panels 4051 in which sound-absorbing material 2610 is exposed on the back of the lighting systems or itself forms the back of the lighting system. In various embodiments of the present invention, the lighting system of FIG. 40H may have a higher ability to absorb noise relative to the lighting system of FIG. 40G, as sound may be absorbed by sound-absorbing material 2610 from the front of the lighting system, through diffuser 4020, as well as directly by sound-absorbing material 2610 from the back of the lighting system.

Figure 40I:
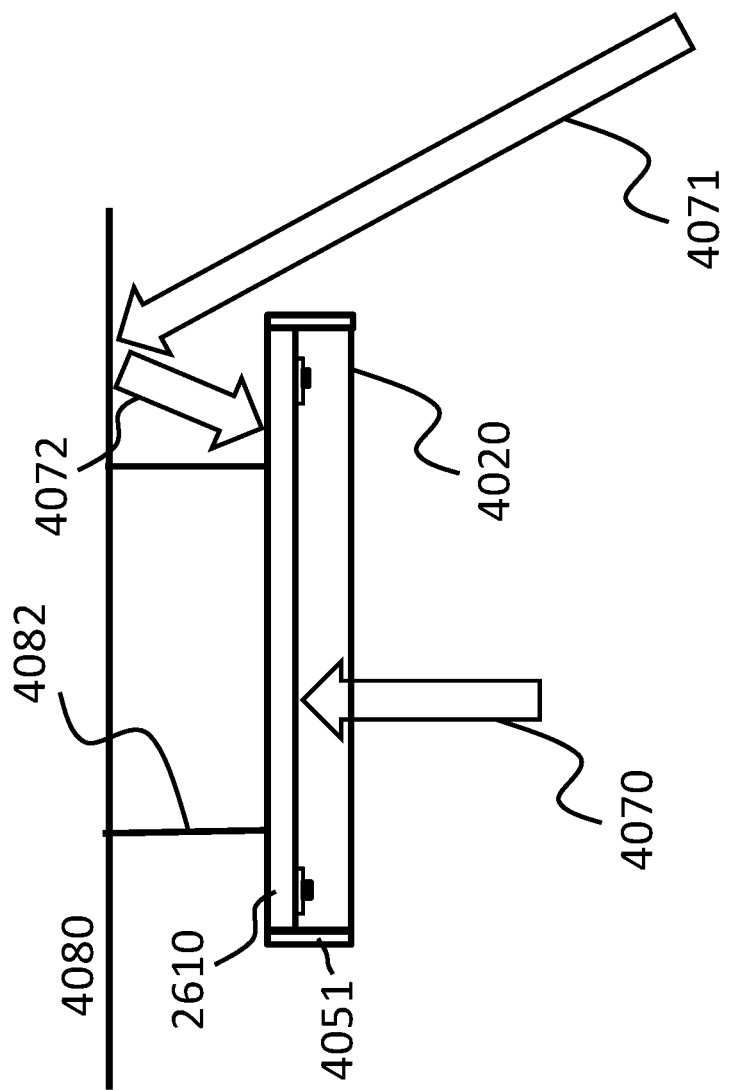
FIG. 40I is a schematic view of a lighting system in accordance with various embodiments of the invention.

FIG. 40I depicts exemplary lighting systems in accordance with embodiments of the present invention, although alternative systems with similar functionality are also within the scope of the invention. FIG. 40I depicts a cross-section of a lighting system that is suspended by cables, rods or wires, or the like, as identified as 4082, from a surface 4080. In various embodiments of the present invention, surface 4080 may be a ceiling; however, this is not a limitation of the present invention, and in other embodiments surface 4080 may include sub-ceiling, mounting platform, or other regions. Referring to FIG. 40I, sound or noise 4070 and 4071 may be incident on the front of the lighting system (in the case of sound or noise 4070) or may be incident on surface 4080 (in the case of sound or noise 4071). In various embodiments of the present invention, sound or noise 4070 may transmit partially or completely through diffuser 4020 and may be partially or completely absorbed by sound-absorption material 2610, while sound or noise 4071 may partially or completely reflect off of surface 4080 and may be partially or completely absorbed by sound-absorption material 2610, thus increasing the ability to absorb sound compared to a lighting system in which the back of sound-absorbing material 2610 is not exposed, for example as described in reference to FIG. 40G.

While a number of the examples described herein include or consist essentially of one or more flexible light sheets and one or more frame elements, this is not a limitation and in other embodiments frame elements may be eliminated, resulting in light panels including or consisting essentially of one or more flexible light sheets with no frame elements.

While a number of the examples described herein utilize a constant-voltage drive system for powering one or more light sheets or light panels, this is not a limitation of the present invention, and in other embodiments other modes of energizing one or more light sheets or light panels may be utilized, for example constant-current or AC drive or other modes. In some embodiments of the present invention, the mode of powering the light sheets or light panels may determine the type, number, or need for current control elements on each light sheet or light panel. For example, in some embodiments of the present invention, no current control elements may be required on the light panel or light sheet, for example if using a constant-current drive mode.

While a number of examples presented herein utilize 9V battery connectors for connectorized panels (i.e., panels having one or more connectors), this is not a limitation of the present invention and in other embodiments other types of connectors may be utilized. For example, such connectors may include commercially available plug and jack or male and female connectors, polarized or unpolarized connectors, or connectors which on one or more ends are connected to a light sheet or light panel by wires.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux LEDs, laser diodes or other similar devices as would be readily understood. The emitted radiation of an LEE may be visible, such as red, blue or green, or invisible, such as infrared or ultraviolet. An LEE may produce radiation of a continuous or discontinuous spread of wavelengths. An LEE may feature a phosphorescent or fluorescent material, also known as a light-conversion material (or a wavelength-conversion material, or a phosphor), for converting a portion of its emissions from one set of wavelengths to another. In some embodiments, the light from an LEE includes or consists essentially of a combination of light directly emitted by the LEE and light emitted by an adjacent or surrounding light-conversion material. An LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective. Herein "reflective" is defined as having a reflectivity greater than 65% for a wavelength of light emitted by the LEE on which the contacts are disposed. In some embodiments, an LEE may include or consist essentially of an electronic device or circuit or a passive device or circuit. In some embodiments, an LEE includes or consists essentially of multiple devices, for example an LED and a Zener diode for static-electricity protection. In some embodiments, an LEE may include or consist essentially of a packaged LED, i.e., a bare LED die encased or partially encased in a package. In some embodiments, the packaged LED may also include a light-conversion material. In some embodiments, the light from the LEE may include or consist essentially of light emitted only by the light-conversion material, while in other embodiments the light from the LEE may include or consist essentially of a combination of light emitted from an LED and from the light-conversion material. In some embodiments, the light from the LEE may include or consist essentially of light emitted only by an LED.

One or more non-LEE devices such as Zener diodes, transient voltage suppressors (TVSs), varistors, etc., may be placed on each light sheet to protect the LEEs 230 from damage that may be caused by high-voltage events, such as electrostatic discharge (ESD) or lightning strikes. In one embodiment, conductive trace segments shown in FIG. 2B between the LEE strings 250 may be used for placement of a single protection device per light sheet, where the device spans the positive and negative power traces, for example power conductors 210, 220. These trace segments also serve to provide a uniform visual pattern of lines in the web direction, which may be more aesthetically pleasing than a light sheet with noticeable gaps between LEE strings 250. In a more general sense, in addition to conductive traces 260 that are part of string 250, additional conductive traces 260 that may or may not be electrically coupled to other strings 250 and/or power conductors 210, 220 may be formed on substrate 265, for example to provide additional power conduction pathways or to achieve a decorative or aesthetically pleasing look to the pattern on the light sheet or to provide a communication pathway to one or more CEs 240, for example to provide a control signal to the one or more CEs 240. These trace segments also serve to provide a uniform visual pattern of lines in the web direction, which may be more aesthetically pleasing than a light sheet with noticeable gaps between LEE strings 250.

In one embodiment, an LEE 230 includes or consists essentially of a bare semiconductor die (such as an LED), while in other embodiments LEE 230 includes or consists essentially of a packaged LED.

In some embodiments, LEE 230 may include or consist essentially of a "white die" that includes an LED that is integrated with a light-conversion material (e.g., a phosphor) before being attached to the light sheet, as described in U.S. patent application Ser. No. 13/748,864, filed Jan. 24, 2013, or U.S. patent application Ser. No. 13/949,543, filed Jul. 24, 2013, the entire disclosure of each of which is incorporated by reference herein.

In some embodiments, LEEs 230 may emit light in a relatively small wavelength range, for example having a full width at half maximum in the range of about 20 nm to about 200 nm. In some embodiments, all LEEs 230 may emit light of the same or substantially the same wavelength, while in other embodiments different LEEs 230 may emit light of different wavelengths. In some embodiments LEEs 230 may emit white light, for example that is perceived as white light by the eye. In some embodiments, the white light may be visible light with a spectral power distribution the chromaticity of which is close to the blackbody locus in the CIE 1931 xy or similar color space. In some embodiments, white light has a color temperature in the range of about 2000 K to about 10,000 K. The emission wavelength, full width at half maximum (FWHM) of the emitted light or radiation or other optical characteristics of LEEs 230 may not be all the same and are not a limitation of the present invention.

In various embodiments, substrate 265 and/or the power bus substrate may include or consist essentially of a semicrystalline or amorphous material, e.g., polyethylene naphthalate (PEN), polyethylene terephthalate (PET), polycarbonate, polyethersulfone, polyester, polyimide, polyethylene, fiberglass, FR4, metal core printed circuit board, (MCPCB), and/or paper. Substrate 265 may include multiple layers, e.g., a deformable layer over a rigid layer, for example, a semicrystalline or amorphous material, e.g., PEN, PET, polycarbonate, polyethersulfone, polyester, polyimide, polyethylene, and/or paper formed over a rigid substrate for example comprising, acrylic, aluminum, steel and the like. Depending upon the desired application for which embodiments of the invention are utilized, substrate 265 may be substantially optically transparent, translucent, or opaque. For example, substrate 265 may exhibit a transmittance or a reflectivity greater than 70% for optical wavelengths ranging between approximately 400 nm and approximately 700 nm. In some embodiments substrate 265 may exhibit a transmittance or a reflectivity of greater than 70% for one or more wavelengths emitted by LEE 230. Substrate 265 may also be substantially insulating, and may have an electrical resistivity greater than approximately 100 ohm-cm, greater than approximately $1 \times 10^6$ ohm-cm, or even greater than approximately $1 \times 10^{10}$ ohm-cm. In some embodiments substrate 265 may have a thickness in the range of about 10 μm to about 500 μm.

In various embodiments, conductive elements, e.g., power conductors 210, 220 and conductive traces 260, and/or power conductors 2120 and 2130, may be formed via conventional deposition, photolithography, and etching processes, plating processes, lamination, lamination and patterning, evaporation sputtering or the like or may be formed using a variety of different printing processes. For example, power conductors 210, 220 and conductive traces 260, and/or power conductors 2120 and 2130, may be formed via screen printing, flexographic printing, ink-jet printing, and/or gravure printing. Power conductors 210, 220 and conductive traces 260, and/or power conductors 2120 and 2130, may include or consist essentially of a conductive material (e.g., an ink or a metal, metal film or other conductive materials or the like), which may include one or more elements such as silver, gold, aluminum, chromium, copper, and/or carbon. Power conductors 210, 220 and conductive traces 260, and/or power conductors 2120 and 2130, may have a thickness in the range of about 50 nm to about 1000 µm. In some embodiments, the thickness of power conductors 210, 220 and conductive traces 260 may be determined by the current to be carried thereby. While the thickness of one or more of power conductors 210, 220 and conductive traces 260, and/or power conductors 2120 and 2130, may vary, the thickness is generally substantially uniform along the length of the trace to simplify processing. However, this is not a limitation of the present invention, and in other embodiments the thickness and/or material of power conductors 210, 220 and conductive traces 260, and/or power conductors 2120 and 2130, may vary. In some embodiments, all or a portion of power conductors 210, 220 and conductive traces 260, and/or power conductors 2120 and 2130, may be covered or encapsulated. In some embodiments, a layer of material, for example insulating material, may be formed over all or a portion of power conductors 210, 220 and conductive traces 260, and/or power conductors 2120 and 2130. Such a material may include, e.g., a sheet of material such as used for substrate 265, a printed layer, for example using screen, ink jet, stencil or other printing means, a laminated layer, or the like. Such a printed layer may include, for example, an ink, a plastic and oxide, or the like. The covering material and/or the method by which it is applied is not a limitation of the present invention.

In various embodiments of the present invention, the substrate and conductive traces may have a thickness less than about 5 mm or less than about 2 mm or less than about 1 mm.

In various embodiments, the conductive traces 260 are formed with a gap between adjacent conductive traces 260, and LEEs 130 and CEs 240 are electrically coupled to conductive traces 260 using conductive adhesive, e.g., an isotropically conductive adhesive and/or an ACA. ACAs may be utilized with or without stud bumps and embodiments of the present invention are not limited by the particular mode of operation of the ACA. For example, the ACA may utilize a magnetic field rather than pressure (e.g., the ZTACH ACA available from SunRay Scientific of Mt. Laurel, N.J., for which a magnetic field is applied during curing in order to align magnetic conductive particles to form electrically conductive "columns" in the desired conduction direction). Furthermore, various embodiments utilize one or more other electrically conductive adhesives, e.g., isotropically conductive adhesives, non-conductive adhesives, in addition to or instead of one or more ACAs. In other embodiments, LEEs 230 and CEs 240 may be attached to and/or electrically coupled to conductive traces 260 by other means, for example solder, reflow solder, wave solder, wire bonding, or the like. The method by which LEEs 230 and CEs 240 are attached to conductive traces 260 is not a limitation of the present invention.

CE 240 may be one component or multiple active and/or passive components. In one embodiment, power conductors 210, 220 provide a DC voltage or substantially DC voltage and CE 240 includes or consists essentially of a resistor, e.g. a current-limiting resistor. The choice of the resistance value may be a trade-off between a number of parameters and characteristics that may include, e.g., efficiency and current stability. In general, a larger resistance will result in reduced efficiency but greater current stability, while a smaller resistance will result in increased efficiency but reduced current stability. Variations in the current may result from variations in the input voltage (for example across power conductors 210, 220), variations in forward voltage of the LEEs 230 within the string, variations in the value of the current-limiting resistor, variations in current that may occur if one or more LEEs 230 in the string become short-circuited or the like. In the case of CE 240 including or consisting essentially of a resistor, in some embodiments CE 240 is a discrete resistor formed within or on conductive traces 260, such as a chip resistor, a bare-die resistor or surface mount device (SMD) resistor.

As discussed above, in embodiments where CE 240 includes or consists essentially of a resistor, there may be trade-offs between efficiency and current stability. While such trade-offs may be acceptable in certain products, other products may require relatively better current stability at higher efficiencies, and in these cases CE 240 may include or consist essentially of multiple components or a circuit element, as discussed above. In some embodiments CE 240 includes or consists essentially of a field-effect transistor (FET) and a resistor. In another embodiment CE 240 includes or consists essentially of two bipolar junction transistors (BJTs) and two resistors.

In general, the efficiency and current stability increase with the number of components, as does the cost. In some embodiments where a CE 240 includes or consists essentially of multiple components, the components may be in discrete form (i.e., each component individually electrically coupled to conductive traces 260) or in hybrid form (where multiple separate components are mounted on a submount, which is then electrically coupled to conductive traces 260), or in monolithic form (where multiple components are integrated on a semiconductor chip, for example a silicon-based or other semiconductor-based integrated circuit). In some embodiments, CEs 240 may be in bare-die form, while in other embodiments CEs 240 may be packaged or potted or the like. In some embodiments, a CE 240 may include or consist essentially of a bare-die integrated circuit. In some embodiments, the integrated circuit includes or consists essentially of multiple active and/or passive devices that are fabricated on a common semiconductor substrate.

In other embodiments, power conductors 210, 220 may provide AC power, or power modulated at different frequencies and in these embodiments CEs 240 may be selected accordingly or may be omitted. In one embodiment, power conductors 210, 220 may provide a standard line voltage, for example about 120 VAC or about 240 VAC or about 277 VAC, for example at about 50 Hz or about 60 Hz. In some embodiments, CEs 240 may accommodate a plurality of input types, and thus be so-called "universal" CEs 240, while in other embodiments different CEs 240 may be required for different input types. The actual component or components of CEs 240 are not limiting to this invention; however, in preferred embodiments of this invention, the positioning of CEs 240 does not disrupt the LEE pitch. In another embodiment of this invention, the positioning of CEs 240 is independent of LEE pitch. As discussed herein, CEs 240 and LEEs 230 may be electrically coupled to conductive traces 260 using a variety of means, for example solder, conductive adhesive or ACA; however, the method of electrical coupling of CEs 140 and LEEs 230 is not a limitation of the present invention.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An acoustic lighting system comprising:
   a rigid support panel having first and second opposing surfaces;
   disposed over the first surface of the support panel, a light panel comprising (i) a substrate having one or more apertures or cut-out regions defined therein and (ii) a plurality of light-emitting elements disposed over the substrate; and
   disposed between the support panel and the light panel, a plurality of sections of a sound-absorbing material having gaps therebetween, at least some of the sections being exposed through the one or more apertures or cut-out regions in the light-panel.

2. The acoustic lighting system of claim 1, further comprising, extending from the second surface of the support panel, means for suspending the lighting system from a wall or ceiling.

3. The acoustic lighting system of claim 1, further comprising an optic disposed over the light panel.

4. The acoustic lighting system of claim 3, wherein the optic comprises at least one of a lens, an optical diffuser, a refractive optic, a reflective optic, a Fresnel optic, a fabric, a polymer, stone, or a graphic panel.

5. The acoustic lighting system of claim 3, wherein the optic comprises an optical diffuser.

6. The acoustic lighting system of claim 5, wherein the optical diffuser has an optical transmissivity greater than 25% for a wavelength of light emitted by at least some of the light-emitting elements.

7. The acoustic lighting system of claim 5, wherein (i) the light-emitting elements are spaced apart at a first pitch, (ii) the optical diffuser is spaced apart from the light-emitting elements by a first spacing and (iii) the first spacing is greater than the first pitch.

8. The acoustic lighting system of claim 1, wherein the support panel defines one or more apertures therethrough to expose sound-absorbing material via the second surface of the support panel.

9. The acoustic lighting system of claim 1, wherein each section of the sound-absorbing material comprises at least one of fiberglass, sound-absorbing foam, mineral wool, mineral fiber, acoustic fleece, polyester, polyester felt, polyethylene terephthalate, acoustic ceiling tile, or fiberglass foam.

10. The acoustic lighting system of claim 1, wherein each section of the sound-absorbing material is a multi-layer structure comprising at least one rigid layer and at least one layer that is flexible and/or soft.

11. The acoustic lighting system of claim 1, wherein the substrate is disposed on and in direct mechanical contact with the sections of the sound-absorbing material.

12. The acoustic lighting system of claim 1, wherein the light panel is attached to the sections of the sound-absorbing material with at least one of an adhesive or a plurality of mechanical fasteners.

13. The acoustic lighting system of claim 1, wherein (i) the substrate has a first surface and a second surface opposite the first surface, (ii) each section of the sound-absorbing material has a first surface and a second surface opposite the first surface, (iii) the second surface of the substrate faces the first surfaces of the sections of the sound-absorbing material, (iv) the first surface of the substrate has a first CIELAB color value of $L^*_1$, $a^*_1$, $b^*_1$, (v) the first surfaces of the sections of the sound-absorbing material have a second CIELAB color value of $L^*_2$, $a^*_2$, $b^*_2$, and (vi) a difference $\Delta E^*$ between the first and second CIELAB color values is less than 6.

14. The acoustic lighting system of claim 1, wherein (i) the substrate has a first surface and a second surface opposite the first surface, (ii) each section of the sound-absorbing material has a first surface and a second surface opposite the first surface, (iii) the second surface of the substrate faces the first surfaces of the sections of the sound-absorbing material, (iv) the first surface of the substrate has a first reflectivity to a wavelength of light emitted by the light-emitting elements, (v) the first surfaces of the sections of the sound-absorbing material have a second reflectivity to a wavelength of light emitted by the light-emitting elements, and (vi) the first and second reflectivities are equal to each other ±20%.

15. The acoustic lighting system of claim 1, further comprising a protective panel disposed over the light panel and defining therein a plurality of first apertures and a plurality of second apertures, wherein:
   the first apertures are positioned to allow light emitted from the light-emitting elements to pass through the first apertures, and
   the second apertures at least partially overlap with the one or more apertures or cut-out regions in the light panel.

16. The acoustic lighting system of claim 15, wherein the protective panel comprises at least one of plastic, foam, or sound-absorbing material.

17. The acoustic lighting system of claim 15, wherein (i) the substrate has a first surface and a second surface opposite the first surface, (ii) the protective panel has a first surface and a second surface opposite the first surface, (iii) the first surface of the substrate faces the second surface of the protective panel, (iv) the first surface of the substrate has a first CIELAB color value of $L^*_1$, $a^*_1$, $b^*_1$, (v) the first surface of the protective panel has a second CIELAB color value of $L^*_2$, $a^*_2$, $b^*_2$, and (vi) a difference $\Delta F^*$ between the first and second CIELAB color values is less than 6.

18. The acoustic lighting system of claim 15, wherein (i) the substrate has a first surface and a second surface opposite the first surface, (ii) the protective panel has a first surface and a second surface opposite the first surface, (iii) the first surface of the substrate faces the second surface of the protective panel, (iv) the first surface of the substrate has a first reflectivity to a wavelength of light emitted by the light-emitting elements, (v) the first surface of the protective panel has a second reflectivity to a wavelength of light emitted by the light-emitting elements, and (vi) the first and second reflectivities are equal to each other ±20%.

19. The acoustic lighting system of claim 1, wherein the light panel comprises first and second power conductors configured to provide power to the plurality of light-emitting elements.

20. The acoustic lighting system of claim 19, wherein the light-emitting elements are electrically configured as a plurality of light-emitting strings each comprising a plurality of series-connected light-emitting elements.

21. An acoustic lighting system comprising:
   a rigid sound-absorbing material having first and second opposing surfaces; and
   a first light panel disposed over the first surface of the sound-absorbing material, the first light panel comprising (i) a substrate and (ii) a plurality of light-emitting elements disposed over the substrate,
   wherein:
   the first light panel comprises (i) a first elongated portion extending in a first direction, (ii) first and second power conductors extending over the substrate in the first elongated portion, and (iii) a plurality of second elongated portions extending from the first elongated portion in a second direction different from the first direction, each second elongated portion comprises a plurality of light-emitting elements thereon, power being supplied to said light-emitting elements by the first and second power conductors, and the second elongated portions are separated by gaps therebetween such that the sound-absorbing material is exposed through the gaps between the second elongated portions.

22. The acoustic lighting system of claim 21, wherein the first direction is substantially perpendicular to the second direction.

23. The acoustic lighting system of claim 21, wherein each light-emitting string is disposed on a different second elongated portion.

\* \* \* \* \*